United States Patent
Bok et al.

(10) Patent No.: US 11,442,567 B2
(45) Date of Patent: *Sep. 13, 2022

(54) ORGANIC LIGHT EMITTING DISPLAY DEVICE AND METHOD OF MANUFACTURING THE SAME

(71) Applicant: Samsung Display Co., Ltd., Yongin-Si (KR)

(72) Inventors: Seung-Lyong Bok, Hwaseong-si (KR); Young-Seok Seo, Seoul (KR); Mu-Gyeom Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/222,946

(22) Filed: Apr. 5, 2021

(65) Prior Publication Data

US 2021/0223898 A1 Jul. 22, 2021

Related U.S. Application Data

(63) Continuation of application No. 16/704,418, filed on Dec. 5, 2019, now Pat. No. 10,969,893, which is a (Continued)

(30) Foreign Application Priority Data

Oct. 6, 2015 (KR) .................. 10-2015-0140248

(51) Int. Cl.
*G06F 3/045* (2006.01)
*G06F 3/041* (2006.01)
(Continued)

(52) U.S. Cl.
CPC .......... *G06F 3/0412* (2013.01); *G06F 3/0443* (2019.05); *H01L 27/323* (2013.01);
(Continued)

(58) Field of Classification Search
CPC ...... G06F 3/041; G06F 3/0412; G06F 3/0416; G06F 3/0418; G06F 3/044; G06F 3/0443;
(Continued)

(56) References Cited

U.S. PATENT DOCUMENTS 8,629,842 B2   1/2014  Jang
9,099,676 B2   8/2015  Kuo et al.
(Continued)

FOREIGN PATENT DOCUMENTS

CN    102437172 A    5/2012
CN    203607415 U    5/2014
(Continued)

OTHER PUBLICATIONS

Chinese Office Action for Application No. 201610864942.3 dated May 8, 2021 enumerating the above listed references in the Chinese Office Action.

*Primary Examiner* — Joe H Cheng
(74) *Attorney, Agent, or Firm* — Cantor Colburn LLP

(57) ABSTRACT

An organic light emitting display device includes a substrate including a light-emitting region and a reflection region, a plurality of sensing patterns disposed in the light-emitting region and the reflection region, and including a material having a first reflectivity, and a reflection pattern disposed in the reflection region, and including a material having a second reflectivity, and overlapping the plurality of sensing patterns.

12 Claims, 107 Drawing Sheets

Related U.S. Application Data continuation of application No. 15/907,645, filed on Feb. 28, 2018, now Pat. No. 10,503,299, which is a continuation of application No. 15/209,010, filed on Jul. 13, 2016, now Pat. No. 9,927,898.

(51) Int. Cl.
*G06F 3/044* (2006.01)
*H01L 27/32* (2006.01)
*H01L 51/52* (2006.01)

(52) U.S. Cl.
CPC ...... *H01L 51/5237* (2013.01); *H01L 51/5271* (2013.01); *G06F 2203/04103* (2013.01); *H01L 2227/323* (2013.01)

(58) Field of Classification Search
CPC . G06F 2203/04101; G06F 2203/04103; G06F 2203/04104; G06F 2203/04105; G06F 2203/041111; H01L 27/32; H01L 27/3225; H01L 27/323; H01L 51/52; H01L 51/5237; H01L 51/524; H01L 51/5271; H01L 2227/323; G09G 3/36; G09G 3/3674; G09G 3/3677; G09G 3/3685; G09G 3/3688; G09G 3/3696; G09G 2310/0272; G09G 2310/0278
See application file for complete search history.

(56) References Cited

U.S. PATENT DOCUMENTS

| | | | |
|---|---|---|---|
| 9,647,041 B2 | 5/2017 | Liu et al. | |
| 9,791,960 B2 | 10/2017 | Hao et al. | |
| 9,927,898 B2 * | 3/2018 | Bok | H01L 51/5237 |
| 9,946,419 B2 | 4/2018 | Kimura et al. | |
| 9,991,474 B2 | 6/2018 | Kim et al. | |
| 10,268,294 B2 | 4/2019 | Seo et al. | |
| 10,503,299 B2 * | 12/2019 | Bok | G06F 3/0412 |
| 10,969,893 B2 * | 4/2021 | Bok | G06F 3/0443 |
| 2009/0236981 A1 | 9/2009 | Chang et al. | |
| 2011/0080372 A1 * | 4/2011 | Lee | G06F 3/045 |
| | | | 257/E33.056 |
| 2013/0049640 A1 | 2/2013 | Kuo et al. | |
| 2013/0321296 A1 | 12/2013 | Lee et al. | |
| 2014/0078108 A1 | 3/2014 | Hotelling et al. | |
| 2014/0160411 A1 | 6/2014 | Yim et al. | |
| 2014/0267166 A1 | 9/2014 | Griffiths | |
| 2015/0034918 A1 | 2/2015 | Yim et al. | |
| 2015/0123938 A1 | 5/2015 | Gecnuk | |
| 2015/0205418 A1 | 7/2015 | Nam et al. | |
| 2015/0255518 A1 | 9/2015 | Watanabe et al. | |
| 2015/0280154 A1 | 10/2015 | Jang et al. | |
| 2016/0204168 A1 * | 7/2016 | Wang | H01L 51/5281 |
| | | | 257/40 |
| 2016/0218324 A1 | 7/2016 | Kim et al. | |
| 2017/0179203 A1 * | 6/2017 | Ma | G06F 3/04164 |
| 2018/0204886 A1 * | 7/2018 | Lee | H01L 27/323 |
| 2018/0239476 A1 | 8/2018 | Yoshida et al. | |

FOREIGN PATENT DOCUMENTS

| | | |
|---|---|---|
| CN | 104503609 A | 4/2015 |
| CN | 104637973 A | 5/2015 |
| KR | 1020040031826 A | 4/2004 |
| KR | 200400903 Y1 | 11/2005 |
| KR | 101315227 B1 | 10/2013 |
| KR | 1020140073216 A | 6/2014 |
| KR | 1020160063540 A | 6/2016 |
| WO | 2014203418 A1 | 12/2014 |

* cited by examiner

FIG. 14
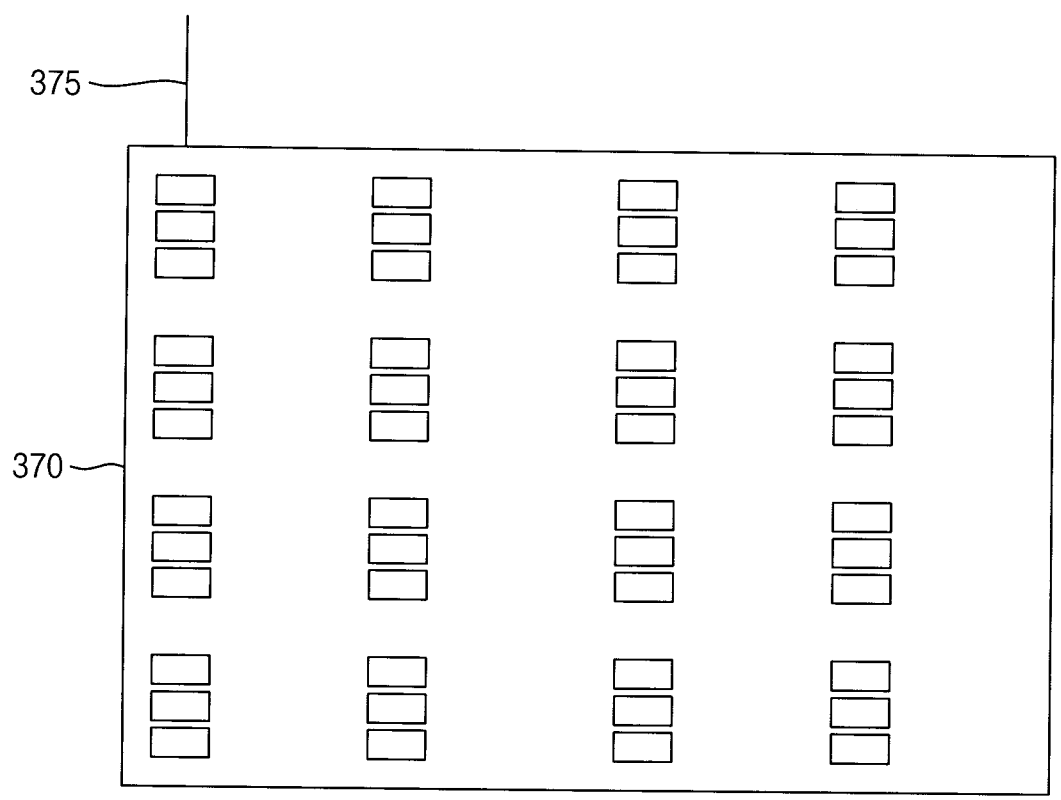
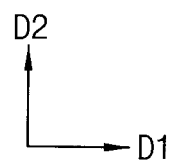

FIG. 17
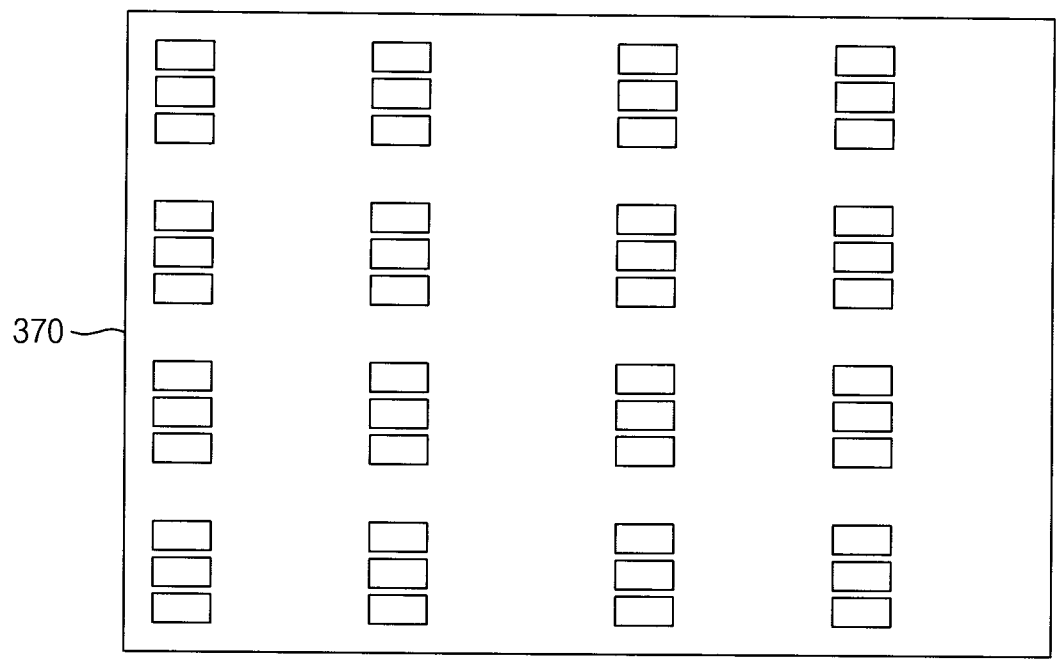
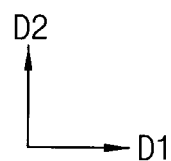

FIG. 36
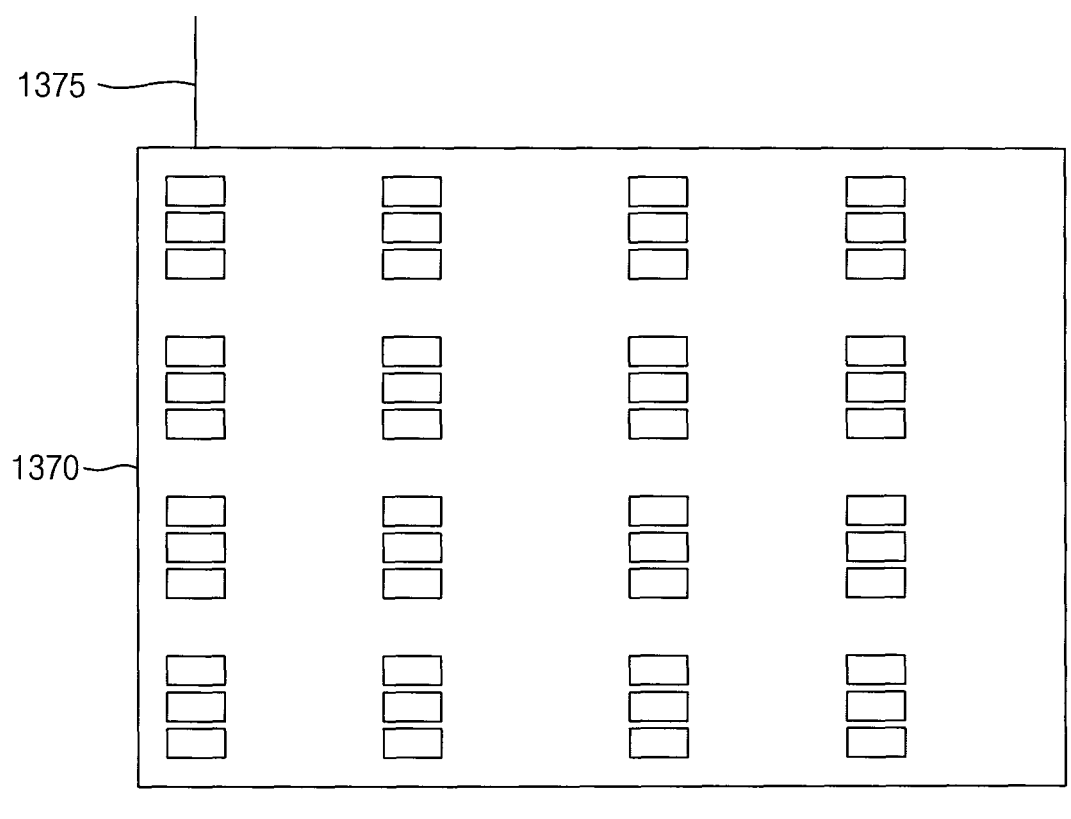

2370

FIG. 93
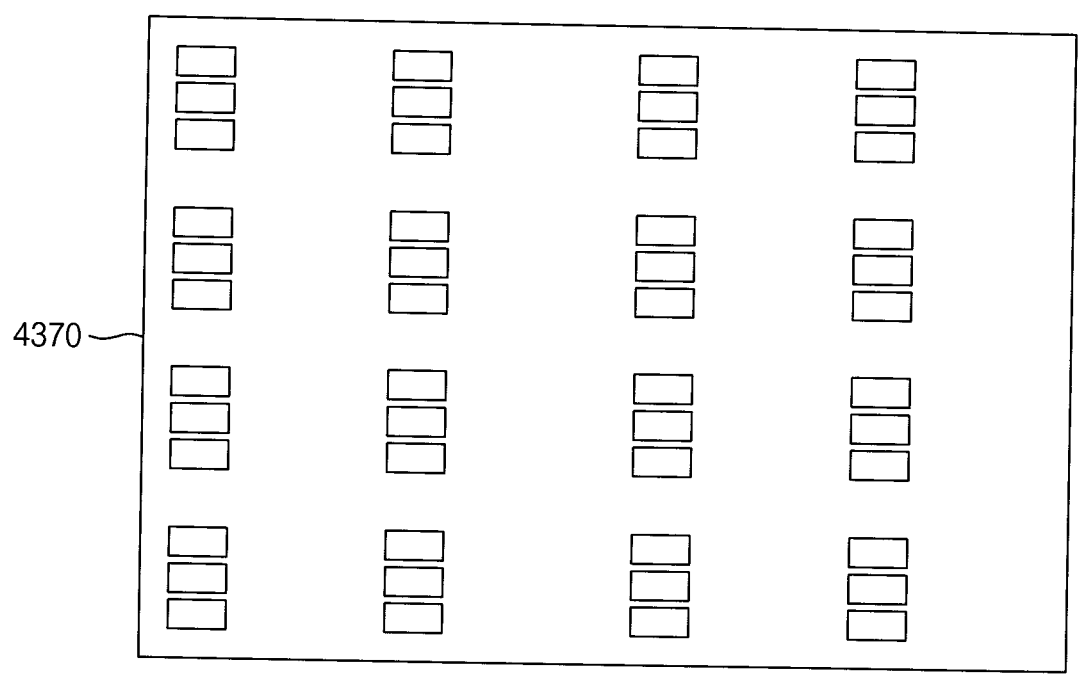
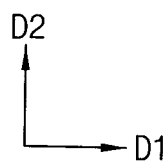

FIG. 94
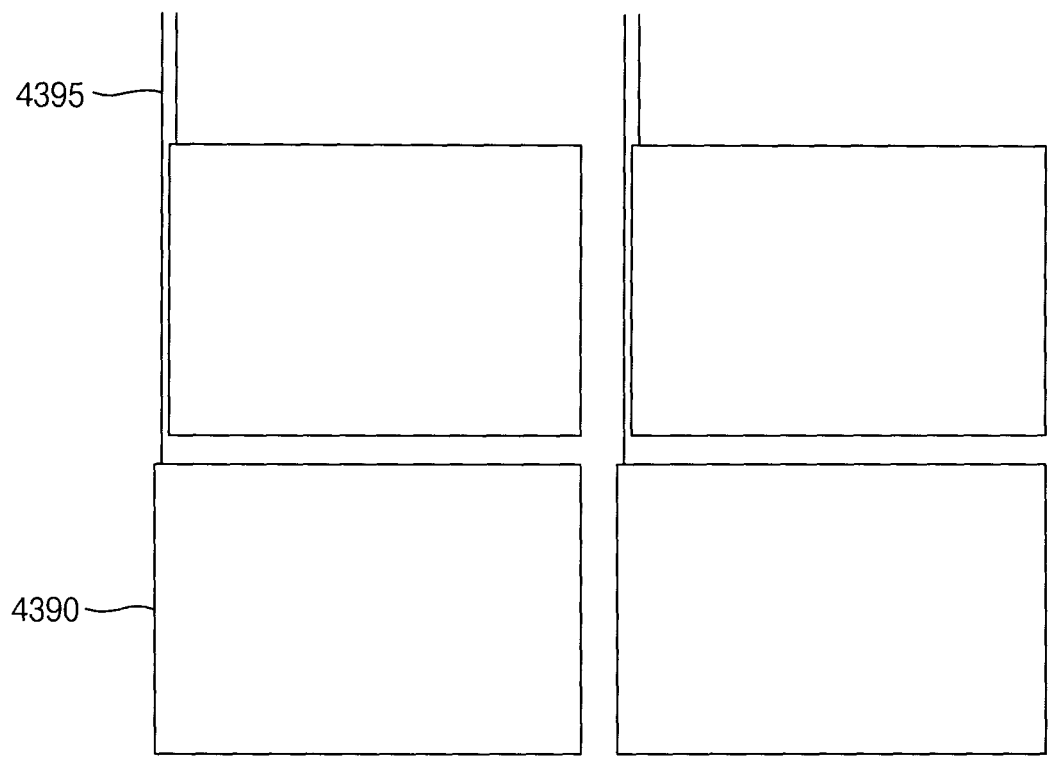

FIG. 102
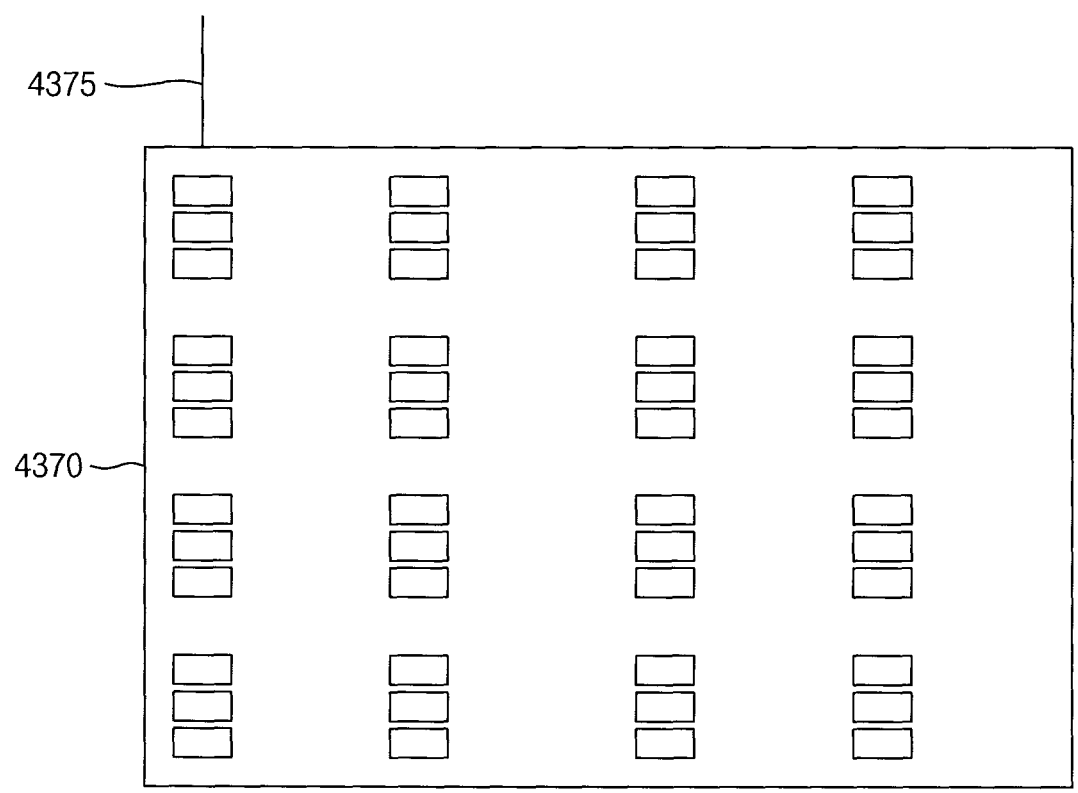
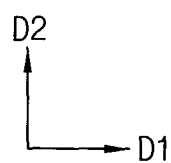

ORGANIC LIGHT EMITTING DISPLAY DEVICE AND METHOD OF MANUFACTURING THE SAME

This application is a continuation of U.S. patent application Ser. No. 16/704,418, filed on Dec. 5, 2019, now U.S. Pat. No. 10,969,893 B2, which is a continuation of U.S. patent application Ser. No. 15/907,645, filed on Feb. 28, 2018, now U.S. Pat. No. 10,503,299 B2, which is a continuation of U.S. patent application Ser. No. 15/209,010, filed on Jul. 13, 2016, now U.S. Pat. No. 9,927,898 B2, which claims priority to Korean Patent Application No. 10-2015-0140248, filed on Oct. 6, 2015, and all the benefits accruing therefrom under 35 U.S.C. § 119, the content of which in its entirety is herein incorporated by reference.

BACKGROUND

1. Field

Exemplary embodiments of the invention relate to an organic light emitting display ("OLED") device and a method of manufacturing the OLED device. More particularly, exemplary embodiments relate to an OLED device having a mirror function and a touch function, and a method of manufacturing the OLED device.

2. Description of the Related Art

A flat panel display ("FPD") device is widely used as a display device for an electronic device due to its lightweight and thinness compared to a cathode-ray tube ("CRT") display device. Typical examples of the flat panel display device include a liquid crystal display ("LCD") device and an organic light emitting diode ("OLED") display device. Compared to the LCD, the OLED has many advantages such as a higher luminance and a wider viewing angle. In addition, the OLED display device can be made thinner than the LCD because the OLED display device does not require a backlight. In the OLED display device, electrons and holes are injected into an organic thin layer through a cathode and an anode, and then recombined in the organic thin layer to generate excitons, thereby emitting a light of a predetermined wavelength.

Recently, a mirror OLED device reflecting an image of an object (or target) that is located in the front of the OLED device by including a reflective member has been developed. In addition, an OLED device having a mirror function and a touch function has also been developed.

SUMMARY

In order to manufacture an organic light emitting display ("OLED") device having a mirror function and a touch function, an additional process for forming an electrode layer having a touch function is commonly employed, thus increasing a manufacturing cost.

Exemplary embodiments of the invention provide an OLED device having mirror function and touch function.

Exemplary embodiments of the invention also provide a method of manufacturing the OLED device.

In an exemplary embodiment of an OLED device according to the invention, the OLED device includes a substrate comprising a light-emitting region and a reflection region, plurality of sensing patterns disposed in the light-emitting region and the reflection region, and comprising a material having a first reflectivity and a reflection pattern disposed in the reflection region, and comprising a material having a second reflectivity, and overlapping the sensing patterns.

In an exemplary embodiment, the OLED device may further include an opposite substrate facing the substrate. The sensing patterns may be disposed on a first surface of the opposite substrate, the sensing patterns may be disposed between the substrate and the opposite substrate, and the reflection pattern may be disposed on the sensing patterns. The OLED device may further include an insulation layer disposed between the sensing patterns and the reflection pattern, and comprising an adhesive material.

In an exemplary embodiment, the reflection pattern may be electrically connected to the substrate through a conductive adhesive member.

In an exemplary embodiment, the OLED device may further include a thin film encapsulation layer disposed on the substrate. The sensing patterns may be disposed on the thin film encapsulation layer, and the reflection pattern may be disposed on the sensing patterns. The OLED device may further include an insulation layer disposed between the sensing patterns and the reflection pattern, and comprising an adhesive material.

In an exemplary embodiment, the OLED device may further include a first thin film encapsulation layer disposed on the substrate. The sensing patterns may be disposed on the first thin film encapsulation layer, and the reflection pattern may be disposed on the sensing patterns. The OLED device may further include a second thin film encapsulation layer disposed between the sensing patterns and the reflection pattern.

In an exemplary embodiment, the sensing patterns may be classified as a plurality of sensing groups comprising a predetermined number of sensing patterns of the plurality of sensing patterns. When a touch signal is applied to the sensing patterns, a sensing group of the plurality of sensing groups to which the touch signal is applied may be detected, and an accurate touch position in the sensing group to which the touch signal is applied may be detected.

In an exemplary embodiment, when the touch signal is applied to the sensing group, a signal having the same signal as the touch signal may be applied to the reflection pattern.

In an exemplary embodiment, the reflection pattern may include a plurality of sub-reflection patterns having an area corresponding to an area of one sensing group of the plurality of sensing groups. When the touch signal is applied to the sensing group, a signal having the same signal as the touch signal may be applied to a sub-reflection pattern overlapping the sensing group to which the touch signal is applied In an exemplary embodiment, the reflection pattern may include a plurality of sub-reflection patterns having an area corresponding to an area of a predetermined number of sensing patterns of the plurality of sensing patterns. The sub-reflection pattern may sense a touch position of a wide range, and after the sub-reflection pattern senses the touch position, the sensing pattern may sense an accurate touch position.

In an exemplary embodiment, the reflection pattern may include a plurality of sub-reflection patterns having an area corresponding to an area of one sensing pattern. One sub-reflection pattern may be electrically connected to one sensing pattern.

In an exemplary embodiment of a method of manufacturing an OLED device including a substrate comprising a light-emitting region and a reflection region, the method includes forming a plurality of sensing patterns comprising a material having a first reflectivity on the light-emitting region and the reflection region and forming a reflection pattern comprising a material having a second reflectivity on the reflection region, the reflection pattern overlapping the sensing patterns.

In an exemplary embodiment, forming the sensing patterns and forming the reflection pattern may include forming the sensing patterns on a first surface of an opposite substrate facing the substrate, forming an insulation layer on the sensing patterns and forming the reflection pattern on the insulation layer. The sensing patterns and the reflection pattern may be disposed between the substrate and the opposite substrate.

In an exemplary embodiment, the method may further include connecting electrically the reflection pattern to the substrate by a conductive adhesive member.

In an exemplary embodiment, forming the sensing patterns and forming the reflection pattern may include forming a thin film encapsulation layer on the substrate, forming the sensing patterns on the thin film encapsulation layer, forming an insulation layer on the sensing patterns and forming the reflection pattern on the insulation layer.

In an exemplary embodiment, forming the sensing patterns and forming the reflection pattern may include forming a first thin film encapsulation layer on the substrate, forming the sensing patterns on the first thin film encapsulation layer, forming a second thin film encapsulation layer comprising the same material as that of the first thin film encapsulation layer on the sensing patterns and forming the reflection pattern on the second thin film encapsulation layer.

In an exemplary embodiment, the sensing patterns may be classified as a plurality of sensing groups comprising a predetermined number of sensing patterns of the plurality of sensing patterns. When a touch signal is applied to the sensing patterns, a sensing group to which the touch signal is applied may be detected, and an accurate touch position in the sensing group to which the touch signal is applied may be detected.

In an exemplary embodiment, when the touch signal is applied to a sensing group, a signal having the same signal as the touch signal may be applied to the reflection pattern.

In an exemplary embodiment, the reflection pattern may include a plurality of sub-reflection patterns having an area corresponding to an area of one sensing group. When the touch signal is applied to a sensing group, a signal having the same signal as the touch signal may be applied to a sub-reflection pattern overlapping the sensing group to which the touch signal is applied.

In an exemplary embodiment, the reflection pattern may include a plurality of sub-reflection patterns having an area corresponding to an area of a predetermined number of sensing patterns of the plurality of sensing patterns. The sub-reflection pattern may sense a touch position of a wide range, and after the sub-reflection pattern senses the touch position, the sensing pattern may sense an accurate touch position. One sub-reflection pattern may be electrically connected to one sensing pattern.

In an exemplary embodiment, the reflection pattern may include a plurality of sub-reflection patterns having an area corresponding to an area of one sensing pattern.

According to the exemplary embodiment, an OLED device includes a reflection member having mirror function and touch function. Thus, additional process for forming an electrode layer having a touch function may be omitted. This, a manufacturing cost may be decreased.

In addition, the OLED device includes a first reflection member disposed in a reflection region and a second disposed in the light-emitting region and the reflection region. Thus, scattered reflection occurred at an edge of the first reflection member may be decreased.

In addition, the OLED device includes a thin film encapsulation layer. Thus, a flexible OLED device having mirror function and touch function may be manufactured.

BRIEF DESCRIPTION OF THE DRAWINGS

The above and other features and advantages of the invention will become more apparent by describing in detailed exemplary embodiments thereof with reference to the accompanying drawings, in which:

FIG. 14 is a plan view illustrating a reflection pattern of FIG. 2;

FIG. 17 is a plan view illustrating a reflection pattern of FIG. 2;

FIG. 36 is a plan view illustrating a reflection pattern of FIG. 27;

FIG. 93 is a plan view illustrating a reflection pattern of FIG. 84;

FIG. 94 is a plan view illustrating a sensing pattern of FIG. 84;

FIG. 102 is a plan view illustrating a reflection pattern of FIG. 84;

DETAILED DESCRIPTION

Figure 1:
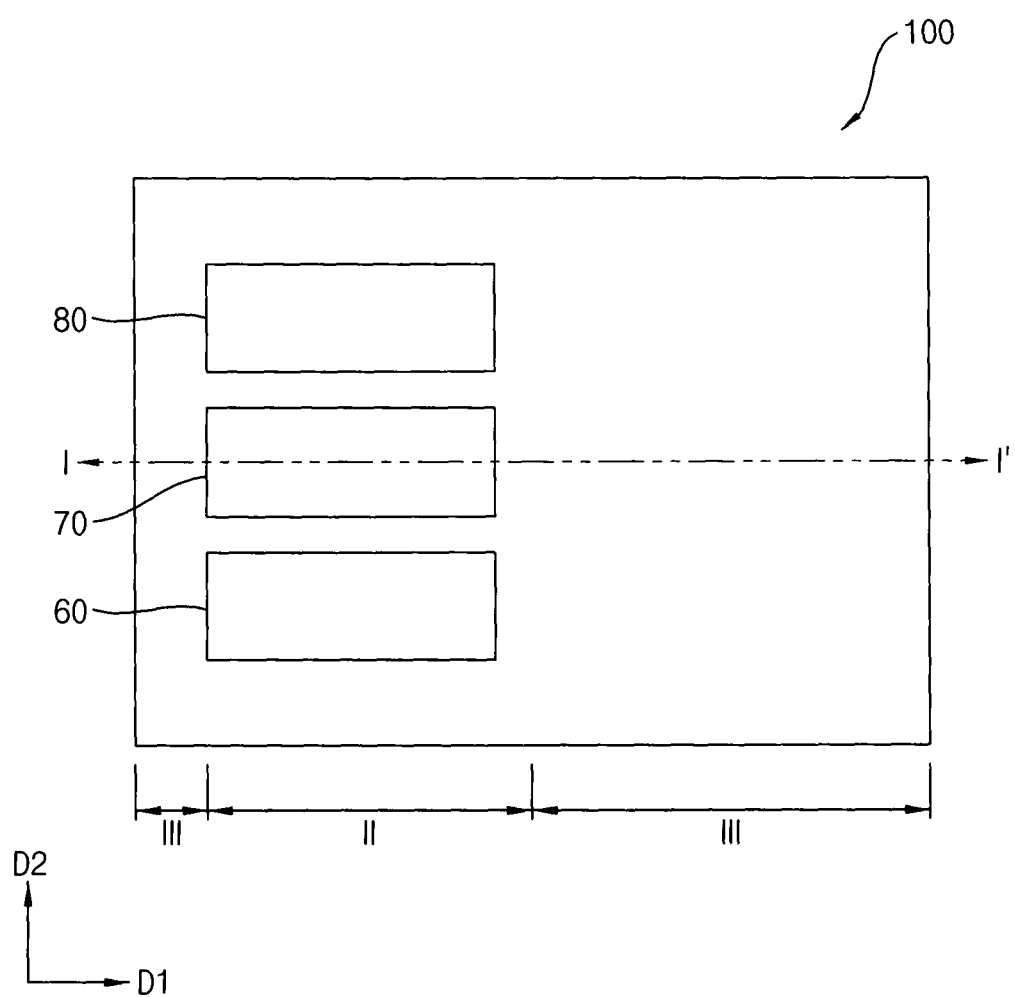
FIG. 1 is a plan view illustrating an exemplary embodiment of an organic light emitting display ("OLED") device according to the invention.

Hereinafter, the invention will be explained in detail with reference to the accompanying drawings. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or" As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
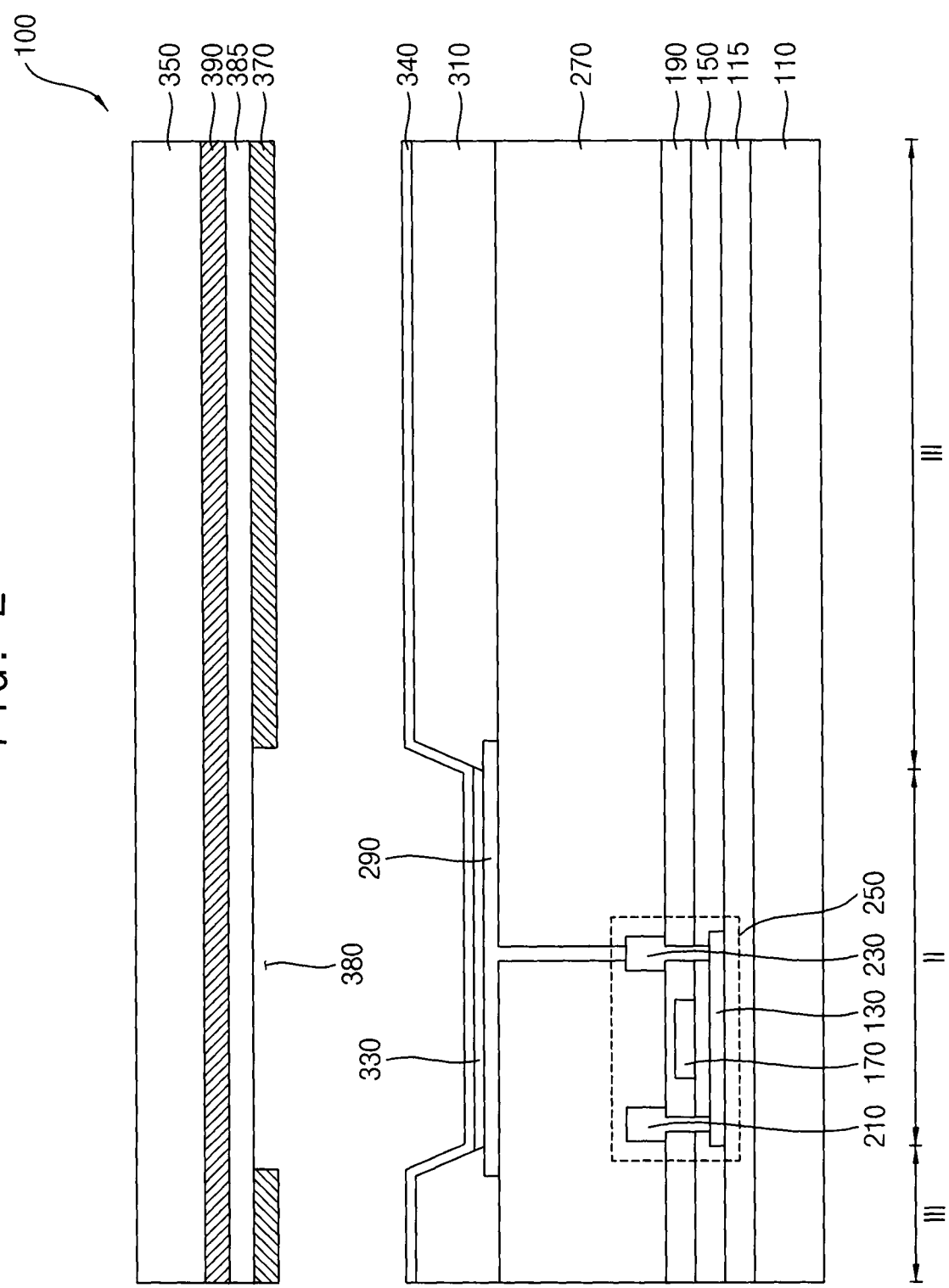
FIG. 2 is a cross-sectional view taken along line of FIG. 1.

FIG. 1 is a plan view illustrating an organic light emitting display ("OLED") device according to an exemplary embodiment of the invention. FIG. 2 is a cross-sectional view taken along line I-I' of FIG. 1.

Referring to FIGS. 1 and 2, an OLED device according to an exemplary embodiment of the invention may include a light-emitting region II and a reflection region III. Pixels 60, 70, and 80 may be positioned in the light-emitting region II, and a transparent window may be positioned in the reflection region III. In an exemplary embodiment, the pixel 60 may be a pixel emitting a red color, the pixel 70 may be a pixel emitting a green color, and the pixel 80 may be a pixel emitting a blue color, for example.

A reflection member may be disposed in the light-emitting region II and the reflection region III. The reflection member may include a first reflection member disposed in the reflection region III and a second reflection member disposed in the light-emitting region II and the reflection region III. The first reflection member may have different reflectivity from the second reflection member. When the reflection member includes only the first reflection member, scattered reflection may be occurred at an edge of the first reflection member. However, an OLED device according to an exemplary embodiment of the invention includes the second reflection member disposed in the light-emitting region II and the reflection region III. Thus, scattered reflection occurred at an edge of the first reflection member may be decreased.

The first reflection member according to an exemplary embodiment of the invention may be a reflection pattern 370 including a material having a predetermined reflectivity. In addition, the second reflection member according to an exemplary embodiment of the invention may be a sensing pattern 390 including a material having a predetermined reflectivity and configured to sense a touch position. The reflection pattern 370 may overlap the sensing pattern 390.

The sensing pattern 390 may function as a sensing electrode of a touch screen panel of self capacitance type. In an exemplary embodiment, when an electric conductor is contacted, capacitance of the sensing pattern 390 around a touch position is changed, for example. Thus, a touch panel sensor (not shown) may decide a touch position based on a capacitance sensing signal corresponding to the change of capacitance. However, the invention is not limited thereto, and the reflection pattern 370 may function as a sensing electrode of a touch screen panel of self capacitance type. In addition, both the reflection pattern 370 and the sensing pattern 390 may function as a sensing electrode of a touch screen panel of self capacitance type.

An OLED device 100 according to an exemplary embodiment of the invention includes a first substrate 110, a buffer layer 115, a first insulation interlayer 150, a second insulation layer 190, a third insulation layer 270, a light emitting structure, a pixel defining layer 310, a reflection pattern 370, a sensing pattern 390 and a second substrate 350. Here, the light emitting structure includes a semiconductor element 250, a lower electrode 290, an emission layer 330 and an upper electrode 340. The semiconductor element 250 includes an active pattern 130, a gate electrode 170, a source electrode 210 and a drain electrode 230. An opening 380 is defined in the reflection pattern 370.

The OLED device 100 may include a plurality of pixel regions. One pixel region may include the light-emitting region II and the reflection region III. The reflection region III may substantially surround the light-emitting region II. The semiconductor element 250, the lower electrode 290, the emission layer 330 and a portion of the upper electrode 340 may be disposed in the light-emitting region II. In addition, the reflection pattern 370 may be disposed in the reflection region III, and the sensing pattern 390 may be disposed in the light-emitting region II and the reflection region III.

A display image may be displayed in light-emitting region II. An image of an object that is located in the front of the OLED device 100 may be reflected in the reflection region III.

The light emitting structure may be disposed on the first substrate 110. The first substrate 110 may include transparent materials. In an exemplary embodiment, the first substrate 110 may include quartz, synthetic quartz, calcium fluoride, fluoride-doping quartz, sodalime glass, a non-alkali glass etc., for example. In an alternative exemplary embodiment, the first substrate 110 may include a flexible transparent resin substrate. Here, the flexible transparent resin substrate for the first substrate 110 may include a polyimide substrate. In an exemplary embodiment, the polyimide substrate may include at least one of a first polyimide layer, a barrier film layer, a second polyimide layer, etc., for example. When the polyimide substrate is thin and flexible, the polyimide substrate may be disposed on a rigid glass substrate to help support the formation of the light emitting structure. That is, in exemplary embodiments, the first substrate 110 may have a structure in which the first polyimide layer, the barrier film layer and the second polyimide layer are stacked on a glass substrate. Here, after an insulation layer is provided on the second polyimide layer, the light emitting structure (e.g., the semiconductor element 250, a capacitor, the lower electrode 290, the light emitting layer 330, the upper electrode 340, etc.) may be disposed on the insulation layer.

After the light emitting structure is disposed on the insulation layer, the glass substrate may be removed. It may be difficult that the light emitting structure is directly disposed on the polyimide substrate because the polyimide substrate is thin and flexible. Accordingly, the light emitting structure is disposed on a rigid glass substrate, and then the polyimide substrate may serve as the first substrate 110 after the removal of the glass substrate. As the OLED device 100 includes the light-emitting region II and the reflection region III, the first substrate 110 may also include the light-emitting region II and the reflection region III.

A buffer layer 115 may be disposed on the first substrate 110. The buffer layer 115 may extend from the light-emitting region II into the reflection region III. The buffer layer 115 may prevent the diffusion (e.g., an out gassing) of metal atoms and/or impurities from the first substrate 110. Additionally, the buffer layer 115 may control a rate of a heat transfer in a crystallization process for forming the active pattern 130, thereby obtaining substantially uniform the active pattern 130. Furthermore, the buffer layer 115 may improve a surface flatness of the first substrate 110 when a surface of the first substrate 110 is relatively irregular. According to a type of the first substrate 110, at least two buffer layers may be provided on the first substrate 110, or the buffer layer may not be disposed.

The semiconductor element 250 may include the active pattern 130, the gate electrode 170, the source electrode 210, and the drain electrode 230. In an exemplary embodiment, the active pattern 130 may be disposed on the first substrate 110, for example. In an exemplary embodiment, the active pattern 130 may include at least one of an oxide semiconductor, an inorganic semiconductor (e.g., amorphous silicon, polysilicon, etc.), an organic semiconductor, etc., for example.

The first insulation layer 150 may be disposed on the active pattern 130. The first insulation layer 150 may cover the active pattern 130 in the light-emitting region II, and may extend in the first direction on the first substrate 110. That is, the first insulation layer 150 may be disposed on the entire first substrate 110. In an exemplary embodiment, the first insulation layer 150 may include at least one of a silicon compound, a metal oxide, etc., for example.

The gate electrode 170 may be disposed on a portion of the first insulation layer 150 under which the active pattern 130 is disposed. In an exemplary embodiment, the gate electrode 170 may include a metal, an alloy, metal nitride, conductive metal oxide, transparent conductive materials, etc., for example.

The second insulation layer 190 may be disposed on the gate electrode 170. The second insulation layer 190 may cover the gate electrode 170 in the light-emitting region II, and may extend in the first direction on the first substrate 110. That is, the second insulation layer 190 may be disposed on the entire first substrate 110. In an exemplary embodiment, the second insulation layer 190 may include a silicon compound, a metal oxide, etc., for example.

The source electrode 210 and the drain electrode 230 may be disposed on the second insulation layer 190. The source electrode 210 may contact a first side of the active layer 130 by removing a portion of the first and second insulation layers 150 and 190. The drain electrode 230 may contact a second side of the active layer 130 by removing a second portion of the first and second insulation layers 150 and 190. In an exemplary embodiment, each of the source electrode 210 and the drain electrode 230 may include a metal, an alloy, metal nitride, conductive metal oxide, transparent conductive materials, etc., for example.

The third insulation layer 270 may be disposed on the source electrode 210 and the drain electrode 230. The third insulation layer 270 may cover the source electrode 210 and the drain electrode 230 in the sub-pixel region II, and may extend in the first direction on the first substrate 110. That is, the third insulation layer 270 may be disposed on the entire first substrate 110. In an exemplary embodiment, the third insulation layer 270 may include a silicon compound, a metal oxide, etc., for example.

The lower electrode 290 may be disposed on the third insulation layer 270. The lower electrode 290 may contact the drain electrode 230 by removing a portion of the third insulation layer 270. In addition, the lower electrode 290 may be electrically connected to the semiconductor element 250. In an exemplary embodiment, the lower electrode 290 may include a metal, an alloy, metal nitride, conductive metal oxide, transparent conductive materials, etc., for example.

The pixel defining layer 310 may be disposed the on third insulation layer 270 to expose a portion of the lower electrode 290. The pixel defining layer 310 may include organic materials or inorganic materials. In this case, the light emitting layer 330 may be disposed on a portion that the lower electrode 290 is exposed by the pixel defining layer 310.

The light emitting layer 330 may be disposed on the exposed lower electrode 290. The light emitting layer 330 may be provided using light emitting materials generating different colors of light (e.g., a red color of light, a blue color of light, and a green color of light).

The upper electrode 340 may be disposed on the pixel defining layer 310 and the light emitting layer 330. The upper electrode 340 may cover the pixel defining layer 310 and the light emitting layer 330 in the light-emitting region II and the reflection region III, and may extend in the first direction on the first substrate 110. That is, the upper electrode 340 may be electrically connected to the first through third pixels. In an exemplary embodiment, the upper electrode 340 may include a metal, an alloy, metal nitride, conductive metal oxide, a transparent conductive material, etc., for example. These may be used alone or in a combination thereof.

The sensing pattern 390 may include a material having a predetermined reflectivity. In an exemplary embodiment, the sensing pattern 390 may include gold (Au), silver (Ag), aluminum (Al), magnesium (Mg), platinum (Pt), Nickel (Ni), titanium (Ti), etc., for example. In an alternative exemplary embodiment, the sensing pattern 390 may include an alloy, metal nitride, conductive metal oxide, etc., for example. In an exemplary embodiment, the sensing pattern 390 may include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The second substrate 350 and the first substrate 110 may include substantially the same materials. In an exemplary embodiment, the second substrate 350 may include quartz, synthetic quartz, calcium fluoride, fluoride-doping quartz, sodalime glass, non-alkali glass etc., for example. In exemplary embodiments, the second substrate 350 may include a transparent inorganic material or flexible plastic. In an exemplary embodiment, the second substrate 350 may include a flexible transparent resin substrate, for example. In this case, to increase flexibility of the OLED device 100, the second substrate 350 may include a stacked structure where at least one organic layer and at least one inorganic layer are alternately stacked.

A fourth insulation layer 385 is disposed on the sensing pattern 390. The fourth insulation layer 385 may include an adhesive material.

The reflection pattern 370 is disposed on the fourth insulation layer 385. The reflection pattern 370 may be disposed in the reflection region III.

The reflection pattern 370 may include a material having a predetermined reflectivity. In an exemplary embodiment, the reflection pattern 370 may include gold (Au), silver (Ag), aluminum (Al), magnesium (Mg), platinum (Pt), Nickel (Ni), titanium (Ti), etc., for example. In an alternative exemplary embodiment, the reflection pattern 370 may include an alloy, metal nitride, conductive metal oxide, etc., for example. In an exemplary embodiment, the reflection pattern 370 max include an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

FIGS. 3 to 10 are cross-sectional views illustrating a method of manufacturing the OLED device 100 of FIG. 2.

Figure 3:
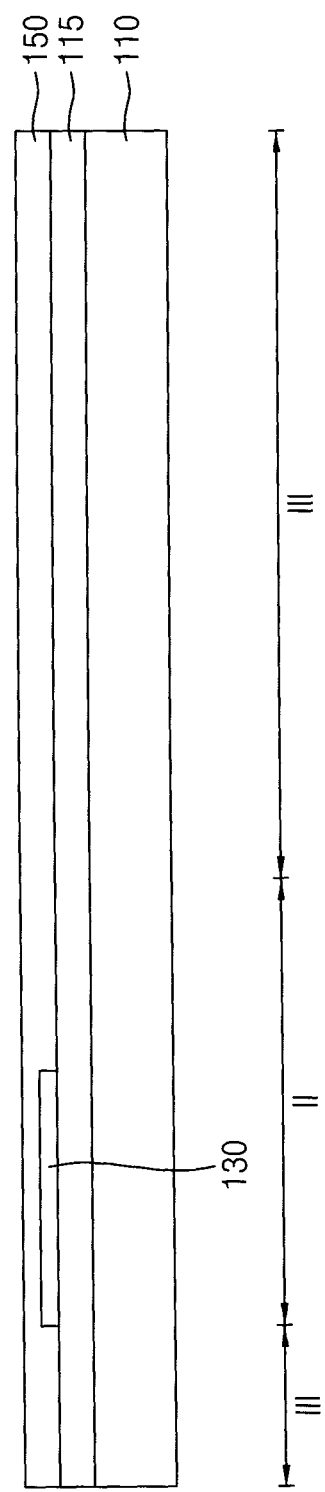
FIGS. 3 to 10 are cross-sectional views illustrating a method of manufacturing the OLED device of FIG. 2.

Referring to FIG. 3, the buffer layer 115 is disposed on the first substrate 110. Thereafter, the active pattern 130 and the first insulation layer 150 are disposed on the buffer layer 115.

In an exemplary embodiment, the first substrate 110 may include quartz, synthetic quartz, calcium fluoride, fluoride-doping quartz, a sodalime glass, a non-alkali glass etc., for example.

A buffer layer 115 may be disposed on the first substrate 110. The buffer layer 115 may extend from the light-emitting region II into the reflection region III. The buffer layer 115 may prevent the diffusion (e.g., an out gassing) of metal atoms and/or impurities from the first substrate 110. Additionally, the buffer layer 115 may control a rate of a heat transfer in a crystallization process for forming the active pattern 130, thereby obtaining substantially uniform the active pattern 130. Furthermore, the buffer layer 115 may improve a surface flatness of the first substrate 110 when a surface of the first substrate 110 is relatively irregular.

According to a type of the first substrate 110, at least two buffer layers may be provided on the first substrate 110, or the buffer layer may not be disposed.

In an exemplary embodiment, the active pattern 130 may include at least one of an oxide semiconductor, an inorganic semiconductor (e.g., amorphous silicon, polysilicon, etc.), an organic semiconductor, etc., for example.

The first insulation layer 150 may be disposed on the active pattern 130. The first insulation layer 150 may cover the active pattern 130 in the light-emitting region II, and may extend in the first direction on the first substrate 110. That is, the first insulation layer 150 may be disposed on the entire first substrate 110. In an exemplary embodiment, the first insulation layer 150 may include at least one of a silicon compound, a metal oxide, etc., for example.

Figure 4:
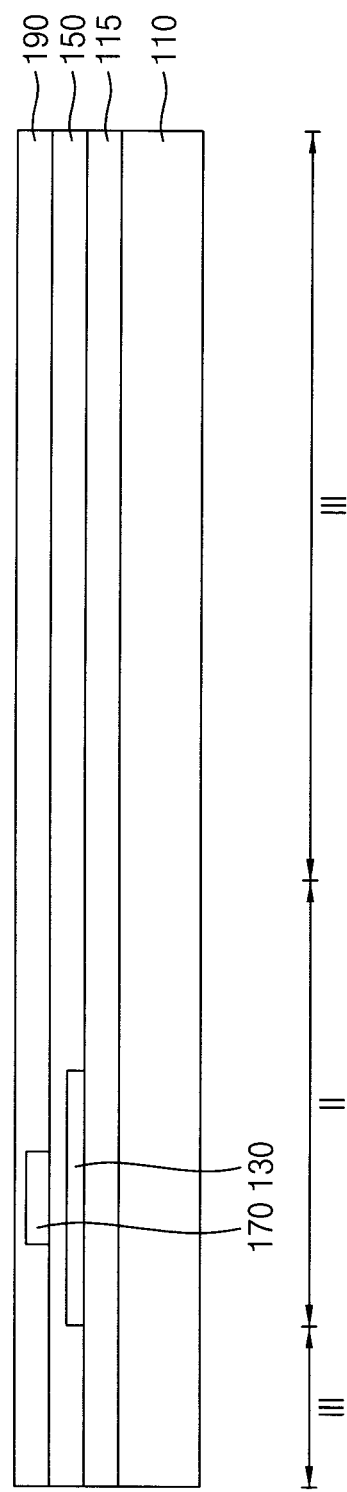

Referring to FIG. 4, the gate electrode 170 and the second insulation layer 190 are disposed on the first substrate 110 on which the first insulation layer 150 is disposed.

The gate electrode 170 may be disposed on a portion of the first insulation layer 150 under which the active pattern 130 is disposed. In an exemplary embodiment, the gate electrode 170 may include a metal, an alloy, metal nitride, conductive metal oxide, transparent conductive materials, etc., for example.

The second insulation layer 190 may be disposed on the gate electrode 170. The second insulation layer 190 may cover the gate electrode 170 in the light-emitting region II, and may extend in the first direction on the first substrate 110. That is, the second insulation layer 190 may be disposed on the entire first substrate 110. In an exemplary embodiment, the second insulation layer 190 may include a silicon compound, a metal oxide, etc., for example.

Figure 5:
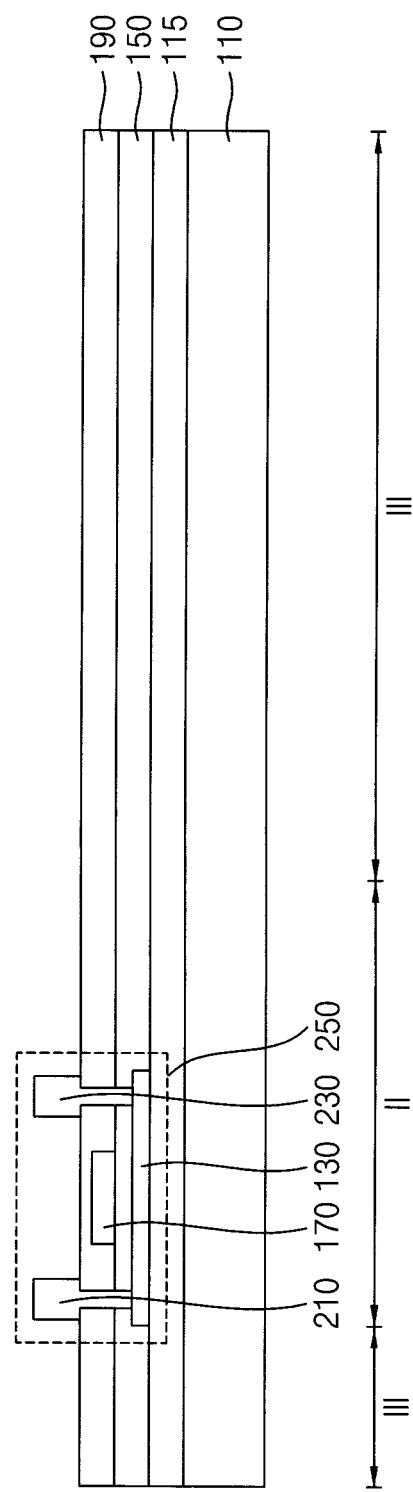

Referring to FIG. 5, the source electrode 210 and the drain electrode 230 are disposed on the first substrate 110 on which the second insulation layer 190 is disposed.

The source electrode 210 and the drain electrode 230 may be disposed on the second insulation layer 190. The source electrode 210 may contact a first side of the active layer 130 by removing a portion of the first and second insulation layers 150 and 190. The drain electrode 230 may contact a second side of the active layer 130 by removing a second portion of the first and second insulation layers 150 and 190. In an exemplary embodiment, each of the source electrode 210 and the drain electrode 230 may include a metal, an alloy, metal nitride, conductive metal oxide, transparent conductive materials, etc., for example.

Figure 6:
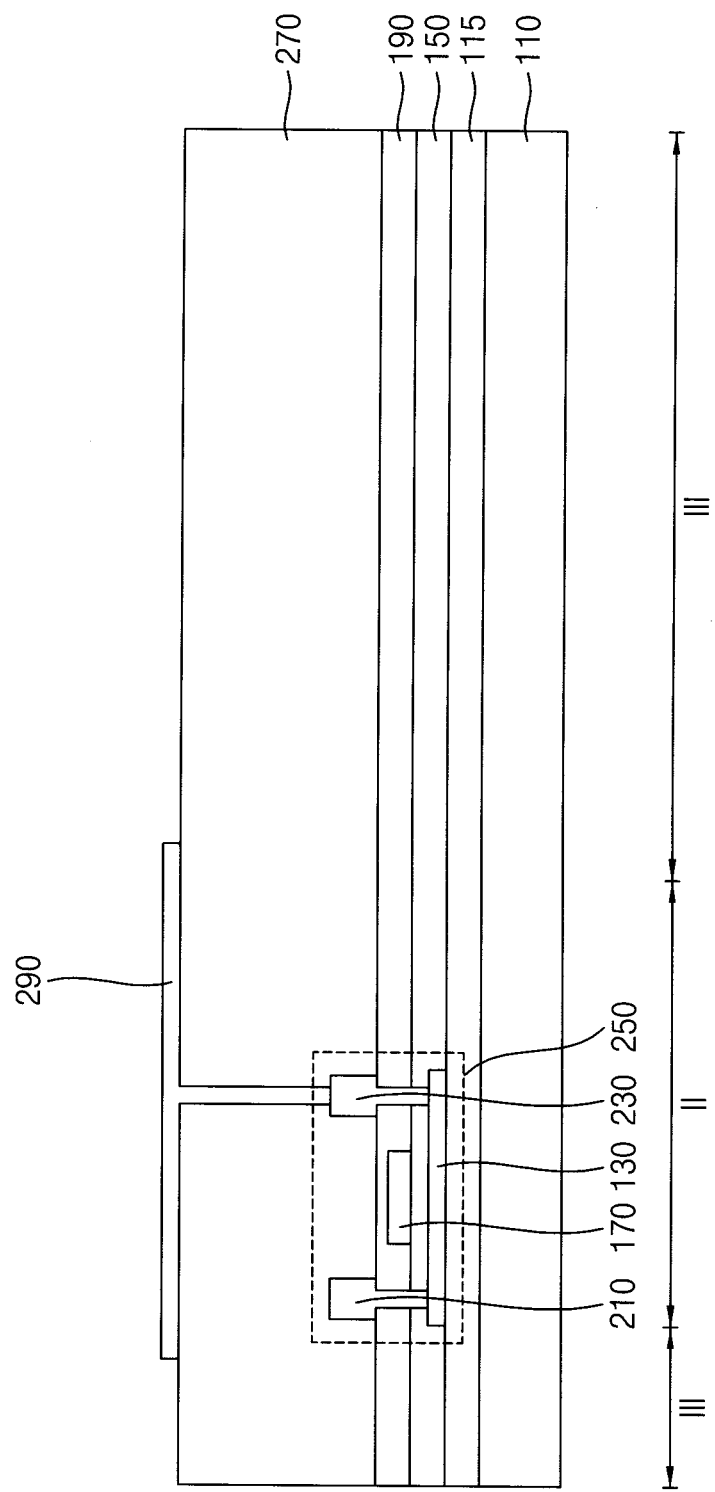

Referring to FIG. 6, the third insulation layer 270 and the lower electrode 290 are disposed on the first substrate 110 on which the source electrode 210 and the drain electrode 230 are disposed.

The third insulation layer 270 may be disposed on the source electrode 210 and the drain electrode 230. The third insulation layer 270 may cover the source electrode 210 and the drain electrode 230 in the sub-pixel region II, and may extend in the first direction on the first substrate 110. That is, the third insulation layer 270 may be disposed on the entire first substrate 110. In an exemplary embodiment, the third insulation layer 270 may include a silicon compound, a metal oxide, etc., for example.

The lower electrode 290 may be disposed on the third insulation layer 270. The lower electrode 290 may contact the drain electrode 230 by removing a portion of the third insulation layer 270, In addition, the lower electrode 290 may be electrically connected to the semiconductor element 250. In an exemplary embodiment, the lower electrode 290 may include at least one of a metal, an alloy, metal nitride, conductive metal oxide, transparent conductive materials, etc., for example.

Figure 7:
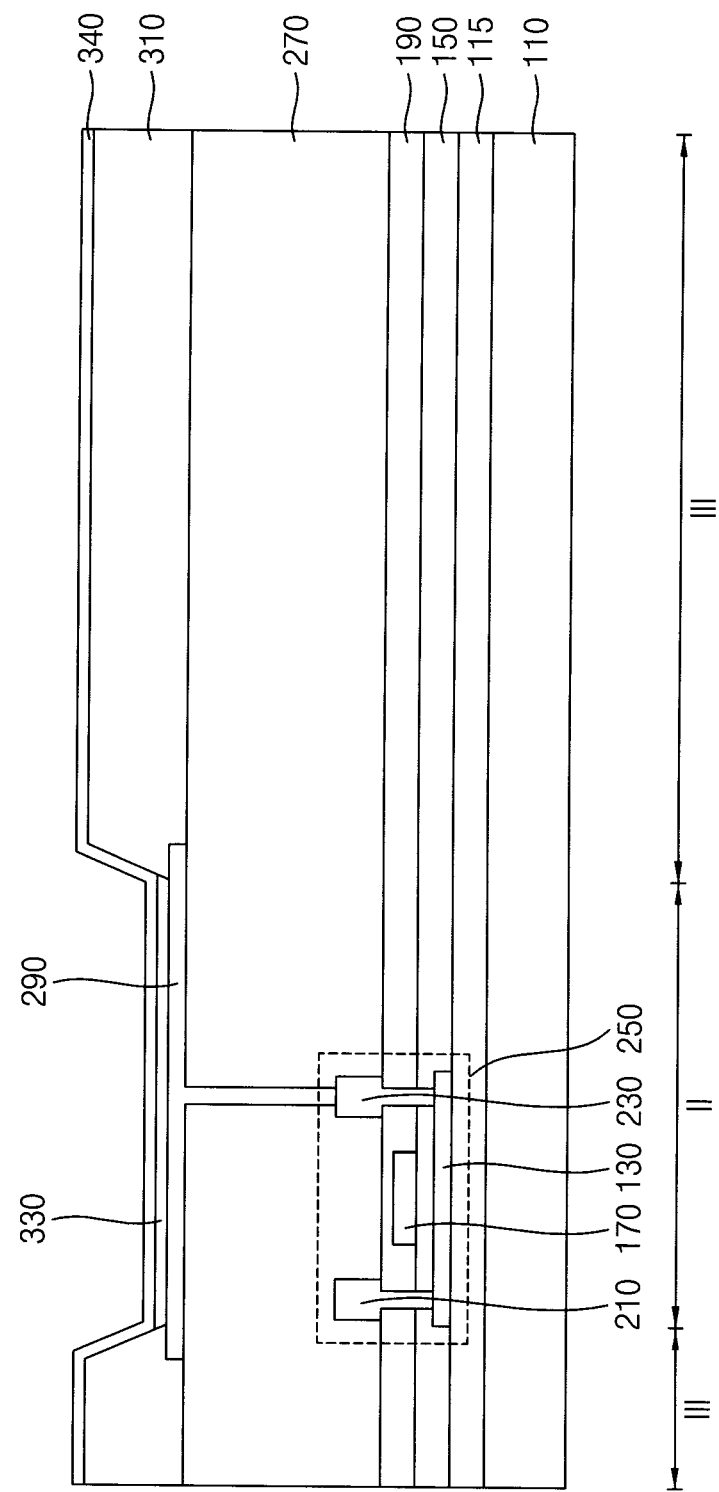

Referring to FIG. 7, the pixel defining layer 310, the light emitting layer 330 and the upper electrode 340 are disposed on the first substrate 110 on which the lower electrode 290 is disposed.

The pixel defining layer 310 may be disposed the on third insulation layer 270 to expose a portion of the lower electrode 290. The pixel defining layer 310 may include organic materials or inorganic materials. In this case, the light emitting layer 330 may be disposed on a portion that the lower electrode 290 is exposed by the pixel defining layer 310.

The light emitting layer 330 may be disposed on the exposed lower electrode 290. The light emitting layer 330 may be provided using light emitting materials generating different colors of light (e.g., a red color of light, a blue color of light, and a green color of light).

The upper electrode 340 may be disposed on the pixel defining layer 310 and the light emitting layer 330. The upper electrode 340 may cover the pixel defining layer 310 and the light emitting layer 330 in light-emitting region II and the reflection region III, and may extend in the first direction on the first substrate 110. That is, the upper electrode 340 may be electrically connected to the first through third pixels. In an exemplary embodiment, the upper electrode 340 may include at least one of a metal, an alloy, metal nitride, conductive metal oxide, a transparent conductive material, etc., for example. These may be used alone or in a combination thereof.

Figure 8:
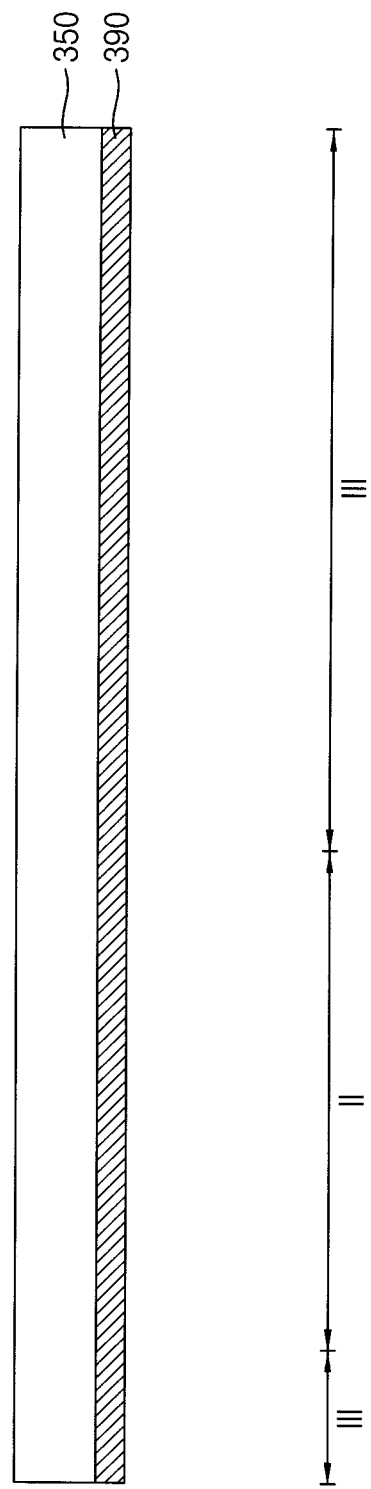

Referring to FIG. 8, the sensing pattern 390 is disposed on the second substrate 350.

The sensing pattern 390 may be disposed on a first surface of the second substrate 350. The sensing pattern 390 may be disposed between the first substrate 110 and the second substrate 350. The sensing pattern 390 may be disposed in the light-emitting region II and the reflection region III.

The sensing pattern 390 may include a material having a predetermined reflectivity. In an exemplary embodiment, the sensing pattern 390 may include at least one of gold (Au), silver (Ag), aluminum (Al), magnesium (Mg), platinum (Pt), Nickel (Ni), titanium (Ti), etc., for example. In an alternative exemplary embodiment, the sensing pattern 390 may include at least one of an alloy, metal nitride, conductive metal oxide, etc., for example. In an exemplary embodiment, the sensing pattern 390 may include at least one of an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The second substrate 350 and the first substrate 110 may include substantially the same materials. In an exemplary embodiment, the second substrate 350 may include at least one of quartz, synthetic quartz, calcium fluoride, fluoride-doping quartz, sodalime glass, non-alkali glass etc., for example.

Figure 9:
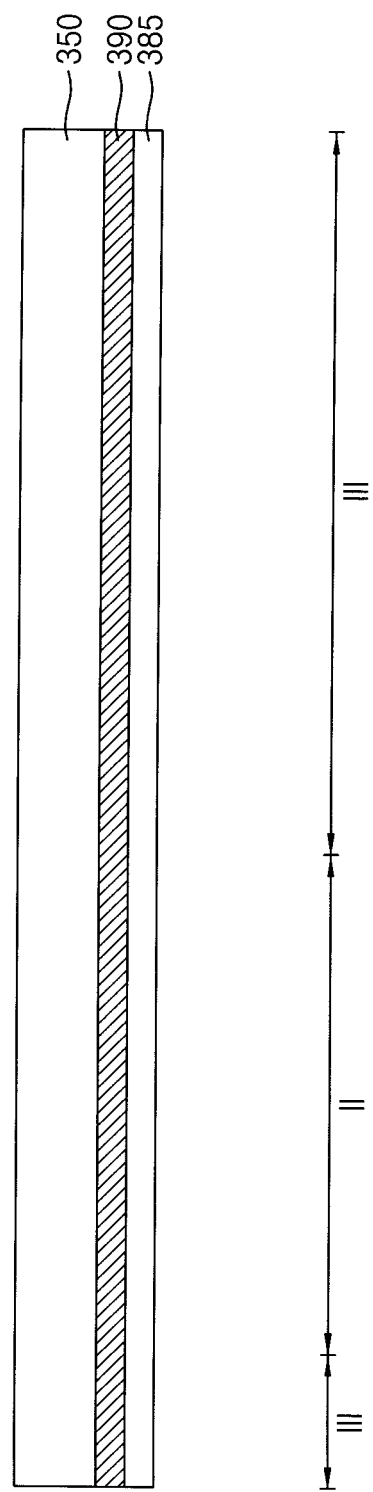

Referring to FIG. 9, the fourth insulation layer 385 is disposed on the second substrate 350 on which the sensing pattern 390 is disposed.

The fourth insulation layer 385 may prevent from oxidation of the sensing pattern 390. The fourth insulation layer 385 may include an adhesive material. The fourth insulation layer 385 may prevent from separating of the reflection pattern 370 and the sensing pattern 390 from the second substrate 350. The fourth insulation layer 385 may insulate between the reflection pattern 370 and the sensing pattern 390.

Figure 10:
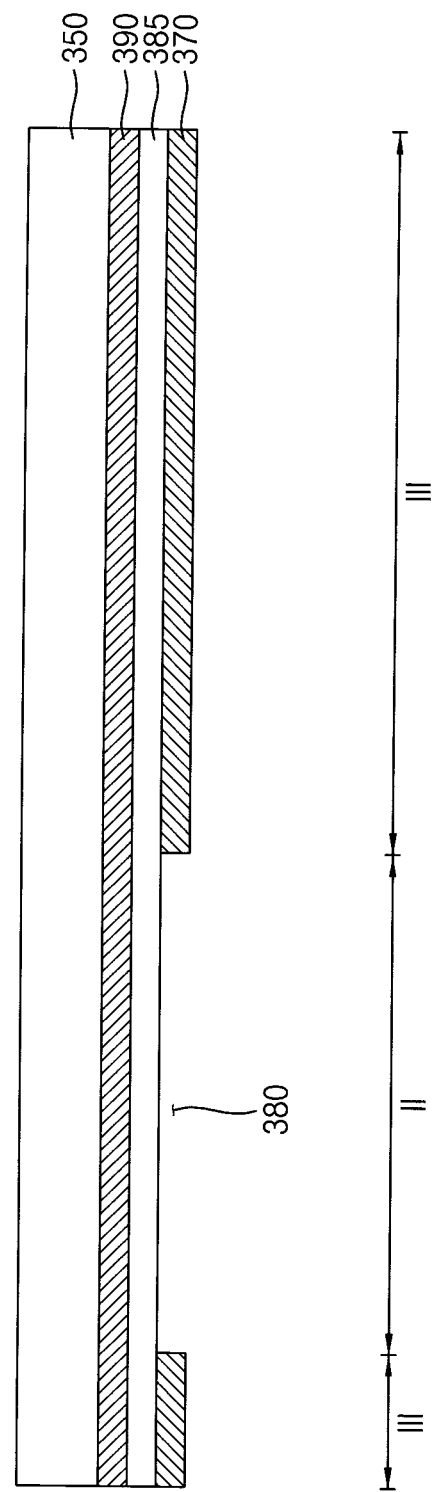

Referring to FIG. 10, the reflection pattern 370 is disposed on the fourth insulation layer 385.

The reflection pattern 370 may be disposed in the reflection region III.

The reflection pattern 370 may include a material having a predetermined reflectivity. In an exemplary embodiment, the reflection pattern 370 may include at least one of gold (Au), sifter (Ag), aluminum (Al), magnesium (Mg), platinum (Pt), Nickel (Ni), titanium (Ti), etc., for example. In an alternative exemplary embodiment, the reflection pattern 370 may include at least one of an alloy, metal nitride, conductive metal oxide, etc., for example. In an exemplary embodiment, the reflection pattern 370 may include at least one of an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

Figure 11:
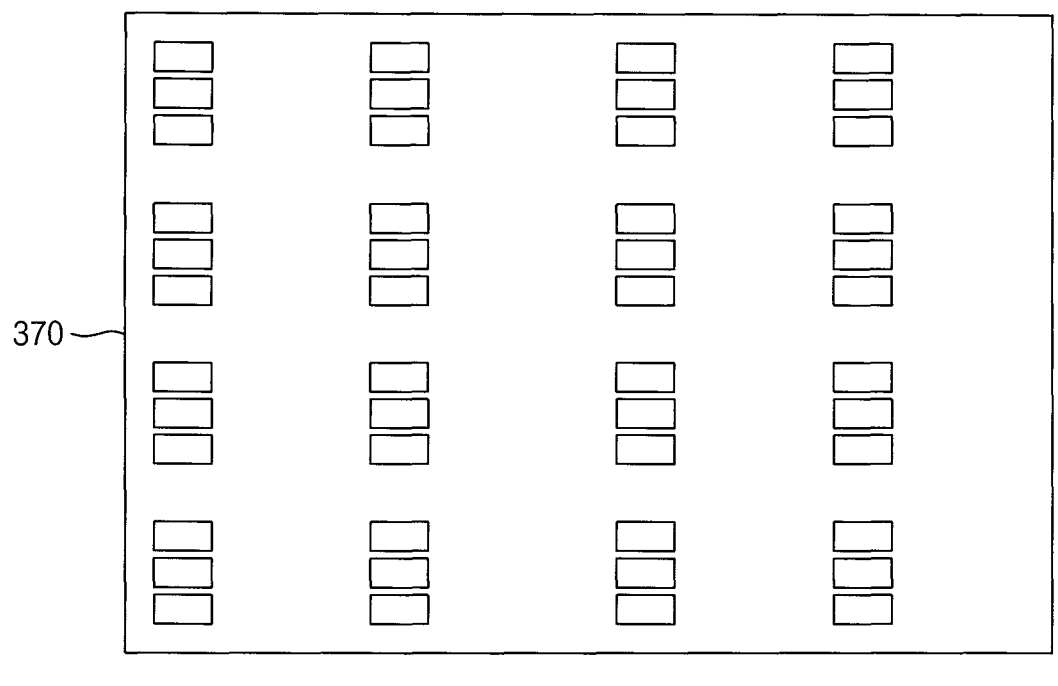
FIG. 11 is a plan view illustrating a reflection pattern of FIG. 2.
Figure 12:
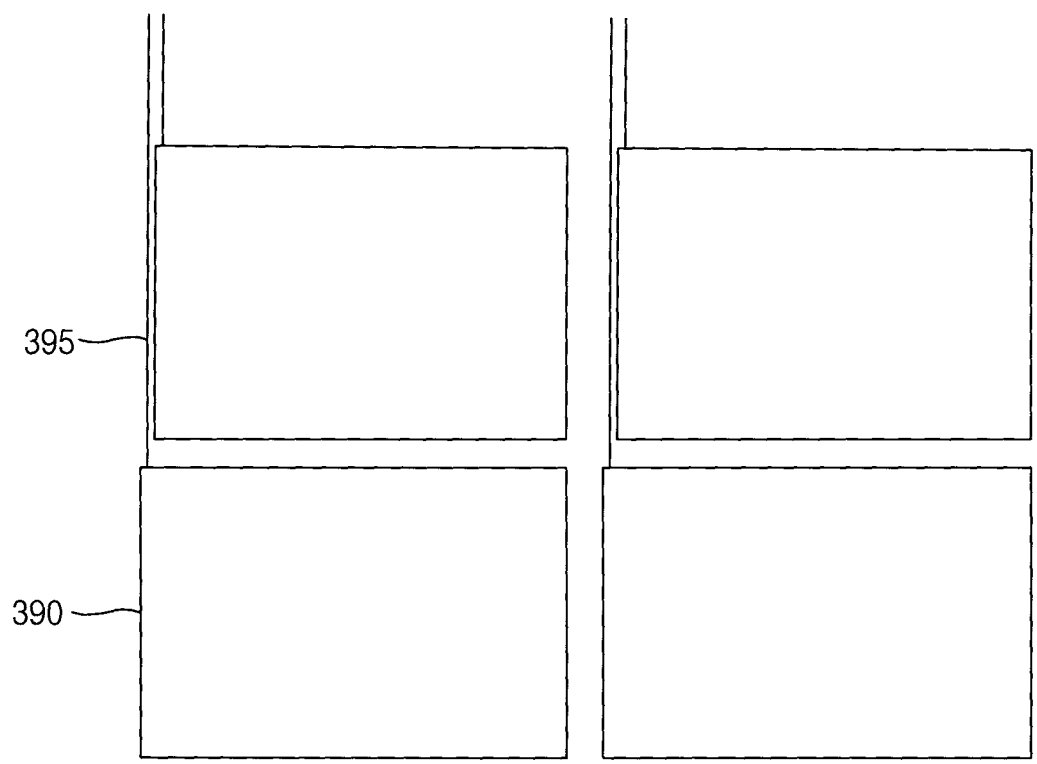
FIG. 12 is a plan view illustrating a sensing pattern of FIG. 2.
Figure 13:
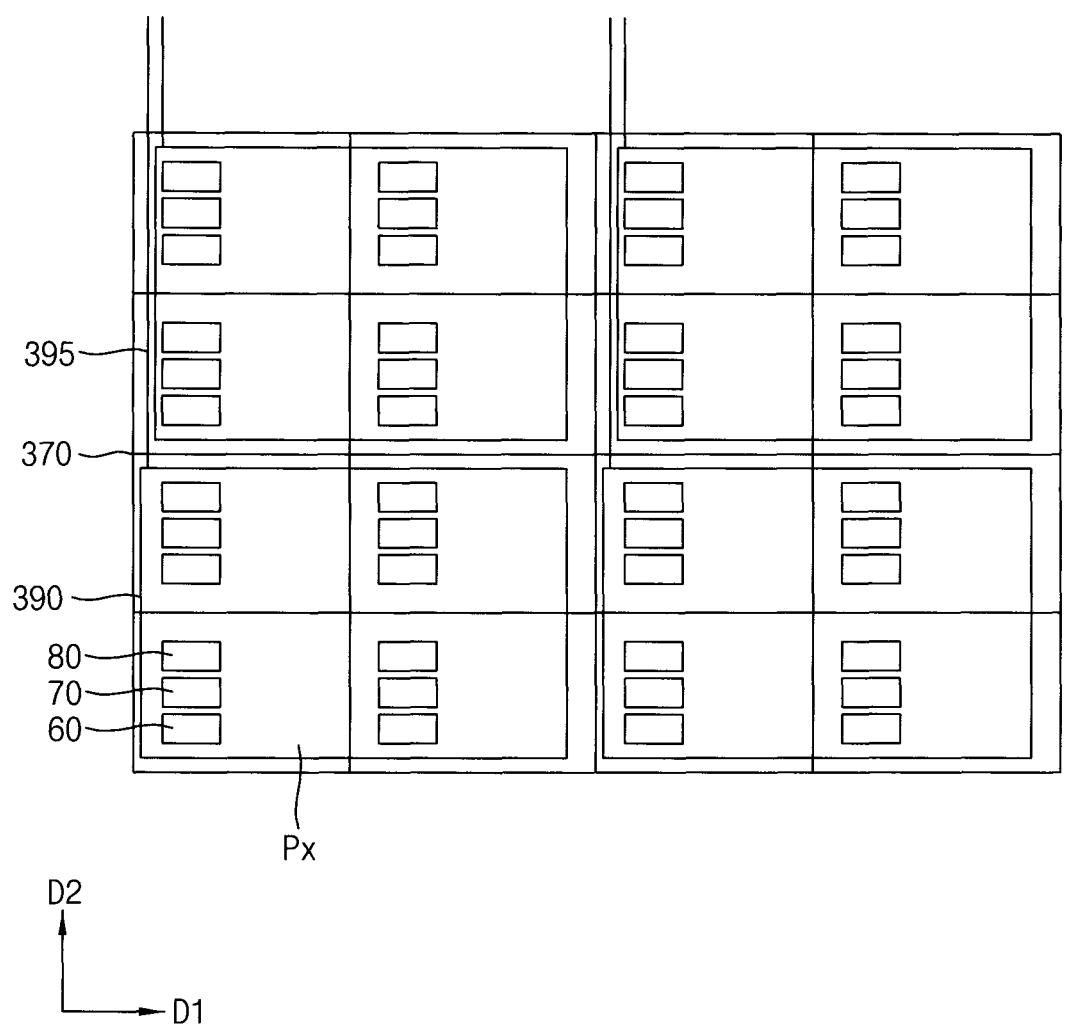
FIG. 13 is a plan view illustrating the reflection pattern of FIG. 11 and the sensing pattern of FIG. 12.

FIG. 11 is a plan view illustrating a reflection pattern of FIG. 2. FIG. 12 is a plan view illustrating a sensing pattern of FIG. 2. FIG. 13 is a plan view illustrating the reflection pattern of FIG. 11 and the sensing pattern of FIG. 12.

Referring to FIG. 2 and FIGS. 11 to 13, the reflection pattern 370 and the sensing pattern 390 are illustrated.

The reflection pattern 370 is disposed only in the reflection region III. Thus, the reflection pattern 370 is not disposed in a region that the Pixels 60, 70, and 80 are disposed. The reflection pattern 370 is provided as one pattern.

The sensing pattern 390 is disposed in the light-emitting region II and the reflection region III. The sensing pattern 390 may be electrically connected to a sensing driver (not shown) through a connection line 395. The connection line 395 may include the same material as that of the sensing pattern 390. The connection line 395 may disposed on the same layer as the sensing pattern 390. However, the invention is not limited thereto, and the connection line 395 may include different material from the sensing pattern 390.

The sensing pattern 390 may function as a sensing electrode of a touch screen panel of self capacitance type. In an exemplary embodiment, when an electric conductor is contacted, capacitance of the sensing pattern 390 around a touch position is changed, for example. Thus, a touch panel sensor (not shown) may decide a touch position based on a capacitance sensing signal corresponding to the change of capacitance.

The sensing pattern 390 may have a size corresponding to a predetermined number of unit pixels Px. The sensing pattern 390 may have an appropriate size according to a size of a display device.

Figure 15:
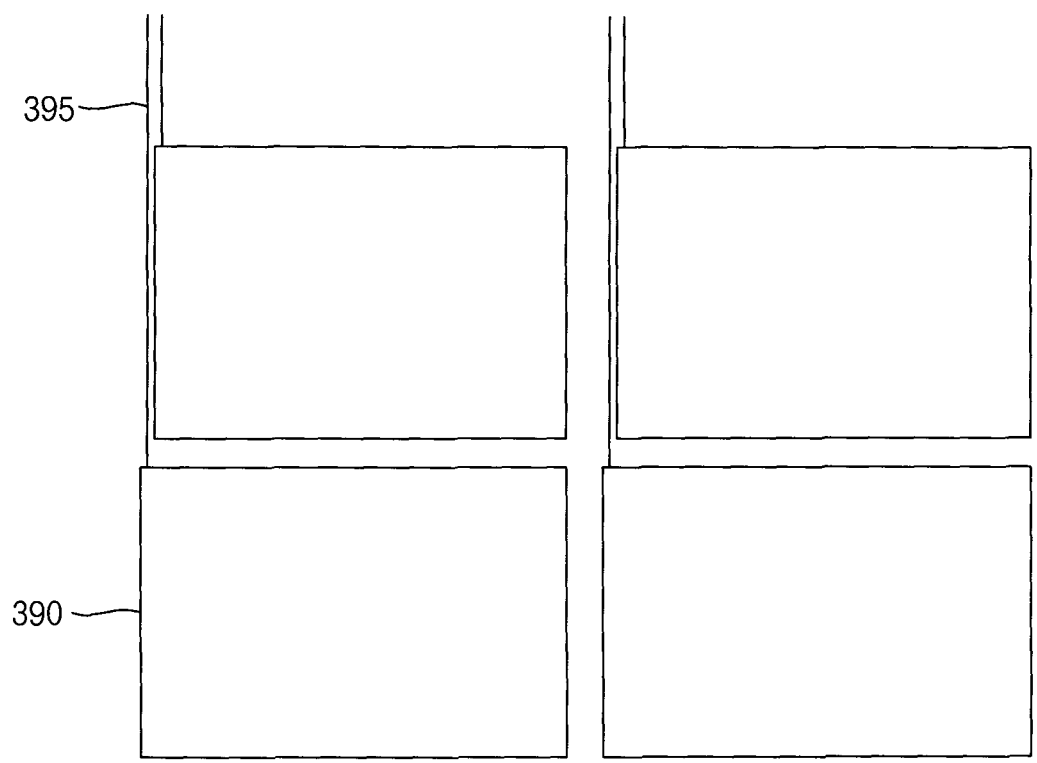
FIG. 15 is a plan view illustrating a sensing pattern of FIG. 2.
Figure 16:
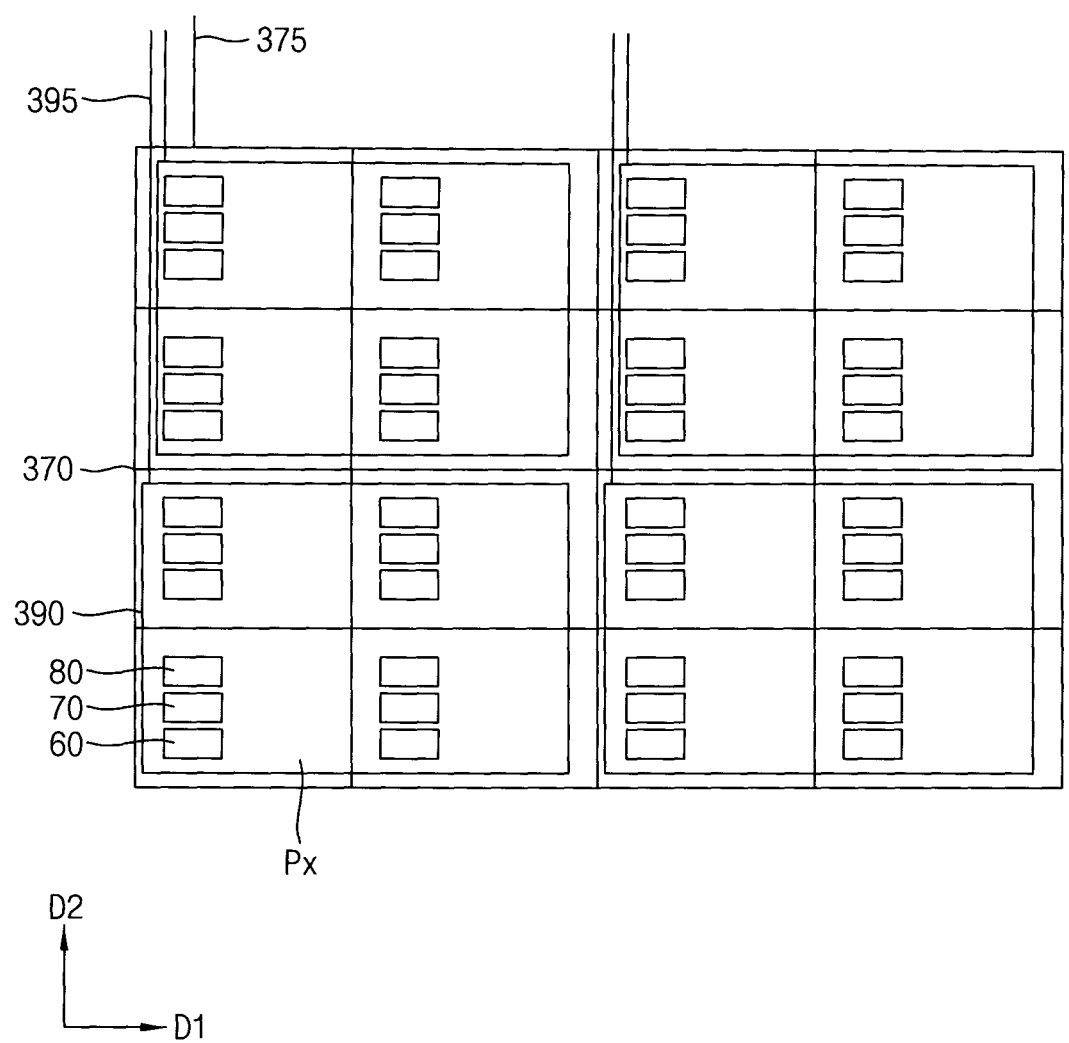
FIG. 16 is a plan view illustrating the reflection pattern of FIG. 14 and the sensing pattern of FIG. 15.

FIG. 14 is a plan view illustrating a reflection pattern of FIG. 2. FIG. 15 is a plan view illustrating a sensing pattern of FIG. 2. FIG. 16 is a plan view illustrating the reflection pattern of FIG. 14 and the sensing pattern of FIG. 15.

Referring to FIG. 2 and FIGS. 14 to 16, the reflection pattern 370 and the sensing pattern 390 are illustrated.

The reflection pattern 370 is disposed only in the reflection region III. Thus, the reflection pattern 370 is not disposed in a region that the Pixels 60, 70, and 80 are disposed. The reflection pattern 370 may function as a sensing electrode of a touch screen panel of self capacitance type. The reflection pattern 370 may have a size corresponding to a predetermined number of unit pixels Px. The reflection pattern 370 may have an appropriate size according to a size of a display device.

The reflection pattern 370 may be electrically connected to a sensing driver (not shown) through a first connection line 375. The first connection line 375 may include the same material as that of the reflection pattern 370. The first connection line 375 may disposed on the same layer as the reflection pattern 370. However, the invention is not limited thereto, and the first connection line 375 may include different material from the reflection pattern 370.

The sensing pattern 390 is disposed in the light-emitting region II and the reflection region III. The sensing pattern 390 may be electrically connected to a sensing driver (not shown) through a second connection line 395. The second connection line 395 may include the same material as that of the sensing pattern 390. The second connection line 395 may disposed on the same layer as the sensing pattern 390. However, the invention is not limited thereto, and the second connection line 395 may include different material from the sensing pattern 390.

The sensing pattern 390 may function as a sensing electrode of a touch screen panel of self capacitance type. In an exemplary embodiment, when an electric conductor is contacted, capacitance of the sensing pattern 390 around a touch position is changed, for example. Thus, a touch panel sensor (not shown) may decide a touch position based on a capacitance sensing signal corresponding to the change of capacitance.

The sensing pattern 390 may have a size corresponding to a predetermined number of unit pixels Px. The sensing pattern 390 may have an appropriate size according to a size of a display device.

In the illustrated exemplary embodiment, a size of the reflection pattern 370 may be bigger than a size of the sensing pattern 390. In an exemplary embodiment, the reflection pattern 370 may have a size corresponding to four reflection patterns 370, for example. However, the invention is not limited thereto, and the reflection pattern 370 may have a various size.

Since the reflection pattern 370 is provided as relatively big area, the reflection pattern 370 may detect touch position of a wide range. Thus, reflection pattern 370 senses a touch position of a wide range, and after the reflection pattern 370 senses the touch position, the sensing pattern 390 senses an accurate touch position. Accordingly, high speed driving of a touch screen panel may be performed.

Figure 18:
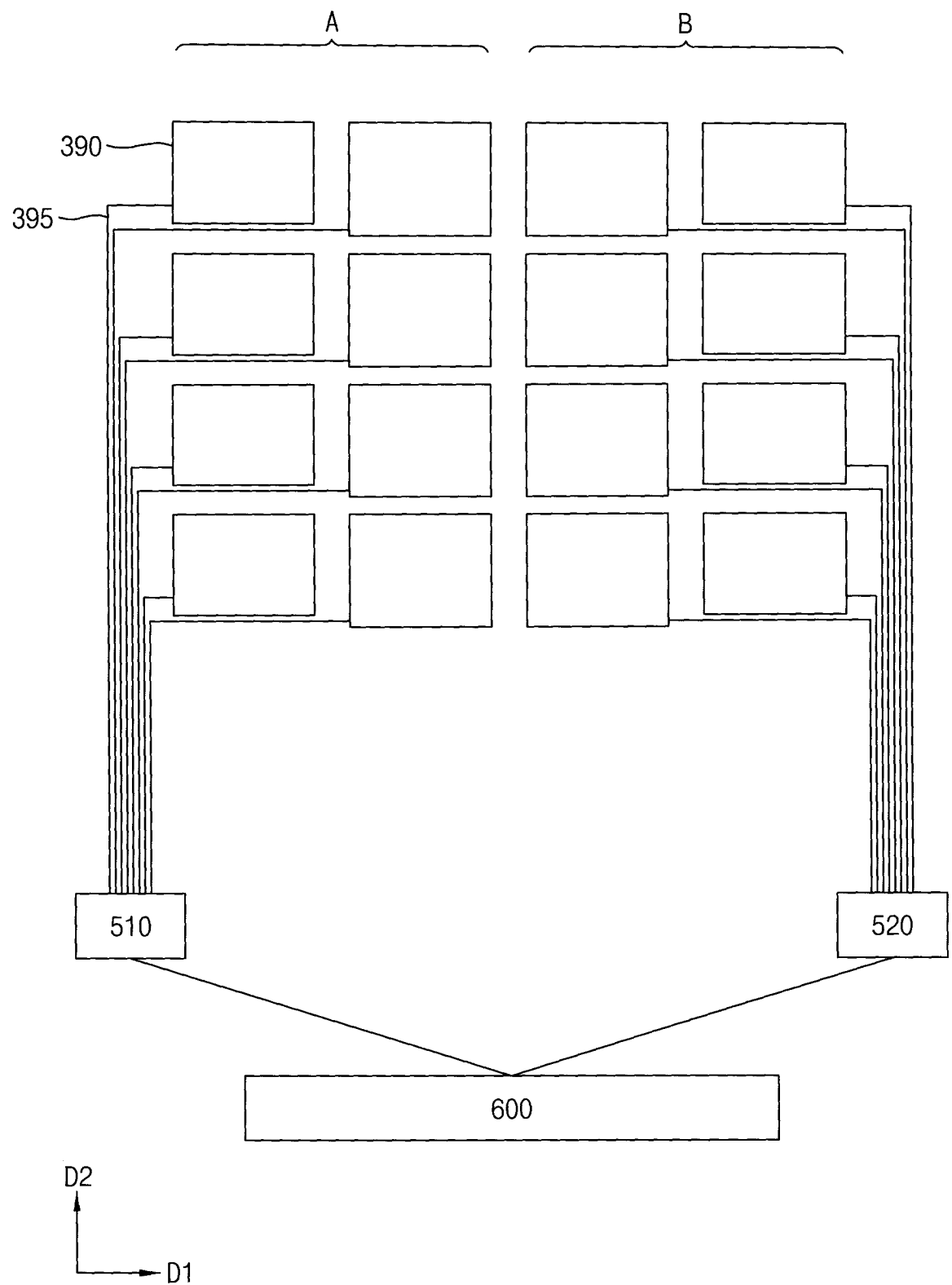
FIG. 18 is a plan view illustrating a sensing pattern of FIG. 2.
Figure 19:
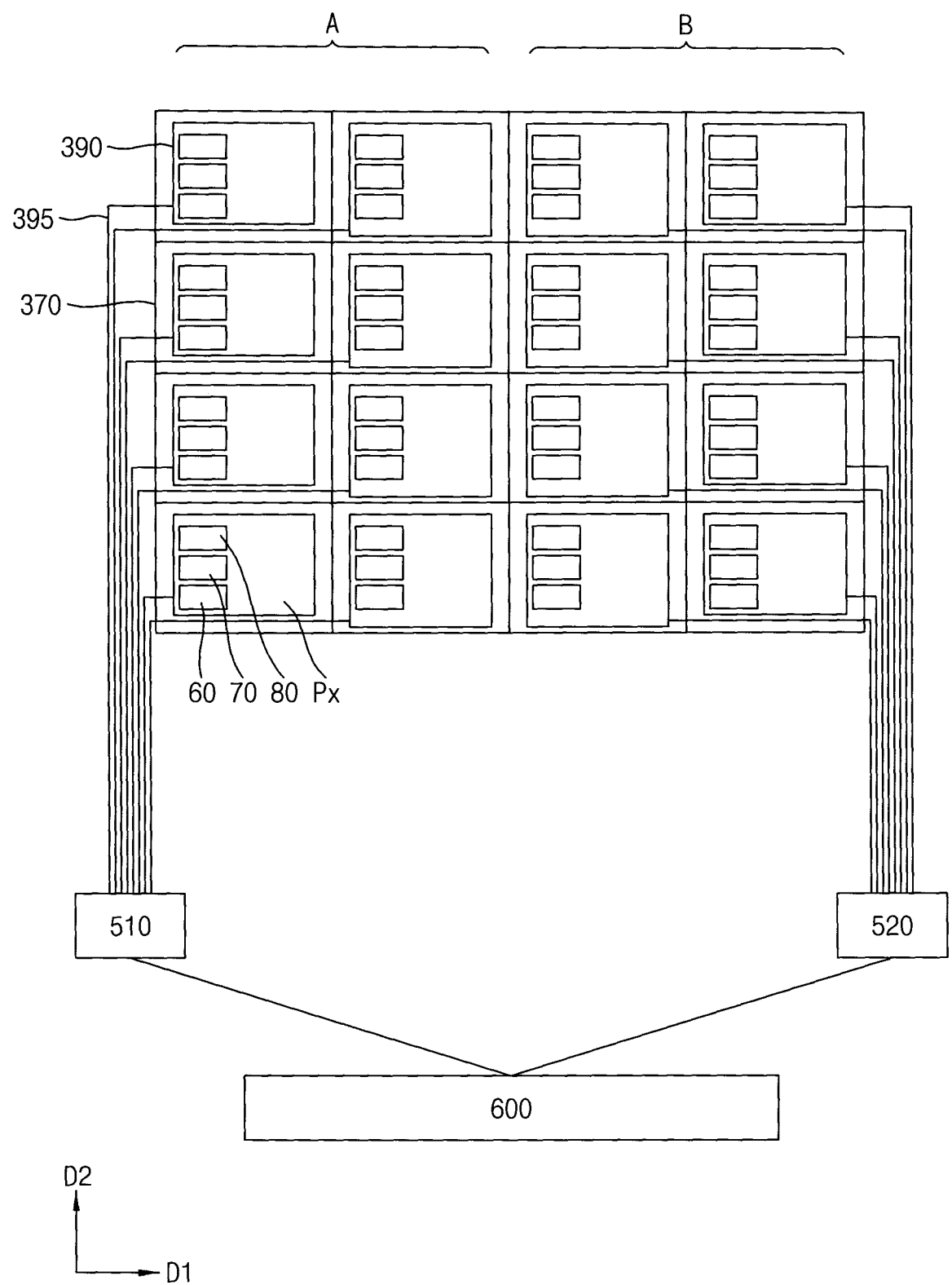
FIG. 19 is a plan view illustrating the reflection pattern of FIG. 17 and the sensing pattern of FIG. 18.

FIG. 17 is a plan view illustrating a reflection pattern of FIG. 2. FIG. 18 is a plan view illustrating a sensing pattern of FIG. 2. FIG. 19 is a plan view illustrating the reflection pattern of FIG. 17 and the sensing pattern of FIG. 18.

Referring to FIG. 2 and FIGS. 17 to 19, the reflection pattern 370 and the sensing pattern 390 are illustrated.

The reflection pattern 370 is disposed only in the reflection region III. Thus, the reflection pattern 370 is not disposed in a region that the Pixels 60, 70, and 80 are disposed. The reflection pattern 370 is provided as one pattern.

The sensing pattern 390 is disposed in the light-emitting region II and the reflection region III. The sensing pattern 390 may be electrically connected to a sensing driver (not shown) through a connection line 395. The connection line 395 may include the same material as that of the sensing pattern 390. The connection line 395 may disposed on the same layer as the sensing pattern 390. However, the invention is not limited thereto, and the connection line 395 may include different material from the sensing pattern 390.

The sensing pattern 390 may function as a sensing electrode of a touch screen panel of self capacitance type. In an exemplary embodiment, when an electric conductor is contacted, capacitance of the sensing pattern 390 around a touch position is changed, for example. Thus, a touch panel sensor (not shown) may decide a touch position based on a capacitance sensing signal corresponding to the change of capacitance.

The sensing pattern 390 may have a size corresponding to a predetermined number of unit pixels Px. The sensing pattern 390 may have an appropriate size according to a size of a display device.

In the illustrated exemplary embodiment, the sensing patterns 390 classified as a plurality of sensing groups comprising a predetermined number of sensing patterns. In an exemplary embodiment, sensing patterns of A group are electrically connected to a first group driver 510, and sensing patterns of B group are electrically connected to a second group driver 520, for example. The first group driver 510 and the second group driver 520 are electrically connected to a sensing driver 600.

When a touch signal is applied to the sensing patterns 390, a sensing group to which the touch signal is applied is detected, and an accurate touch position in the sensing group to which the touch signal is applied is detected. Accordingly, high speed driving of a touch screen panel may be performed.

Figure 20:
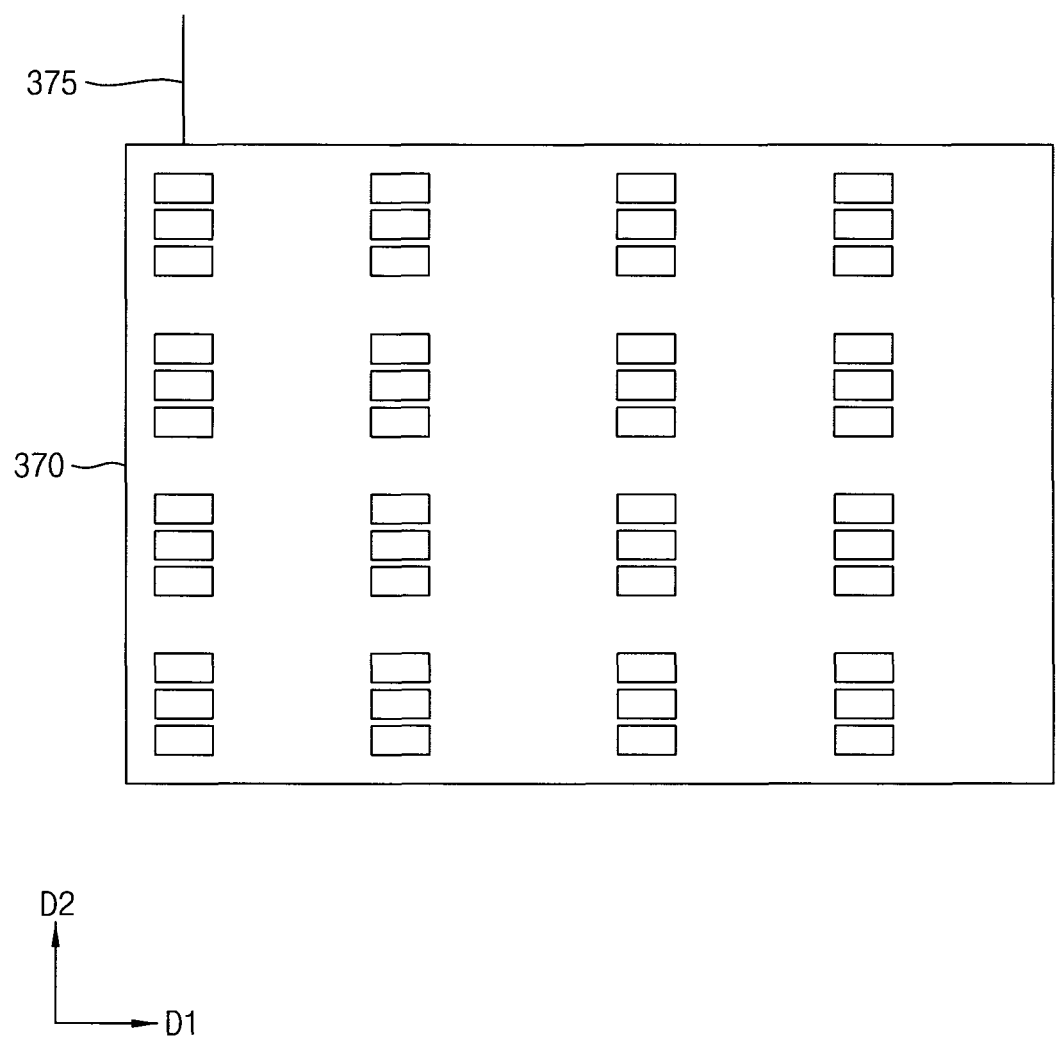
FIG. 20 is a plan view illustrating a reflection pattern of FIG. 2.
Figure 21:
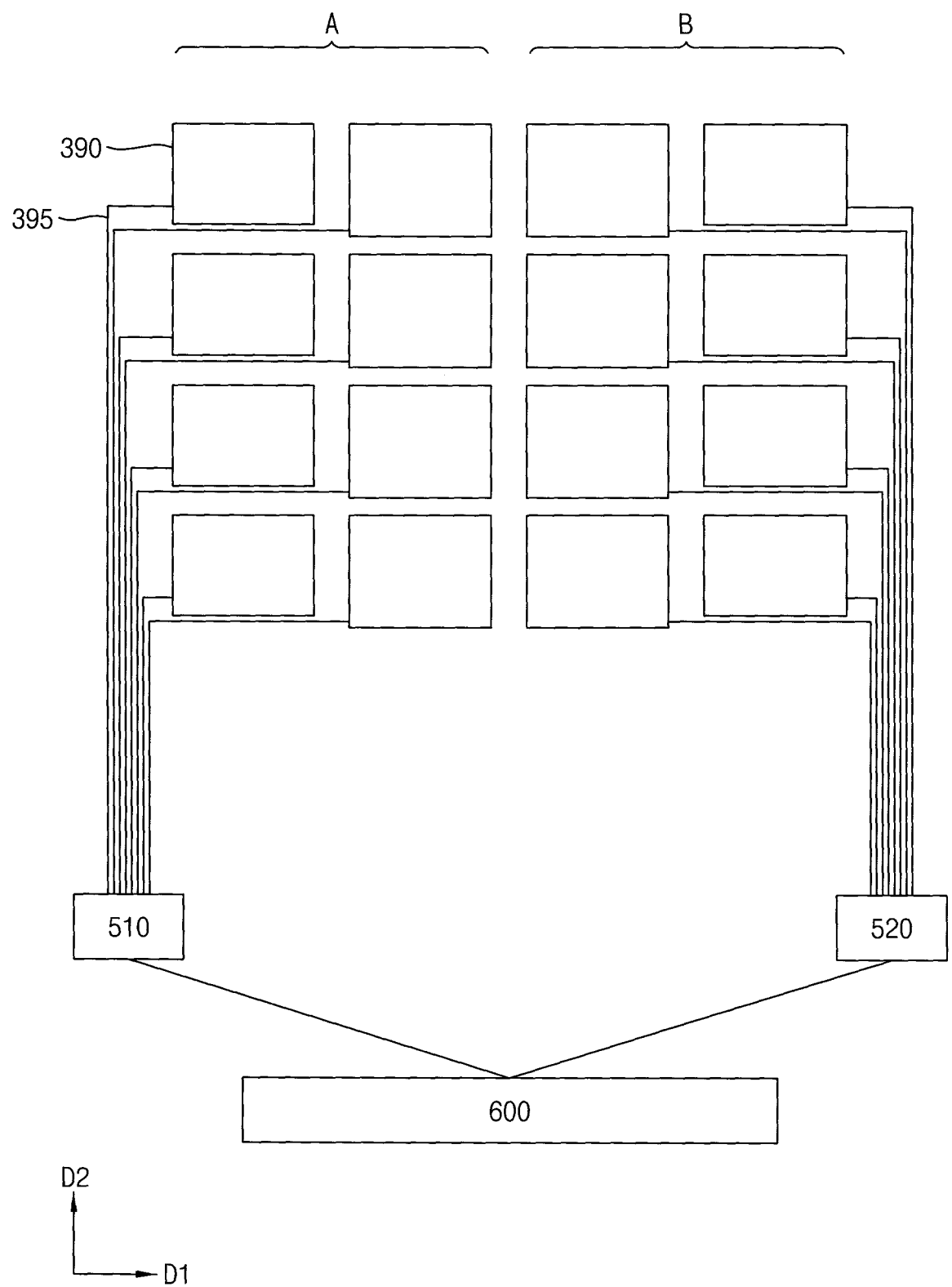
FIG. 21 is a plan view illustrating a sensing pattern of FIG. 2.
Figure 22:
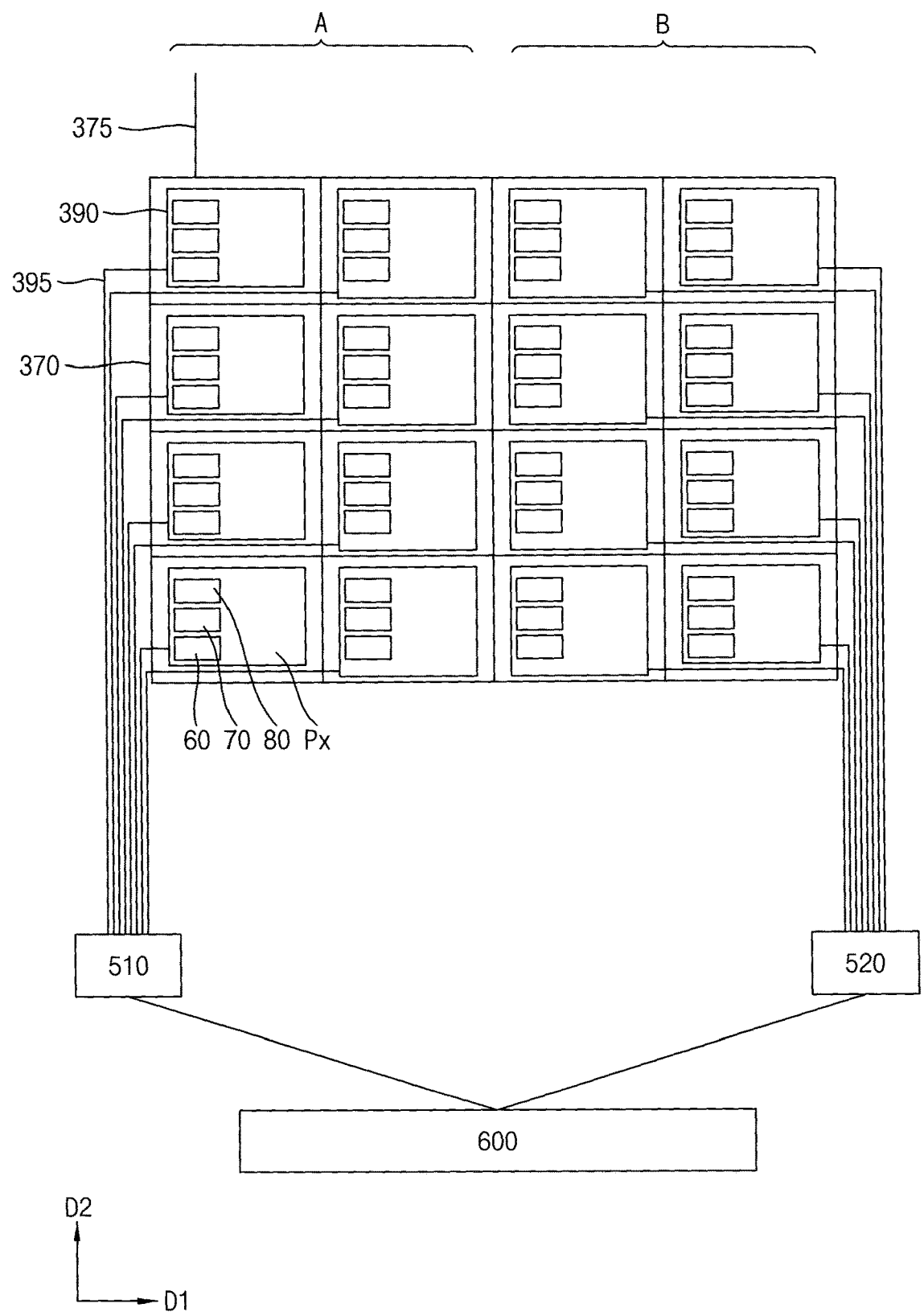
FIG. 22 is a plan view illustrating the reflection pattern of FIG. 20 and the sensing pattern of FIG. 21.

FIG. 20 is a plan view illustrating a reflection pattern of FIG. 2. FIG. 21 is a plan view illustrating a sensing pattern of FIG. 2. FIG. 22 is a plan view illustrating the reflection pattern of FIG. 20 and the sensing pattern of FIG. 21.

Referring to FIG. 2 and FIGS. 20 to 22, the reflection pattern 370 and the sensing pattern 390 are illustrated.

The reflection pattern 370 is disposed only in the reflection region III. Thus, the reflection pattern 370 is not disposed in a region that the Pixels 60, 70, and 80 are disposed. The reflection pattern 370 may be electrically connected to a sensing driver (not shown) through a first connection line 375. The first connection line 375 may include the same material as that of the reflection pattern 370. The first connection line 375 may disposed on the same layer as the reflection pattern 370. However, the invention is not limited thereto, and the first connection line 375 may include different material from the reflection pattern 370.

The sensing pattern 390 is disposed in the light-emitting region II and the reflection region III. The sensing pattern 390 may be electrically connected to a sensing driver (not shown) through a second connection line 395. The second connection line 395 may include the same material as that of the sensing pattern 390. The second connection line 395 may disposed on the same layer as the sensing pattern 390. However, the invention is not limited thereto, and the second connection line 395 may include different material from the sensing pattern 390.

The sensing pattern 390 may function as a sensing electrode of a touch screen panel of self capacitance type. In an exemplary embodiment, when an electric conductor is contacted, capacitance of the sensing pattern 390 around a touch position is changed, for example. Thus, a touch panel sensor (not shown) may decide a touch position based on a capacitance sensing signal corresponding to the change of capacitance.

The sensing pattern 390 may have a size corresponding to a predetermined number of unit pixels Px. The sensing pattern 390 may have an appropriate size according to a size of a display device.

In the illustrated exemplary embodiment, the sensing patterns 390 classified as a plurality of sensing groups comprising a predetermined number of sensing patterns. In an exemplary embodiment, sensing patterns of A group are electrically connected to a first group driver 510, and sensing patterns of B group are electrically connected to a second group driver 520, for example. The first group driver 510 and the second group driver 520 are electrically connected to a sensing driver 600.

When a touch signal is applied to the sensing patterns 390, a sensing group to which the touch signal is applied is detected, and an accurate touch position in the sensing group to which the touch signal is applied is detected. Accordingly, high speed driving of a touch screen panel may be performed.

When a touch signal is applied to the sensing pattern 390, potential difference between the sensing pattern 390 and the reflection pattern 370 may be occurred. Thus, capacitance between the sensing pattern 390 and the reflection pattern 370 is occurred, so that touch sensitivity may be declined due to the capacitance between the sensing pattern 390 and the reflection pattern 370.

However, in the illustrated exemplary embodiment, when a touch signal is applied to a sensing pattern 390, a signal having the same signal as the touch signal is applied to the reflection pattern 370. Thus, potential difference between the sensing pattern 390 and the reflection pattern 370 may be not occurred. Thus, capacitance between the sensing pattern 390 and the reflection pattern 370 is not occurred, so that decline of touch sensitivity may be prevented.

Figure 23:
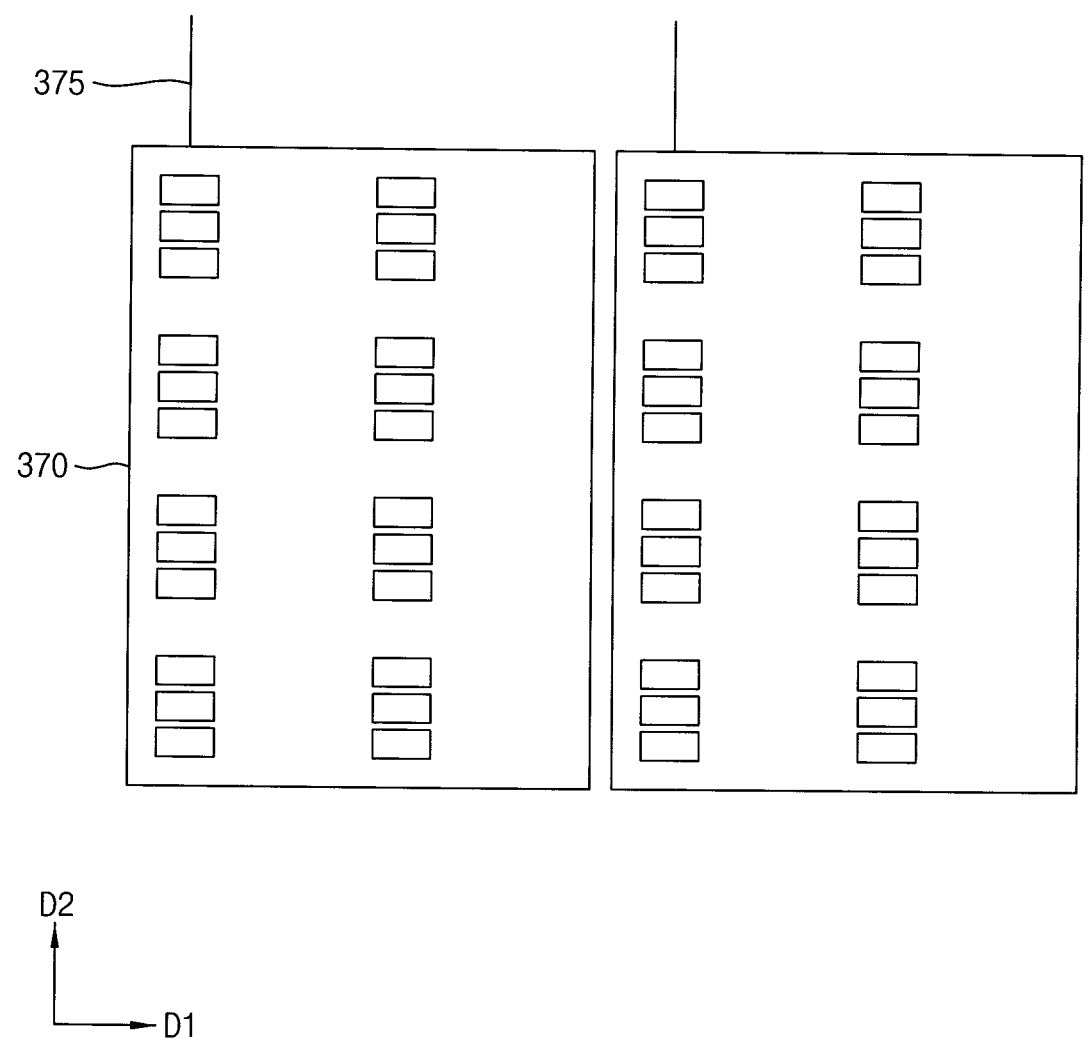
FIG. 23 is a plan view illustrating a reflection pattern of FIG. 2.
Figure 24:
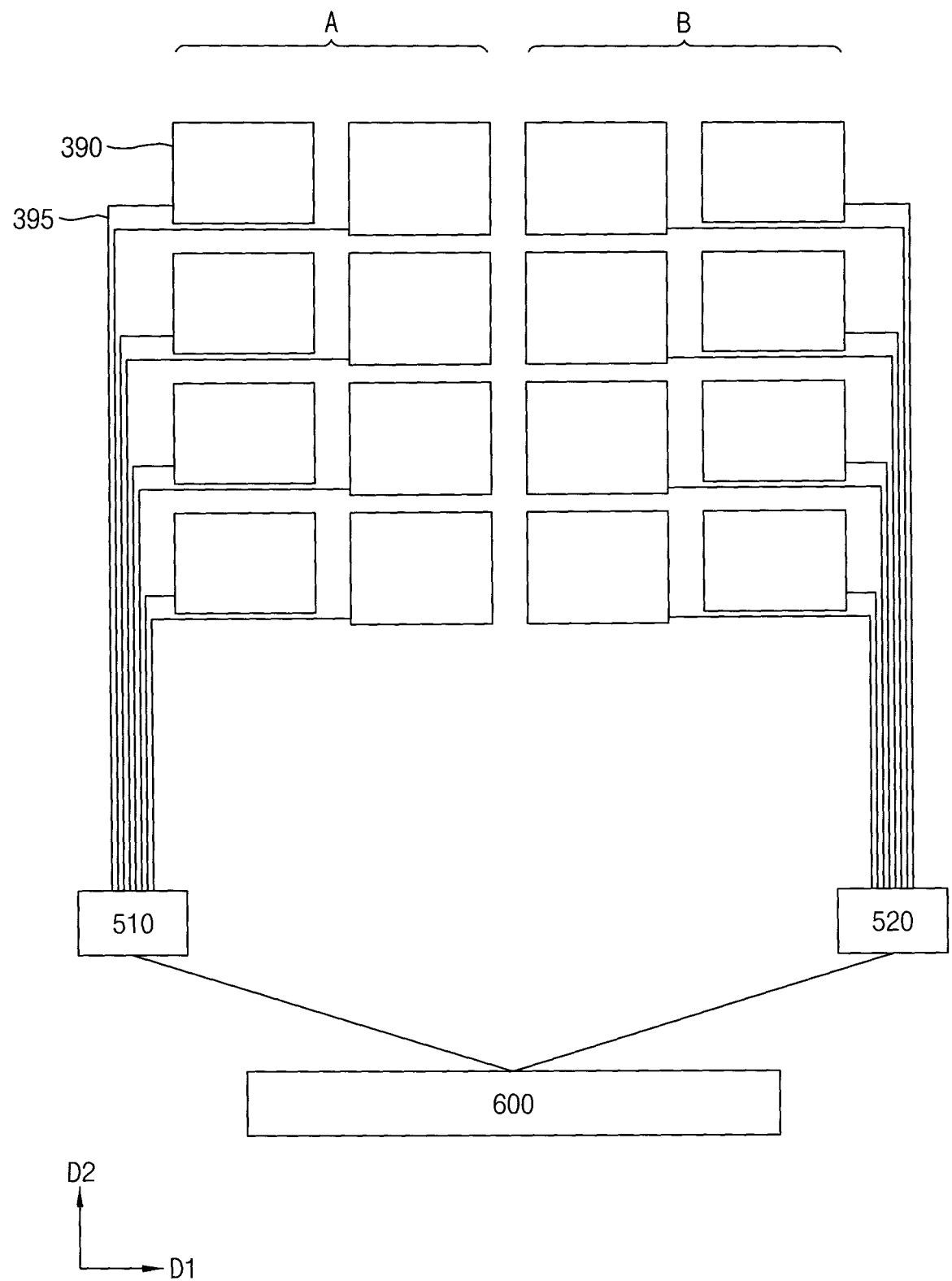
FIG. 24 is a plan view illustrating a sensing pattern of FIG. 2.
Figure 25:
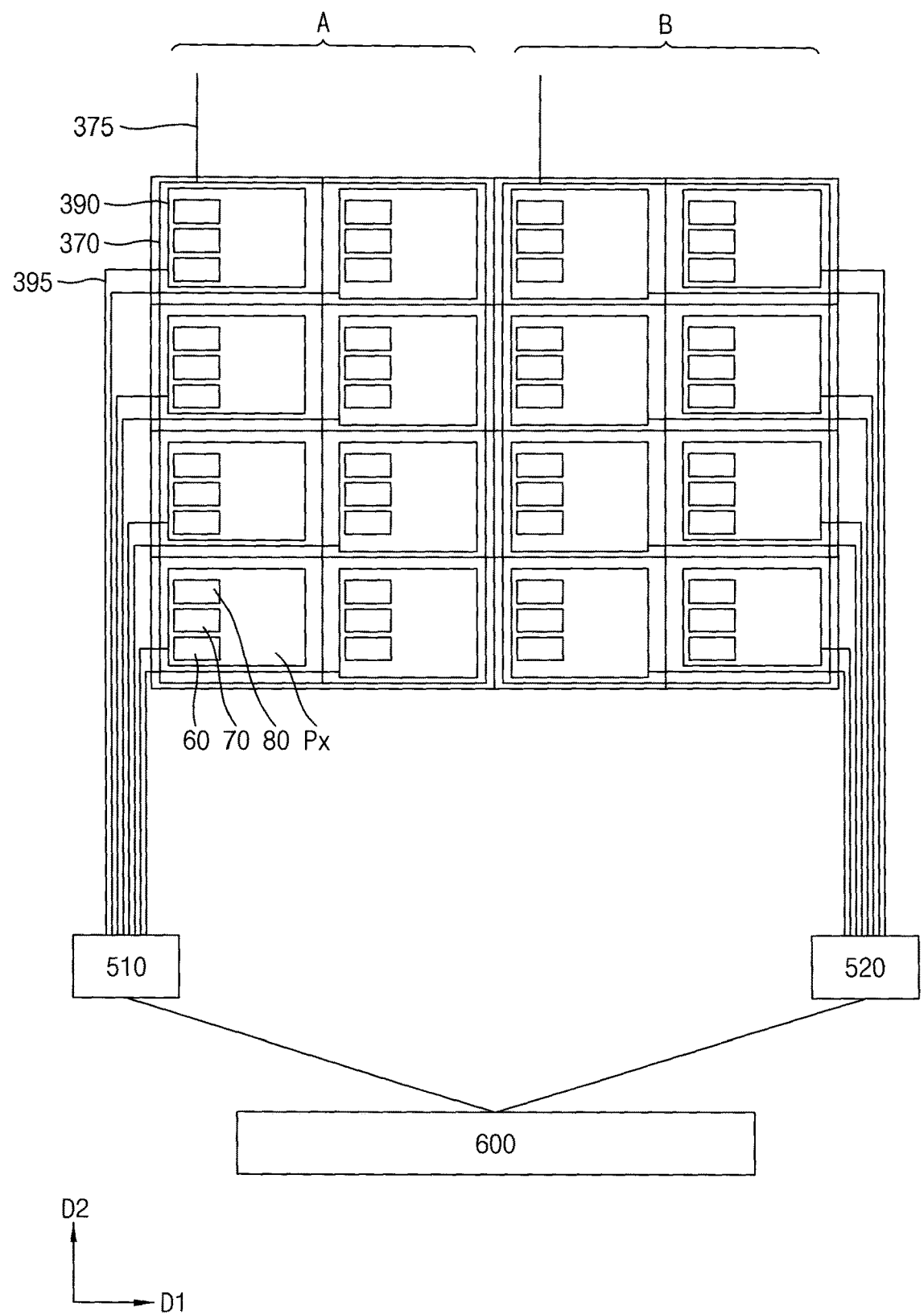
FIG. 25 is a plan view illustrating the reflection pattern of FIG. 23 and the sensing pattern of FIG. 24.

FIG. 23 is a plan view illustrating a reflection pattern of FIG. 2. FIG. 24 is a plan view illustrating a sensing pattern of FIG. 2. FIG. 25 is a plan view illustrating the reflection pattern of FIG. 23 and the sensing pattern of FIG. 24.

Referring to FIG. 2 and FIGS. 23 to 25, the reflection pattern 370 and the sensing pattern 390 are illustrated.

The reflection pattern 370 is disposed only in the reflection region III. Thus, the reflection pattern 370 is not disposed in a region that the Pixels 60, 70, and 80 are disposed. The reflection pattern 370 may be electrically connected to a sensing driver (not shown) through a first connection line 375. The first connection line 375 may include the same material as that of the reflection pattern 370. The first connection line 375 may disposed on the same layer as the reflection pattern 370. However, the invention is not limited thereto, and the first connection line 375 may include different material from the reflection pattern 370.

The sensing pattern 390 is disposed in the light-emitting, region II and the reflection region III. The sensing pattern 390 may be electrically connected to a sensing driver (not shown) through a second connection line 395. The second connection line 395 may include the same material as that of the sensing pattern 390. The second connection line 395 may disposed on the same layer as the sensing pattern 390. However, the invention is not limited thereto, and the second connection line 395 may include different material from the sensing pattern 390.

The sensing pattern 390 may function as a sensing electrode of a touch screen panel of self capacitance type. In an exemplary embodiment, when an electric conductor is contacted, capacitance of the sensing pattern 390 around a touch position is changed. Thus, a touch panel sensor (not shown) may decide a touch position based on a capacitance sensing signal corresponding to the change of capacitance.

The sensing pattern 390 may have a size corresponding to a predetermined number of unit pixels Px. The sensing pattern 390 may have an appropriate size according to a size of a display device.

In the illustrated exemplary embodiment, the sensing patterns 390 classified as a plurality of sensing groups comprising a predetermined number of sensing patterns. In an exemplary embodiment, sensing patterns of A group are electrically connected to a first group driver 510, and sensing patterns of B group are electrically connected to a second group driver 520, for example. The first group driver 510 and the second group driver 520 are electrically connected to a sensing driver 600.

When a touch signal is applied to the sensing patterns 390, a sensing group to which the touch signal is applied is detected, and an accurate touch position in the sensing group to which the touch signal is applied is detected. Accordingly, high speed driving of a touch screen panel may be performed.

In the illustrated exemplary embodiment, the reflection pattern 370 is provided as a size corresponding to one group of the sensing patterns 390. In an exemplary embodiment, the reflection pattern 370 may have a size corresponding to eight reflection patterns 370, for example. However, the invention is not limited thereto, and the reflection pattern 370 may have a various size.

When a touch signal is applied to the sensing pattern 390, potential difference between the sensing pattern 390 and the reflection pattern 370 may be occurred. Thus, capacitance between the sensing pattern 390 and the reflection pattern 370 is occurred, so that touch sensitivity may be declined due to the capacitance between the sensing pattern 390 and the reflection pattern 370.

However, in the illustrated exemplary embodiment, when a touch signal is applied to a sensing pattern 390, a signal having the same signal as the touch signal is applied to the reflection pattern 370. Thus, potential difference between the sensing pattern 390 and the reflection pattern 370 may be not occurred. Thus, capacitance between the sensing pattern 390 and the reflection pattern 370 is not occurred, so that decline of touch sensitivity may be prevented.

Figure 26:
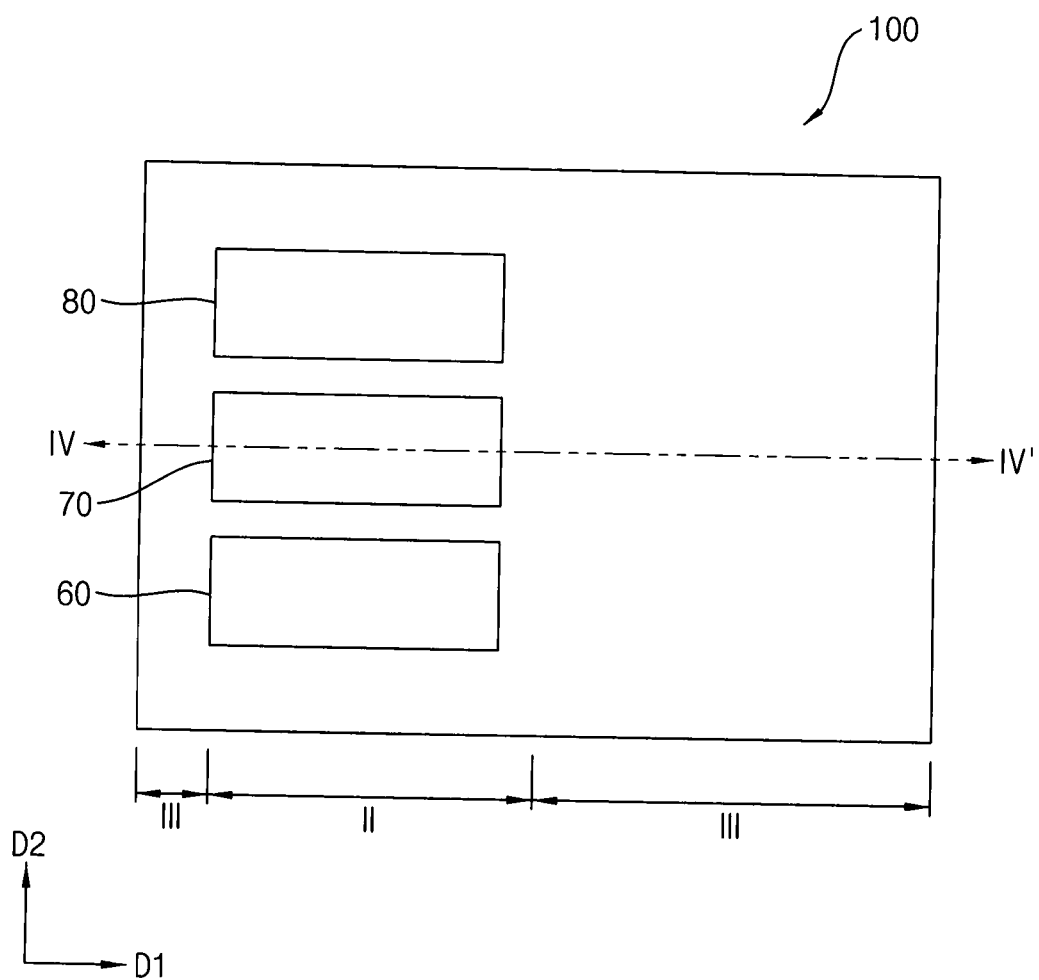
FIG. 26 is a plan view illustrating an exemplary embodiment of an OLED device according to the invention.
Figure 27:
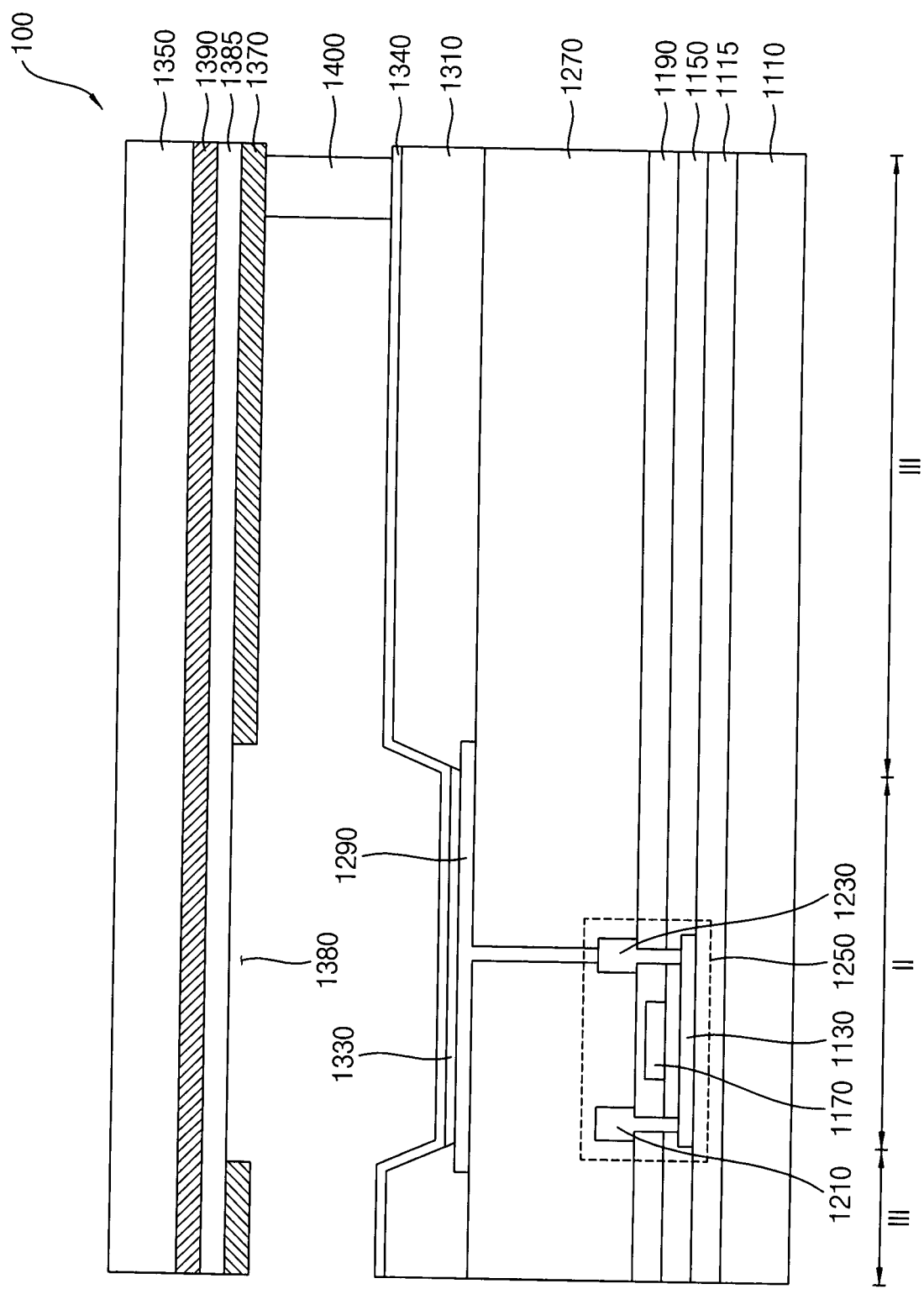
FIG. 27 is a cross-sectional view taken along line IV-IV' of FIG. 26.

FIG. 26 is a plan view illustrating an OLED device according to an exemplary embodiment of the invention. FIG. 27 is a cross-sectional view taken along line IV-IV' of FIG. 26.

The OLED device according to the illustrated exemplary embodiment is substantially same as the OLED device of FIGS. 1 and 2 except for a conductive adhesive member 1400, and thus similar reference numerals are used for same elements and repetitive explanation will be omitted.

Referring to FIGS. 26 and 27, a reflection pattern 1370 disposed on a second substrate 1350 is electrically connected to a conductive adhesive member 1400. The conductive adhesive member 1400 may be electrically connected to pads (not shown) disposed on a first substrate 1110.

The conductive adhesive member 1400 may include a conductive material. The reflection pattern 1370 may be electrically connected to pads (not shown) disposed on a first substrate 1110 through the conductive adhesive member 1400. Thus, additional flexible printed circuit board ("FPCB") is not required.

The sensing pattern 1390 may function as a sensing electrode of a touch screen panel of self capacitance type. In an exemplary embodiment, when an electric conductor is contacted, capacitance of the sensing pattern 1390 around a touch position is changed, for example. Thus, a touch panel sensor (not shown) may decide a touch position based on a capacitance sensing signal corresponding to the change of capacitance. However, the invention is not limited thereto, and the reflection pattern 1370 may function as a sensing electrode of a touch screen panel of self capacitance type. In addition, both the reflection pattern 1370 and the sensing pattern 1390 may function as a sensing electrode of a touch screen panel of self capacitance type.

FIGS. 28 to 35 are cross-sectional views illustrating a method of manufacturing the OLED device of FIG. 27.

Figure 28:
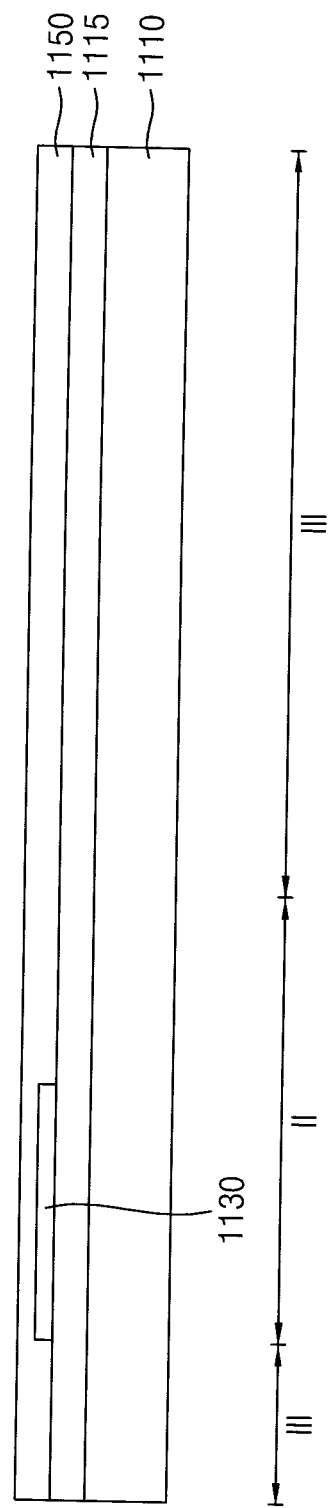
FIGS. 28 to 35 are cross-sectional views illustrating a method of manufacturing the OLED device of FIG. 27.

Referring to FIG. 28, the buffer layer 1115 is disposed on the first substrate 1110. Thereafter, the active pattern 1130 and the first insulation layer 1150 are disposed on the buffer layer 1115.

In an exemplary embodiment, the first substrate 1110 may include at least one of quartz, synthetic quartz, calcium fluoride, fluoride-doping quartz, a sodalime glass, a non-alkali glass etc., for example.

A buffer layer 1115 may be disposed on the first substrate 1110. The buffer layer 1115 may extend from the light-emitting region II into the reflection region III. The buffer layer 1115 may prevent the diffusion (e.g., an out gassing) of metal atoms and/or impurities from the first substrate 1110. Additionally, the buffer layer 1115 may control a rate of a heat transfer in a crystallization process for forming the active pattern 1130, thereby obtaining substantially uniform the active pattern 1130. Furthermore, the buffer layer 1115 may improve a surface flatness of the first substrate 1110 when a surface of the first substrate 1110 is relatively irregular. According to a type of the first substrate 1110, at least two buffer layers may be provided on the first substrate 1110, or the buffer layer may not be disposed.

In an exemplary embodiment, the active pattern 1130 may include at least one of an oxide semiconductor, an inorganic semiconductor (e.g., amorphous silicon, polysilicon, etc.), an organic semiconductor, etc., for example.

The first insulation layer 1150 may be disposed on the active pattern 1130. The first insulation layer 1150 may cover the active pattern 1130 in the light-emitting region II, and may extend in the first direction on the first substrate 1110. That is, the first insulation layer 1150 may be disposed on the entire first substrate 1110. In an exemplary embodiment, the first insulation layer 1150 may include at least one of a silicon compound, a metal oxide, etc., for example.

Figure 29:
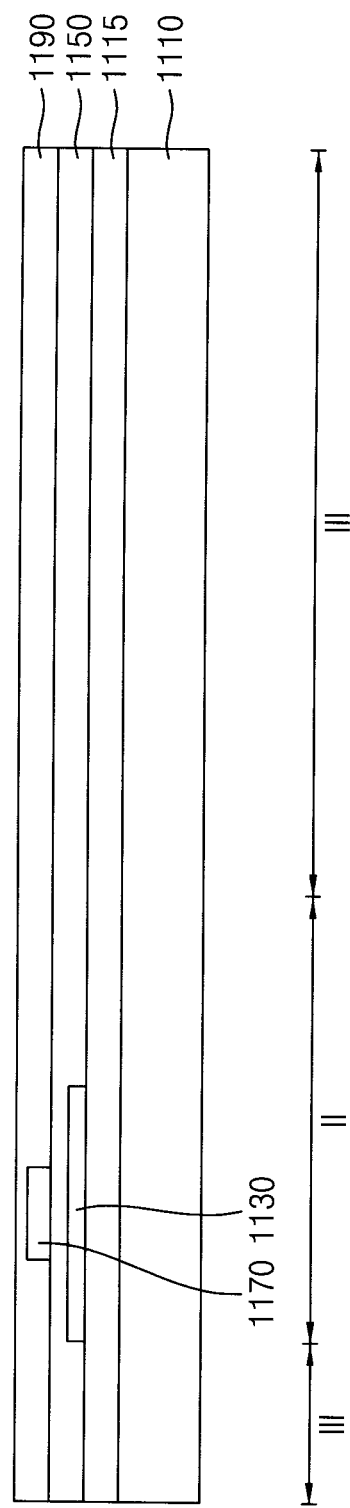

Referring to FIG. 29, the gate electrode 1170 and the second insulation layer 1190 are disposed on the first substrate 1110 on which the first insulation layer 1150 is disposed.

The gate electrode 1170 may be disposed on a portion of the first insulation layer 1150 under which the active pattern 1130 is disposed. In an exemplary embodiment, the gate electrode 1170 may include at least one of a metal, an alloy, metal nitride, conductive metal oxide, transparent conductive materials, etc., for example.

The second insulation layer 1190 may be disposed on the gate electrode 1170. The second insulation layer 1190 may cover the gate electrode 1170 in the light-emitting region ii, and may extend in the first direction on the first substrate 1110. That is, the second insulation layer 1190 may be disposed on the entire first substrate 1110. In an exemplary embodiment, the second insulation layer 1190 may include at least one of a silicon compound, a metal oxide, etc., for example.

Figure 30:
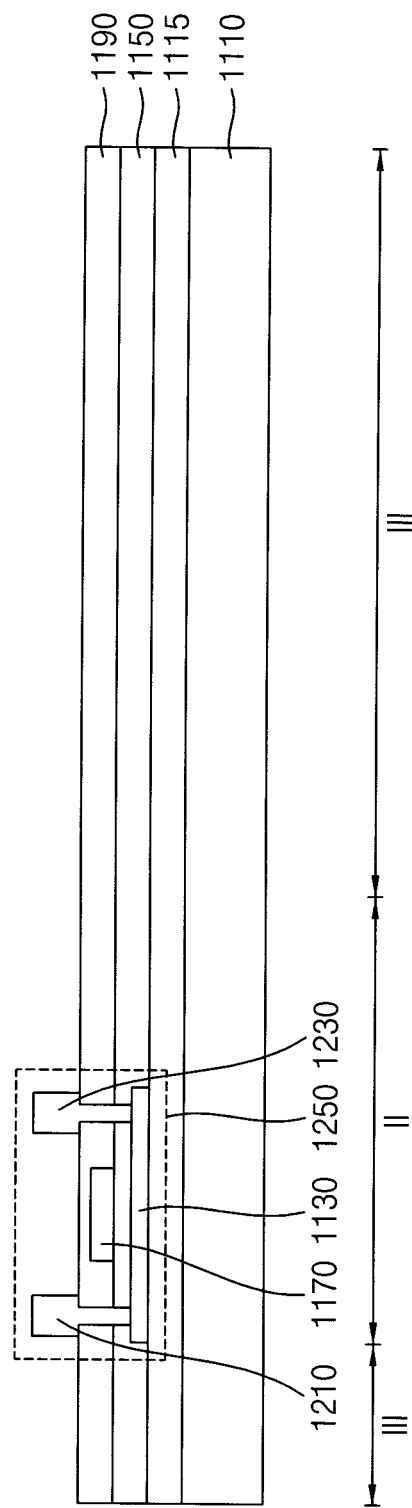

Referring to FIG. 30, the source electrode 1210 and the drain electrode 1230 are disposed on the first substrate 1110 on which the second insulation layer 1190 is disposed.

The source electrode 1210 and the drain electrode 1230 may be disposed on the second insulation layer 1190. The source electrode 1210 may contact a first side of the active layer 1130 by removing a portion of the first and second insulation layers 1150 and 1190.

The drain electrode 1230 may contact a second side of the active layer 1130 by removing a second portion of the first and second insulation layers 1150 and 1190. In an exemplary embodiment, each of the source electrode 1210 and the drain electrode 1230 may include at least one of a metal, an alloy, metal nitride, conductive metal oxide, transparent conductive materials, etc., for example.

Figure 31:
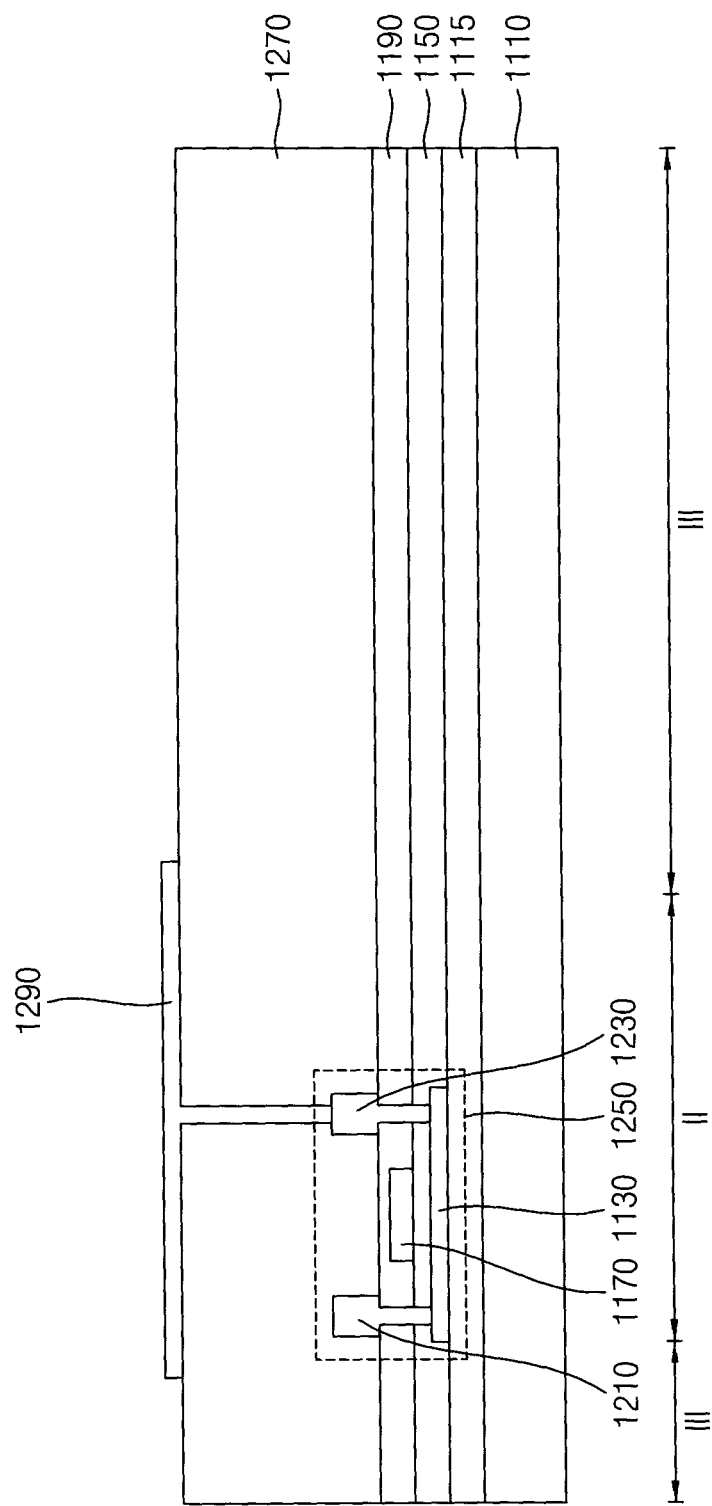

Referring to FIG. 31, the third insulation layer 1270 and the lower electrode 1290 are disposed on the first substrate 1110 on which the source electrode 1210 and the drain electrode 1230 are disposed.

The third insulation layer 1270 may be disposed on the source electrode 1210 and the drain electrode 1230. The third insulation layer 1270 may cover the source electrode 1210 and the drain electrode 1230 in the sub-pixel region II, and may extend in the first direction on the first substrate 1110. That is, the third insulation layer 1270 may be disposed on the entire first substrate 1110. In an exemplary embodiment, the third insulation layer 1270 may include at least one of a silicon compound, a metal oxide, etc., for example.

The lower electrode 1290 may be disposed on the third insulation layer 1270. The lower electrode 1290 may contact the drain electrode 1230 by removing a portion of the third insulation layer 1270. In addition, the lower electrode 1290 may be electrically connected to the semiconductor element 1250. In an exemplary embodiment, the lower electrode 1290 may include at least one of a metal, an alloy, metal nitride, conductive metal oxide, transparent conductive materials, etc., for example.

Figure 32:
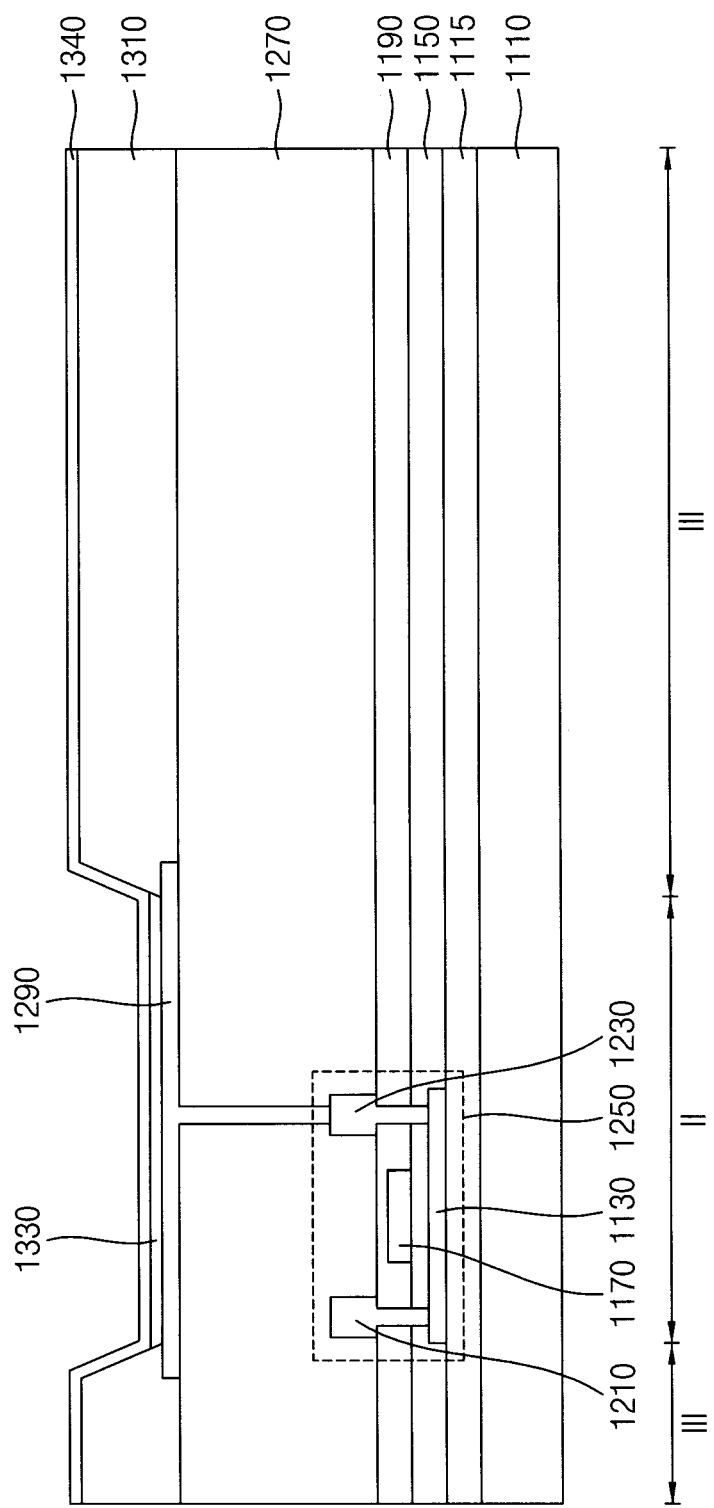

Referring to FIG. 32, the pixel defining layer 1310, the light emitting layer 1330 and the upper electrode 1340 are disposed on the first substrate 1110 on which the lower electrode 1290 is disposed.

The pixel defining layer 1310 may be disposed the on third insulation layer 1270 to expose a portion of the lower electrode 1290. The pixel defining layer 1310 may include organic materials or inorganic materials. In this case, the light emitting layer 1330 may be disposed on a portion that the lower electrode 1290 is exposed by the pixel defining layer 1310.

The light emitting layer 1330 may be disposed on the exposed lower electrode 1290. The light emitting layer 1330 may be provided using light emitting materials generating different colors of light (e.g., a red color of light, a blue color of light, and a green color of light).

The upper electrode 1340 may be disposed on the pixel defining layer 1310 and the light emitting layer 1330. The upper electrode 1340 may cover the pixel defining layer 1310 and the light emitting layer 1330 in light-emitting region II and the reflection region III, and may extend in the first direction on the first substrate 1110. That is, the upper electrode 1340 may be electrically connected to the first through third pixels. In an exemplary embodiment, the upper electrode 1340 may include at least one of a metal, an alloy, metal nitride, conductive metal oxide, a transparent conductive material, etc., for example. These may be used alone or in a combination thereof.

Figure 33:
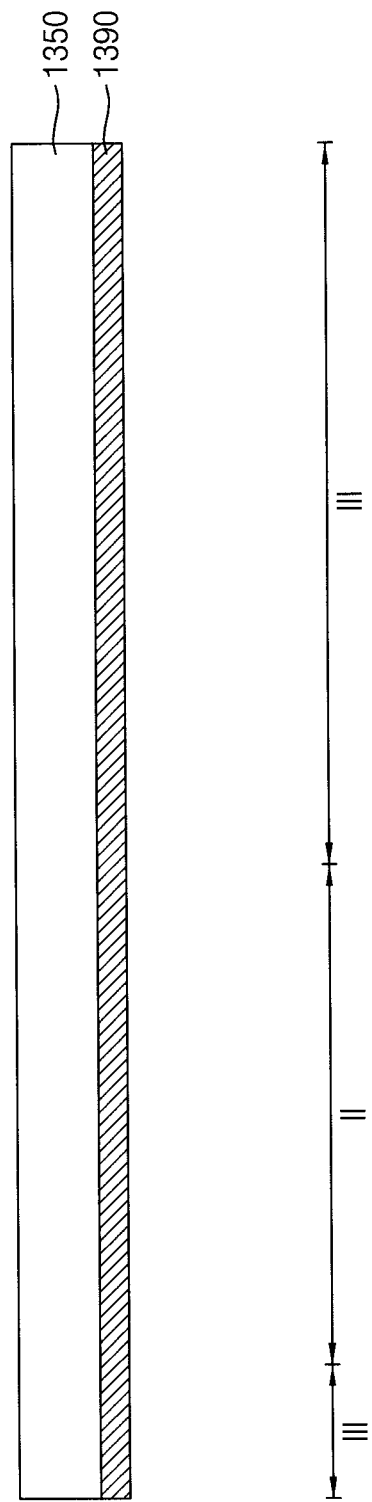

Referring to FIG. 33, the sensing pattern 1390 is disposed on the second substrate 1350.

The sensing pattern 1390 may be disposed on a first surface of the second substrate 1350. The sensing pattern 1390 may be disposed between the first substrate 1110 and the second substrate 1350. The sensing pattern 1390 may be disposed in the light-emitting region II and the reflection region III.

The sensing pattern 1390 may include a material having a predetermined reflectivity. In an exemplary embodiment, the sensing pattern 1390 may include at least one of gold (Au), silver (Ag), aluminum (Al), magnesium (Mg), platinum (Pt), Nickel (Ni), titanium (Ti), etc., for example. In an alternative exemplary embodiment, the sensing pattern 1390 may include at least one of an alloy, metal nitride, conductive metal oxide, etc., for example. In an exemplary embodiment, the sensing pattern 1390 may include at least one of an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The second substrate 1350 and the first substrate 1110 may include substantially the same materials. In an exemplary embodiment, the second substrate 1350 may include at least one of quartz, synthetic quartz, calcium fluoride, fluoride-doping quartz, sodalime glass, non-alkali glass etc., for example.

Figure 34:
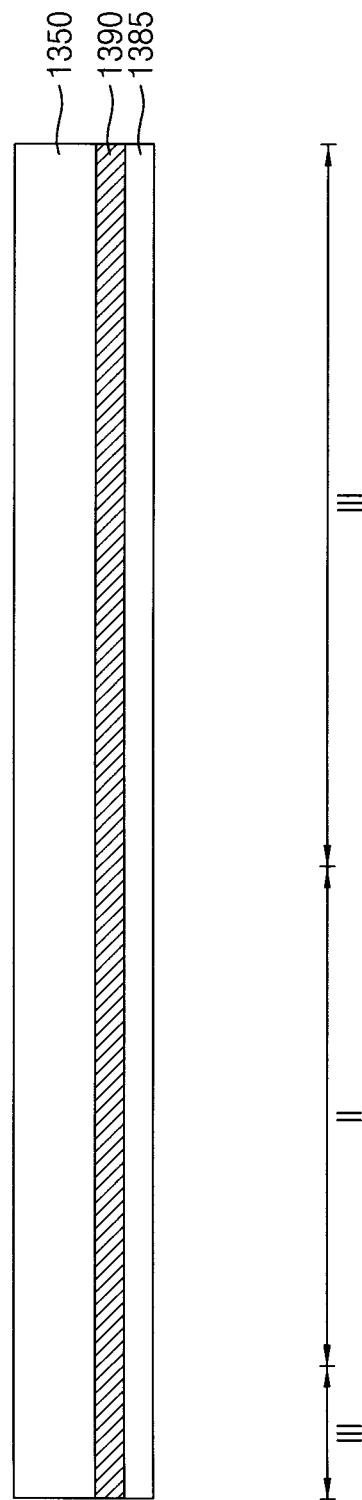

Referring to FIG. 34, the fourth insulation layer 1385 is disposed on the second substrate 1350 on which the sensing pattern 1390 is disposed.

The fourth insulation layer 1385 may prevent from oxidation of the sensing pattern 1390. The fourth insulation layer 1385 may include an adhesive material. The fourth insulation layer 1385 may prevent from separating of the reflection pattern 1370 and the sensing pattern 1390 from the second substrate 1350. The fourth insulation layer 1385 may insulate between the reflection pattern 1370 and the sensing pattern 1390.

Figure 35:
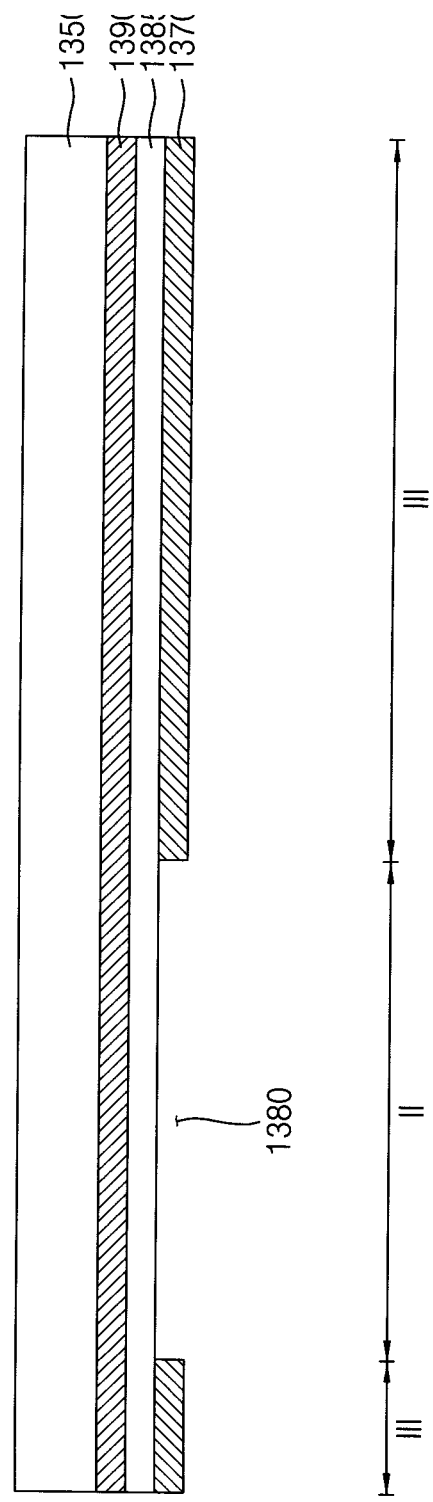

Referring to FIG. 35, the reflection pattern 1370 is disposed on the fourth insulation layer 1385.

The reflection pattern 1370 may be disposed in the reflection region III.

The reflection pattern 1370 may include a material having a predetermined reflectivity. In an exemplary embodiment, the reflection pattern 1370 may include at least one of gold (Au), silver (Ag), aluminum (Al), magnesium (Mg), platinum (Pt), Nickel (Ni), titanium (Ti), etc., for example. In an alternative exemplary embodiment, the reflection pattern 1370 may include at least one of an alloy, metal nitride, conductive metal oxide, etc. In an exemplary embodiment, the reflection pattern 1370 may include at least one of an alloy including aluminum, aluminum nitride (AlNx), an alloy including silver, tungsten nitride (WNx), an alloy including copper chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

Referring to FIG. 27, the reflection pattern 1370 is connected to the first substrate 1110 using the conductive adhesive member 1400.

The conductive adhesive member 1400 may include a conductive material. The reflection pattern 1370 may be electrically connected to pads (not shown) disposed on a first substrate 1110 through the conductive adhesive member 1400. Thus, additional FPCB is not required.

Figure 37:
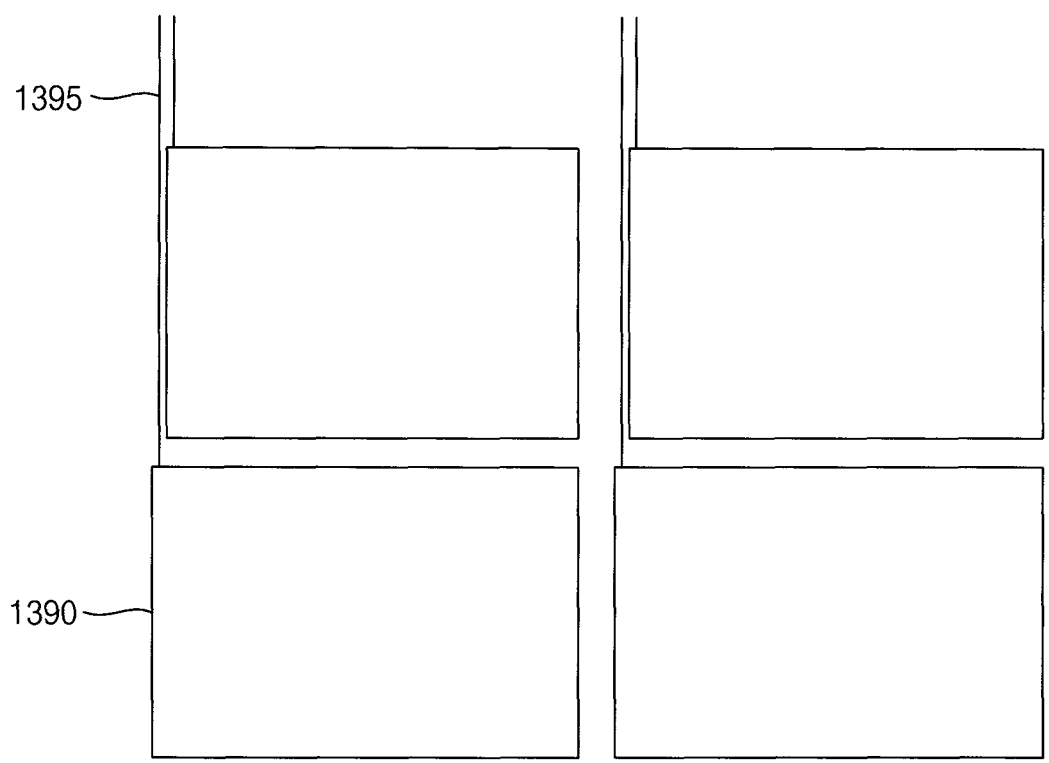
FIG. 37 is a plan view illustrating a sensing pattern of FIG. 27.
Figure 38:
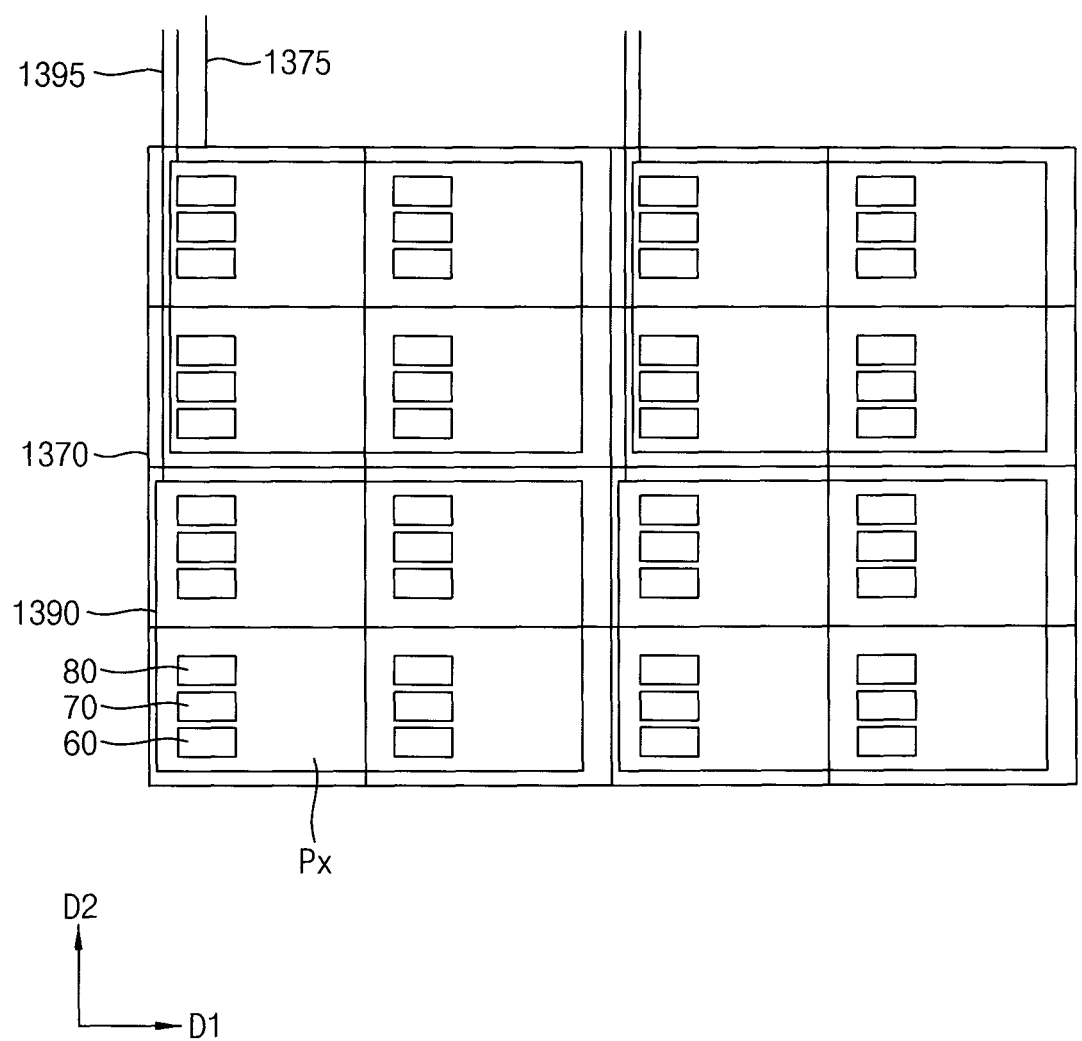
FIG. 38 is a plan view illustrating the reflection pattern of FIG. 36 and the sensing pattern of FIG. 37.

FIG. 36 is a plan view illustrating a reflection pattern of FIG. 27. FIG. 37 is a plan view illustrating a sensing pattern of FIG. 27. FIG. 38 is a plan view illustrating the reflection pattern of FIG. 36 and the sensing pattern of FIG. 37.

Referring to FIG. 27 and FIGS. 36 to 38, the reflection pattern 1370 and the sensing pattern 1390 are illustrated.

The reflection pattern 1370 is disposed only in the reflection region III. Thus, the reflection pattern 1370 is not disposed in a region that the Pixels 60, 70, and 80 are disposed. The reflection pattern 1370 may function as a sensing electrode of a touch screen panel of self capacitance type. The reflection pattern 1370 may have a size corresponding to a predetermined number of unit pixels Px. The reflection pattern 1370 may have an appropriate size according to a size of a display device.

The reflection pattern 1370 may be electrically connected to a sensing driver (not shown) through a first connection line 1375. The first connection line 1375 may include the same material as that of the reflection pattern 1370. The first connection line 1375 may disposed on the same layer as the reflection pattern 1370. However, the invention is not limited thereto, and the first connection line 1375 may include different material from the reflection pattern 1370.

The reflection pattern 1370 disposed on a second substrate 1350 is electrically connected to a conductive adhesive member 1400. The conductive adhesive member 1400 may be electrically connected to pads (not shown) disposed on a first substrate 1110.

The sensing pattern 1390 is disposed in the light-emitting region II and the reflection region III. The sensing pattern 390 may be electrically connected to a sensing driver (not shown) through a second connection line 1395. The second connection line 1395 may include the same material as that of the sensing pattern 1390. The second connection line 1395 may disposed on the same layer as the sensing pattern 1390. However, the invention is not limited thereto, and the second connection line 1395 may include different material from the sensing pattern 1390.

The sensing pattern 1390 may function as a sensing electrode of a touch screen panel of self capacitance type. In an exemplary embodiment, when an electric conductor is contacted, capacitance of the sensing pattern 1390 around a touch position is changed, for example. Thus, a touch panel sensor (not shown) may decide a touch position based on a capacitance sensing signal corresponding to the change of capacitance.

The sensing pattern 1390 may have a size corresponding to a predetermined number of unit pixels Px. The sensing pattern 1390 may have an appropriate size according to a size of a display device.

In the illustrated exemplary embodiment, a size of the reflection pattern 1370 may be bigger than a size of the sensing pattern 1390. In an exemplary embodiment, the reflection pattern 1370 may have a size corresponding to four reflection patterns 1370, for example. However, the invention is not limited thereto, and the reflection pattern 1370 may have a various size.

Since the reflection pattern 370 is provided as relatively big area, the reflection pattern 370 may detect touch position of a wide range. Thus, reflection pattern 370 senses a touch position of a wide range, and after the reflection pattern 370 senses the touch position, the sensing pattern 390 senses an accurate touch position. Accordingly, high speed driving of a touch screen panel may be performed.

Figure 39:
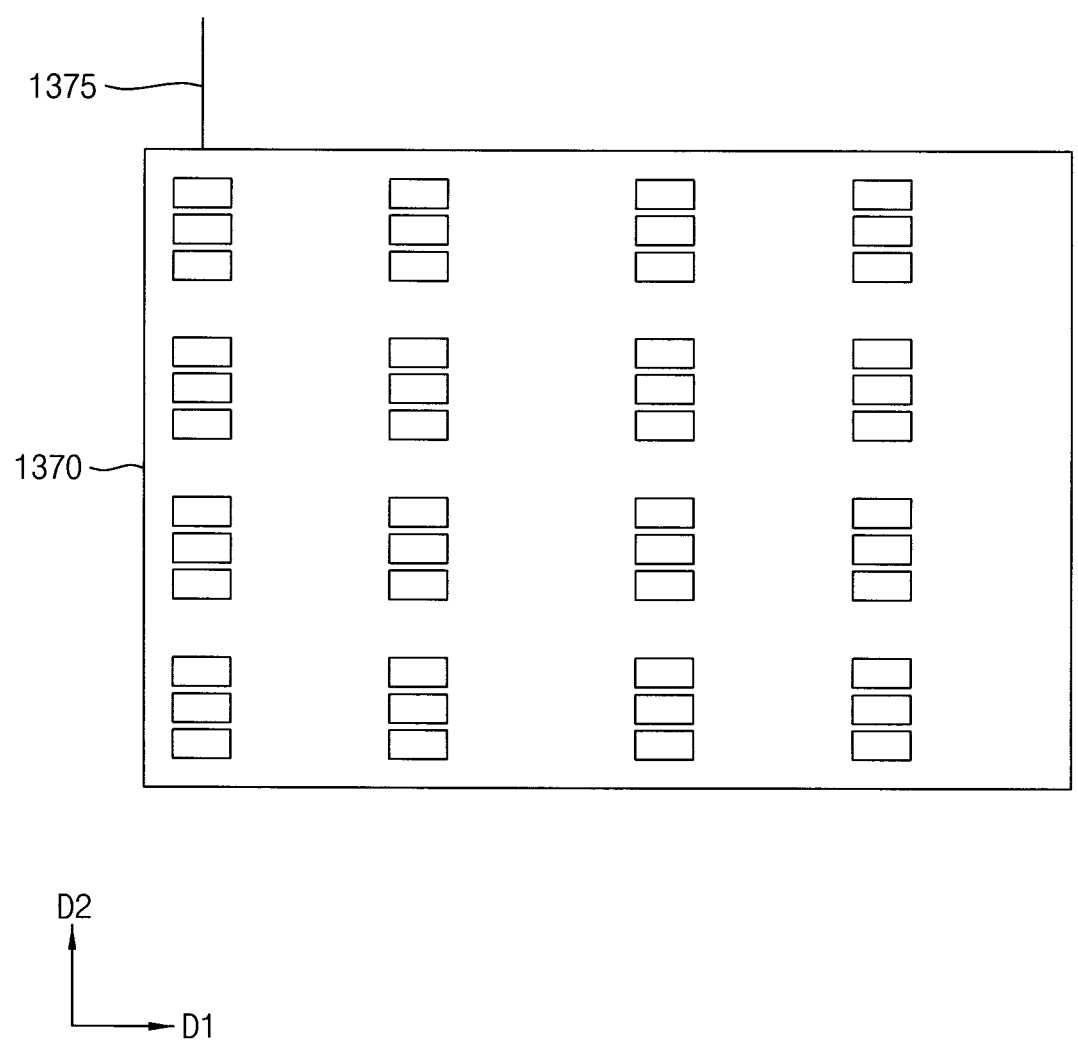
FIG. 39 is a plan view illustrating a reflection pattern of FIG. 27.
Figure 40:
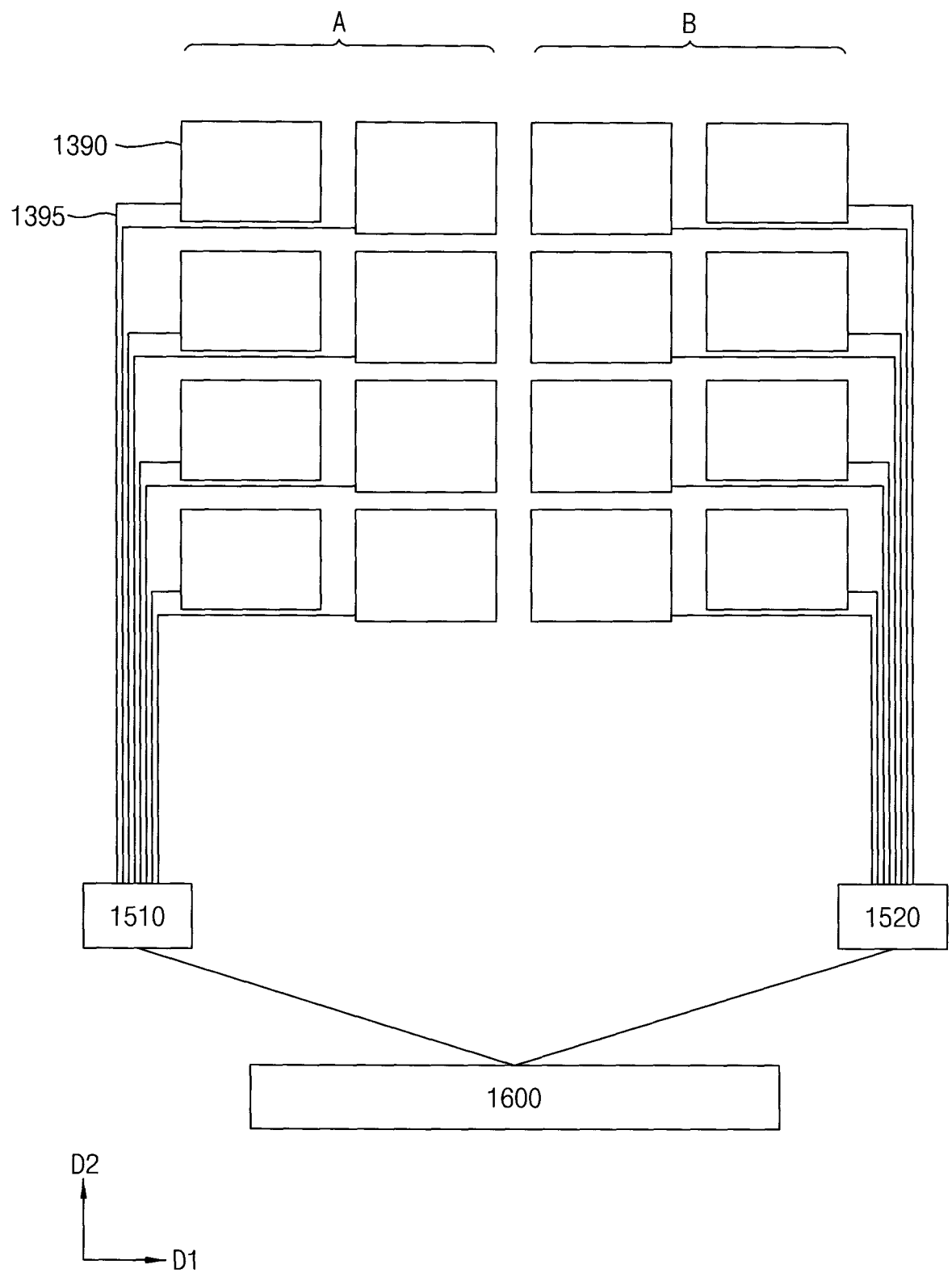
FIG. 40 is a plan view illustrating a sensing pattern of FIG. 27.
Figure 41:
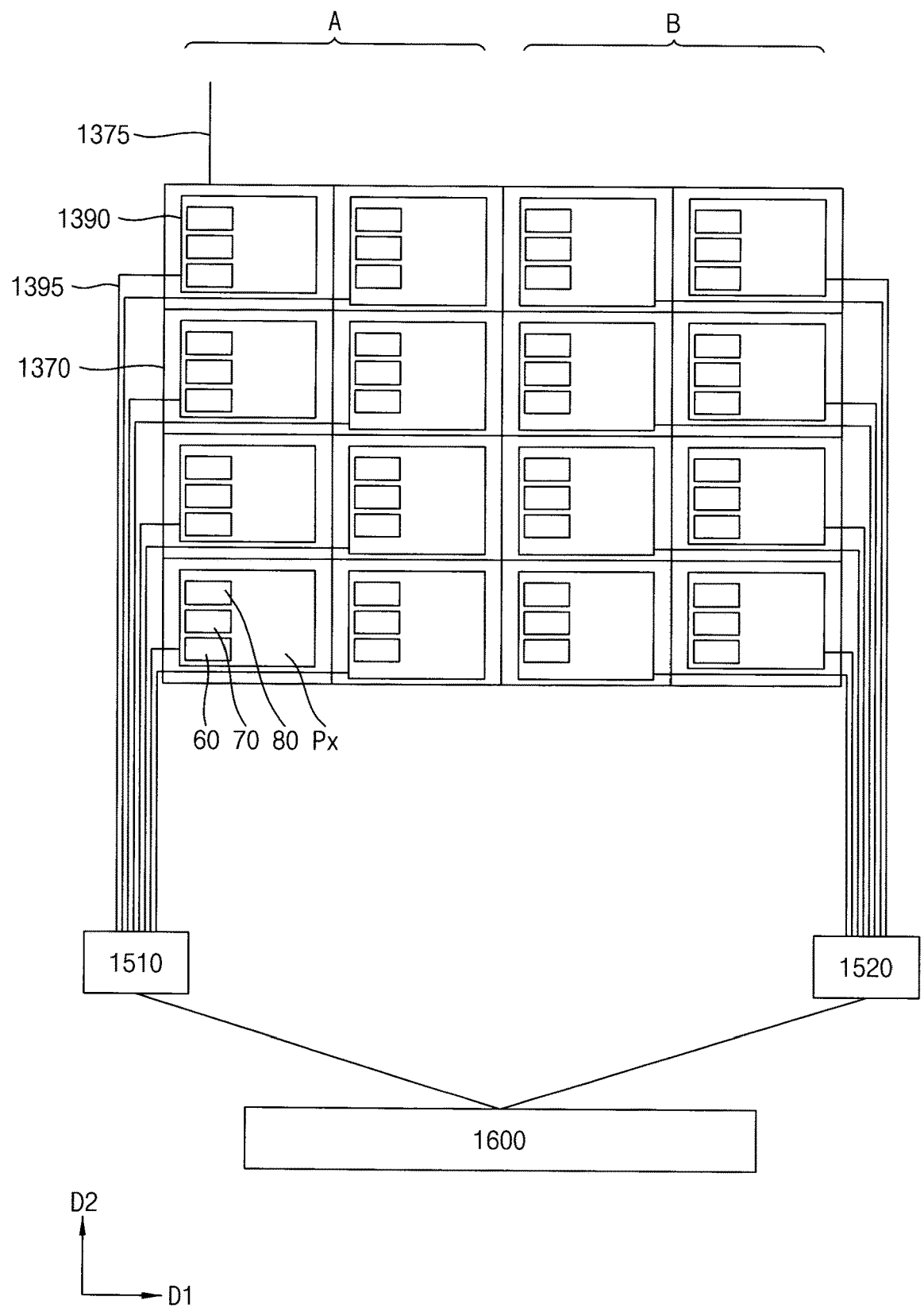
FIG. 41 is a plan view illustrating the reflection pattern of FIG. 39 and the sensing pattern of FIG. 40.

FIG. 39 is a plan view illustrating a reflection pattern of FIG. 27. FIG. 40 is a plan view illustrating a sensing pattern of FIG. 27. FIG. 41 is a plan view illustrating the reflection pattern of FIG. 39 and the sensing pattern of FIG. 40.

Referring to FIG. 27 and FIGS. 39 to 41, the reflection pattern 1370 and the sensing pattern 1390 are illustrated.

The reflection pattern 1370 is disposed only in the reflection region III. Thus, the reflection pattern 1370 is not disposed in a region that the Pixels 60, 70, and 80 are disposed. The reflection pattern 1370 may be electrically connected to a sensing driver (not shown) through a first connection line 1375. The first connection line 1375 may include the same material as that of the reflection pattern 1370. The first connection line 1375 may disposed on the same layer as the reflection pattern 1370. However, the invention is not limited thereto, and the first connection line 1375 may include different material from the reflection pattern 1370.

The reflection pattern 1370 disposed on a second substrate 1350 is electrically connected to a conductive adhesive member 1400. The conductive adhesive member 1400 may be electrically connected to pads (not shown) disposed on a first substrate 1110.

The sensing pattern 1390 is disposed in the light-emitting region II and the reflection region III. The sensing pattern 1390 may be electrically connected to a sensing driver (not shown) through a second connection line 1395. The second connection line 1395 may include the same material as that of the sensing pattern 1390. The second connection line 1395 may disposed on the same layer as the sensing pattern 1390. However, the invention is not limited thereto, and the second connection line 1395 may include different material from the sensing pattern 1390.

The sensing pattern 1390 may function as a sensing electrode of a touch screen panel of self capacitance type. In an exemplary embodiment, when an electric conductor is contacted, capacitance of the sensing pattern 1390 around a touch position is changed, for example. Thus, a touch panel sensor (not shown) may decide a touch position based on a capacitance sensing signal corresponding to the change of capacitance.

The sensing pattern 1390 may have a size corresponding to a predetermined number of unit pixels Px. The sensing pattern 1390 may have an appropriate size according to a size of a display device.

In the illustrated exemplary embodiment, the sensing patterns 1390 classified as a plurality of sensing groups comprising a predetermined number of sensing patterns. In an exemplary embodiment, sensing patterns of A group are electrically connected to a first group driver 1510, and sensing patterns of B group are electrically connected to a second group driver 1520, for example. The first group driver 1510 and the second group driver 1520 are electrically connected to a sensing driver 1600.

When a touch signal is applied to the sensing patterns 1390, a sensing group to which the touch signal is applied is detected, and an accurate touch position in the sensing group to which the touch signal is applied is detected. Accordingly, high speed driving of a touch screen panel may be performed.

When a touch signal is applied to the sensing pattern 1390, potential difference between the sensing pattern 1390 and the reflection pattern 1370 may be occurred. Thus, capacitance between the sensing pattern 1390 and the reflection pattern 1370 is occurred, so that touch sensitivity may be declined due to the capacitance between the sensing pattern 1390 and the reflection pattern 1370.

However, in the illustrated exemplary embodiment, when a touch signal is applied to a sensing pattern 1390, a signal having the same signal as the touch signal is applied to the reflection pattern 1370. Thus, potential difference between the sensing pattern 1390 and the reflection pattern 1370 may be not occurred. Thus, capacitance between the sensing pattern 1390 and the reflection pattern 1370 is not occurred, so that decline of touch sensitivity may be prevented.

Figure 42:
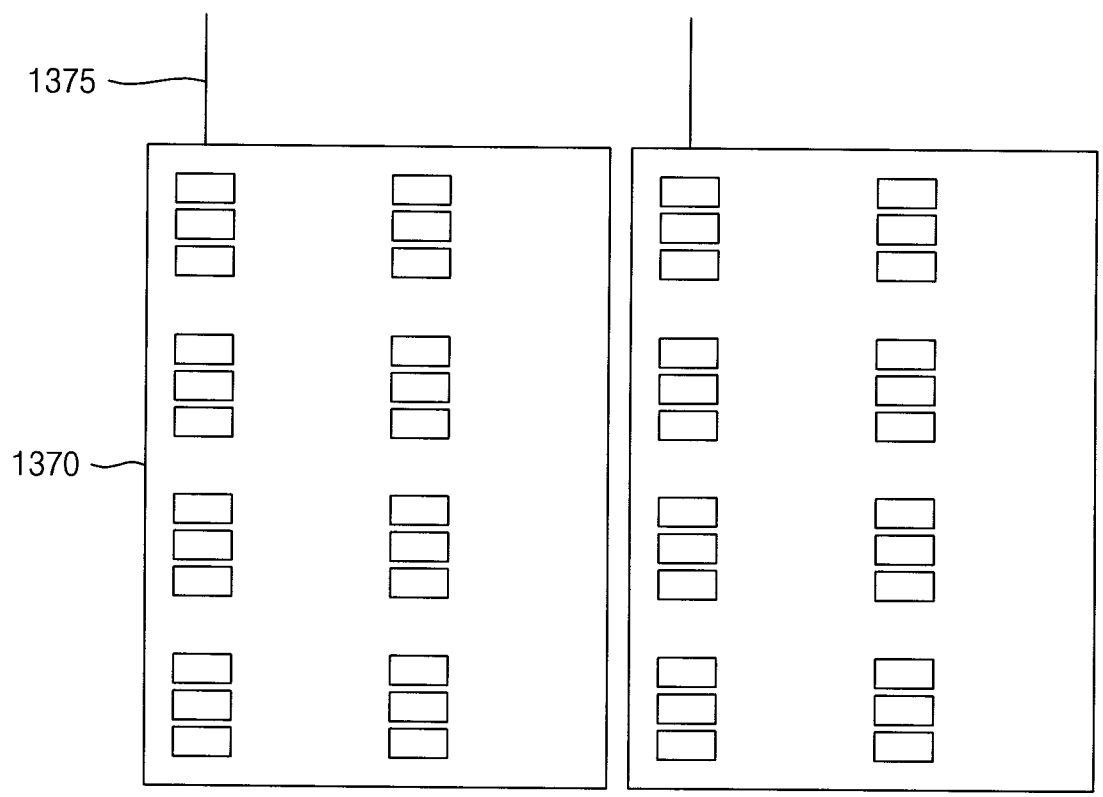
FIG. 42 is a plan view illustrating a reflection pattern of FIG. 27.
Figure 43:
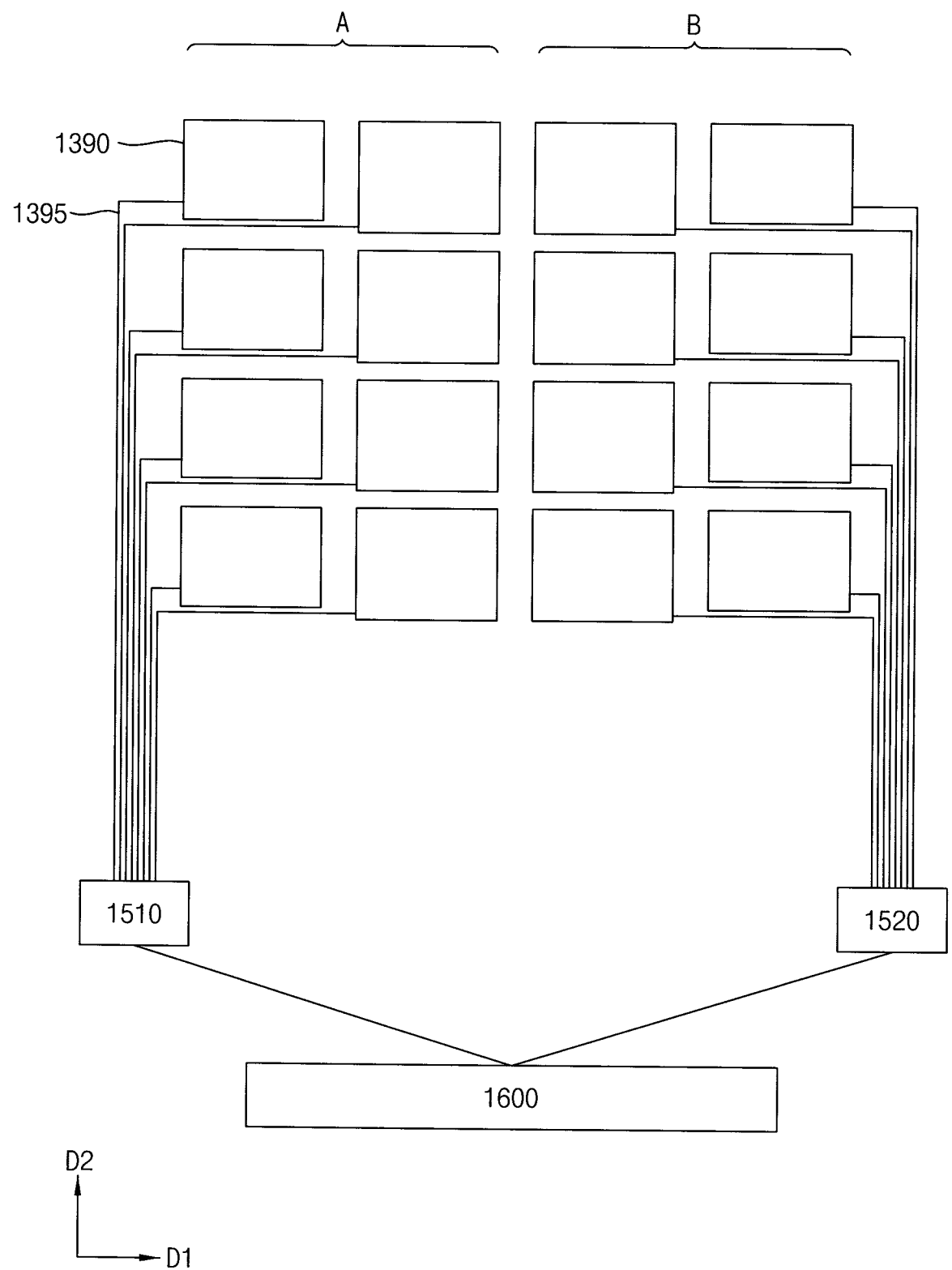
FIG. 43 is a plan view illustrating a sensing pattern of FIG. 27.
Figure 44:
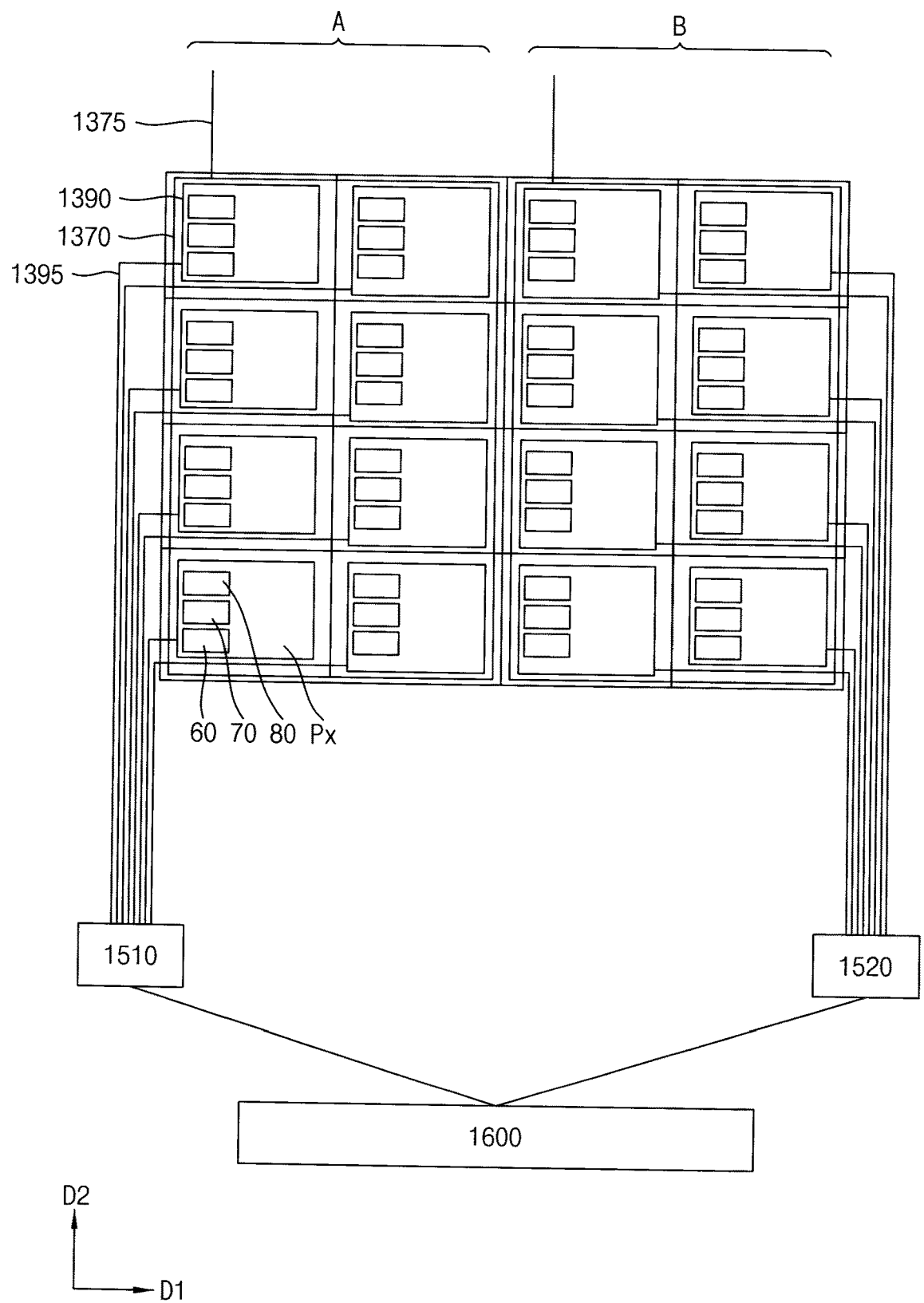
FIG. 44 is a plan view illustrating the reflection pattern of FIG. 42 and the sensing pattern of FIG. 43.

FIG. 42 is a plan view illustrating a reflection pattern of FIG. 27. FIG. 43 is a plan view illustrating a sensing pattern of FIG. 27. FIG. 44 is a plan view illustrating the reflection pattern of FIG. 42 and the sensing pattern of FIG. 43.

Referring to FIG. 27 and FIGS. 42 to 44, the reflection pattern 1370 and the sensing pattern 1390 are illustrated.

The reflection pattern 1370 is disposed only in the reflection region Thus, the reflection pattern 1370 is not disposed in a region that the Pixels 60, 70, and 80 are disposed. The reflection pattern 1370 may be electrically connected to a sensing driver (not shown) through a first connection line 1375. The first connection line 1375 may include the same material as that of the reflection pattern 1370. The first connection line 1375 may disposed on the same layer as the reflection pattern 1370. However, the invention is not limited thereto, and the first connection line 1375 may include different material from the reflection pattern 1370.

The reflection pattern 1370 disposed on a second substrate 1350 is electrically connected to a conductive adhesive member 1400. The conductive adhesive member 1400 may be electrically connected to pads (not shown) disposed on a first substrate 1110.

The sensing pattern 1390 is disposed in the light-emitting region II and the reflection region III. The sensing pattern 1390 may be electrically connected to a sensing driver (not shown) through a second connection line 1395. The second connection line 1395 may include the same material as that of the sensing pattern 1390. The second connection line 1395 may disposed on the same layer as the sensing pattern 1390. However, the invention is not limited thereto, and the second connection line 1395 may include different material from the sensing pattern 1390.

The sensing pattern 1390 may function as a sensing electrode of a touch screen panel of self capacitance type. In an exemplary embodiment, when an electric conductors contacted, capacitance of the sensing pattern 1390 around a touch position is changed, for example. Thus, a touch panel sensor (not shown) may decide a touch position based on a capacitance sensing signal corresponding to the change of capacitance.

The sensing pattern 1390 may have a size corresponding to a predetermined number of unit pixels Px. The sensing pattern 1390 may have an appropriate size according to a size of a display device.

In the illustrated exemplary embodiment, the sensing patterns 1390 classified as a plurality of sensing groups comprising a predetermined number of sensing patterns. In an exemplary embodiment, sensing patterns of A group are electrically connected to a first group driver 1510, and sensing patterns of B group are electrically connected to a second group driver 1520, for example. The first group driver 1510 and the second group driver 1520 are electrically connected to a sensing driver 1600.

When a touch signal is applied to the sensing patterns 1390, a sensing group to which the touch signal is applied is detected, and an accurate touch position in the sensing group to which the touch signal is applied is detected. Accordingly, high speed driving of a touch screen panel may be performed.

In the exemplary embodiment, the reflection pattern 1370 is provided as a size corresponding to one group of the sensing patterns 1390. In an exemplary embodiment, the reflection pattern 1370 may have a size corresponding to eight reflection patterns 1370, for example. However, the invention is not limited thereto, and the reflection pattern 1370 may have a various size.

When a touch signal is applied to the sensing pattern 1390, potential difference between the sensing pattern 1390 and the reflection pattern 1370 may be occurred. Thus, capacitance between the sensing pattern 1390 and the reflection pattern 1370 is occurred, so that touch sensitivity may be declined due to the capacitance between the sensing pattern 1390 and the reflection pattern 1370.

However, in the illustrated exemplary embodiment, when a touch signal is applied to a sensing pattern 1390, a signal having the same signal as the touch signal is applied to the reflection pattern 1370. Thus, potential difference between the sensing pattern 1390 and the reflection pattern 1370 may be not occurred. Thus, capacitance between the sensing pattern 1390 and the reflection pattern 1370 is not occurred, so that decline of touch sensitivity may be prevented.

Figure 45:
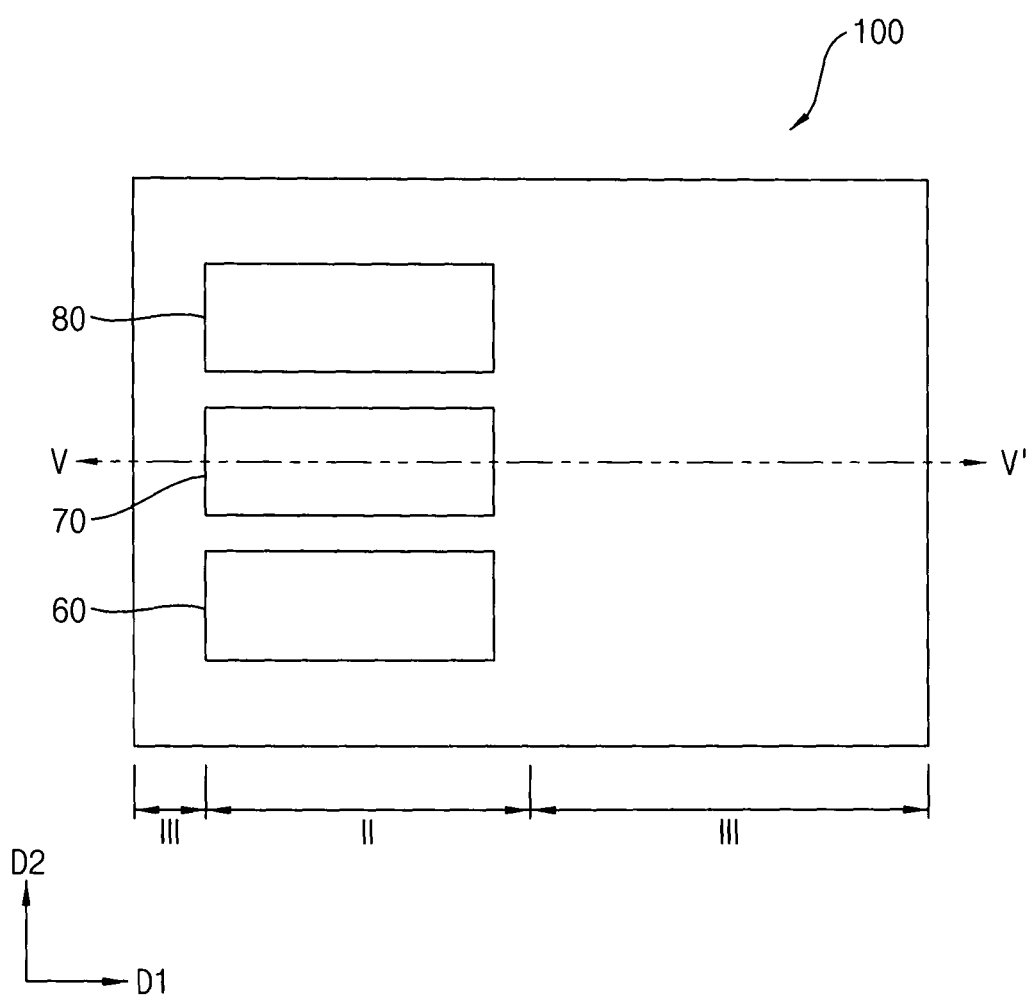
FIG. 45 is a plan view illustrating an exemplary embodiment of an OLED device according to the invention.
Figure 46:
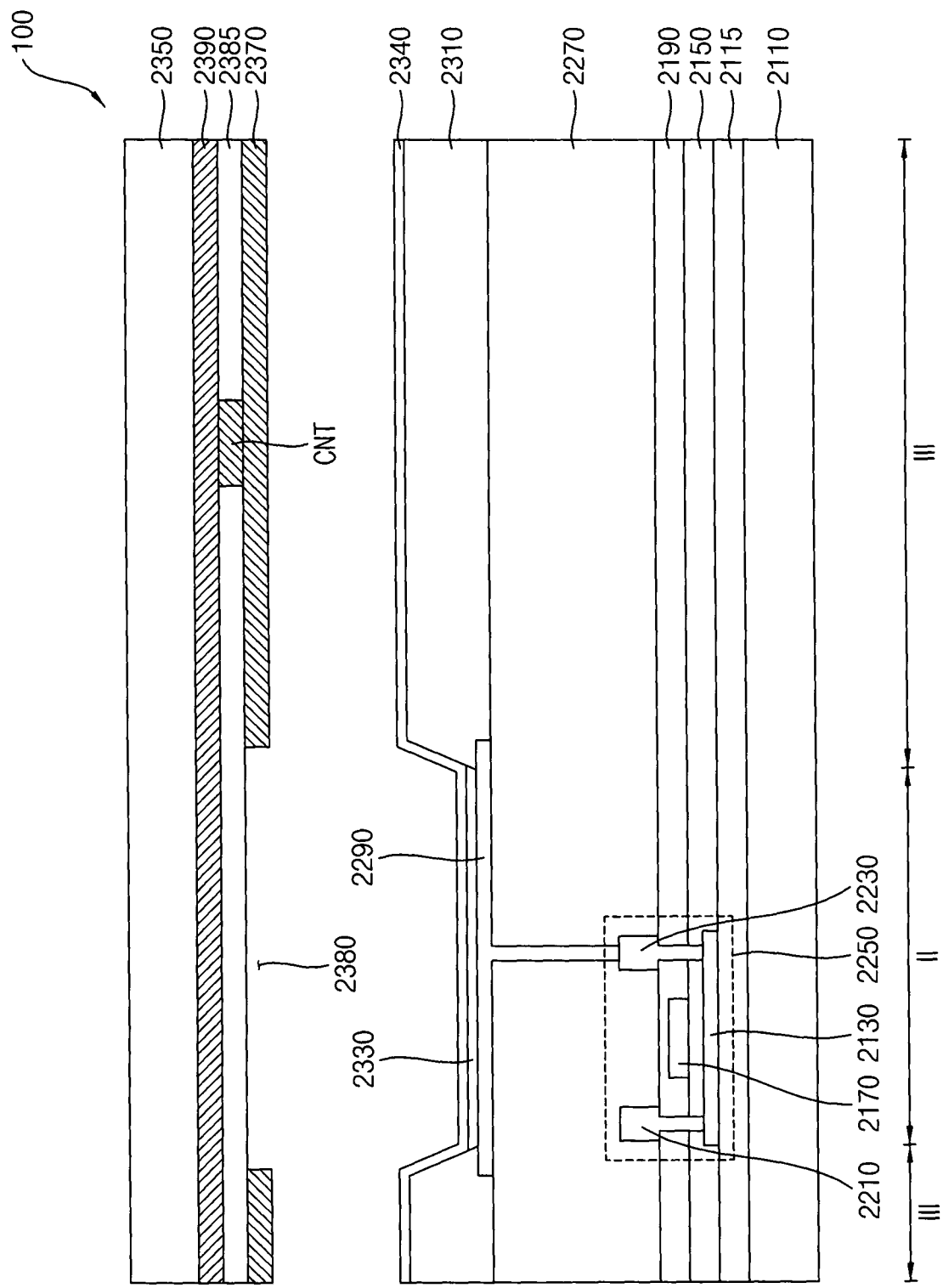
FIG. 46 is a cross-sectional view taken along line V-V" of FIG. 45.

FIG. 45 is a plan view illustrating an OLED device according to an exemplary embodiment of the invention. FIG. 46 is a cross-sectional view taken along line V-V' of FIG. 45.

The OLED device according to the illustrated exemplary embodiment is substantially same as the OLED device of FIGS. 1 and 2 except for a reflection pattern 2370 and a contact hole CNT, and thus similar reference numerals are used for same elements and repetitive explanation will be omitted.

Referring to FIGS. 45 and 46, a contact hole CNT is provided in a fourth insulation layer 2385. The reflection pattern 2370 is electrically connected to a sensing pattern 2390 through the contact hole CNT.

The sensing pattern 2390 may function as a sensing electrode of a touch screen panel of self capacitance type. In an exemplary embodiment, when an electric conductor is contacted, capacitance of the sensing pattern 2390 around a touch position is changed, for example. Thus, a touch panel sensor (not shown) may decide a touch position based on a capacitance sensing signal corresponding to the change of capacitance.

The reflection pattern 2370 is provided as a similar size as the sensing pattern 2390 in a plan view. The reflection pattern 2370 is electrically connected to a sensing pattern 2390 through the contact hole CNT. Accordingly, sensing electrodes of a touch screen panel of self capacitance type may have low-resistance.

FIGS. 47 to 54 are cross-sectional views illustrating a method of manufacturing the OLED device of FIG. 46.

Figure 47:
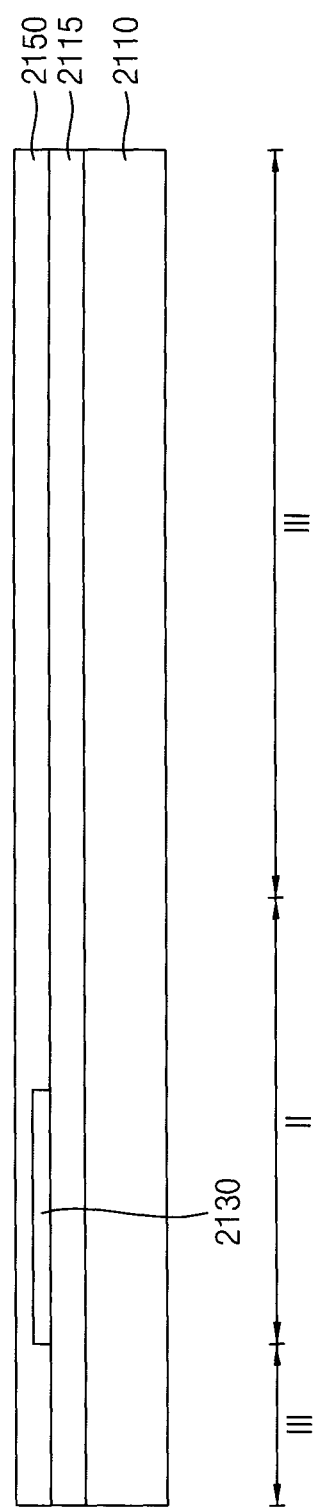
FIGS. 47 to 54 are cross-sectional views illustrating a method of manufacturing the OLED device of FIG. 46.

Referring to FIG. 47, the buffer layer 2115 is disposed on the first substrate 2110. Thereafter, the active pattern 2130 and the first insulation layer 2150 are disposed on the buffer layer 2115.

In an exemplary embodiment, the first substrate 2110 may include at least one of quartz, synthetic quartz, calcium fluoride, fluoride-doping quartz, a sodalime glass, a non-alkali glass etc., for example.

A buffer layer 2115 may be disposed on the first substrate 2110. The buffer layer 2115 may extend from the light-emitting region II into the reflection region III. The buffer layer 2115 may prevent the diffusion (e.g., an out gassing) of metal atoms and/or impurities from the first substrate 2110. Additionally, the buffer layer 2115 may control a rate of a heat transfer in a crystallization process for forming the active pattern 2130, thereby obtaining substantially uniform the active pattern 2130. Furthermore, the buffer layer 2115 may improve a surface flatness of the first substrate 2110 when a surface of the first substrate 2110 is relatively irregular. According to a type of the first substrate 2110, at least two buffer layers may be provided on the first substrate 2110, or the buffer layer may not be disposed.

In an exemplary embodiment, the active pattern 2130 may include at least one of an oxide semiconductor, an inorganic semiconductor (e.g., amorphous silicon, polysilicon, etc.), an organic semiconductor, etc., for example.

The first insulation layer 2150 may be disposed on the active pattern 2130. The first insulation layer 2150 may cover the active pattern 2130 in the light-emitting region and may extend in the first direction on the first substrate 2110. That is, the first insulation layer 2150 may be disposed on the entire first substrate 2110, In an exemplary embodiment, the first insulation layer 2150 may include al least one of a silicon compound, a metal oxide, etc., for example.

Figure 48:
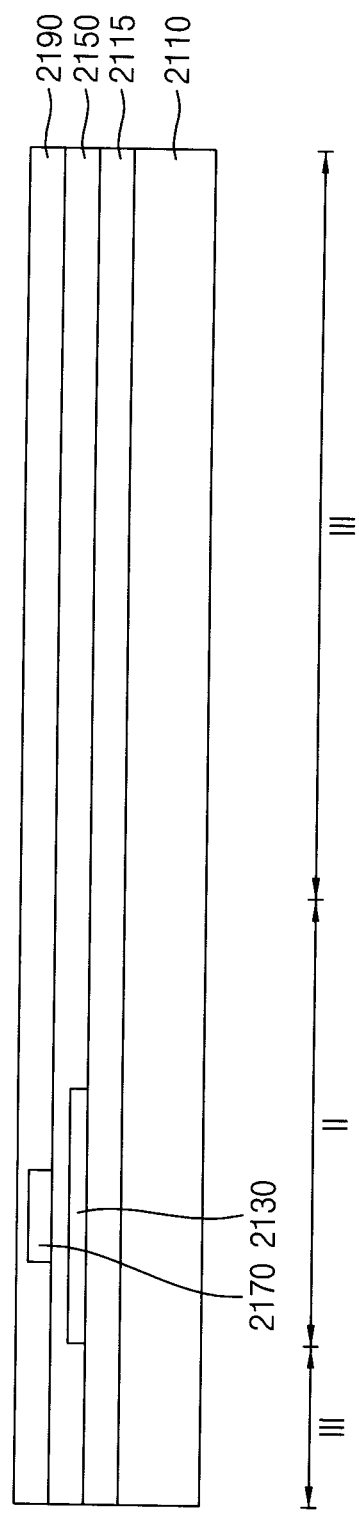

Referring to FIG. 48, the gate electrode 2170 and the second insulation layer 2190 is disposed on the first substrate 2110 on which the first insulation layer 2150 is disposed.

The gate electrode 2170 may be disposed on a portion of the first insulation layer 2150 under which the active pattern 2130 is disposed. In an exemplary embodiment, the gate electrode 2170 may include at least one of a metal, an alloy, metal nitride, conductive metal oxide, transparent conductive materials, etc., for example.

The second insulation layer 2190 may be disposed on the gate electrode 2170. The second insulation layer 2190 may cover the gate electrode 2170 in the light-emitting region II, and may extend in the first direction on the first substrate 2110. That is, the second insulation layer 2190 may be disposed on the entire first substrate 2110. In an exemplary embodiment, the second insulation layer 2190 may include at least one of a silicon compound, a metal oxide, etc., for example.

Figure 49:
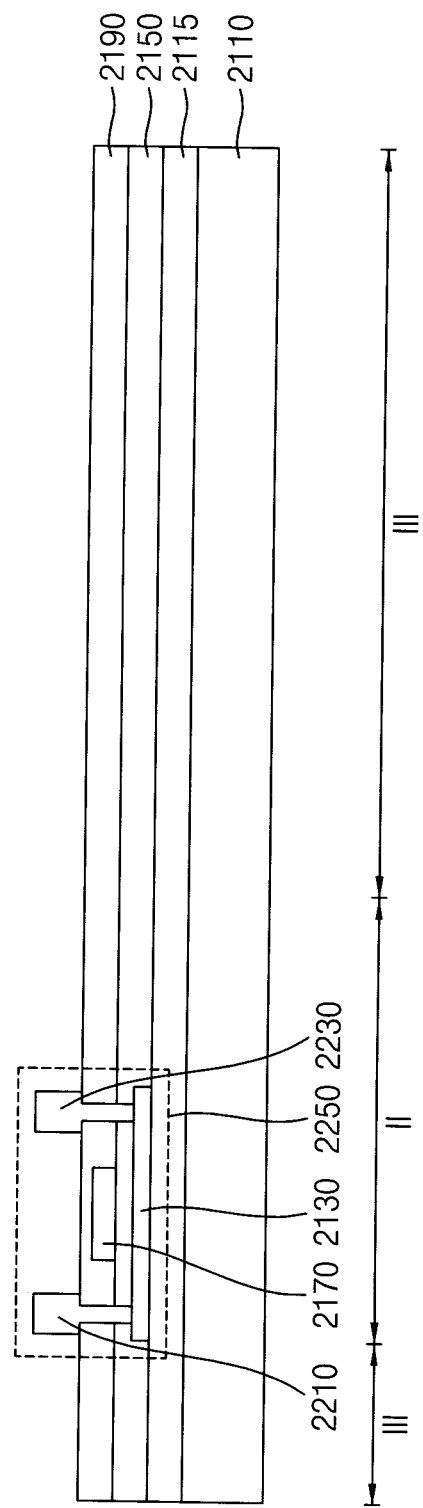

Referring to FIG. 49, the source electrode 2210 and the drain electrode 2230 are disposed on the first substrate 2110 on which the second insulation layer 2190 is disposed.

The source electrode 2210 and the drain electrode 2230 may be disposed on the second insulation layer 2190. The source electrode 2210 may contact a first side of the active layer 2130 by removing a portion of the first and second insulation layers 2150 and 2190. The drain electrode 2230 may contact a second side of the active layer 2130 by removing a second portion of the first and second insulation layers 2150 and 2190. In an exemplary embodiment, each of the source electrode 2210 and the drain electrode 2230 may include at least one of a metal, an alloy, metal nitride, conductive metal oxide, transparent conductive materials, etc., for example.

Figure 50:
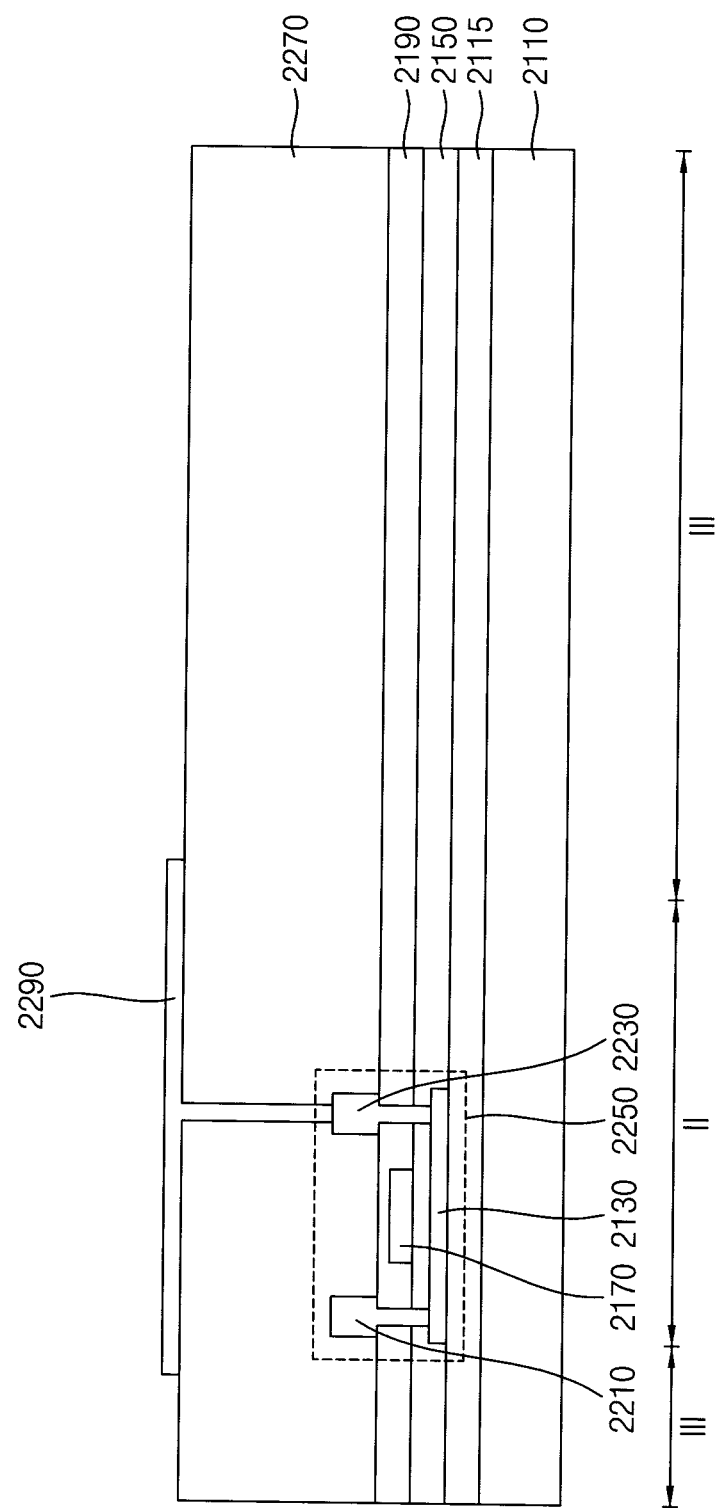

Referring to FIG. 50, the third insulation layer 2270 and the lower electrode 2290 are disposed on the first substrate 2110 on which the source electrode 2210 and the drain electrode 2230 are disposed.

The third insulation layer 2270 may be disposed on the source electrode 2210 and the drain electrode 2230. The third insulation layer 2270 may cover the source electrode 2210 and the drain electrode 2230 in the sub-pixel region II, and may extend in the first direction on the first substrate 2110. That is, the third insulation layer 2270 max be disposed on the entire first substrate 2110. In an exemplary embodiment, the third insulation layer 2270 may include at least one of a silicon compound, a metal oxide, etc., for example.

The lower electrode 2290 may be disposed on the third insulation layer 2270. The lower electrode 2290 may contact the drain electrode 2230 by removing a portion of the third insulation layer 2270. In addition, the lower electrode 2290 may be electrically connected to the semiconductor element 2250. In an exemplary embodiment, the lower electrode 2290 may include at least one of a metal, an alloy, metal nitride, conductive metal oxide, transparent conductive materials, etc., for example.

Figure 51:
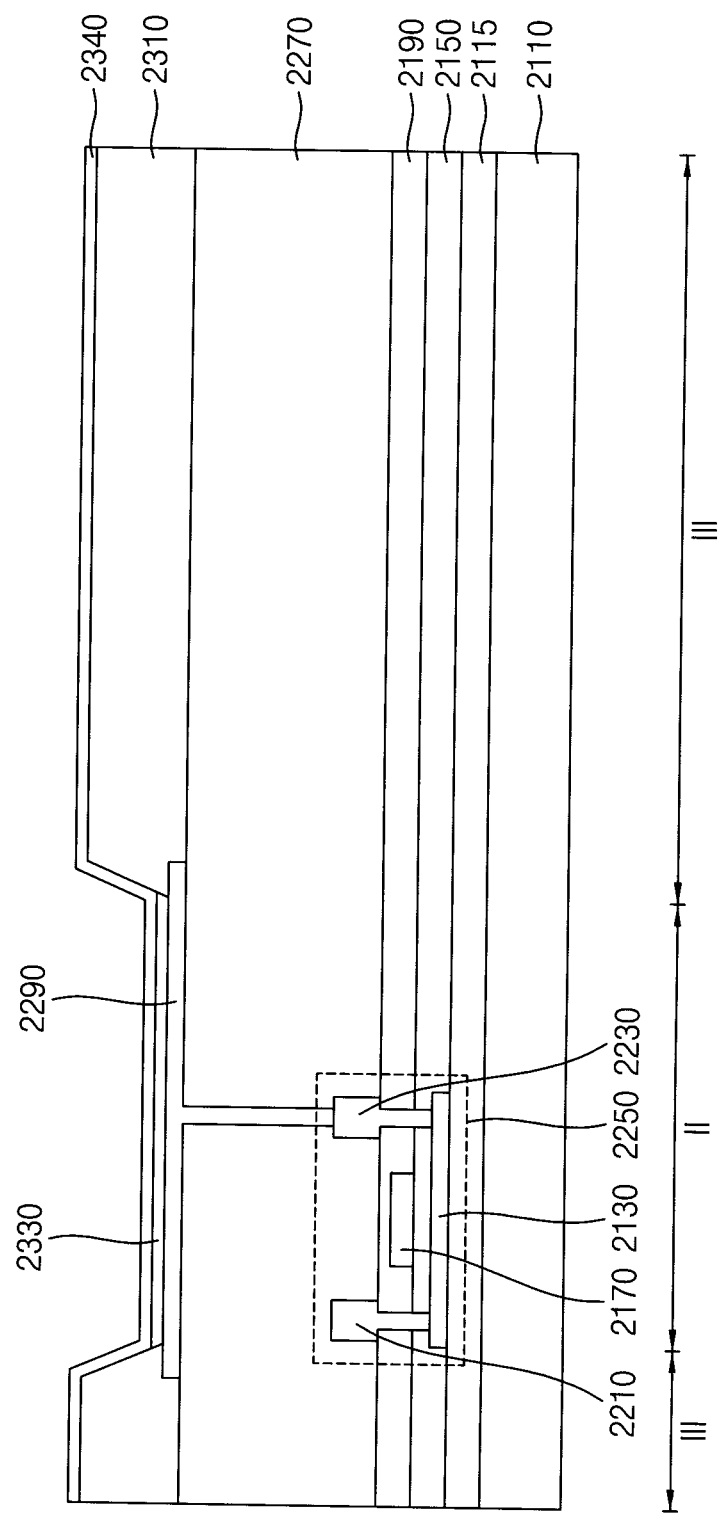

Referring to FIG. 51, the pixel defining layer 2310, the light emitting layer 2330 and the upper electrode 2340 are disposed on the first substrate 2110 on which the lower electrode 2290 is disposed.

The pixel defining layer 2310 may be disposed the on third insulation layer 2270 to expose a portion of the lower electrode 2290. The pixel defining layer 2310 may include organic materials or inorganic materials. In this case, the light emitting layer 2330 may be disposed on a portion that the lower electrode 2290 is exposed by the pixel defining layer 2310.

The light emitting layer 2330 may be disposed on the exposed lower electrode 2290. The light emitting layer 2330 may be provided using light emitting materials generating different colors of light (e.g., a red color of light, a blue color of light, and a green color of light).

The upper electrode 2340 may be disposed on the pixel defining layer 2310 and the light emitting layer 2330. The upper electrode 2340 may cover the pixel defining layer 2310 and the light emitting layer 2330 in light-emitting region II and the reflection region III, and may extend in the first direction on the first substrate 2110. That is, the upper electrode 2340 may be electrically connected to the first through third pixels. In an exemplary embodiment, the upper electrode 2340 may include al least one of a metal, an alloy, metal nitride, conductive metal oxide, a transparent conductive material, etc., for example. These may be used alone or in a combination thereof.

Figure 52:
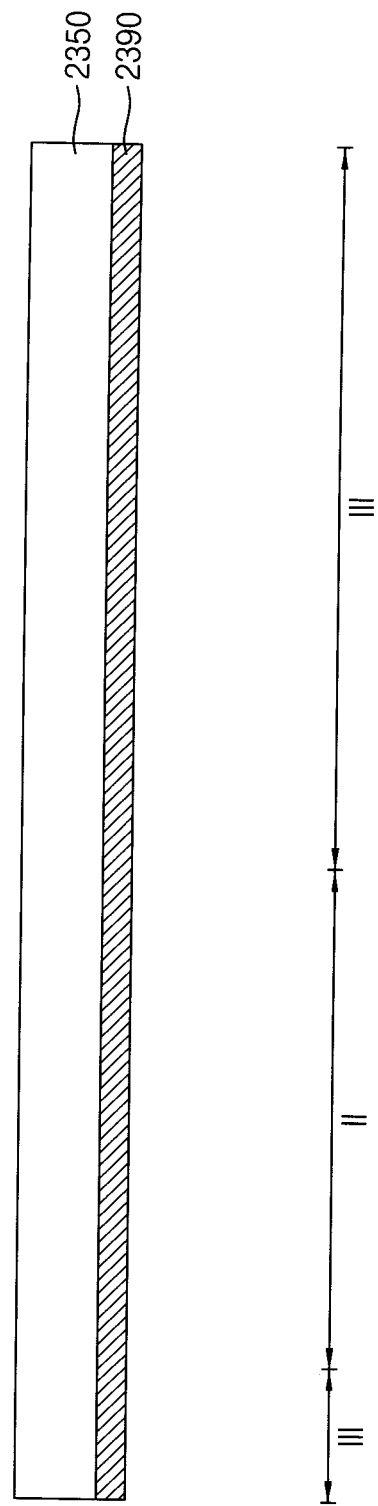

Referring to FIG. 52, the sensing pattern 2390 is disposed on the second substrate 2350.

The sensing pattern 2390 may be disposed on a first surface of the second substrate 2350. The sensing pattern 2390 may be disposed between the first substrate 2110 and the second substrate 2350. The sensing pattern 2390 may be disposed in the light-emitting region II and the reflection region III.

The sensing pattern 2390 may include a material having a predetermined reflectivity. In an exemplary embodiment, the sensing pattern 2390 may include at least one of gold (Au), silver (Ag), aluminum (Al), magnesium (Mg), platinum (Pt), Nickel (Ni), titanium (Ti), etc., for example. In an alternative exemplary embodiment, the sensing pattern 2390 may include at least one of an alloy, metal nitride, conductive metal oxide, etc. In an exemplary embodiment, the sensing pattern 2390 may include at least one of an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The second substrate 2350 and the first substrate 2110 may include substantially the same materials. In an exemplary embodiment, the second substrate 2350 may include at least one of quartz, synthetic quartz, calcium fluoride, fluoride-doping quartz, sodalime glass, non-alkali glass etc., for example.

Figure 53:
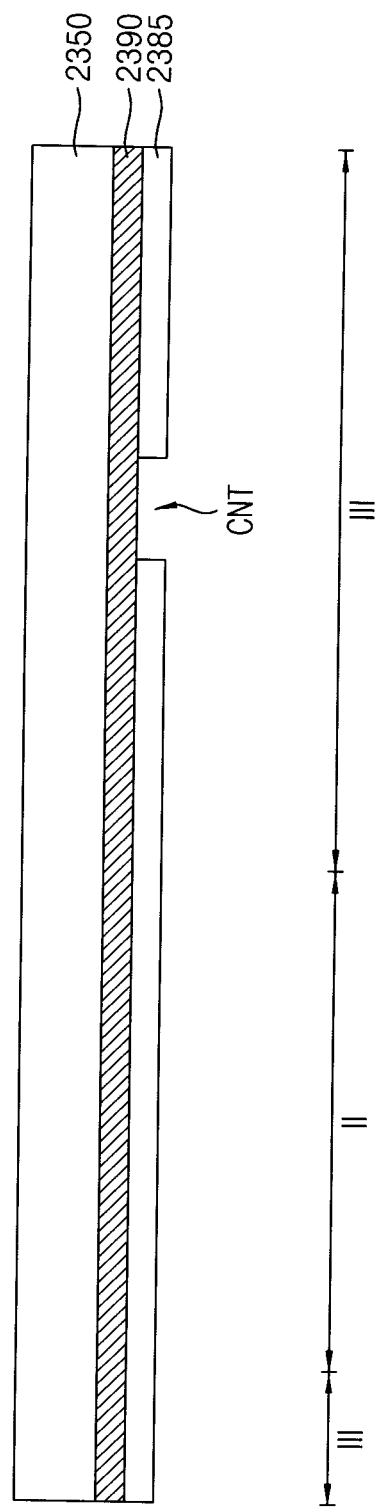

Referring to FIG. 53, the fourth insulation layer 2385 is disposed on the second substrate 2350 on which the sensing pattern 2390 is disposed. Thereafter, the fourth insulation layer 2385 is patterned to define the contact hole CNT.

The fourth insulation layer 2385 may prevent from oxidation of the sensing pattern 2390. The fourth insulation layer 2385 may include an adhesive material. The fourth insulation layer 2385 may prevent from separating of the reflection pattern 2370 and the sensing pattern 2390 from the second substrate 2350. The fourth insulation layer 2385 may insulate between the reflection pattern 2370 and the sensing pattern 2390.

Figure 54:
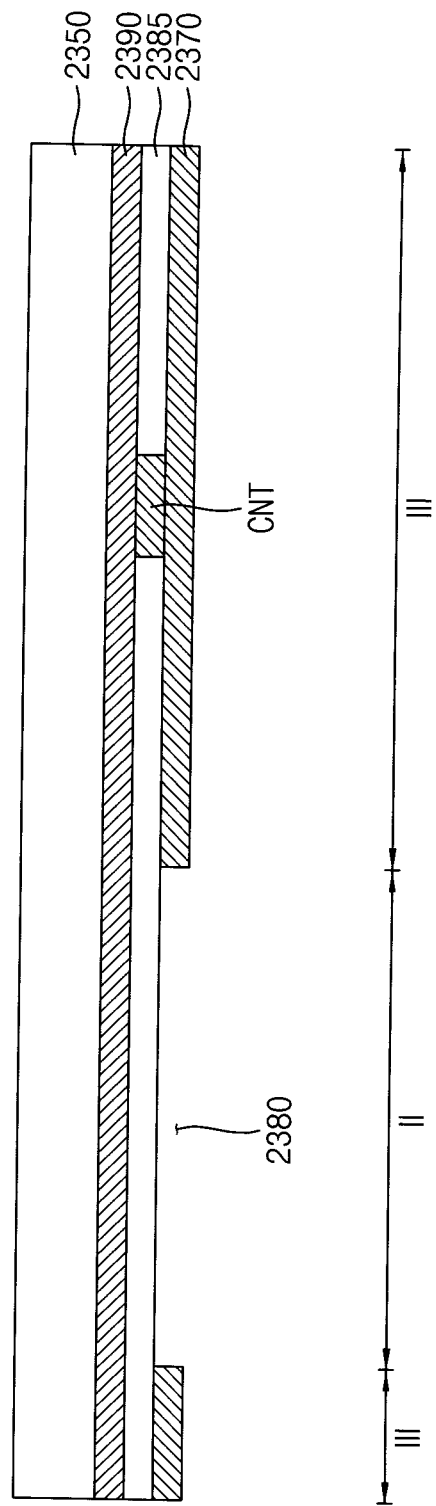

Referring to FIG. 54, the reflection pattern 2370 is disposed on the fourth insulation layer 2385 in which the contact hole CNT is defined.

The reflection pattern 2370 may be disposed in the reflection region III. The reflection pattern 2370 is electrically connected to a sensing pattern 2390 through the contact hole CNT. Accordingly, sensing electrodes of a touch screen panel of self capacitance type may have low-resistance.

The reflection pattern 2370 may include a material having a predetermined reflectivity. In an exemplary embodiment, the reflection pattern 2370 may include at least one of gold (Au), silver (Ag), aluminum (Al), magnesium (Mg), platinum (Pt), Nickel (Ni), titanium (Ti), etc., for example. In an alternative exemplary embodiment, the reflection pattern 2370 may include at least one of an alloy, metal nitride, conductive metal oxide, etc., for example. In an exemplary embodiment, the reflection pattern 2370 may include at least one of an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

Figure 55:
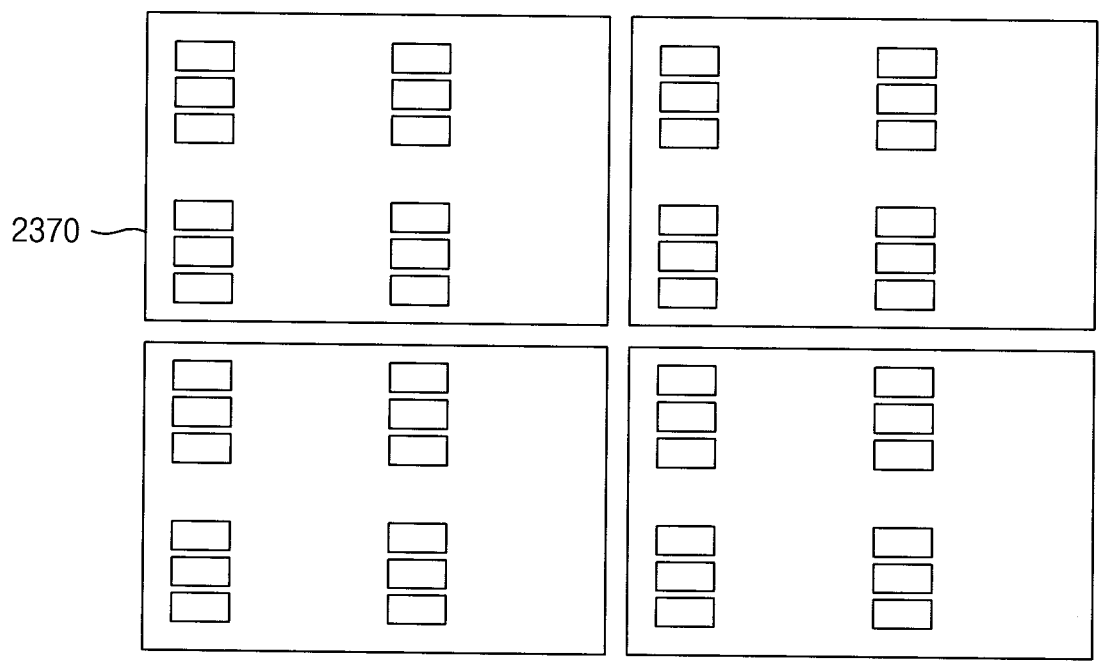
FIG. 55 is a plan view illustrating a reflection pattern of FIG. 46.
Figure 56:
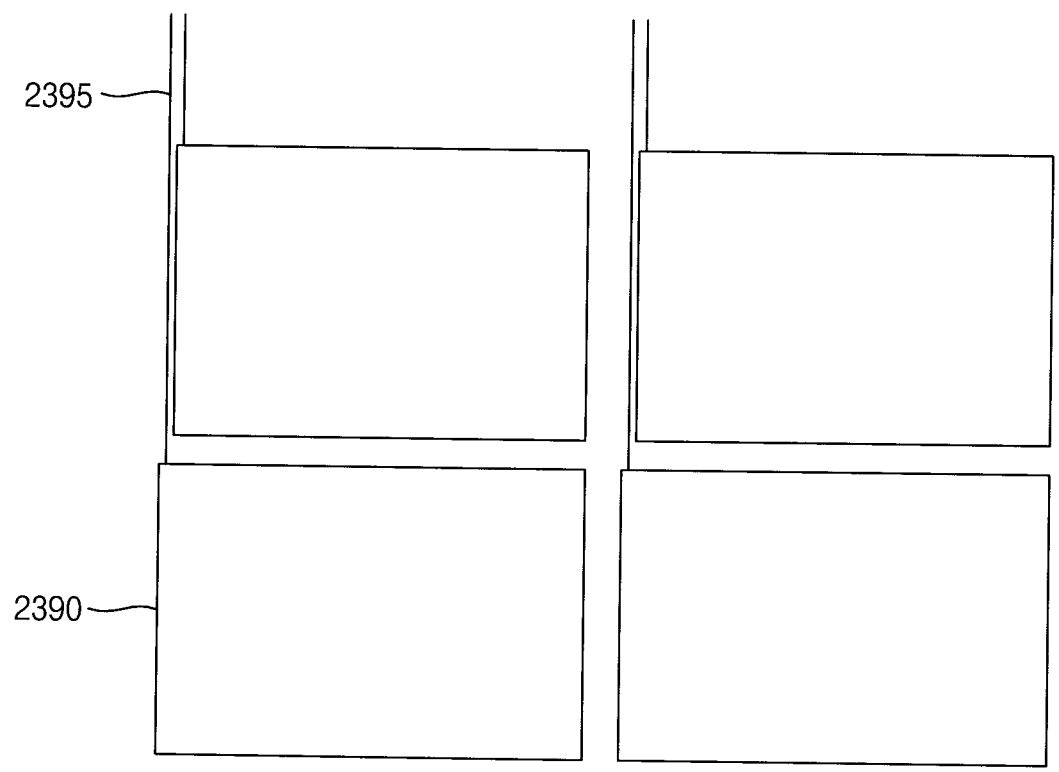
FIG. 56 is a plan view illustrating a sensing pattern of FIG. 46.
Figure 57:
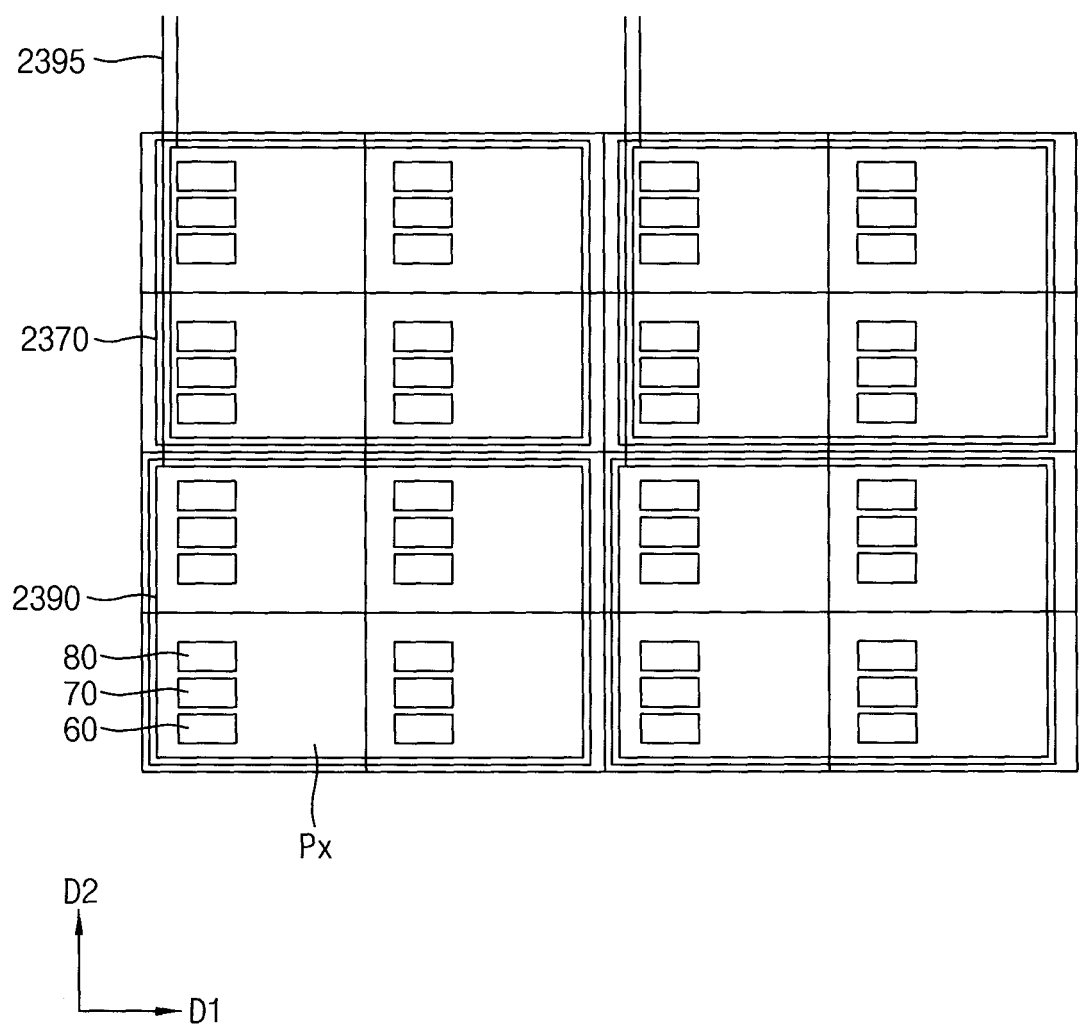
FIG. 57 is a plan view illustrating the reflection pattern of FIG. 55 and the sensing pattern of FIG. 56.

FIG. 55 is a plan view illustrating a reflection pattern of FIG. 46. FIG. 56 is a plan view illustrating a sensing pattern of FIG. 46. FIG. 57 is a plan view illustrating the reflection pattern of FIG. 55 and the sensing pattern of FIG. 56.

Referring to FIG. 46 and FIGS. 55 to 57, the reflection pattern 2370 and the sensing pattern 2390 are illustrated.

The reflection pattern 2370 is disposed only in the reflection region III. Thus, the reflection pattern 2370 is not disposed in a region that the Pixels 60, 70, and 80 are disposed. The reflection pattern 2370 is provided as one pattern. The reflection pattern 2370 is provided as a similar size as the sensing pattern 2390 in a plan view.

The sensing pattern 2390 is disposed in the light-emitting region II and the reflection region III. The sensing pattern 2390 may be electrically connected to a sensing driver (not shown) through a connection line 2395. The connection line 2395 may include the same material as that of the sensing pattern 2390. The connection line 2395 may disposed on the same layer as the sensing pattern 2390. However, the invention is not limited thereto, and the connection line 2395 may include different material from the sensing pattern 2390.

The sensing pattern 2390 may function as a sensing electrode of a touch screen panel of self capacitance type. In an exemplary embodiment, when an electric conductor is contacted, capacitance of the sensing pattern 2390 around a touch position is changed, for example. Thus, a touch panel sensor (not shown) may decide a touch position based on a capacitance sensing signal corresponding to the change of capacitance.

The sensing pattern 2390 may have a size corresponding to a predetermined number of unit pixels Px. The sensing pattern 2390 may have an appropriate size according to a size of a display device.

The reflection pattern 2370 is provided as a similar size as the sensing pattern 2390 in a plan view. The reflection pattern 2370 is electrically connected to a sensing pattern 2390 through the contact hole CNT. Accordingly, sensing electrodes of a touch screen panel of self capacitance type may have low-resistance.

Figure 58:
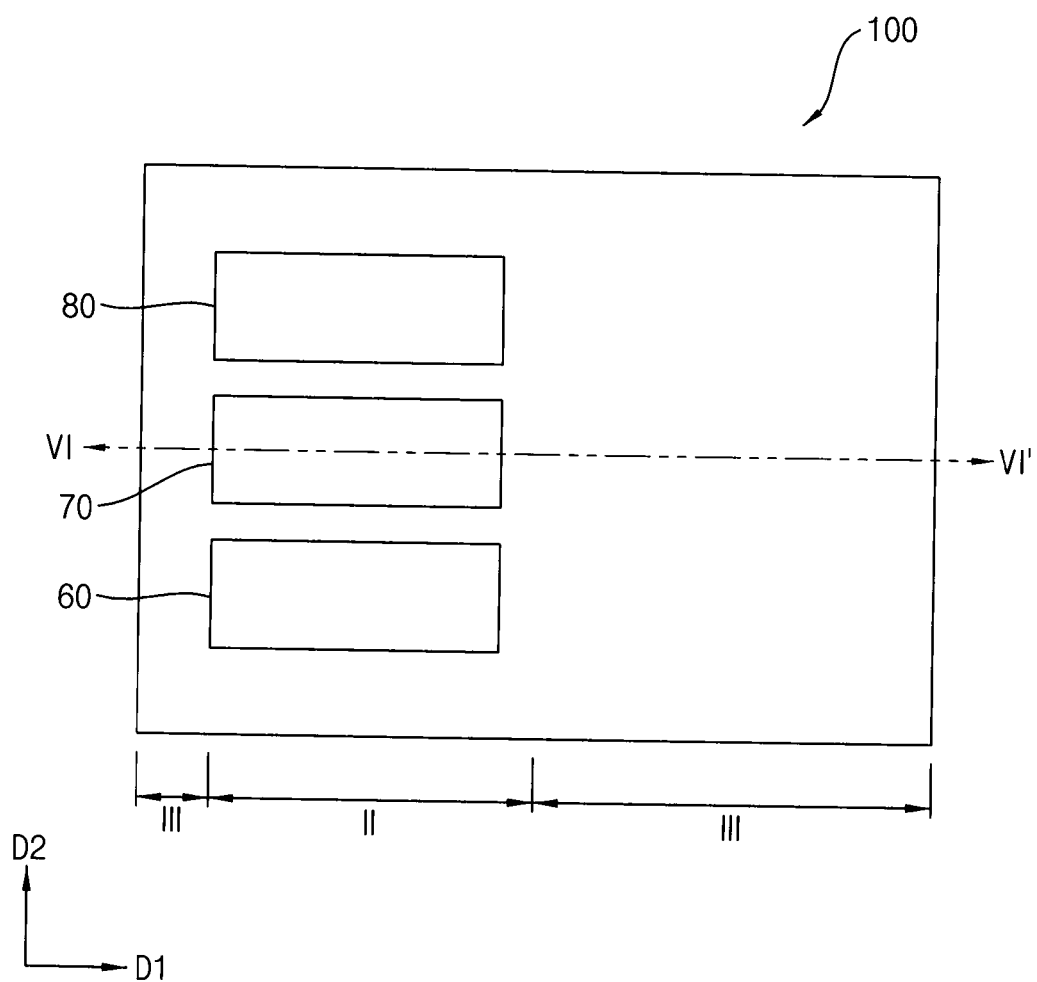
FIG. 58 is a plan view illustrating an exemplary embodiment of an OLED device according to the invention.
Figure 59:
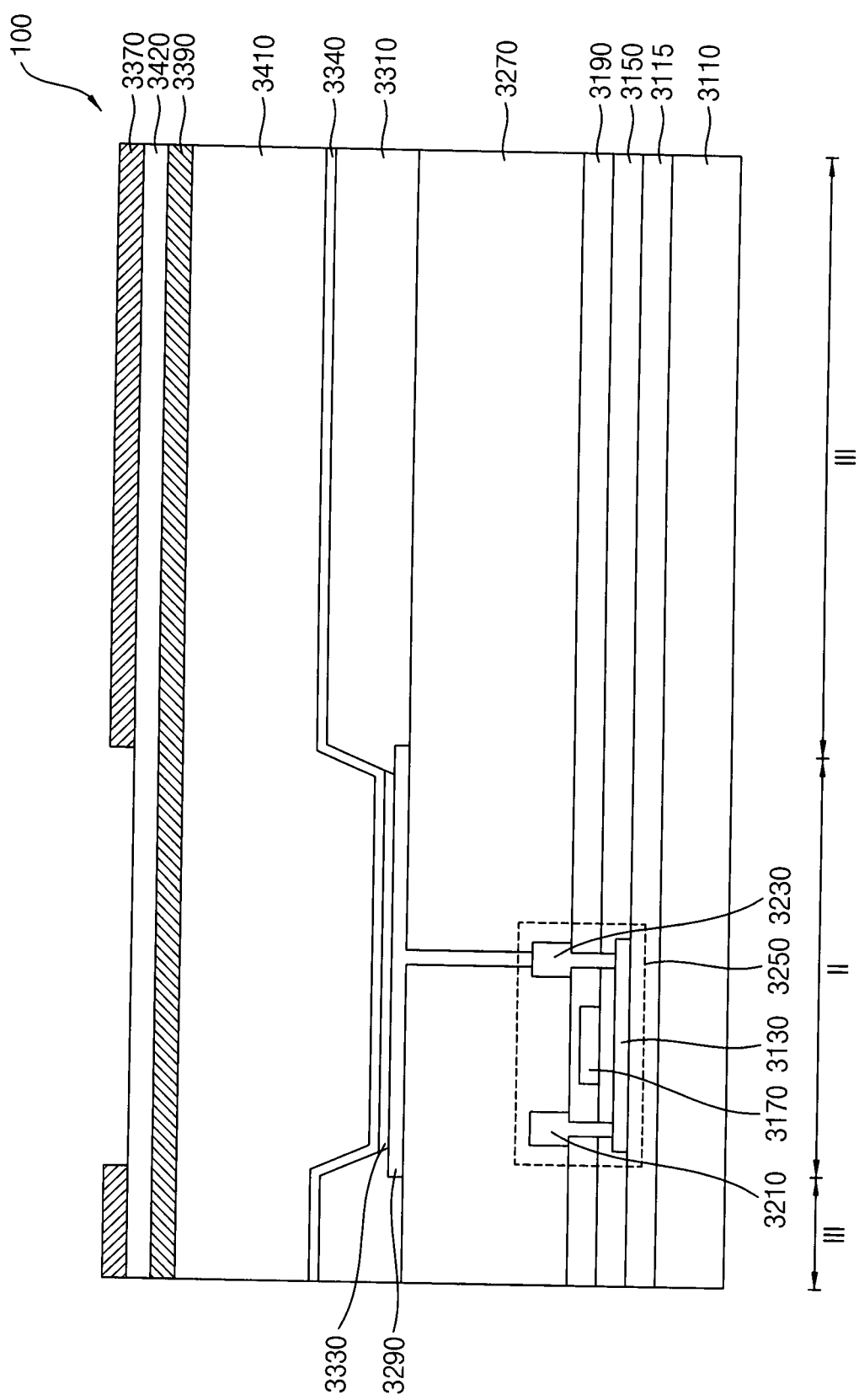
FIG. 59 is a cross-sectional view taken along line VI-VI' of FIG. 58.

FIG. 58 is a plan view illustrating an OLED device according to an exemplary embodiment of the invention FIG. 59 is a cross-sectional view taken along line VI-VI' of FIG. 58

The OLED device according to the illustrated exemplary embodiment is substantially same as the OLED device of FIGS. 1 and 2 except for a reflection pattern 3370, a thin film encapsulation layer 3410, a fourth insulation layer 3420 and a sensing pattern 3370 and thus similar reference numerals are used for same elements and repetitive explanation will be omitted.

Referring to FIGS. 58 and 59, the thin film encapsulation layer 3410 is disposed on an upper electrode 3340. The thin film encapsulation layer 3410 may be provided by stacking (e.g., sequentially stacking) a first inorganic layer, an organic layer, and a second inorganic layer.

In an exemplary embodiment, the organic layer may include a polymer, and may also be a single layer or multiple layers (e.g., stacked layers) that includes, for example, one of polyethylene terephthalate, a polyimide, a polycarbonate, an epoxy, a polyethylene and a polyacrylate. In an exemplary embodiment, the organic layer may also include a polyacrylate, for example, and the organic layer may include a polymerized monomer composition including a diacrylate monomer or a triacrylate monomer. The monomer composition may further include a monoacrylate monomer. The monomer composition may further include a suitable photoinitiator such as thermoplastic polyolefin ("TPO"), but is not limited thereto.

The first inorganic layer and the second inorganic layer may be single layers or stacked layers including a metal oxide or a metal nitride. In an exemplary embodiment, the first inorganic layer and the second inorganic layer may include at least one of silicon nitride SiNx), aluminum oxide (e.g., Al2O3), silicon oxide (e.g., SiO2), and titanium oxide (e.g., TiO2). In this case, the second inorganic layer may prevent or reduce moisture from permeating into the light-emitting structure.

The sensing pattern 3390 is disposed on the thin film encapsulation layer 3410. The sensing pattern 3390 may be disposed in the light-emitting region II and the reflection region III.

The sensing pattern 3390 may include a material having a predetermined reflectivity. In an exemplary embodiment, the sensing pattern 3390 may include at least one of gold (Au), silver (Ag), aluminum (Al), magnesium (Mg), platinum (Pt), Nickel (Ni), titanium (Ti), etc., for example. In an alternative exemplary embodiment, the sensing pattern 3390 may include at least one of an alloy, metal nitride, conductive metal oxide, etc., for example. In an exemplary embodiment, the sensing pattern 3390 may include at least one of an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The fourth insulation layer 3420 is disposed on the sensing pattern 3390. The fourth insulation layer 3420 may include an adhesive material.

The reflection pattern 3370 is disposed on the fourth insulation layer 3420. The reflection pattern 3370 may be disposed in the reflection region III.

The reflection pattern 3370 may include a material having a predetermined reflectivity. In an exemplary embodiment, the reflection pattern 3370 may include at least one of gold (Au), silver (Ag), aluminum (Al), magnesium (Mg), platinum (Pt), Nickel (Ni), titanium (Ti), etc., for example. In an alternative exemplary embodiment, the reflection pattern 3370 may include at least one of an alloy, metal nitride, conductive metal oxide, etc., for example. In an exemplary embodiment, the reflection pattern 3370 may include at least one of an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The sensing pattern 3390 may function as a sensing electrode of a touch screen panel of self capacitance type. In an exemplary embodiment, when an electric conductor is contacted, capacitance of the sensing pattern 3390 around a touch position is changed, for example. Thus, a touch panel sensor (not shown) may decide a touch position based on a capacitance sensing signal corresponding to the change of capacitance. However, the invention is not limited thereto, and the reflection pattern 3370 may function as a sensing electrode of a touch screen panel of self capacitance type. In addition, both the reflection pattern 3370 and the sensing pattern 3390 may function as a sensing electrode of a touch screen panel of self capacitance type.

FIGS. 60 to 67 are cross-sectional views illustrating a method of manufacturing the OLED device of FIG. 59.

Figure 60:
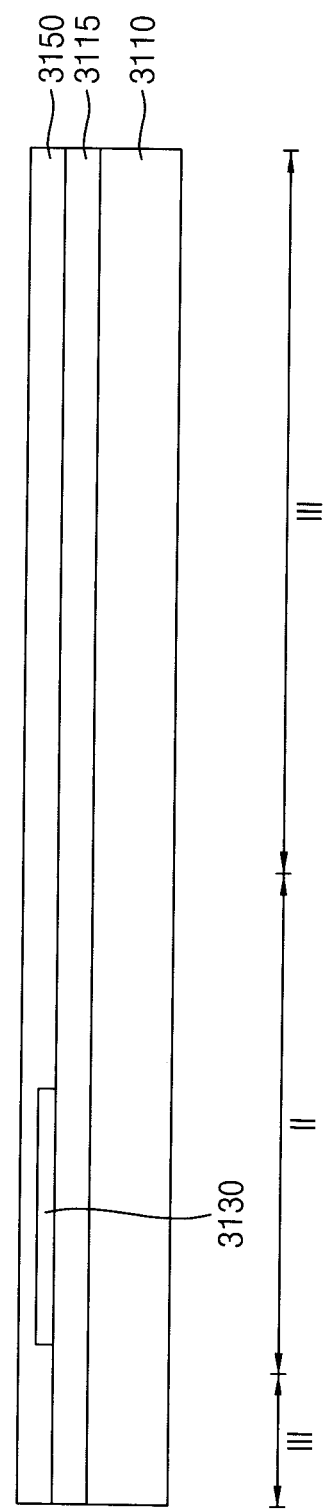
FIGS. 60 to 67 are cross-sectional views illustrating a method of manufacturing the OLED device of FIG. 59.

Referring to FIG. 60, the buffer layer 3115 is disposed on the first substrate 3110. Thereafter, the active pattern 3130 and the first insulation layer 3150 are disposed on the buffer layer 3115.

In an exemplary embodiment, the first substrate 3110 may include at least one of quartz, synthetic quartz, calcium fluoride, fluoride-doping quartz, a sodalime glass, a non-alkali glass etc., for example.

A buffer layer 3115 may be disposed on the first substrate 3110. The buffer layer 3115 may extend from the light-emitting region II into the reflection region III. The buffer layer 3115 may prevent the diffusion (e.g., an out gassing) of metal atoms and/or impurities from the first substrate 3110. Additionally, the buffer layer 3115 may control a rate of a heat transfer in a crystallization process for forming the active pattern 3130, thereby obtaining substantially uniform the active pattern 3130. Furthermore, the buffer layer 3115 may improve a surface flatness of the first substrate 3110 when a surface of the first substrate 3110 is relatively irregular. According to a type of the first substrate 3110, at least two buffer layers may be provided on the first substrate 3110, or the buffer layer may not be disposed.

In an exemplary embodiment, the active pattern 3130 may include at least one of an oxide semiconductor, an inorganic semiconductor (e.g., amorphous silicon, polysilicon, etc.), an organic semiconductor, etc., for example.

The first insulation layer 3150 may be disposed on the active pattern 3130. The first insulation layer 3150 may cover the active pattern 3130 in the light-emitting region II, and may extend in the first direction on the first substrate 3110. That is, the first insulation layer 3150 may be disposed on the entire first substrate 3110. In an exemplary embodiment, the first insulation layer 3150 may include at least one of a silicon compound, a metal oxide, etc., for example.

Figure 61:
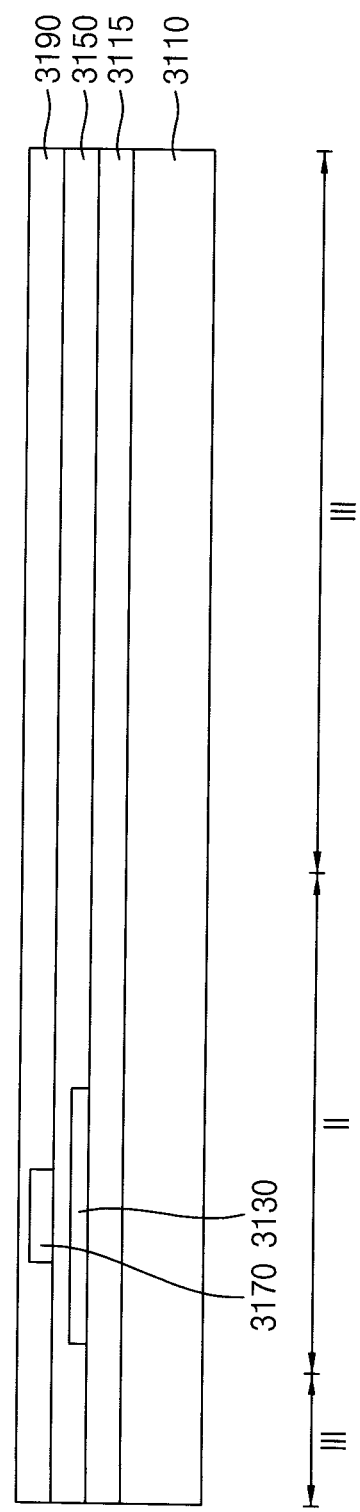

Referring to FIG. 61, the gate electrode 3170 and the second insulation layer 3190 are disposed on the first substrate 3110 on which the first insulation layer 3150 is disposed.

The gate electrode 3170 may be disposed on a portion of the first insulation layer 3150 under which the active pattern 3130 is disposed. In an exemplary embodiment, the gate electrode 3170 may include at least one of a metal, an alloy, metal nitride, conductive metal oxide, transparent conductive materials, etc., for example.

The second insulation layer 3190 may be disposed on the gate electrode 3170. The second insulation layer 3190 may cover the gate electrode 3170 in the light-emitting region II, and may extend in the first direction on the first substrate 3110. That is, the second insulation layer 3190 may be disposed on the entire first substrate 3110. In an exemplary embodiment, the second insulation layer 3190 may include at least one of a silicon compound, a metal oxide, etc., for example.

Figure 62:
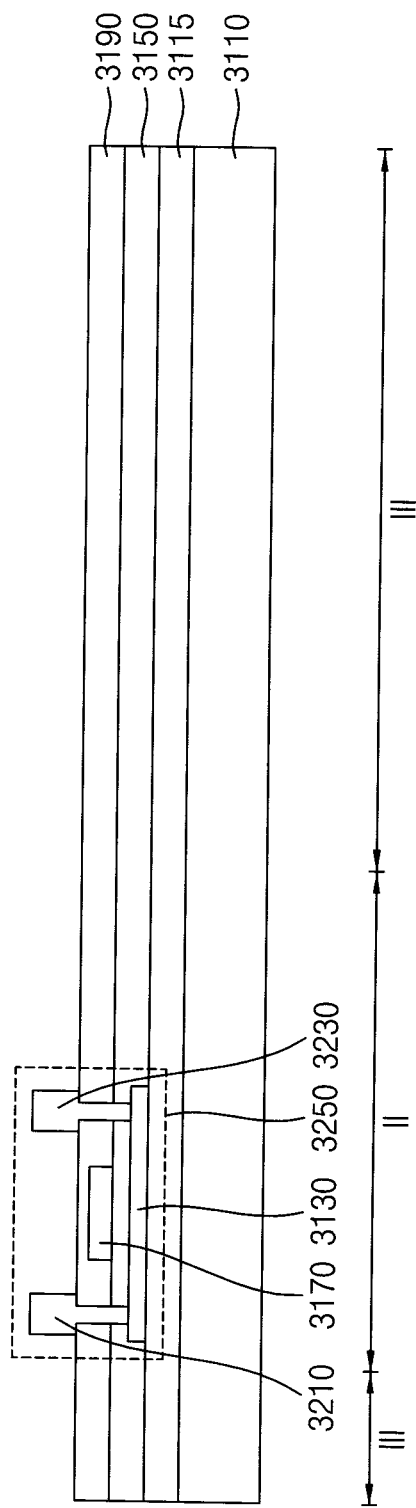

Referring to FIG. 62, the source electrode 3210 and the drain electrode 3230 are disposed on the first substrate 3110 on which the second insulation layer 3190 is disposed.

The source electrode 3210 and the drain electrode 3230 may be disposed on the second insulation layer 3190. The source electrode 3210 may contact a first side of the active layer 3130 by removing a portion of the first and second insulation layers 3150 and 3190. The drain electrode 3230 may contact a second side of the active layer 3130 by removing a second portion of the first and second insulation layers 3150 and 3190. In an exemplary embodiment, each of the source electrode 3210 and the drain electrode 3230 may include at least one of a metal, an alloy, metal nitride, conductive metal oxide, transparent conductive materials, etc., for example.

Figure 63:
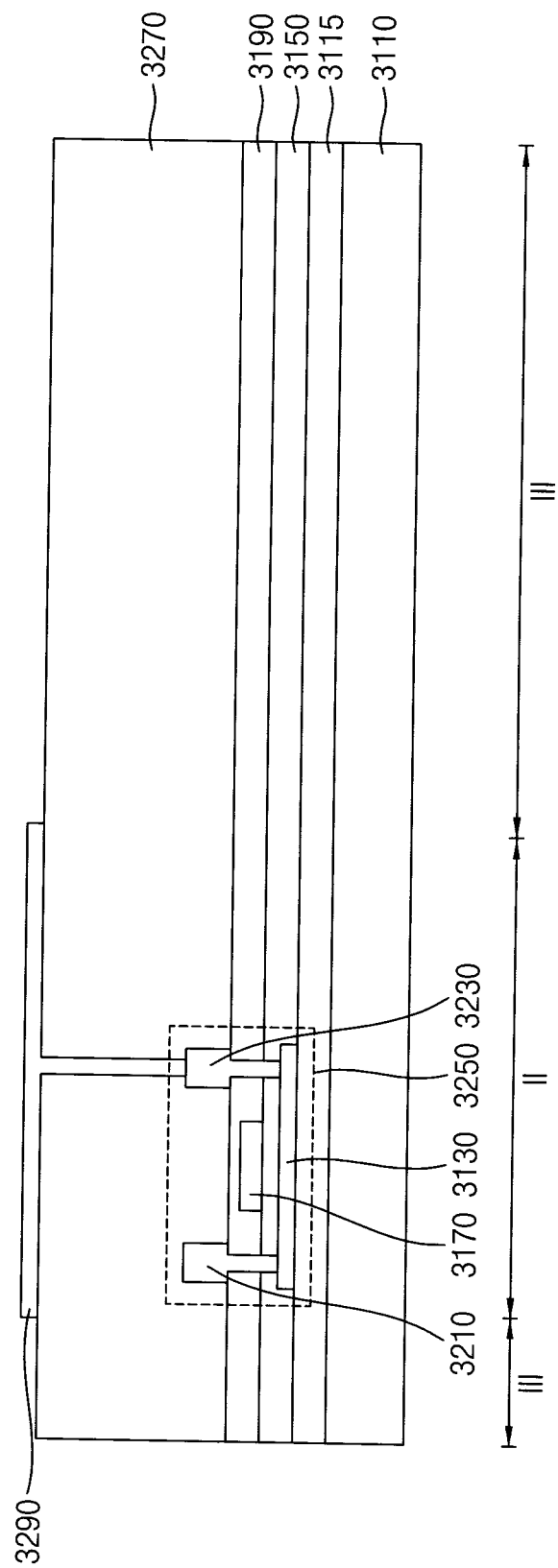

Referring to FIG. 63, the third insulation layer 3270 and the lower electrode 3290 are disposed on the first substrate 3110 on which the source electrode 3210 and the drain electrode 3230 are disposed.

The third insulation layer 3270 may be disposed on the source electrode 3210 and the drain electrode 3230. The third insulation layer 3270 may cover the source electrode 3210 and the drain electrode 3230 in the sub-pixel region II, and may extend in the first direction on the first substrate 3110. That is, the third insulation layer 3270 may be disposed on the entire first substrate 3110. In an exemplary embodiment, the third insulation layer 3270 may include at least one of a silicon compound, a metal oxide, etc., for example.

The lower electrode 3290 may be disposed on the third insulation layer 3270. The lower electrode 3290 may contact the drain electrode 3230 by removing a portion of the third insulation layer 3270. In addition, the lower electrode 3290 may be electrically connected to the semiconductor element 3250. In an exemplary embodiment, the lower electrode 3290 may include at least one of a metal, an alloy, metal nitride, conductive metal oxide, transparent conductive materials, etc., for example.

Figure 64:
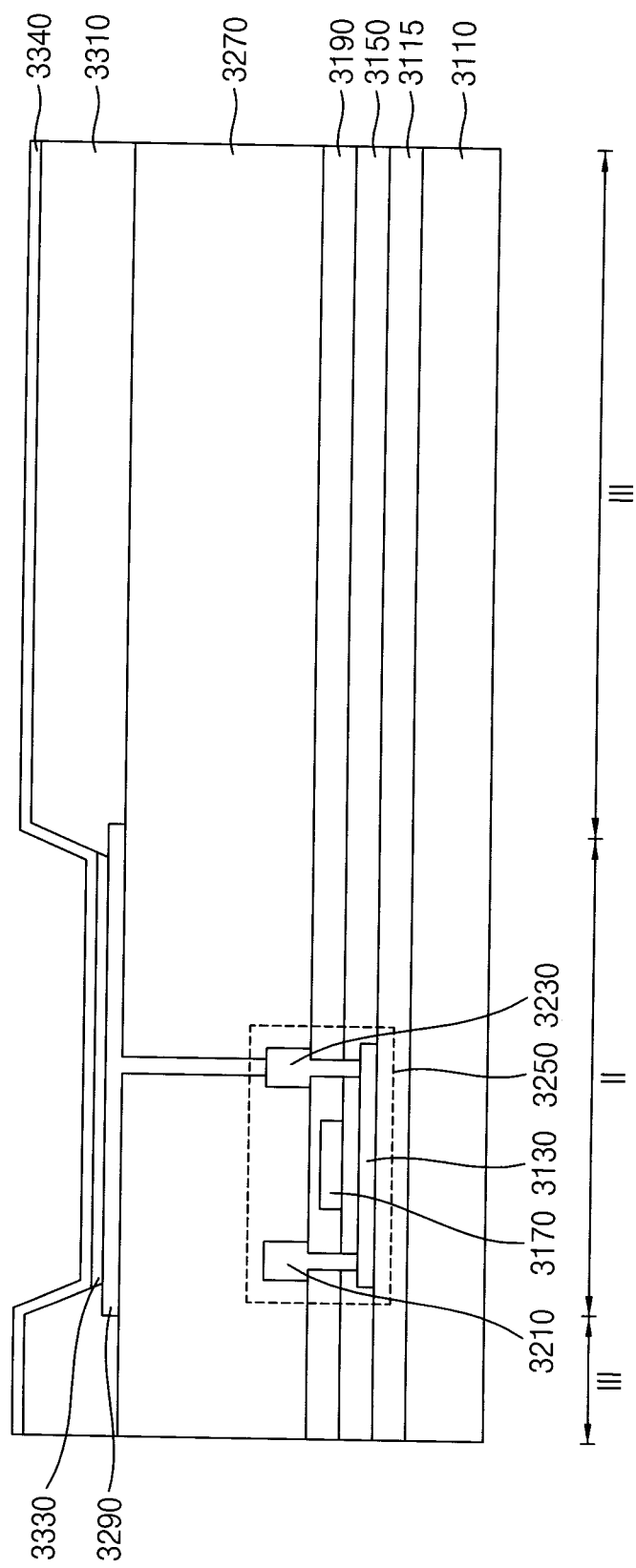

Referring to FIG. 64, the pixel defining layer 3310, the light emitting layer 3330 and the upper electrode 3340 are disposed on the first substrate 3110 on which the lower electrode 3290 is disposed.

The pixel defining layer 3310 may be disposed the on third insulation layer 3270 to expose a portion of the lower electrode 3290. The pixel defining layer 3310 may include organic materials or inorganic materials. In this case, the light emitting layer 3330 may be disposed on a portion that the lower electrode 3290 is exposed by the pixel defining layer 3310.

The light emitting layer 3330 may be disposed on the exposed lower electrode 3290. The light emitting layer 3330 may be provided using light emitting materials generating different colors of light (e.g., a red color of light, a blue color of light, and a green color of light).

The upper electrode 3340 may be disposed on the pixel defining layer 3310 and the light emitting layer 3330. The upper electrode 3340 may cover the pixel defining layer 3310 and the light emitting layer 3330 in light-emitting region II and the reflection region III, and may extend in the first direction on the first substrate 3110. That is, the upper electrode 3340 may be electrically connected to the first through third pixels. In an exemplary embodiment, the upper electrode 3340 may include at least one of a metal, an alloy, metal nitride, conductive metal oxide, a transparent conductive material, etc., for example. These may be used alone or in a combination thereof.

Figure 65:
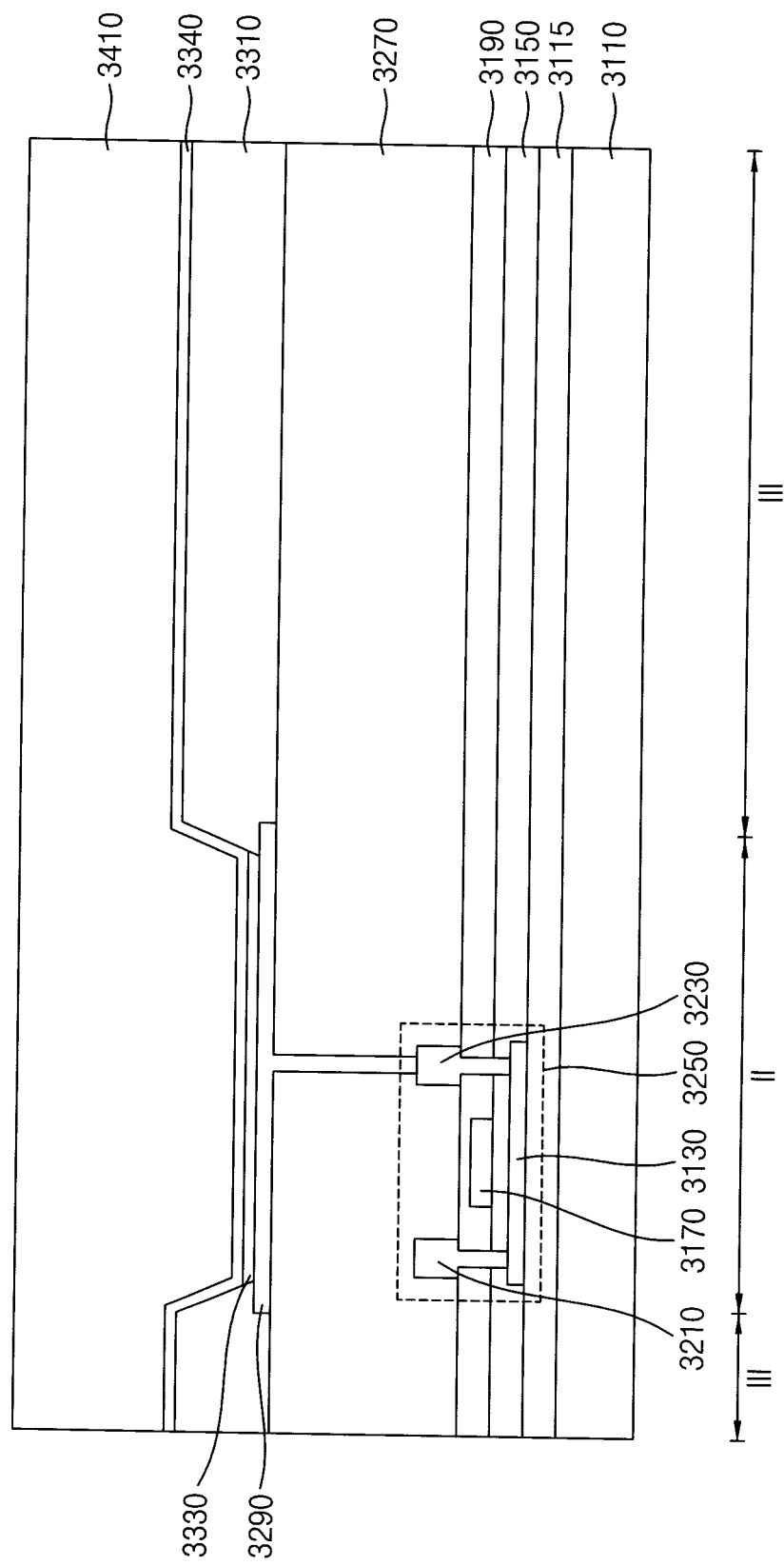

Referring to FIG. 65, the thin film encapsulation layer 3410 is disposed on the first substrate 3110 on which the upper electrode 3340 is disposed.

The thin film encapsulation layer 3410 may be provided by stacking (e.g., sequentially stacking) a first inorganic layer, an organic layer, and a second inorganic layer.

In an exemplary embodiment, the organic layer may include a polymer, and may also be a single layer or multiple layers (e.g., stacked layers) that includes, for example, one of polyethylene terephthalate, a polyimide, a polycarbonate, an epoxy, a polyethylene and a polyacrylate. In an exemplary embodiment, the organic layer may also include a polyacrylate, for example, the organic layer may include a polymerized monomer composition including a diacrylate monomer or a triacrylate monomer. The monomer composition may further include a monoacrylate monomer. The monomer composition may further include a suitable photoinitiator such as TPO, but is not limited thereto.

The first inorganic layer and the second inorganic layer may be single layers or stacked layers including a metal oxide or a metal nitride. In an exemplary embodiment, the first inorganic layer and the second inorganic layer may include at least one of silicon nitride (e.g., SiNx), aluminum oxide (e.g., Al2O3), silicon oxide (e.g., SiO2), and titanium oxide (e.g., TiO2), for example. In this case, the second inorganic layer may prevent or reduce moisture from permeating into the light-emitting structure.

Figure 66:
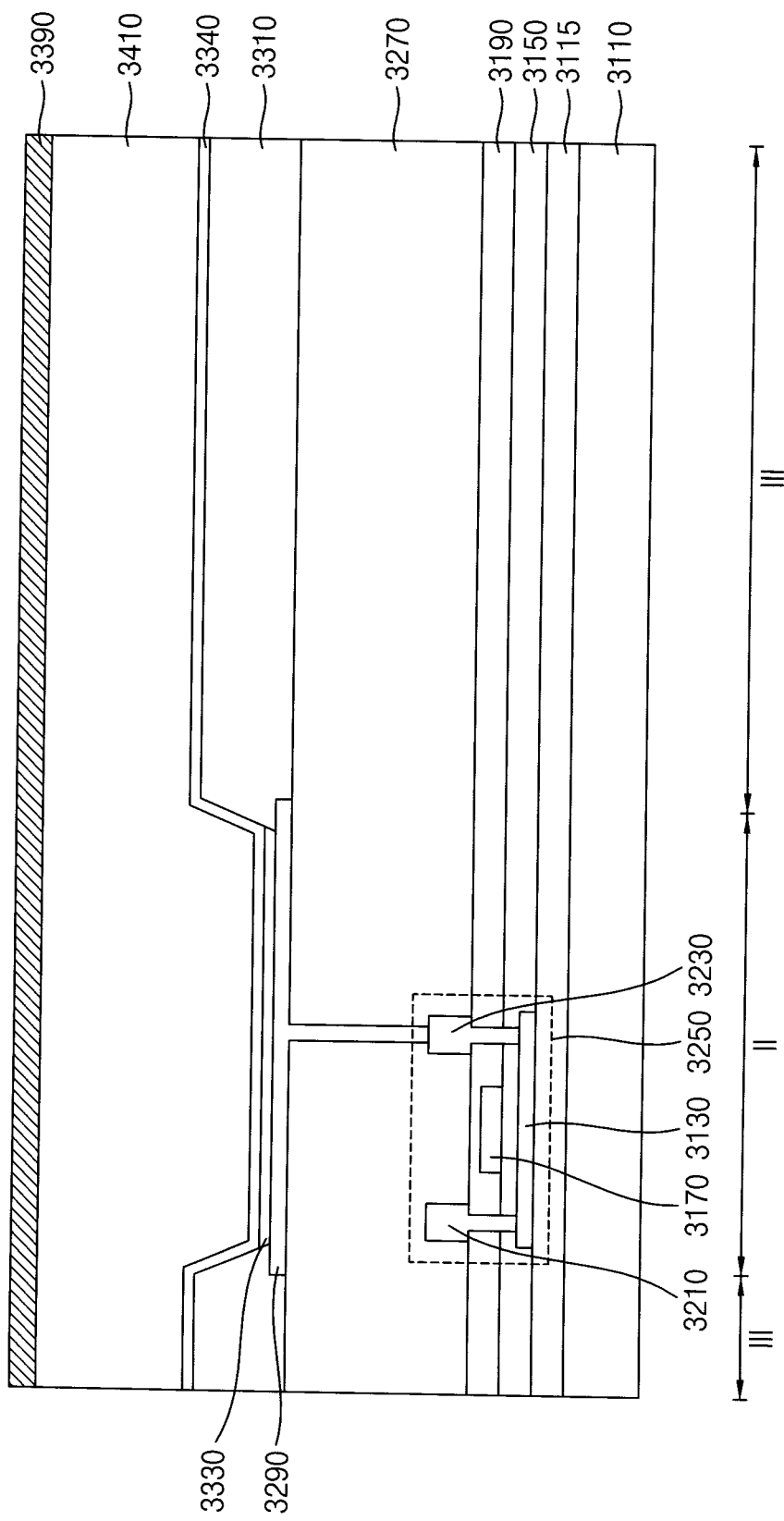

Referring to FIG. 66, the sensing pattern 3390 is disposed on the first substrate 3110 on which the thin film encapsulation layer 3410 is disposed.

The sensing pattern 3390 may be disposed in the light-emitting region II and the reflection region III.

The sensing pattern 3390 may include a material having a predetermined reflectivity. In an exemplary embodiment, the sensing pattern 3390 may include at least one of gold (Au), silver (Ag), aluminum (Al), magnesium (Mg), platinum (Pt), Nickel (Ni), titanium (Ti), etc., for example. In an alternative exemplary embodiment, the sensing pattern 3390 may include at least one of an alloy, metal nitride, conductive metal oxide, etc., for example. In an exemplary embodiment, the sensing pattern 3390 may include at least one of an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

Figure 67:
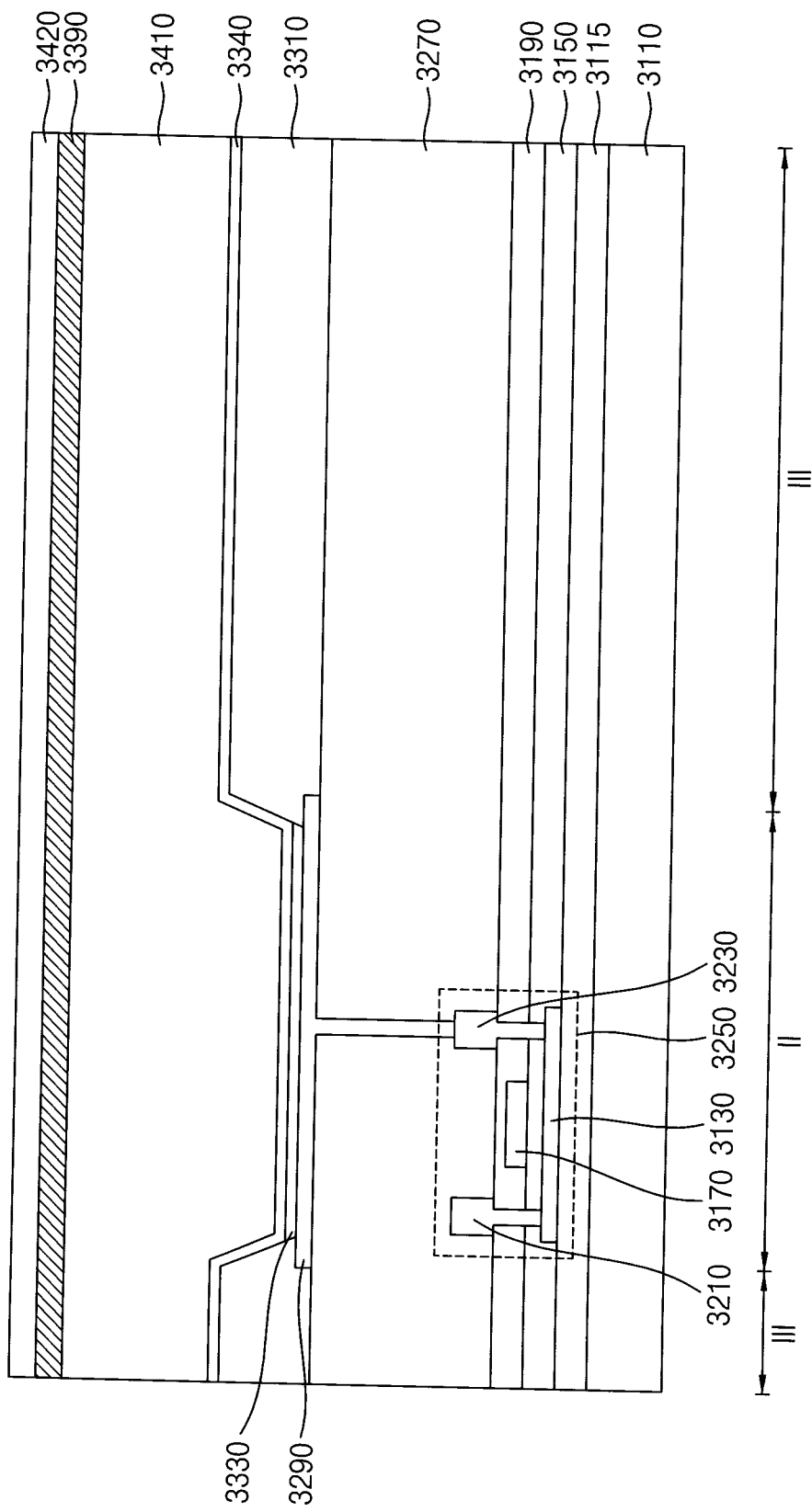

Referring to FIG. 67, the fourth insulation layer 3420 is disposed on the first substrate 3110 on which the sensing pattern 3390 is disposed.

The fourth insulation layer 3420 is disposed on the sensing pattern 3390. The fourth insulation layer 3420 may prevent from oxidation of the sensing pattern 3390. The fourth insulation layer 3420 may include an adhesive material. The fourth insulation layer 3420 may insulate between the reflection pattern 3370 and the sensing pattern 3390.

Referring to FIG. 59, the reflection pattern 3370 is disposed on the first substrate 3110 on which the fourth insulation layer 3420 is disposed.

The reflection pattern 3370 may be disposed in the reflection region III.

The reflection pattern 3370 may include a material having a predetermined reflectivity. In an exemplary embodiment, the reflection pattern 3370 may include at least one of gold (Au), silver (Ag), aluminum (Al), magnesium (Mg), platinum (Pt), Nickel (Ni), titanium (Ti), etc., for example. In an alternative exemplary embodiment, the reflection pattern 3370 may include at least one of an alloy, metal nitride, conductive metal oxide, etc., for example. In an exemplary embodiment, the reflection pattern 3370 may include at least one of an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

Figure 68:
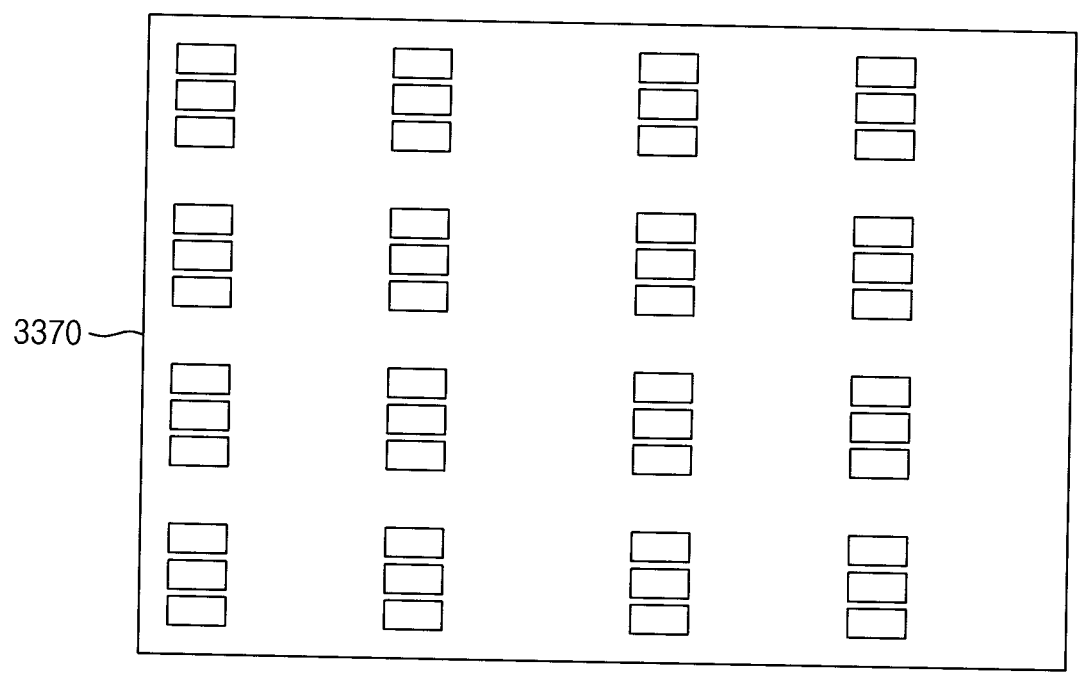
FIG. 68 is a plan view illustrating a reflection pattern of FIG. 59.
Figure 69:
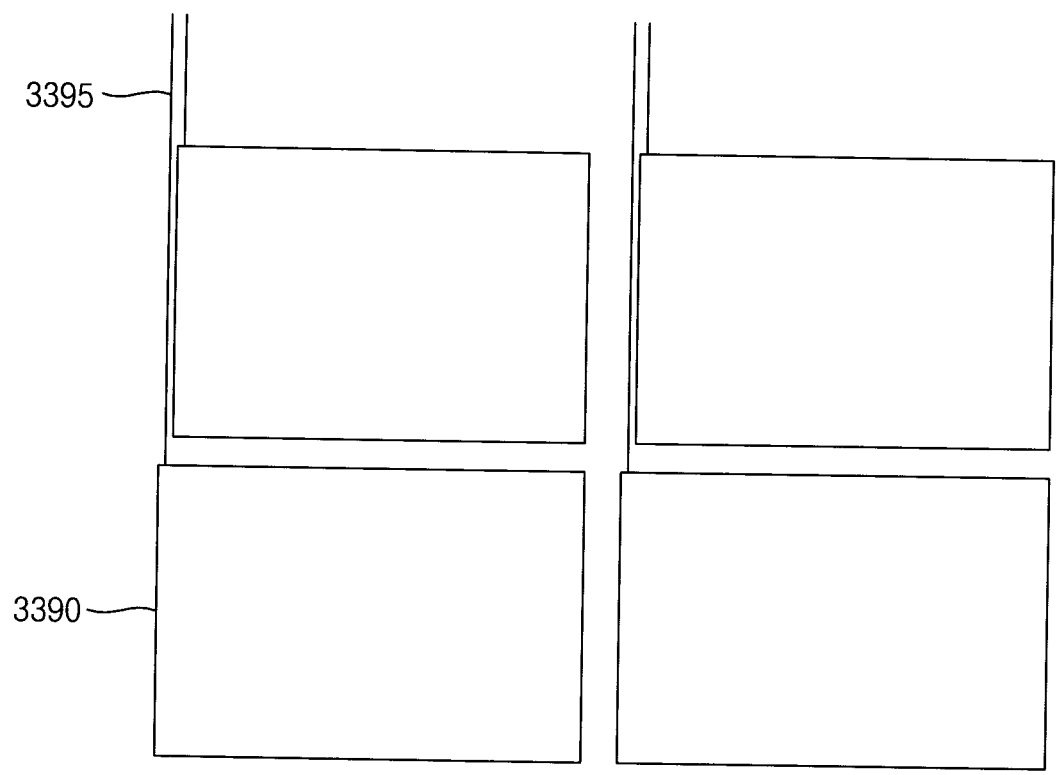
FIG. 69 is a plan view illustrating a sensing pattern of FIG. 59.
Figure 70:
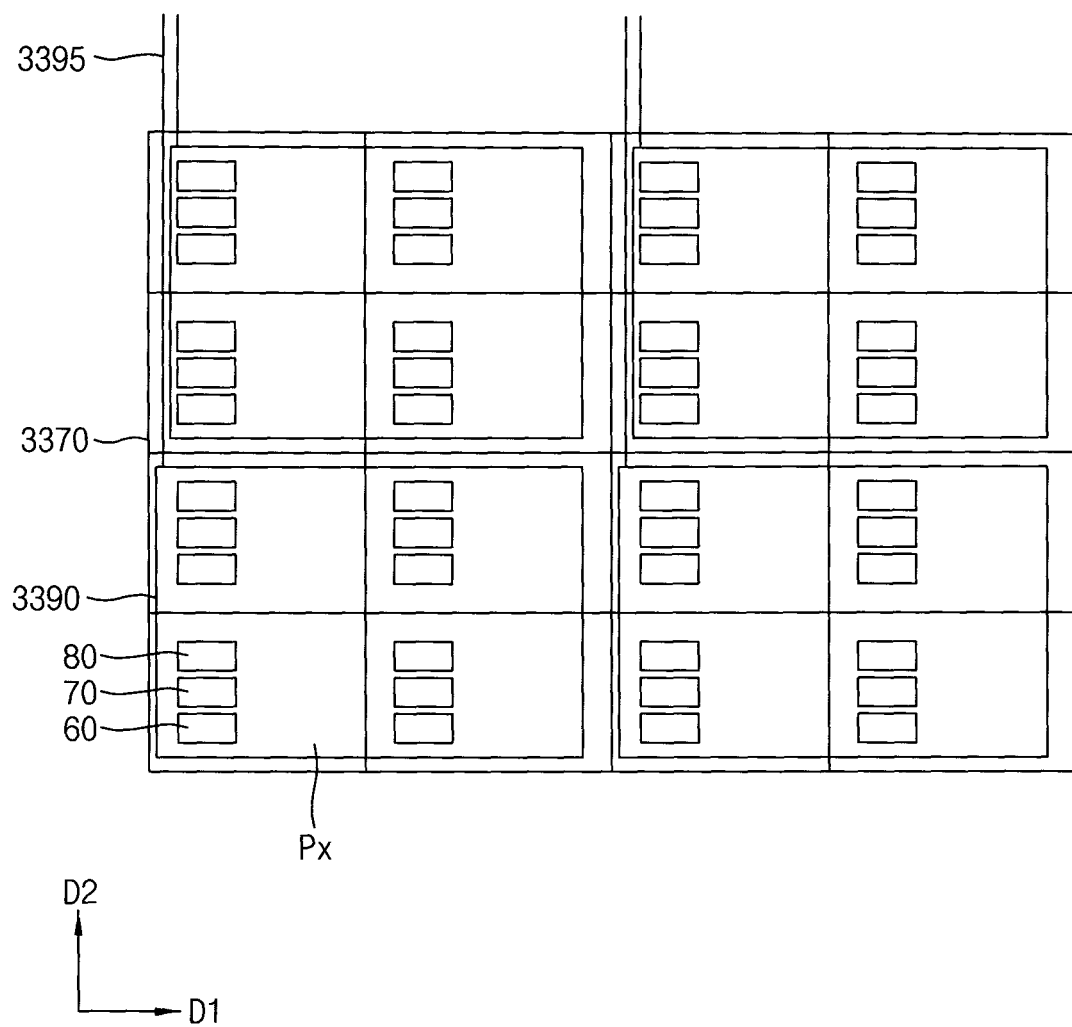
FIG. 70 is a plan view illustrating the reflection pattern of FIG. 68 and the sensing pattern of FIG. 69.

FIG. 68 is a plan view illustrating a reflection pattern of FIG. 59. FIG. 69 is a plan view illustrating a sensing pattern of FIG. 59. FIG. 70 is a plan view illustrating the reflection pattern of FIG. 68 and the sensing pattern of FIG. 69.

Referring to FIG. 59 and FIGS. 68 to 70, the reflection pattern 3370 and the sensing pattern 3390 are illustrated.

The reflection pattern 3370 is disposed only in the reflection region III. Thus, the reflection pattern 3370 is not disposed in a region that the Pixels 60, 70, and 80 are disposed. The reflection pattern 3370 is provided as one pattern.

The sensing pattern 3390 is disposed in the light-emitting region II and the reflection region III. The sensing pattern 3390 may be electrically connected to a sensing driver (not shown) through a connection line 3395. The connection line 3395 may include the same material as that of the sensing pattern 3390. The connection line 3395 may disposed on the same layer as the sensing pattern 3390. However, the invention is not limited thereto, and the connection line 3395 may include different material from the sensing pattern 3390.

The sensing pattern 3390 may function as a sensing electrode of a touch screen panel of self capacitance type. In an exemplary embodiment, when an electric conductor is contacted, capacitance of the sensing pattern 3390 around a touch position is changed, for example. Thus, a touch panel sensor (not shown) may decide a touch position based on a capacitance sensing signal corresponding to the change of capacitance.

The sensing pattern 3390 may have a size corresponding to a predetermined number of unit pixels Px. The sensing pattern 3390 may have an appropriate size according to a size of a display device.

Figure 71:
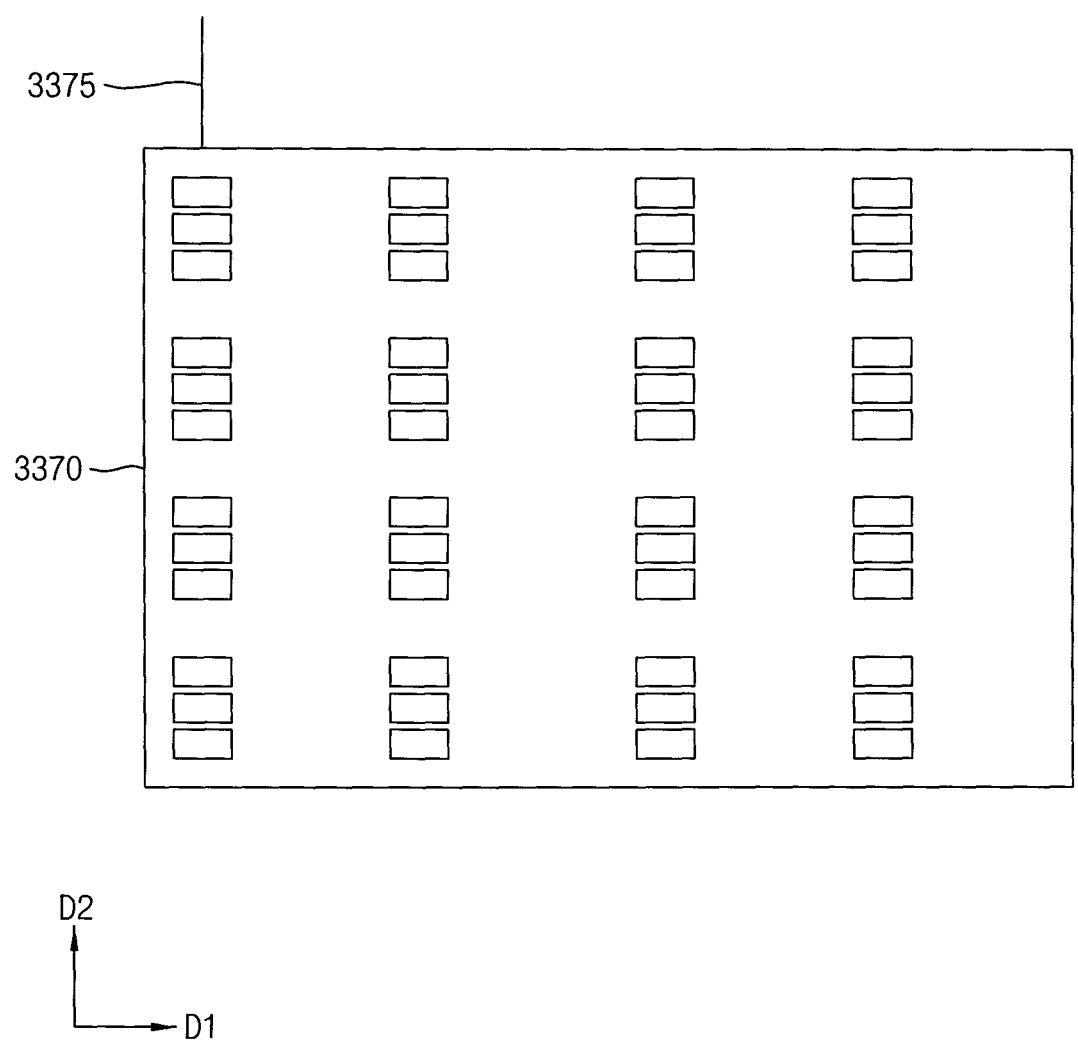
FIG. 71 is a plan view illustrating a reflection pattern of FIG. 59.
Figure 72:
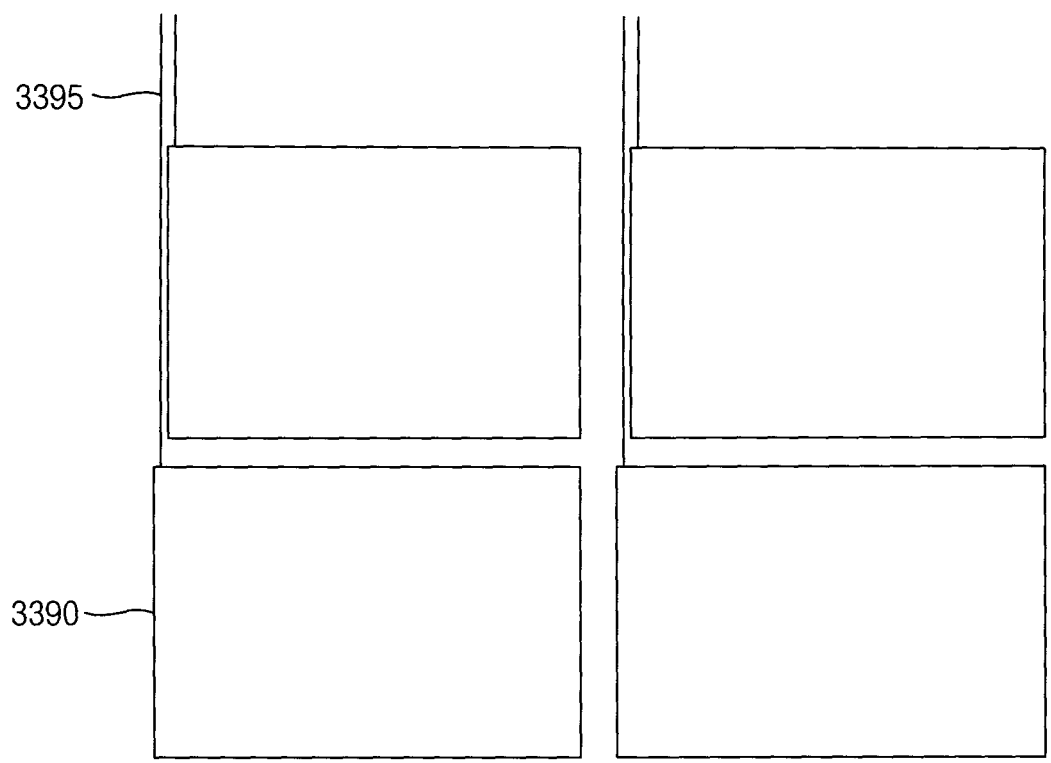
FIG. 72 is a plan view illustrating a sensing pattern of FIG. 59.
Figure 73:
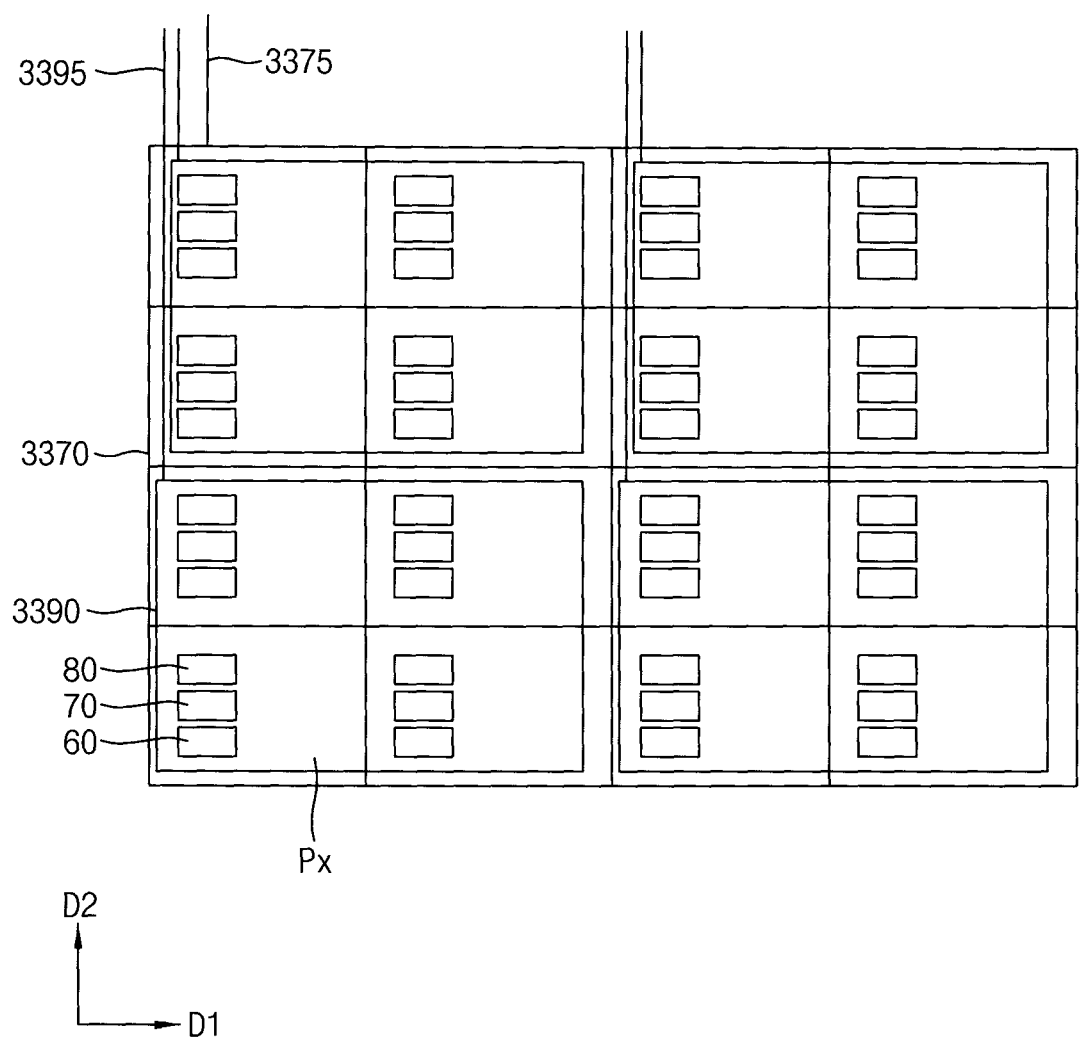
FIG. 73 is a plan view illustrating the reflection pattern of FIG. 71 and the sensing pattern of FIG. 72.

FIG. 71 is a plan view illustrating a reflection pattern of FIG. 59. FIG. 72 is a plan view illustrating a sensing pattern of FIG. 59. FIG. 73 is a plan view illustrating the reflection pattern of FIG. 71 and the sensing pattern of FIG. 72.

Referring to FIG. 59 and FIGS. 71 to 73, the reflection pattern 3370 and the sensing pattern 3390 are illustrated.

The reflection pattern 3370 is disposed only in the reflection region III. Thus, the reflection pattern 3370 is not disposed in a region that the Pixels 60, 70, and 80 are disposed. The reflection pattern 3370 may function as a sensing electrode of a touch screen panel of self capacitance type. The reflection pattern 3370 may have a size corresponding to a predetermined number of unit pixels Px. The reflection pattern 3370 may have an appropriate size according to a size of a display device.

The reflection pattern 3370 may be electrically connected to a sensing driver (not shown) through a first connection line 3375. The first connection line 3375 may include the same material as that of the reflection pattern 3370. The first connection line 3375 may disposed on the same layer as the reflection pattern 3370. However, the invention is not limited thereto, and the first connection line 3375 may include different material from the reflection pattern 3370.

The sensing pattern 3390 is disposed in the light-emitting region II and the reflection region III. The sensing pattern 3390 may be electrically connected to a sensing driver (not shown) through a second connection line 3395. The second connection line 3395 may include the same material as that of the sensing pattern 3390. The second connection line 3395 may disposed on the same layer as the sensing pattern 3390. However, the invention is not limited thereto, and the second connection line 3395 may include different material from the sensing pattern 3390.

The sensing pattern 3390 may function as a sensing electrode of a touch screen panel of self capacitance type. In an exemplary embodiment, when an electric conductor is contacted, capacitance of the sensing pattern 3390 around a touch position is changed, for example. Thus, a touch panel sensor (not shown) may decide a touch position based on a capacitance sensing signal corresponding to the change of capacitance.

The sensing pattern 3390 may have a size corresponding to a predetermined number of unit pixels Px. The sensing pattern 3390 may have an appropriate size according to a size of a display device.

In the illustrated exemplary embodiment, a size of the reflection pattern 3370 may be bigger than a size of the sensing pattern 3390, in an exemplary embodiment, the reflection pattern 3370 may have a size corresponding to four reflection patterns 3370. However, the invention is not limited thereto, and the reflection pattern 3370 may have a various size.

Since the reflection pattern 3370 is provided as relatively big area, the reflection pattern 3370 may detect touch position of a wide range. Thus, reflection pattern 3370 senses a touch position of a wide range, and after the reflection pattern 3370 senses the touch position, the sensing pattern 3390 senses an accurate touch position. Accordingly, high speed driving of a touch screen panel may be performed.

Figure 74:
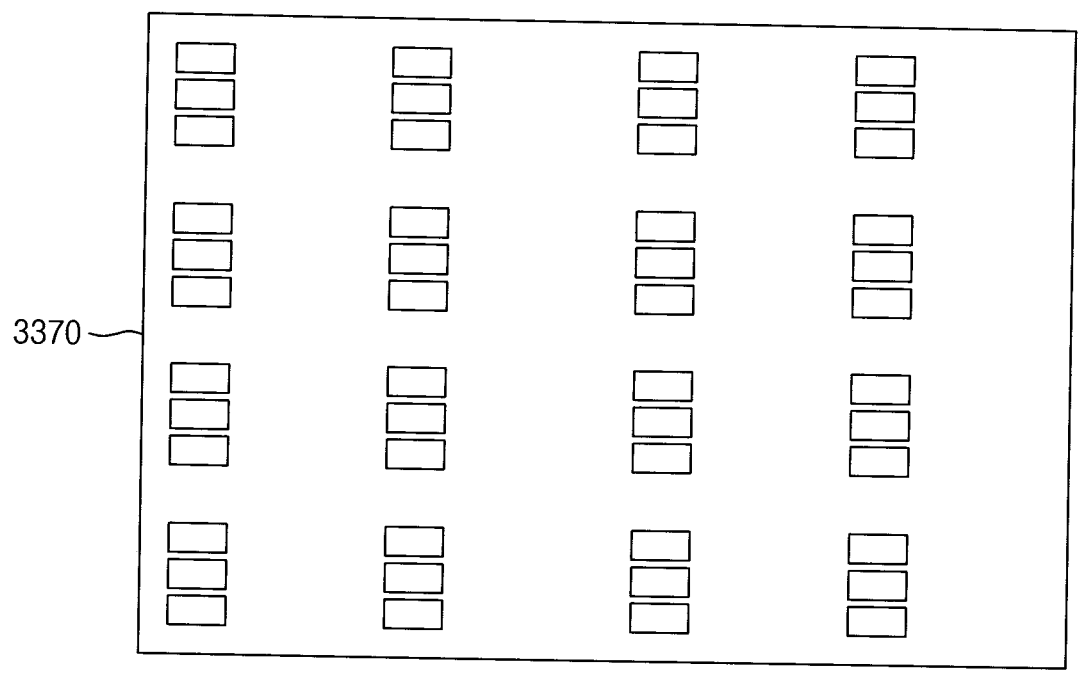
FIG. 74 is a plan view illustrating a reflection pattern of FIG. 59.
Figure 75:
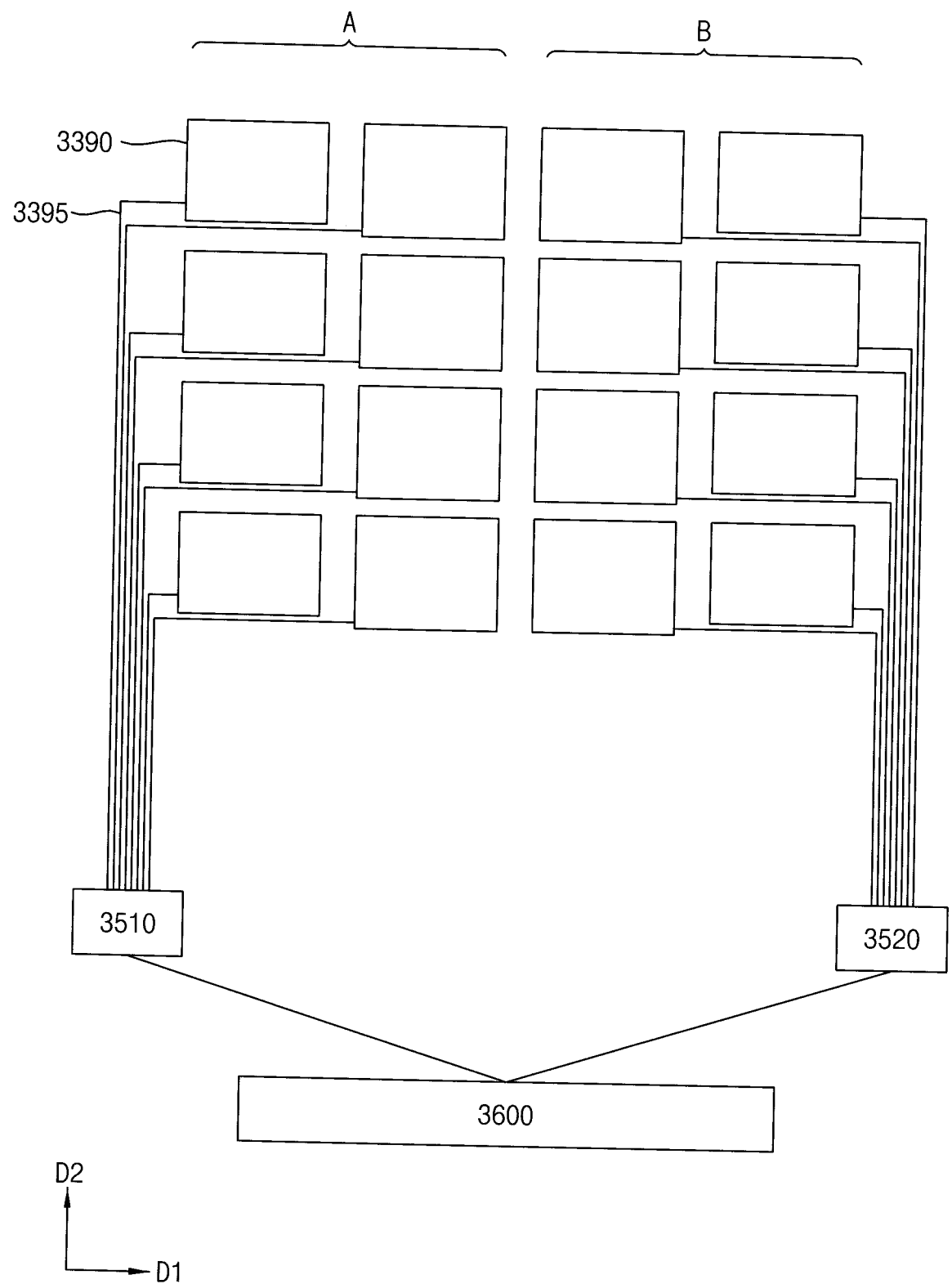
FIG. 75 is a plan view illustrating a sensing pattern of FIG. 59.
Figure 76:
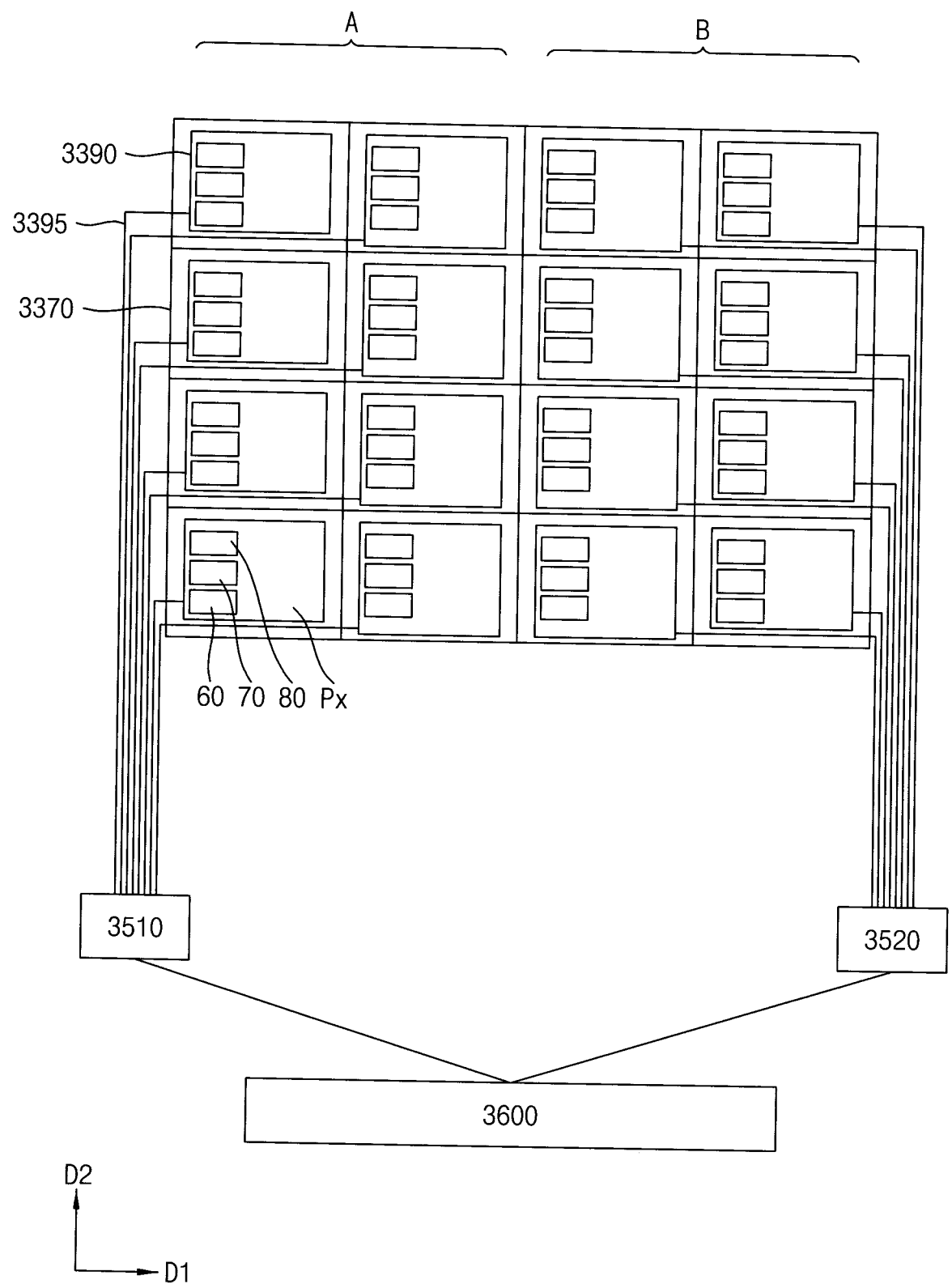
FIG. 76 is a plan view illustrating the reflection pattern of FIG. 74 and the sensing pattern of FIG. 75.

FIG. 74 is a plan view illustrating a reflection pattern of FIG. 59. FIG. 75 is a plan view illustrating a sensing pattern of FIG. 59. FIG. 76 is a plan view illustrating the reflection pattern of FIG. 74 and the sensing pattern of FIG. 75.

Referring to FIG. 59 and FIGS. 74 to 76, the reflection pattern 3370 and the sensing pattern 3390 are illustrated.

The reflection pattern 3370 is disposed only in the reflection region III. Thus, the reflection pattern 3370 is not disposed in a region that the Pixels 60, 70, and 80 are disposed. The reflection pattern 3370 is provided as one pattern.

The sensing pattern 3390 is disposed in the light-emitting region II and the reflection region III. The sensing pattern 3390 may be electrically connected to a sensing driver (not shown) through a connection line 3395. The connection line 3395 may include the same material as that of the sensing pattern 3390. The connection line 3395 may disposed on the same layer as the sensing pattern 3390. However, the invention is not limited thereto, and the connection line 3395 may include different material from the sensing pattern 3390.

The sensing pattern 3390 may function as a sensing electrode of a touch screen panel of self capacitance type. In an exemplary embodiment, when an electric conductor is contacted, capacitance of the sensing pattern 3390 around a touch position is changed, for example. Thus, a touch panel sensor (not shown) may decide a touch position based on a capacitance sensing signal corresponding to the change of capacitance.

The sensing pattern 3390 may have a size corresponding to a predetermined number of unit pixels Px. The sensing pattern 3390 may have an appropriate size according to a size of a display device.

In the illustrated exemplary embodiment, the sensing patterns 3390 classified as a plurality of sensing groups comprising a predetermined number of sensing patterns. In an exemplary embodiment, sensing patterns of A group are electrically connected to a first group driver 3510, and sensing patterns of B group are electrically connected to a second group driver 3520, for example. The first group driver 3510 and the second group driver 3520 are electrically connected to a sensing driver 3600.

When a touch signal is applied to the sensing patterns 3390, a sensing group to which the touch signal is applied is detected, and an accurate touch position in the sensing group to which the touch signal is applied is detected. Accordingly, high speed driving of a touch screen panel may be performed.

Figure 77:
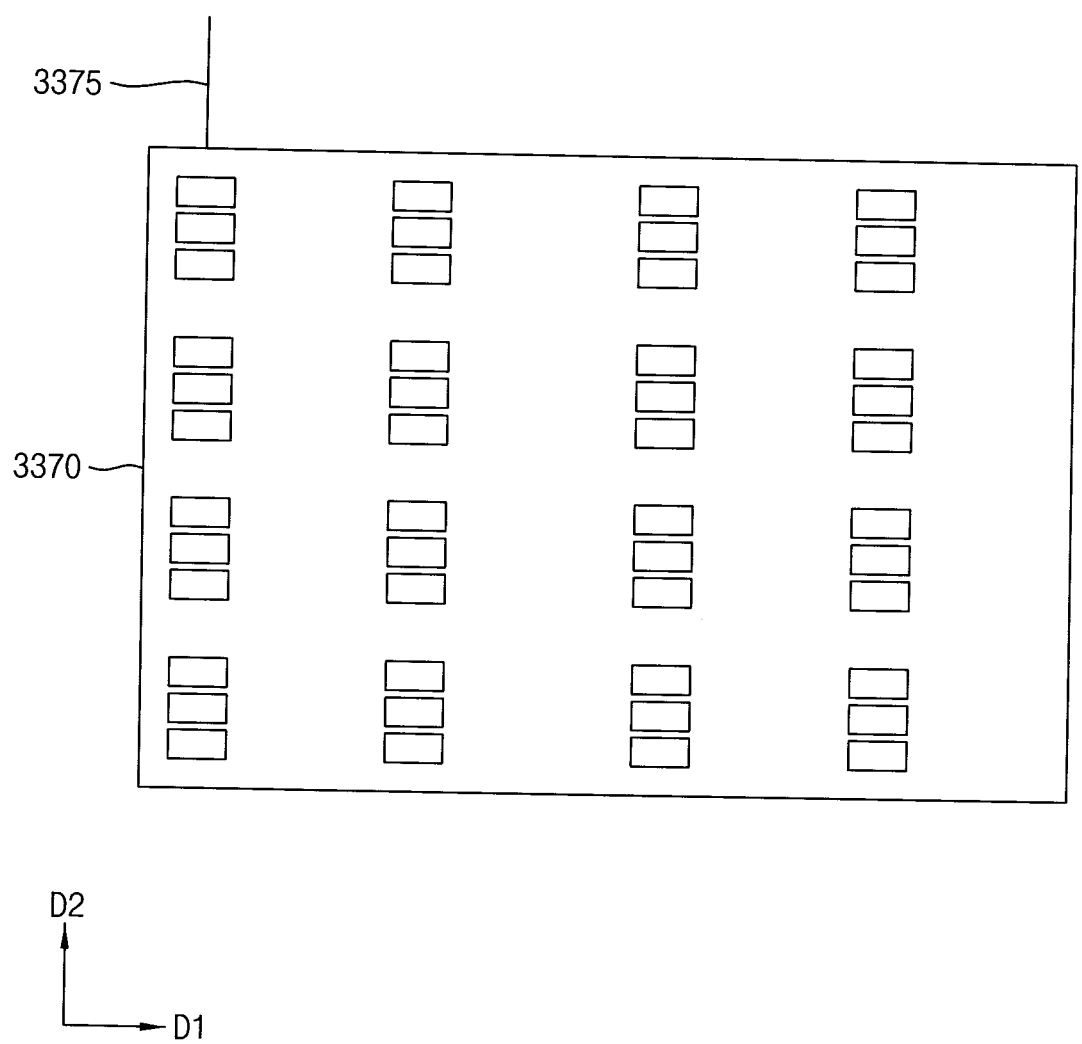
FIG. 77 is a plan view illustrating a reflection pattern of FIG. 59.
Figure 78:
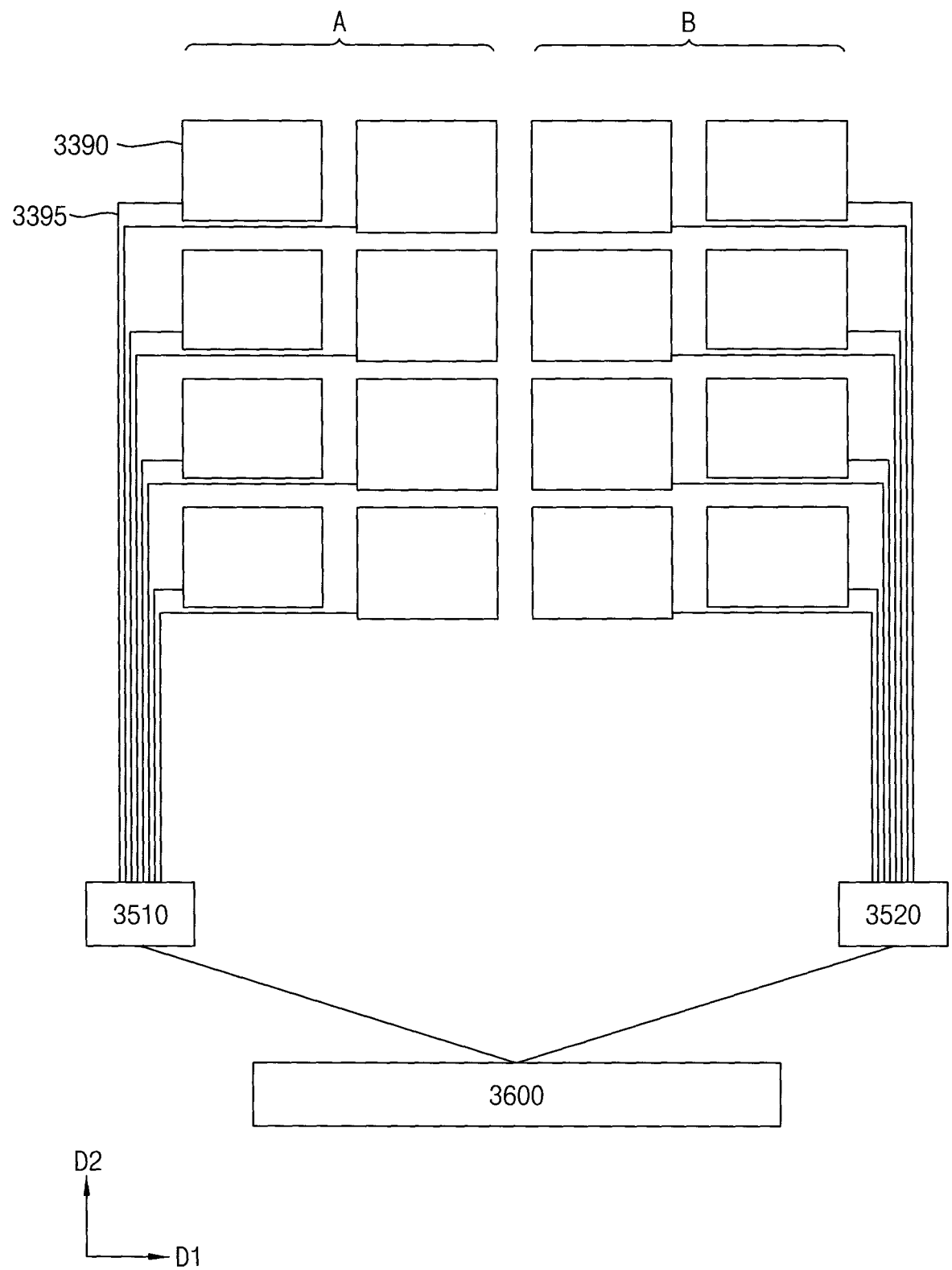
FIG. 78 is a plan view illustrating a sensing pattern of FIG. 59.
Figure 79:
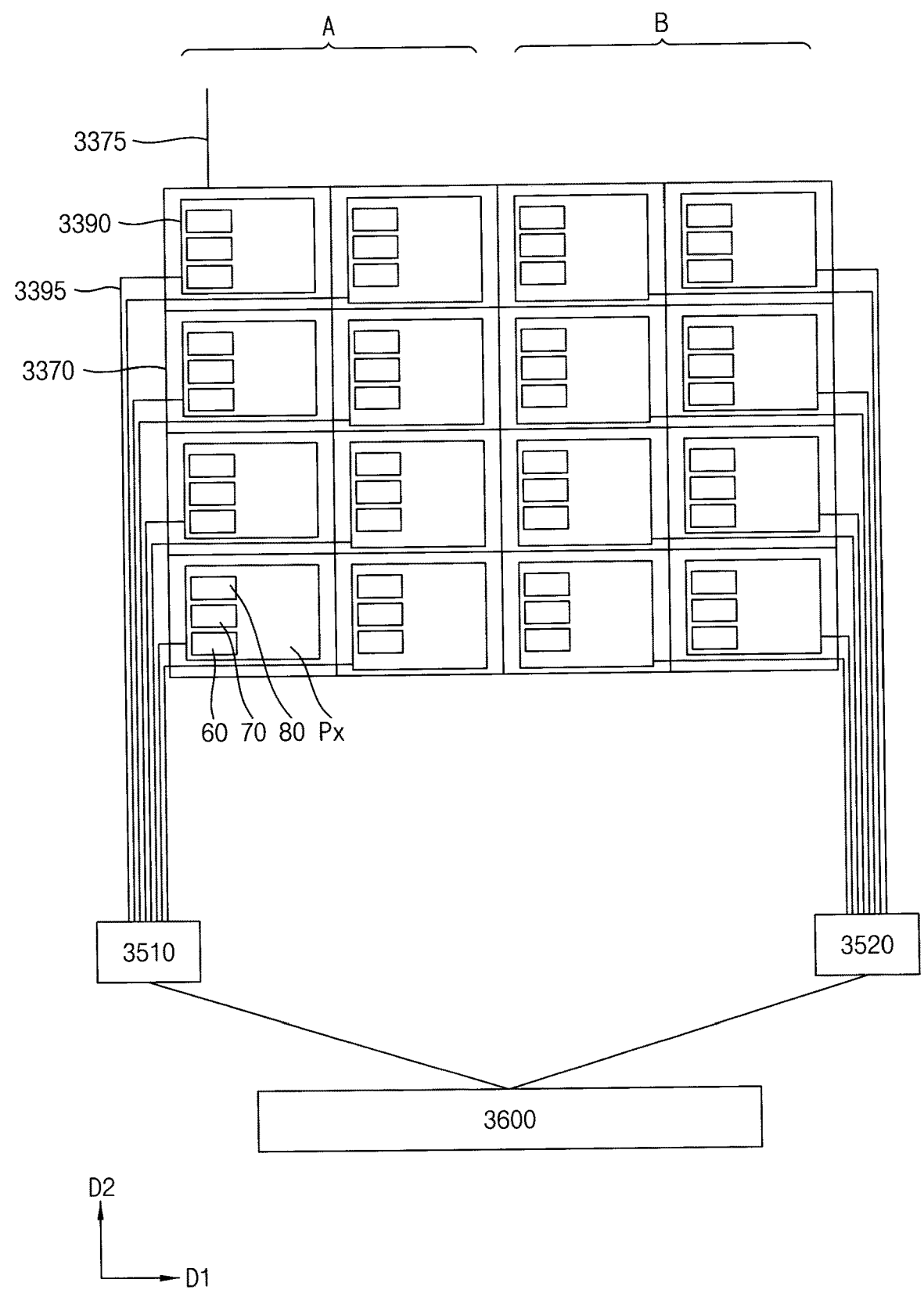
FIG. 79 is a plan view illustrating the reflection pattern of FIG. 77 and the sensing pattern of FIG. 78.
Figure 80:
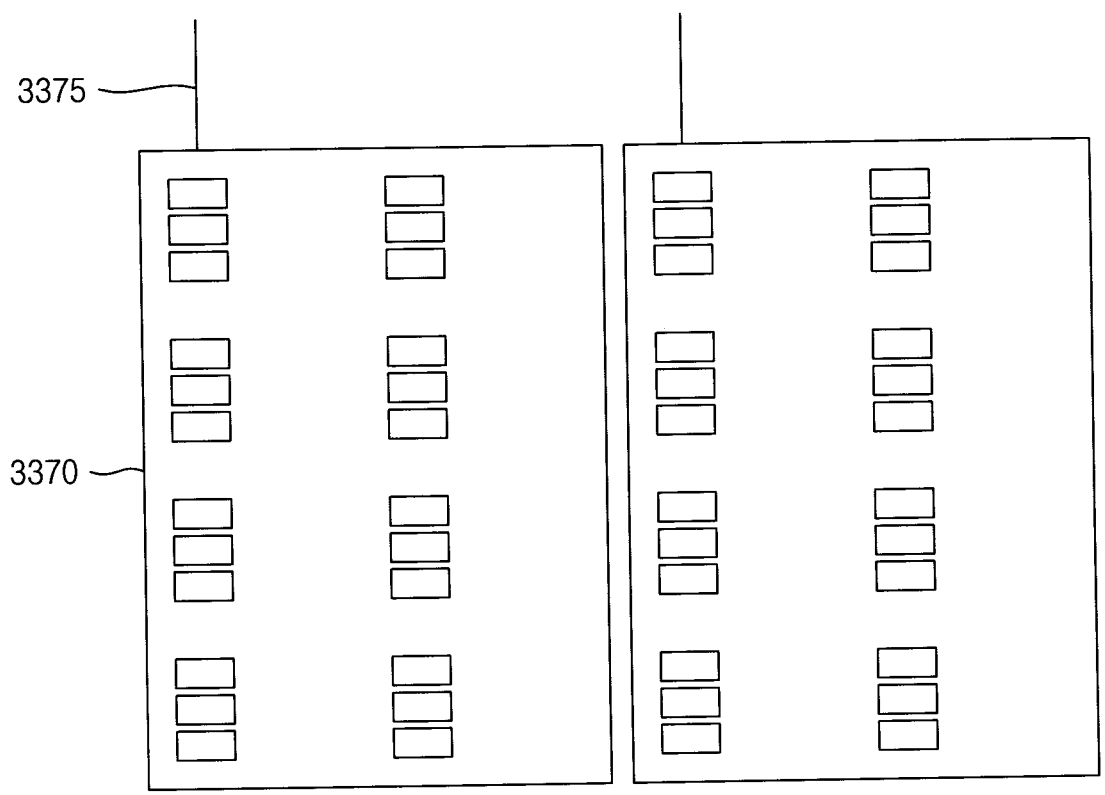
FIG. 80 is a plan view illustrating a reflection pattern of FIG. 59.
Figure 81:
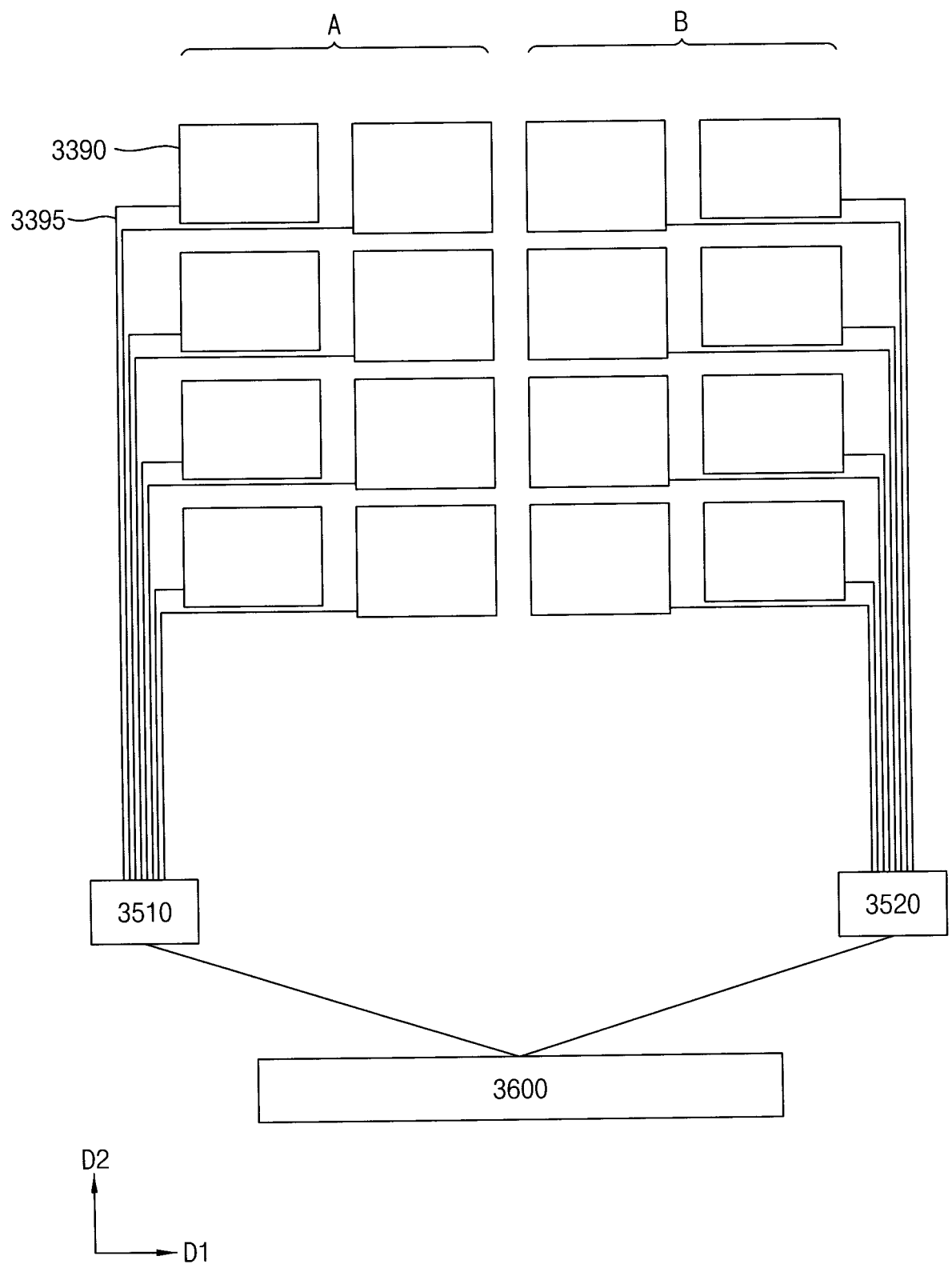
FIG. 81 is a plan view illustrating a sensing pattern of FIG. 59.
Figure 82:
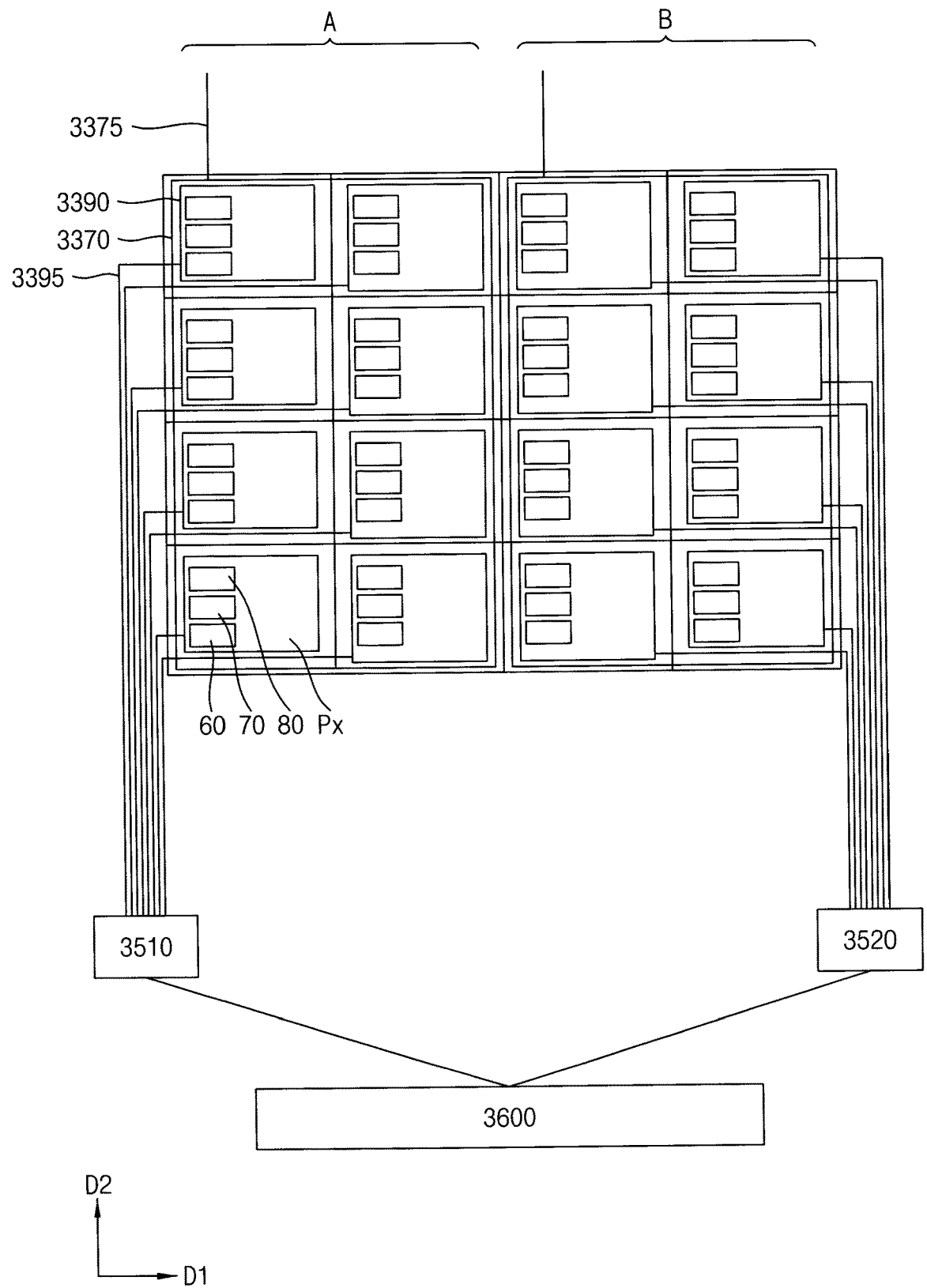
FIG. 82 is a plan view illustrating the reflection pattern of FIG. 80 and the sensing pattern of FIG. 81.

FIG. 77 is a plan view illustrating a reflection pattern of FIG. 59. FIG. 78 is a plan view illustrating a sensing pattern of FIG. 59. FIG. 79 is a plan view illustrating the reflection pattern of FIG. 77 and the sensing pattern of FIG. 78.

Referring to FIG. 59 and FIGS. 77 to 79, the reflection pattern 3370 and the sensing pattern 3390 are illustrated.

The reflection pattern 3370 is disposed only in the reflection region III. Thus, the reflection pattern 3370 is not disposed in a region that the Pixels 60, 70, and 80 are disposed. The reflection pattern 3370 may be electrically connected to a sensing driver (not shown) through a first connection line 3375. The first connection line 3375 may include the same material as that of the reflection pattern 3370. The first connection line 3375 may disposed on the same layer as the reflection pattern 3370. However, the invention is not limited thereto, and the first connection line 3375 may include different material from the reflection pattern 3370.

The sensing pattern 3390 is disposed in the light-emitting region II and the reflection region III. The sensing pattern 3390 may be electrically connected to a sensing driver (not shown) through a second connection line 3395. The second connection line 3395 may include the same material as that of the sensing pattern 3390. The second connection line 3395 may disposed on the same layer as the sensing pattern 3390. However, the invention is not limited thereto, and the second connection line 3395 may include different material from the sensing pattern 3390.

The sensing pattern 3390 may function as a sensing electrode of a touch screen panel of self capacitance type. In an exemplary embodiment, when an electric conductor is contacted, capacitance of the sensing pattern 3390 around a touch position is changed, for example. Thus, a touch panel sensor (not shown) may decide a touch position based on a capacitance sensing signal corresponding to the change of capacitance.

The sensing pattern 3390 may have a size corresponding to a predetermined number of unit pixels Px. The sensing pattern 3390 may have an appropriate size according to a size of a display device.

In the illustrated exemplary embodiment, the sensing patterns 3390 classified as a plurality of sensing groups comprising a predetermined number of sensing patterns. In an exemplary embodiment, sensing patterns of A group are electrically connected to a first group driver 3510, and sensing patterns of B group are electrically connected to a second group driver 3520, for example. The first group driver 3510 and the second group driver 3520 are electrically connected to a sensing driver 3600.

When a touch signal is applied to the sensing patterns 3390, a sensing group to which the touch signal is applied is detected, and an accurate touch position in the sensing group to which the touch signal is applied is detected. Accordingly, high speed driving of a touch screen panel may be performed.

When a touch signal is applied to the sensing pattern 3390, potential difference between the sensing pattern 3390 and the reflection pattern 3370 may be occurred. Thus, capacitance between the sensing pattern 3390 and the reflection pattern 3370 is occurred, so that touch sensitivity may be declined due to the capacitance between the sensing pattern 3390 and the reflection pattern 3370.

However, in the illustrated exemplary embodiment, when a touch signal is applied to a sensing pattern 3390, a signal having the same signal as the touch signal is applied to the reflection pattern 3370. Thus, potential difference between the sensing pattern 3390 and the reflection pattern 3370 may be not occurred. Thus, capacitance between the sensing pattern 3390 and the reflection pattern 3370 is not occurred, so that decline of touch sensitivity may be prevented.

Figure 83:
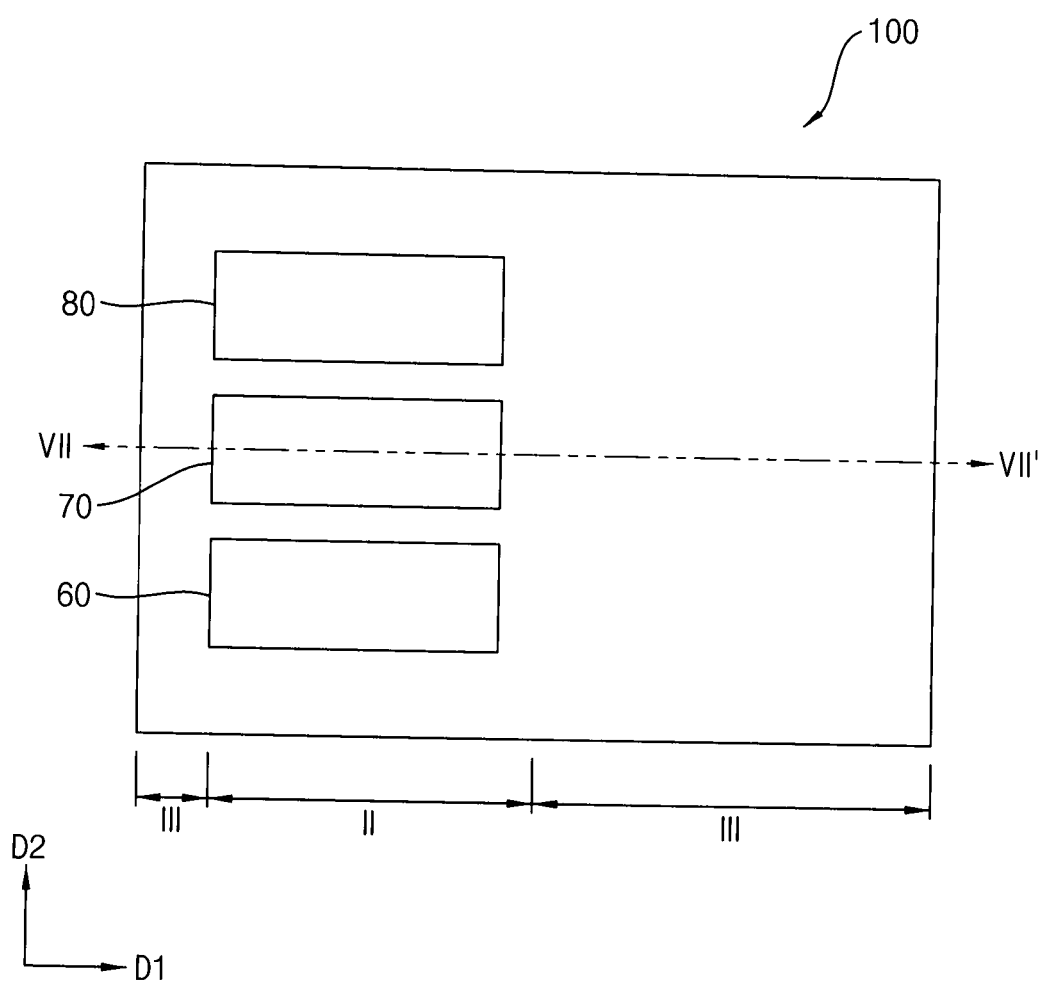
FIG. 83 is a plan view illustrating an exemplary embodiment of an OLED device according to the invention.
Figure 84:
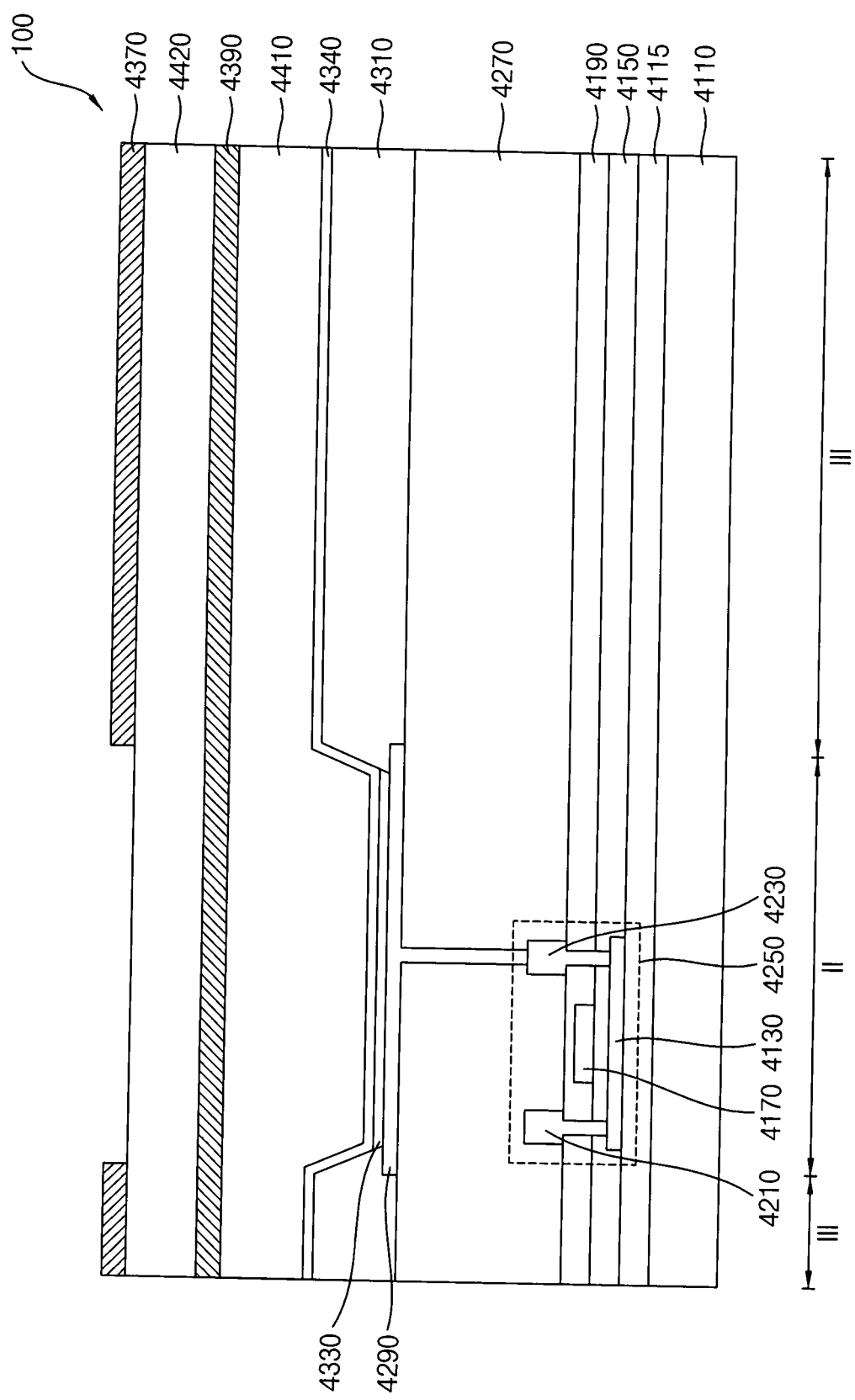
FIG. 84 is a cross-sectional view taken alone line VII-VII' of FIG. 83.

FIG. 83 is a plan view illustrating an OLED device according to an exemplary embodiment of the invention. FIG. 84 is a cross-sectional view taken along line VII-VII' of FIG. 83.

The OLED device according to the illustrated exemplary embodiment is substantially same as the OLED device of FIGS. 1 and 2 except for a reflection pattern 4370, a first thin film encapsulation layer 4410, a second thin film encapsulation layer 4420 and a sensing pattern 4370 and thus similar reference numerals are used for same elements and repetitive explanation will be omitted.

Referring to FIGS. 83 and 84, a thin film encapsulation layer is disposed on an upper electrode 4340. The thin film encapsulation layer may be provided by stacking (e.g., sequentially stacking) a first inorganic layer, an organic layer, and a second inorganic layer.

In an exemplary embodiment, the organic layer may include a polymer, and may also be a single layer or multiple layers (e.g., stacked layers) that includes, for example, one of polyethylene terephthalate, a polyimide, a polycarbonate, an epoxy, a polyethylene and a polyacrylate. In an exemplary embodiment, the organic layer may also include a polyacrylate, for example, the organic layer may include a polymerized monomer composition including a diacrylate monomer or a triacrylate monomer. The monomer composition may further include a monoacrylate monomer. The monomer composition may further include a suitable photoinitiator such as TPO, but is not limited thereto.

The first inorganic layer and the second inorganic layer may be single layers or stacked layers including a metal oxide or a metal nitride. In an exemplary embodiment, the first inorganic layer and the second inorganic layer may include at least one of silicon nitride (e.g., SiNx), aluminum oxide (e.g., Al2O3), silicon oxide (e.g., SiO2), and titanium oxide (e.g., TiO2), for example. In this case, the second inorganic layer may prevent or reduce moisture from permeating into the light-emitting structure.

In the illustrated exemplary embodiment, the thin film encapsulation layer may include a first thin film encapsulation layer 4410 and a second thin film encapsulation layer 4420. In an exemplary embodiment, the first thin film encapsulation layer 4410 may have the first inorganic layer and the organic layer. The second thin film encapsulation layer 4410 may have the second inorganic layer, but is not limited thereto.

The sensing pattern 4390 is disposed on the first thin film encapsulation layer 4410. The sensing pattern 4390 may be disposed in the light-emitting region II and the reflection region III.

The sensing pattern 4390 may include a material having a predetermined reflectivity. In an exemplary embodiment, the sensing pattern 4390 may include at least one of gold (Au), silver (Ag), aluminum (Al), magnesium (Mg), platinum (Pt), Nickel (Ni), titanium (Ti), etc., for example. In an alternative exemplary embodiment, the sensing pattern 4390 may include at least one of an alloy, metal nitride, conductive metal oxide, etc. for example. In an exemplary embodiment, the sensing pattern 4390 may include at least one of an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The second thin film encapsulation layer 4420 is disposed on the sensing pattern 4390. The reflection pattern 4370 is disposed on the second thin film encapsulation layer 4420. The reflection pattern 4370 may be disposed in the reflection region III.

The reflection pattern 4370 may include a material having a predetermined reflectivity. In an exemplary embodiment, the reflection pattern 4370 may include at least one of gold (Au), silver (Ag), aluminum (Al), magnesium (Mg), platinum (Pt), Nickel (Ni), titanium (Ti), etc., for example. In an alternative exemplary embodiment, the reflection pattern 4370 may include at least one of an alloy, metal nitride, conductive metal oxide, etc., for example. In an exemplary embodiment, the reflection pattern 4370 may include at least one of an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

The sensing pattern 4390 may function as a sensing electrode of a touch screen panel of self capacitance type. In an exemplary embodiment, when an electric conductor is contacted, capacitance of the sensing pattern 4390 around a touch position is changed, for example. Thus, a touch panel sensor (not shown) may decide a touch position based on a capacitance sensing signal corresponding to the change of capacitance. However, the invention is not limited thereto, and the reflection pattern 4370 may function as a sensing electrode of a touch screen panel of self capacitance type. In addition, both the reflection pattern 4370 and the sensing pattern 4390 may function as a sensing electrode of a touch screen panel of self capacitance type.

FIGS. 85 to 92 are cross-sectional views illustrating a method of manufacturing the OLED device of FIG. 84.

Figure 85:
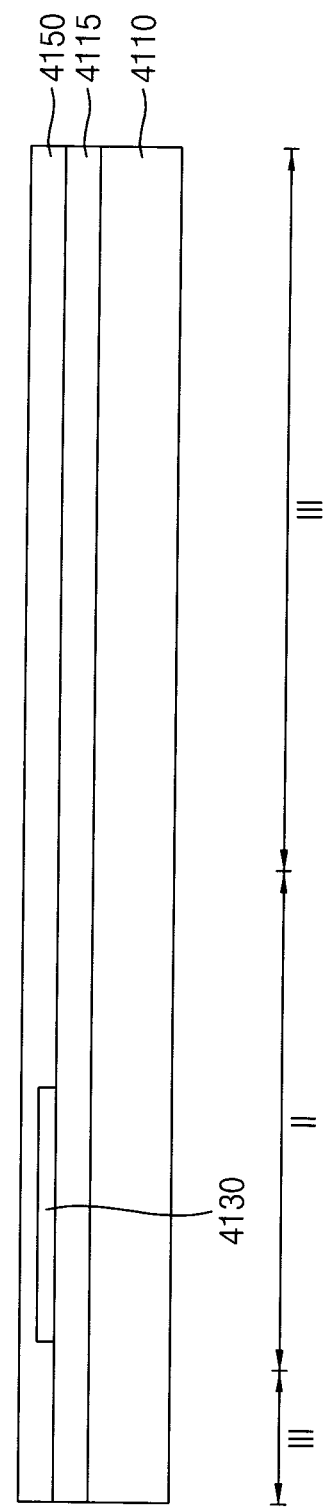
FIGS. 85 to 92 are cross-sectional views illustrating a method of manufacturing the OLED device of FIG. 84.

Referring to FIG. 85, the buffer layer 4115 is disposed on the first substrate 4110. Thereafter, the active pattern 4130 and the first insulation layer 4150 are disposed on the buffer layer 4115.

In an exemplary embodiment, the first substrate 4110 may include at least one of quartz, synthetic quartz, calcium fluoride, fluoride-doping quartz, a sodalime glass, a non-alkali glass etc., for example.

A buffer layer 4115 may be disposed on the first substrate 4110. The buffer layer 4115 may extend from the light-emitting region II into the reflection region III. The buffer layer 4115 may prevent the diffusion (e.g., an out gassing) of metal atoms and/or impurities from the first substrate 4110. Additionally, the buffer layer 4115 may control a rate of a heat transfer in a crystallization process for forming the active pattern 4130, thereby obtaining substantially uniform the active pattern 4130. Furthermore, the buffer layer 4115 may improve a surface flatness of the first substrate 4110 when a surface of the first substrate 4110 is relatively irregular. According to a type of the first substrate 4110, at least two buffer layers may be provided on the first substrate 4110, or the buffer layer may not be disposed.

In an exemplary embodiment, the active pattern 4130 may include at least one of an oxide semiconductor, an inorganic semiconductor (e.g., amorphous silicon, polysilicon, etc.), an organic semiconductor, etc., for example.

The first insulation layer 4150 may be disposed on the active pattern 4130. The first insulation layer 4150 may cover the active pattern 4130 in the light-emitting, region II, and may extend in the first direction on the first substrate 4110. That is, the first insulation layer 4150 may be disposed on the entire first substrate 4110. In an exemplary embodiment, the first insulation layer 4150 may include at least one of a silicon compound, a metal oxide, etc., for example.

Figure 86:
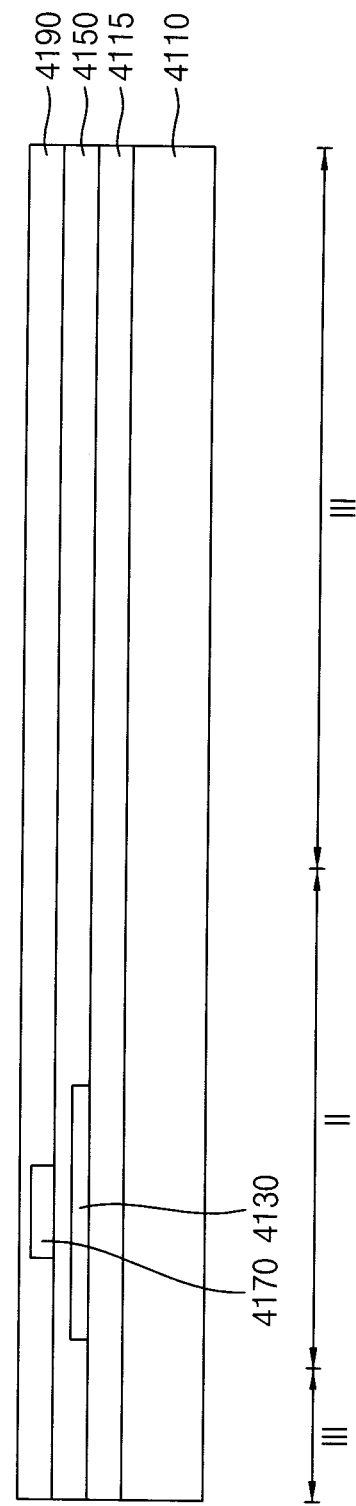

Referring to FIG. 86, the gate electrode 4170 and the second insulation layer 4190 are disposed on the first substrate 4110 on which the first insulation layer 4150 is disposed.

The gate electrode 4170 may be disposed on a portion of the first insulation layer 4150 under which the active pattern 4130 is disposed. In an exemplary embodiment, the gate electrode 4170 may include at least one of a metal, an alloy, metal nitride, conductive metal oxide, transparent conductive materials, etc., for example.

The second insulation layer 4190 may be disposed on the gate electrode 4170. The second insulation layer 4190 may cover the gate electrode 4170 in the light-emitting region and may extend in the first direction on the first substrate 4110. That is, the second insulation layer 4190 may be disposed on the entire first substrate 4110. In an exemplary embodiment, the second insulation layer 4190 may include at least one of a silicon compound, a metal oxide, etc., for example.

Figure 87:
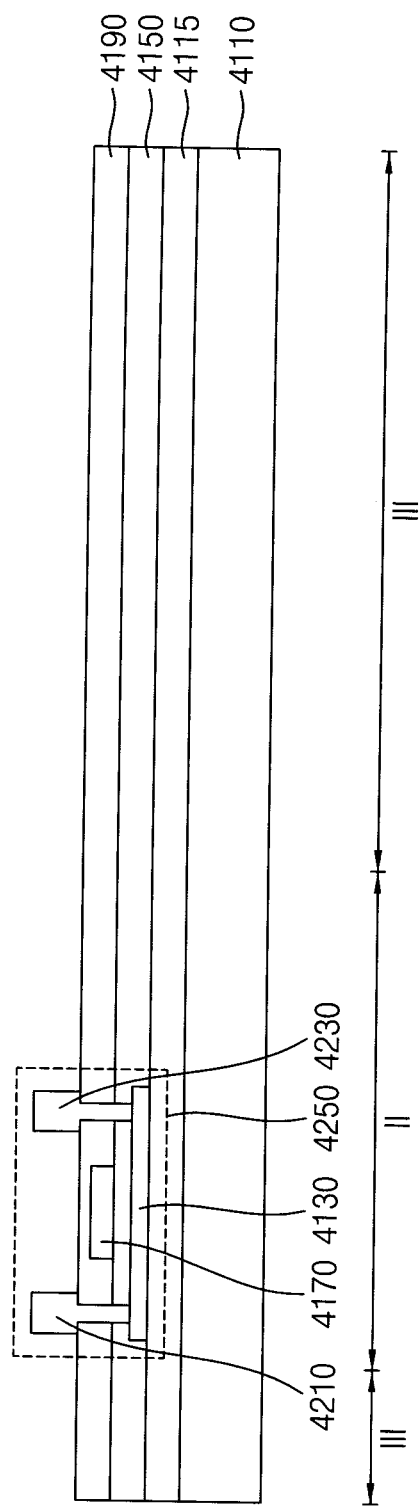

Referring to FIG. 87, the source electrode 4210 and the drain electrode 4230 are disposed on the first substrate 4110 on which the second insulation layer 4190 is disposed.

The source electrode 4210 and the drain electrode 4230 may be disposed on the second insulation layer 4190. The source electrode 4210 may contact a first side of the active layer 4130 by removing a portion of the first and second insulation layers 4150 and 4190. The drain electrode 4230 may contact a second side of the active layer 4130 by removing a second portion of the first and second insulation layers 4150 and 4190. In an exemplary embodiment, each of the source electrode 4210 and the drain electrode 4230 may include at least one of a metal, an alloy, metal nitride, conductive metal oxide, transparent conductive materials, etc., for example.

Figure 88:
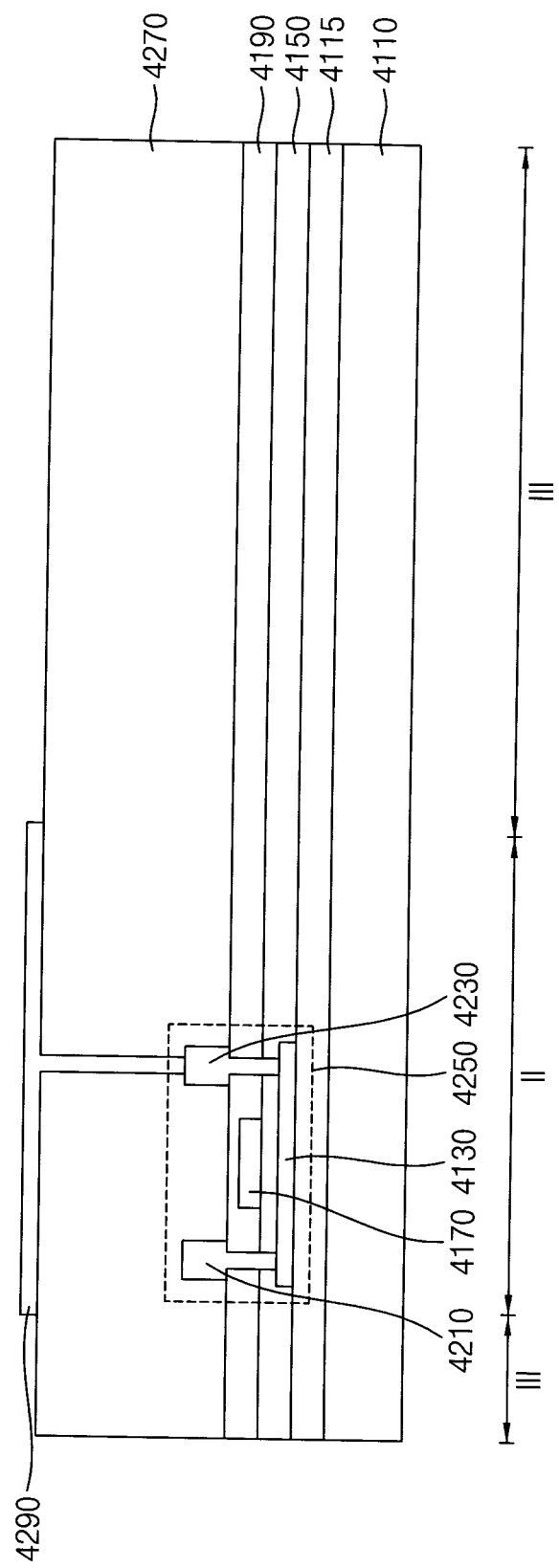

Referring to FIG. 88, the third insulation layer 4270 and the lower electrode 4290 are disposed on the first substrate 4110 on which the source electrode 4210 and the drain electrode 4230 are disposed.

The third insulation layer 4270 may be disposed on the source electrode 4210 and the drain electrode 4230. The third insulation layer 4270 may cover the source electrode 4210 and the drain electrode 4230 in the sub-pixel region II, and may extend in the first direction on the first substrate 4110. That is, the third insulation layer 4270 may be disposed on the entire first substrate 4110. In an exemplary embodiment, the third insulation layer 4270 may include at least one of a silicon compound, a metal oxide, etc., for example.

The lower electrode 4290 may be disposed on the third insulation layer 4270. The lower electrode 4290 may contact the drain electrode 4230 by removing a portion of the third insulation layer 4270. In addition, the lower electrode 4290 may be electrically connected to the semiconductor element 4250. In an exemplary embodiment, the lower electrode 4290 may include at least one of a metal, an alloy, metal nitride, conductive metal oxide, transparent conductive materials, etc., for example.

Figure 89:
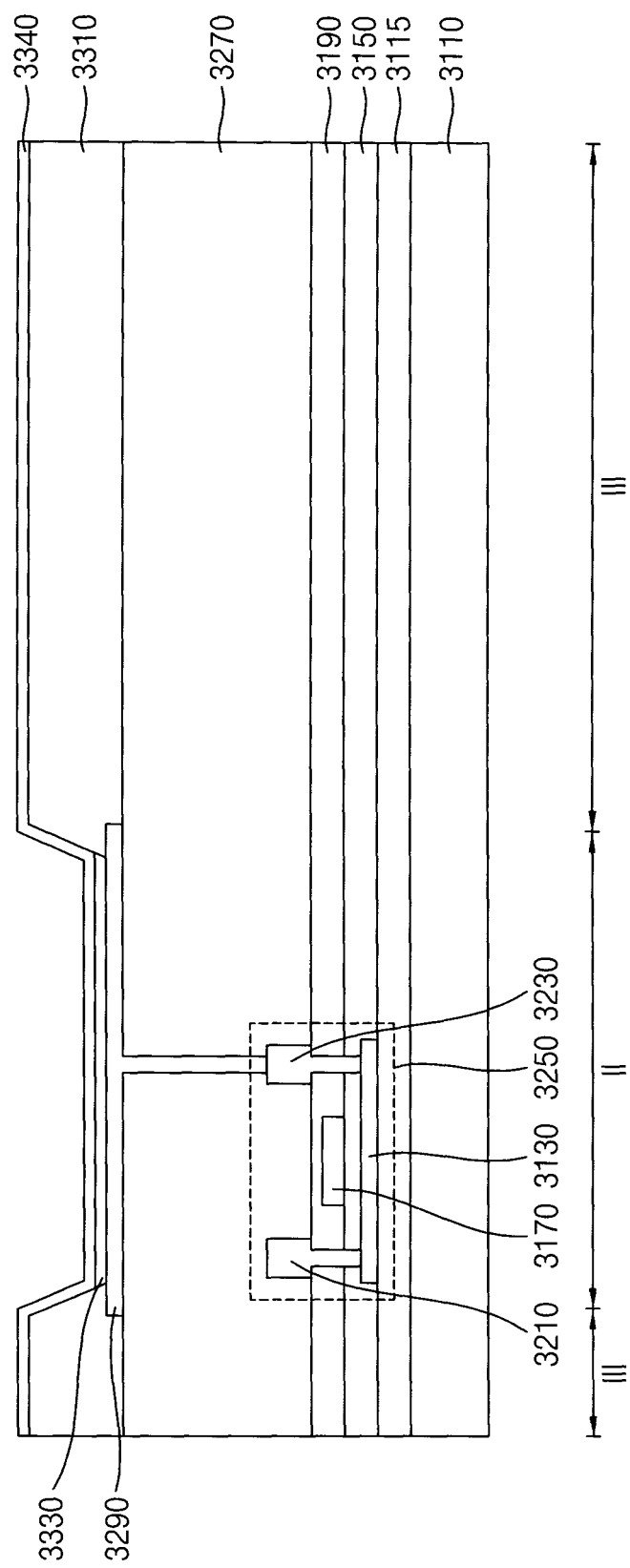
Figure 90:
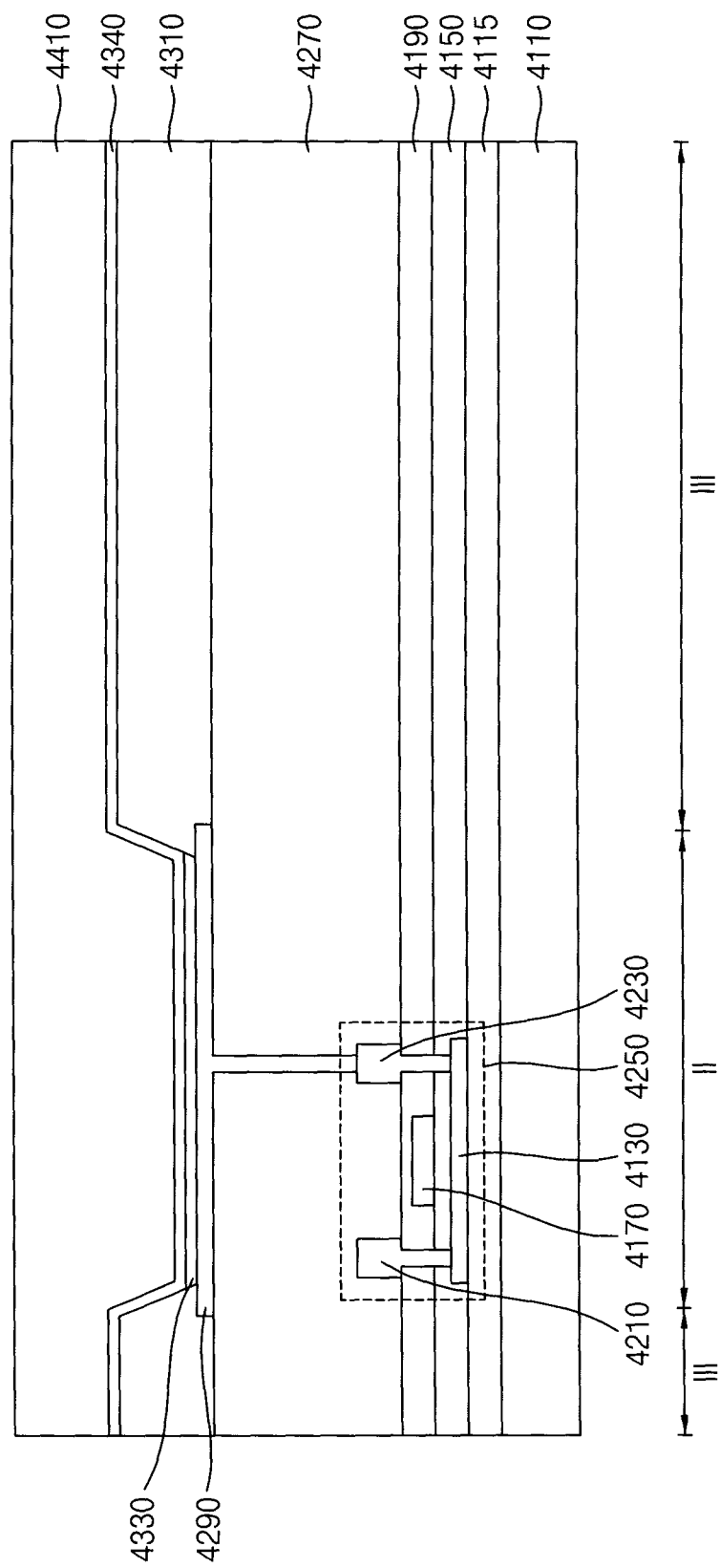

Referring to FIG. 89, the pixel defining layer 4310, the light emitting layer 4330 and the upper electrode 4340 are disposed on the first substrate 4110 on which the lower electrode 4290 is disposed.

The pixel defining layer 4310 may be disposed the on third insulation layer 4270 to expose a portion of the lower electrode 4290. The pixel defining layer 4310 may include organic materials or inorganic materials. In this case, the light emitting layer 4330 may be disposed on a portion that the lower electrode 4290 is exposed by the pixel defining layer 4310.

The light emitting layer 4330 may be disposed on the exposed lower electrode 4290. The light emitting layer 4330 may be provided using light emitting materials generating different colors of light (e.g., a red color of light, a blue color of light, and a green color of light).

The upper electrode 4340 may be disposed on the pixel defining layer 4310 and the light emitting layer 4330. The upper electrode 4340 may cover the pixel defining layer 4310 and the light emitting layer 4330 in light-emitting region II and the reflection region III, and may extend in the first direction on the first substrate 4110. That is, the upper electrode 4340 may be electrically connected to the first through third pixels. In an exemplary embodiment, the upper electrode 4340 may include at least one of a metal, an alloy, metal nitride, conductive metal oxide, a transparent conductive material, etc., for example. These may be used alone or in a combination thereof.

Referring to FIG. 65, the first thin film encapsulation layer 4410 is disposed on the first substrate 4110 on which the upper electrode 4340 is disposed.

In the illustrated exemplary embodiment, the thin film encapsulation layer may include a first thin film encapsulation layer 4410 and a second thin film encapsulation layer 4420. The thin film encapsulation layer may be provided by stacking (e.g., sequentially stacking) a first inorganic layer, an organic layer, and a second inorganic layer.

In an exemplary embodiment, the organic layer may include a polymer, and may also be a single layer or multiple layers (e.g., stacked layers) that includes, for example, one of polyethylene terephthalate, a polyimide, a polycarbonate, an epoxy, a polyethylene and a polyacrylate. In an exemplary embodiment, the organic layer may also include a polyacrylate, for example, the organic layer may include a polymerized monomer composition including a diacrylate monomer or a triacrylate monomer. The monomer composition may further include a monoacrylate monomer. The monomer composition may further include a suitable photoinitiator such as TPO, but is not limited thereto.

The first inorganic layer and the second inorganic layer may be single layers or stacked layers including a metal oxide or a metal nitride. In an exemplary embodiment, the first inorganic layer and the second inorganic layer may include at least one of silicon nitride (e.g., SiNx), aluminum oxide (e.g., Al2O3), silicon oxide (e.g., SiO2), and titanium oxide (e.g., TiO2), for example. In this case, the second inorganic layer may prevent or reduce moisture from permeating into the light-emitting structure.

The first thin film encapsulation layer 4410 may have the first inorganic layer. However, the invention is not limited thereto, and the first thin film encapsulation layer 4410 may have the first inorganic layer and the organic layer.

Figure 91:
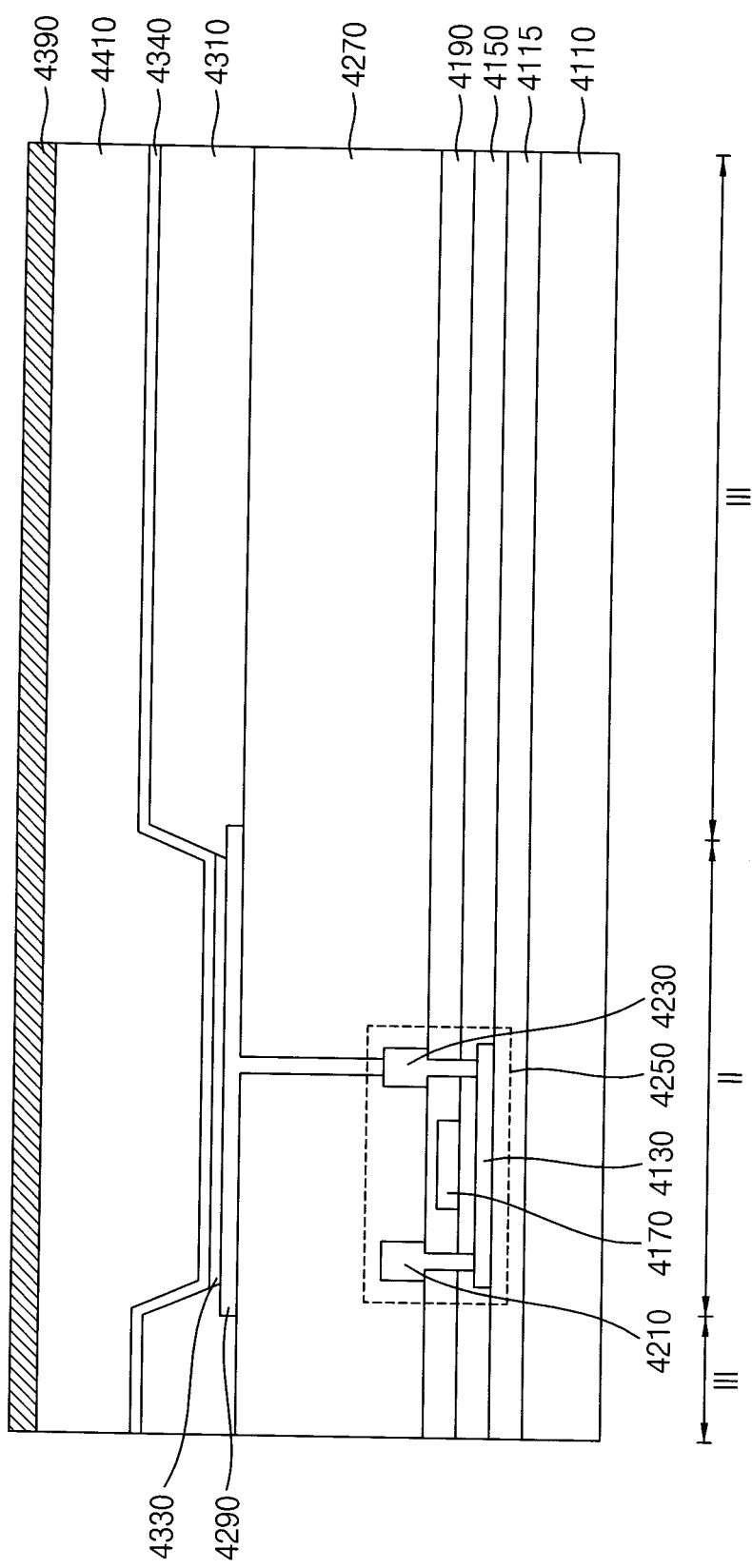

Referring to FIG. 91, the sensing pattern 4390 is disposed on the first substrate 4110 on which the first thin film encapsulation layer 4410 is disposed.

The sensing pattern 4390 may be disposed in the light-emitting region II and the reflection region III.

The sensing pattern 4390 may include a material having a predetermined reflectivity. In an exemplary embodiment, the sensing pattern 4390 may include at least one of gold (Au), silver (Ag), aluminum (Al), magnesium (Mg), platinum (Pt), Nickel (Ni), titanium (Ti), etc., for example. In an alternative exemplary embodiment, the sensing pattern 4390 may include at least one of an alloy, metal nitride, conductive metal oxide, etc., for example. In an exemplary embodiment, the sensing pattern 4390 may include at least one of an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

Figure 92:
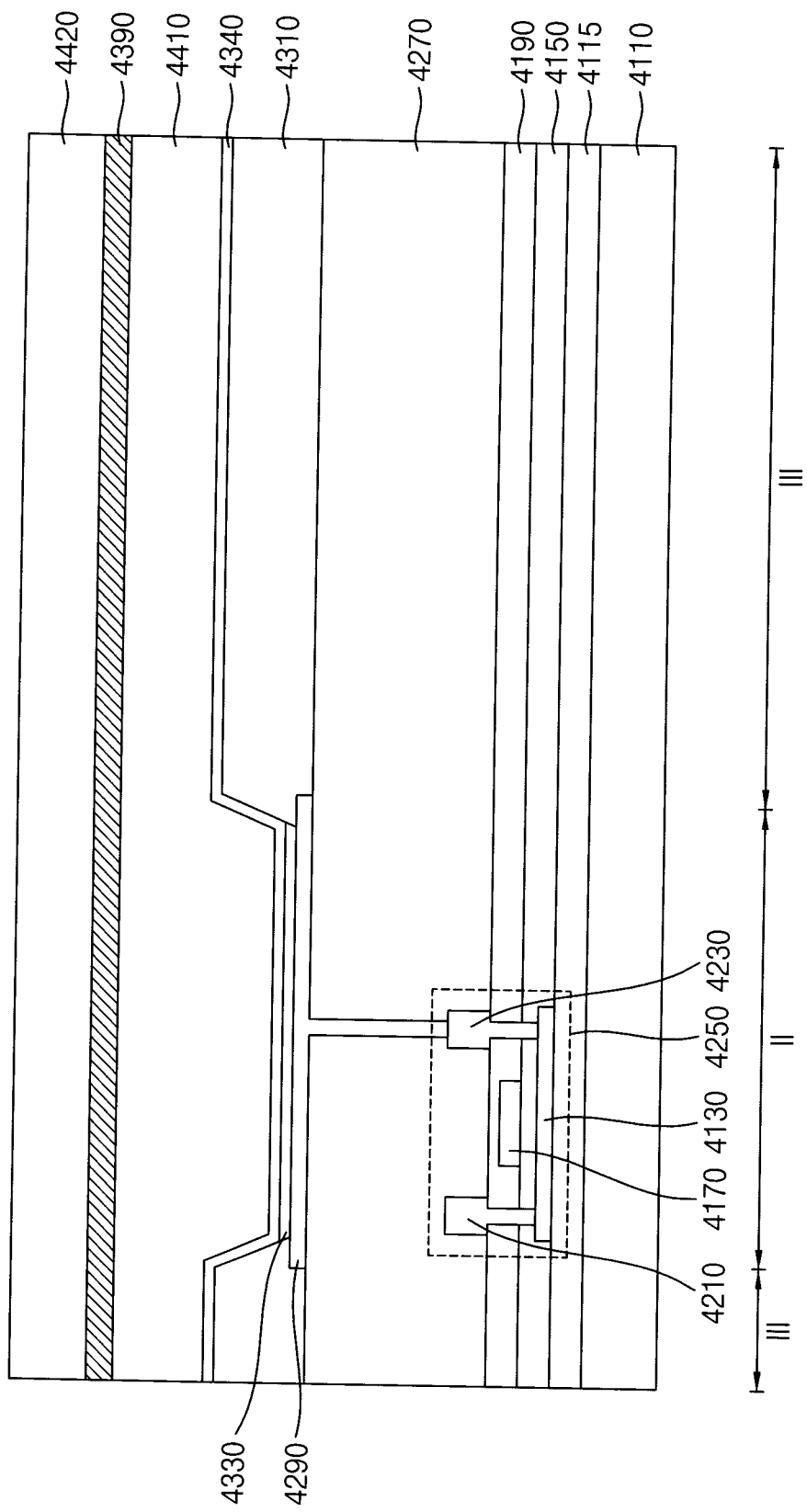

Referring to FIG. 92, the second thin film encapsulation layer 4420 is disposed on the first substrate 4110 on which the sensing pattern 4390 is disposed.

The second thin film encapsulation layer 4420 may have the second inorganic layer. However, the invention is not limited thereto, and the second thin film encapsulation layer 4420 may have the organic layer and the second inorganic layer.

A thin film encapsulation layer according to the illustrated exemplary embodiment includes the first thin film encapsulation layer 4410 and the second thin film encapsulation layer 4420. In addition, the sensing pattern 4390 is disposed between the first thin film encapsulation layer 4410 and the second thin film encapsulation layer 4420. That is, the sensing pattern 4390 is disposed in the thin film encapsulation layer.

Referring to FIG. 84, the reflection pattern 4370 is disposed on the first substrate 4110 on which second thin film encapsulation layer 4420 is disposed.

The reflection pattern 4370 may be disposed in the reflection region III.

The reflection pattern 4370 may include a material having a predetermined reflectivity. In an exemplary embodiment, the reflection pattern 4370 may include at least one of gold (Au), silver (Ag), aluminum (Al), magnesium (Mg), platinum (Pt), Nickel (Ni), titanium (Ti), etc., for example. In an alternative exemplary embodiment, the reflection pattern 4370 may include at least one of an alloy, metal nitride, conductive metal oxide, etc., for example. In an exemplary embodiment, the reflection pattern 4370 may include at least one of an alloy including aluminum, aluminum nitride (AlNx), an alloy including silver, tungsten nitride (WNx), an alloy including copper, chrome nitride (CrNx), an alloy including molybdenum, titanium nitride (TiNx), tantalum nitride (TaNx), SRO, zinc oxide (ZnOx), stannum oxide (SnOx), indium oxide (InOx), gallium oxide (GaOx), etc., for example.

Figure 95:
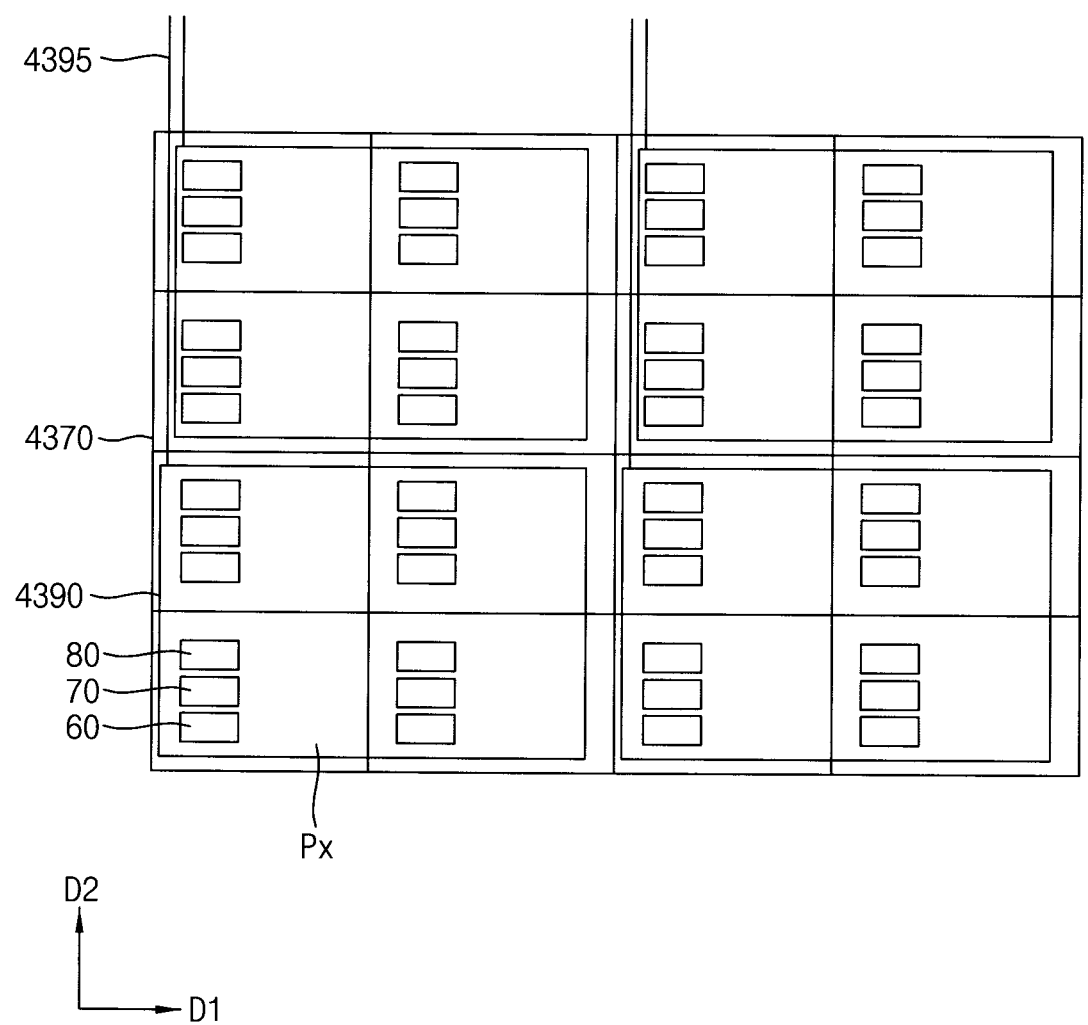
FIG. 95 is a plan view illustrating the reflection pattern of FIG. 93 and the sensing pattern of FIG. 94.

FIG. 93 is a plan view illustrating a reflection pattern of FIG. 84. FIG. 94 is a plan view illustrating a sensing pattern of FIG. 84. FIG. 95 is a plan view illustrating the reflection pattern of FIG. 93 and the sensing pattern of FIG. 94

Referring to FIG. 84 and FIGS. 93 to 95, the reflection pattern 4370 and the sensing pattern 4390 are illustrated.

The reflection pattern 4370 is disposed only in the reflection region III. Thus, the reflection pattern 4370 is not disposed in a region that the Pixels 60, 70, and 80 are disposed. The reflection pattern 4370 is provided as one pattern.

The sensing pattern 4390 is disposed in the light-emitting region II and the reflection region III. The sensing pattern 4390 may be electrically connected to a sensing driver (not shown) through a connection line 4395. The connection line 395 may include the same material as that of the sensing pattern 4390. The connection line 4395 may disposed on the same layer as the sensing pattern 4390. However, the invention is not limited thereto, and the connection line 4395 may include different material from the sensing pattern 4390.

The sensing pattern 4390 may function as a sensing electrode of a touch screen panel of self capacitance type. In an exemplary embodiment, when an electric conductor is contacted, capacitance of the sensing pattern 4390 around a touch position is changed, for example. Thus, a touch panel sensor (not shown) may decide a touch position based on a capacitance sensing signal corresponding to the change of capacitance.

The sensing pattern 4390 may have a size corresponding to a predetermined number of unit pixels Px. The sensing pattern 4390 may have an appropriate size according to a size of a display device.

Figure 96:
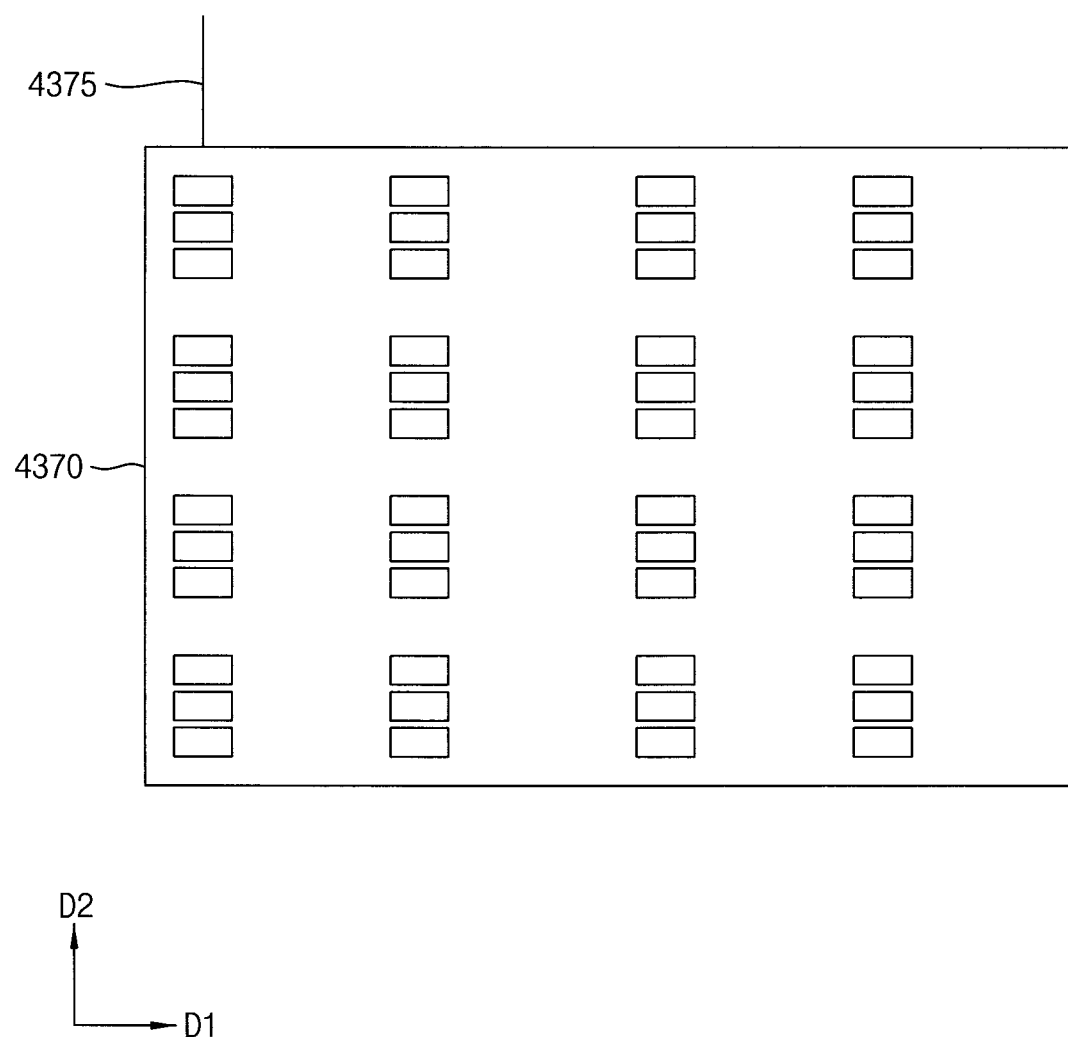
FIG. 96 is a plan view illustrating a reflection pattern of FIG. 84.
Figure 97:
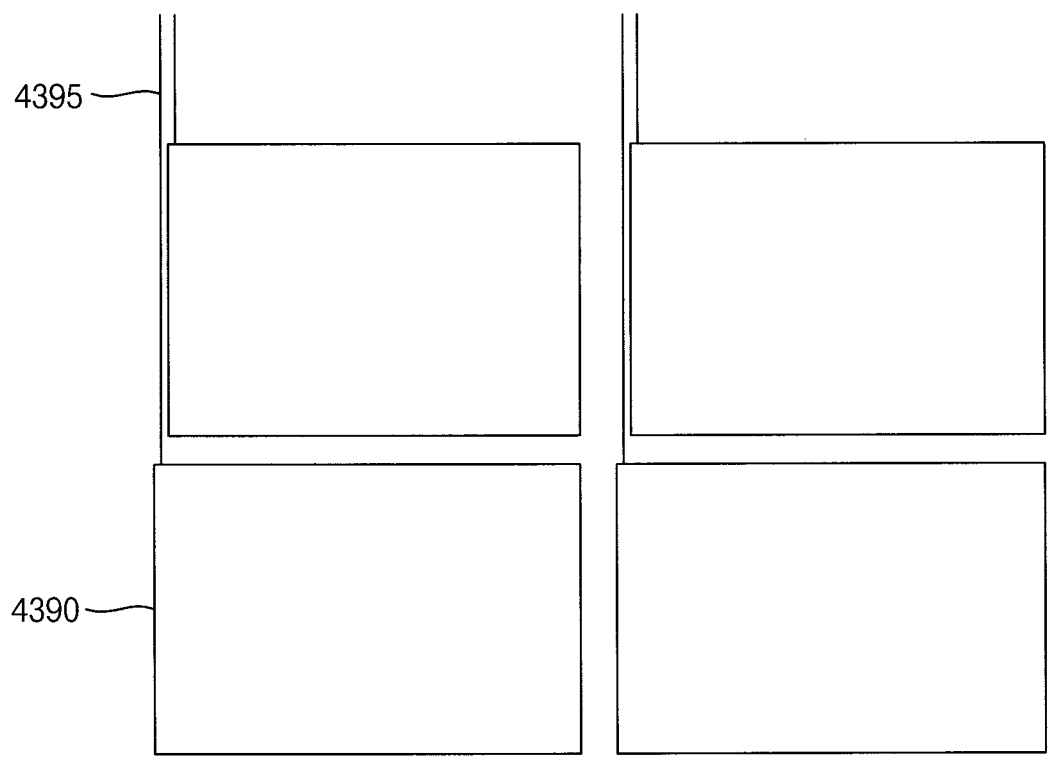
FIG. 97 is a plan view illustrating a sensing pattern of FIG. 84.
Figure 98:
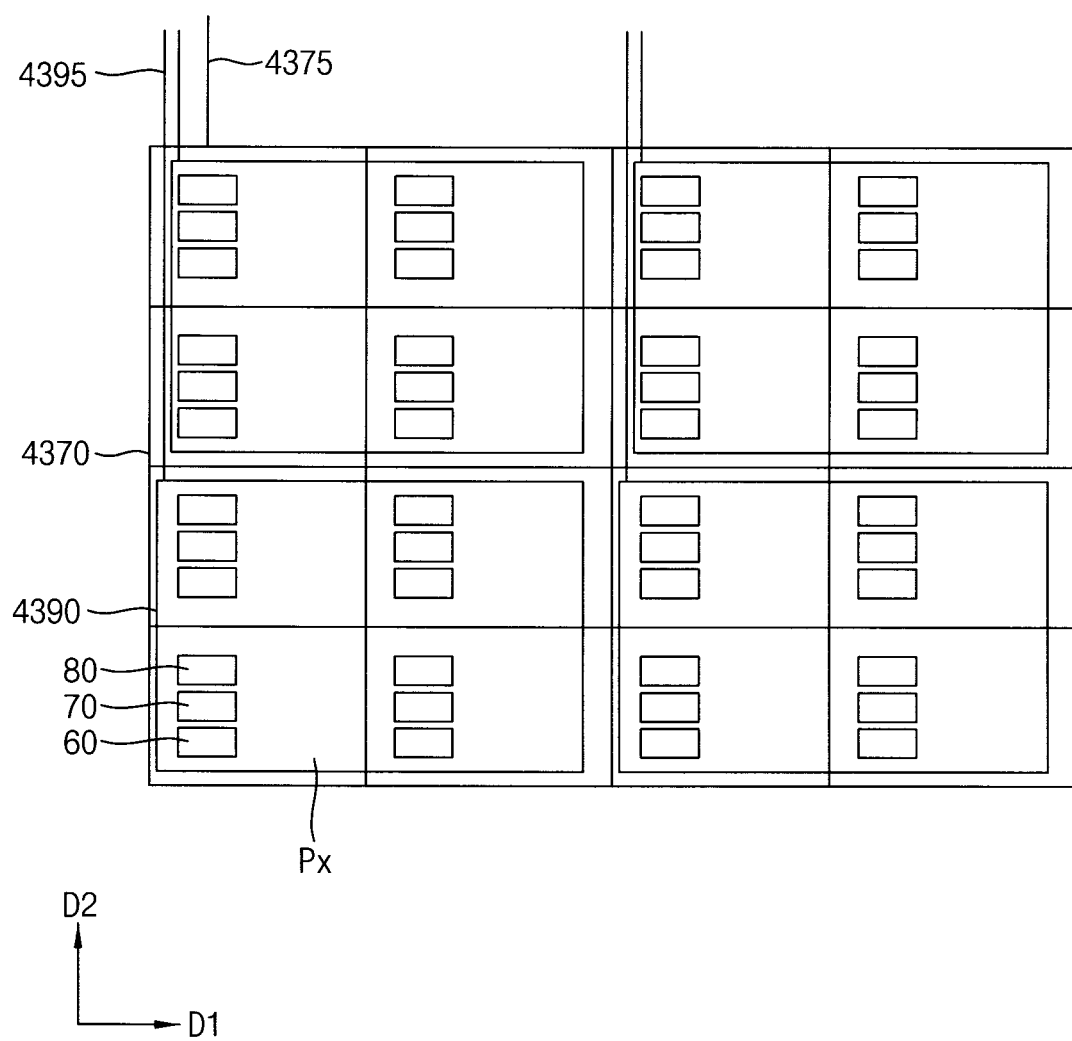
FIG. 98 is a plan view illustrating the reflection pattern of FIG. 96 and the sensing pattern of FIG. 97.

FIG. 96 is a plan view illustrating a reflection pattern of FIG. 84, FIG. 97 is a plan view illustrating a sensing pattern of FIG. 84. FIG. 98 is a plan view illustrating the reflection pattern of FIG. 96 and the sensing pattern of FIG. 97.

Referring to FIG. 84 and FIGS. 96 to 98, the reflection pattern 4370 and the sensing pattern 4390 are illustrated.

The reflection pattern 4370 is disposed only in the reflection region III. Thus, the reflection pattern 4370 is not disposed in a region that the Pixels 60, 70, and 80 are disposed. The reflection pattern 4370 may function as a sensing electrode of a touch screen panel of self capacitance type. The reflection pattern 4370 may have a size corresponding to a predetermined number of unit pixels Px. The reflection pattern 4370 may have an appropriate size according to a size of a display device.

The reflection pattern 4370 may be electrically connected to a sensing driver (not shown) through a first connection line 4375. The first connection line 4375 may include the same material as that of the reflection pattern 4370. The first connection line 4375 may disposed on the same layer as the reflection pattern 4370. However, the invention is not limited thereto, and the first connection line 4375 may include different material from the reflection pattern 4370.

The sensing pattern 4390 is disposed in the light-emitting region II and the reflection region III. The sensing pattern 4390 may be electrically connected to a sensing driver (not shown) through a second connection line 4395. The second connection line 4395 may include the same material as that of the sensing pattern 4390. The second connection line 4395 may disposed on the same layer as the sensing pattern 4390. However, the invention is not limited thereto, and the second connection line 4395 may include different material from the sensing pattern 4390.

The sensing pattern 4390 may function as a sensing electrode of a touch screen panel of self capacitance type. In an exemplary embodiment, when an electric conductor is contacted, capacitance of the sensing pattern 4390 around a touch position is changed, for example. Thus, a touch panel sensor (not shown) may decide a touch position based on a capacitance sensing signal corresponding to the change of capacitance.

The sensing pattern 4390 may have a size corresponding to a predetermined number of unit pixels Px. The sensing pattern 4390 may have an appropriate size according to a size of a display device.

In the illustrated exemplary embodiment, a size of the reflection pattern 4370 may be bigger than a size of the sensing pattern 4390. In an exemplary embodiment, the reflection pattern 4370 may have a size corresponding to four reflection patterns 4370, for example. However, the invention is not limited thereto, and the reflection pattern 4370 may have a various size.

Since the reflection pattern 4370 is provided as relatively big area, the reflection pattern 4370 may detect touch position of a wide range. Thus, reflection pattern 4370 senses a touch position of a wide range, and after the reflection pattern 4370 senses the touch position, the sensing pattern 4390 senses an accurate touch position. Accordingly, high speed driving of a touch screen panel may be performed.

Figure 99:
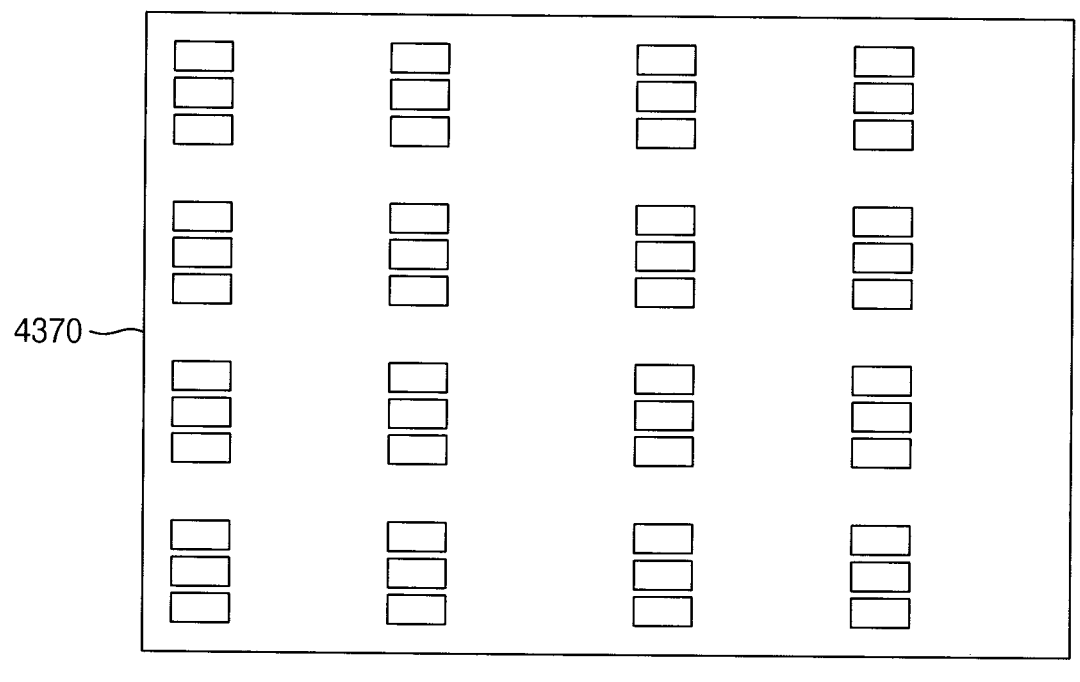
FIG. 99 is a plan view illustrating a reflection pattern of FIG. 84.
Figure 100:
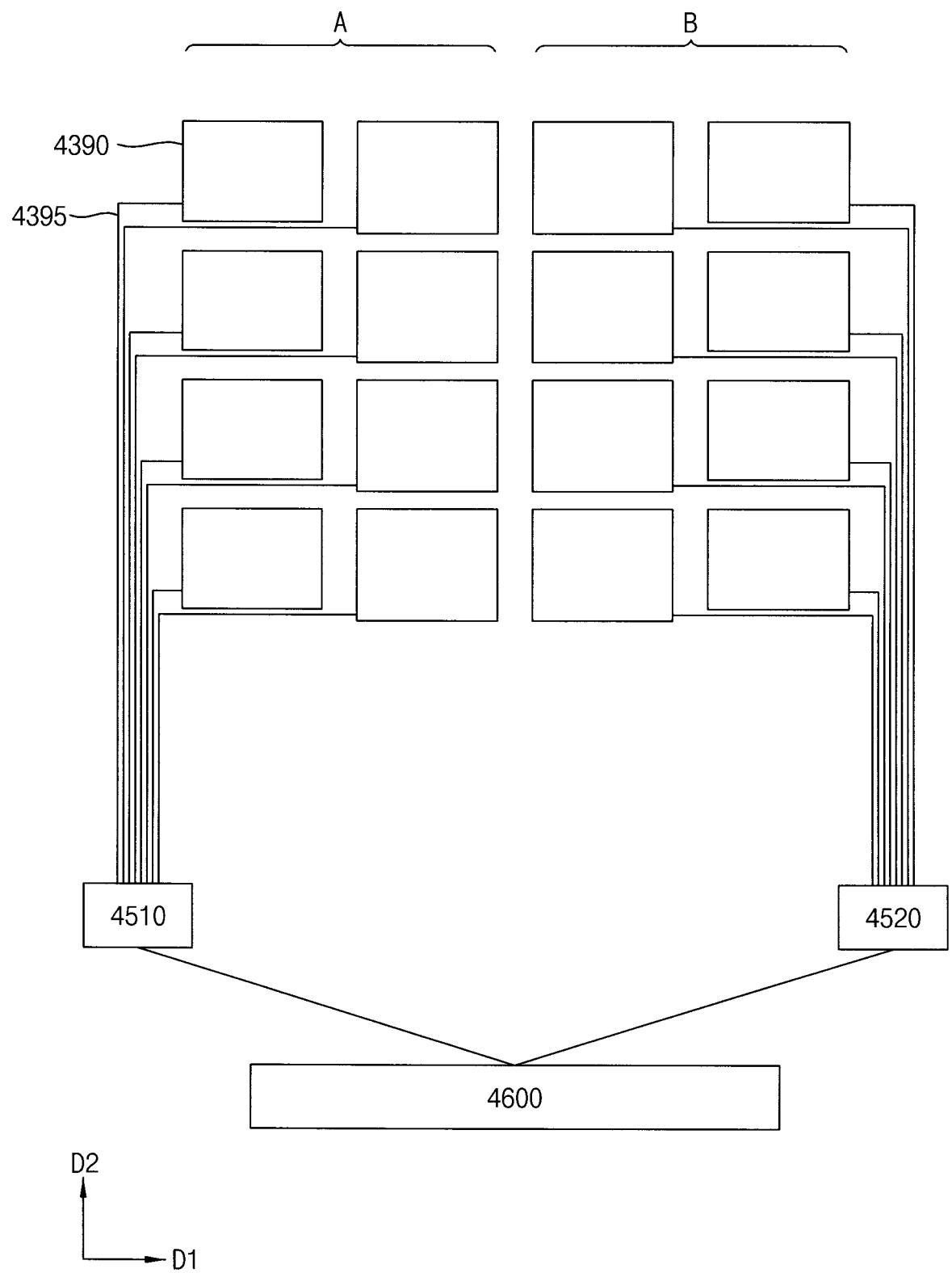
FIG. 100 is a plan view illustrating a sensing pattern of FIG. 84.
Figure 101:
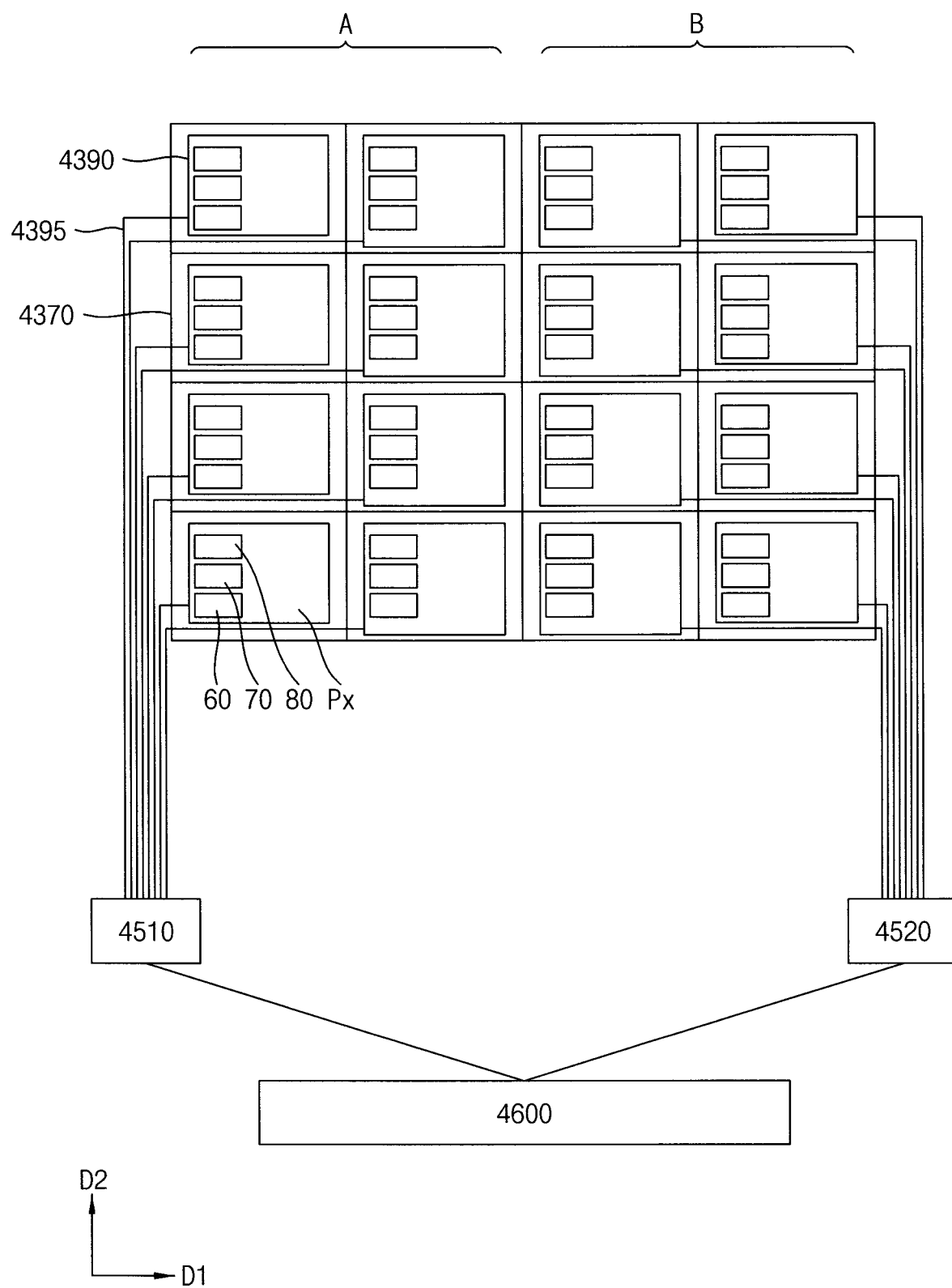
FIG. 101 is a plan view illustrating the reflection pattern of FIG. 99 and the sensing pattern of FIG. 100.

FIG. 99 is a plan view illustrating a reflection pattern of FIG. 84. FIG. 100 is a plan view illustrating a sensing pattern of FIG. 84. FIG. 101 is a plan view illustrating the reflection pattern of FIG. 99 and the sensing pattern of FIG. 100.

Referring to FIG. 84 and FIGS. 99 to 101, the reflection pattern 4370 and the sensing pattern 4390 are illustrated.

The reflection pattern 4370 is disposed only in the reflection region III. Thus, the reflection pattern 4370 is not disposed in a region that the Pixels 60, 70, and 80 are disposed. The reflection pattern 4370 is provided as one pattern.

The sensing pattern 4390 is disposed in the light-emitting region II and the reflection region III. The sensing pattern 4390 may be electrically connected to a sensing driver (not shown) through a connection line 4395. The connection line 4395 may include the same material as that of the sensing pattern 4390. The connection line 4395 may disposed on the same layer as the sensing pattern 4390. However, the invention is not limited thereto, and the connection line 4395 may include different material from the sensing pattern 4390.

The sensing pattern 4390 may function as a sensing electrode of a touch screen panel of self capacitance type. In an exemplary embodiment, when an electric conductor is contacted, capacitance of the sensing pattern 4390 around a touch position is changed, for example. Thus, a touch panel sensor (not shown) may decide a touch position based on a capacitance sensing signal corresponding to the change of capacitance.

The sensing pattern 4390 may have a size corresponding to a predetermined number of unit pixels Px. The sensing pattern 4390 may have an appropriate size according to a size of a display device.

In the illustrated exemplary embodiment, the sensing patterns 4390 classified as a plurality of sensing groups comprising a predetermined number of sensing patterns. In an exemplary embodiment, sensing patterns of A group are electrically connected to a first group driver 4510, and sensing patterns of B group are electrically connected to a second group driver 4520, for example. The first group driver 4510 and the second group driver 4520 are electrically connected to a sensing driver 4600.

When a touch signal is applied to the sensing patterns 4390, a sensing group to which the touch signal is applied is detected, and an accurate touch position in the sensing group to which the touch signal is applied is detected. Accordingly, high speed driving of a touch screen panel may be performed.

Figure 103:
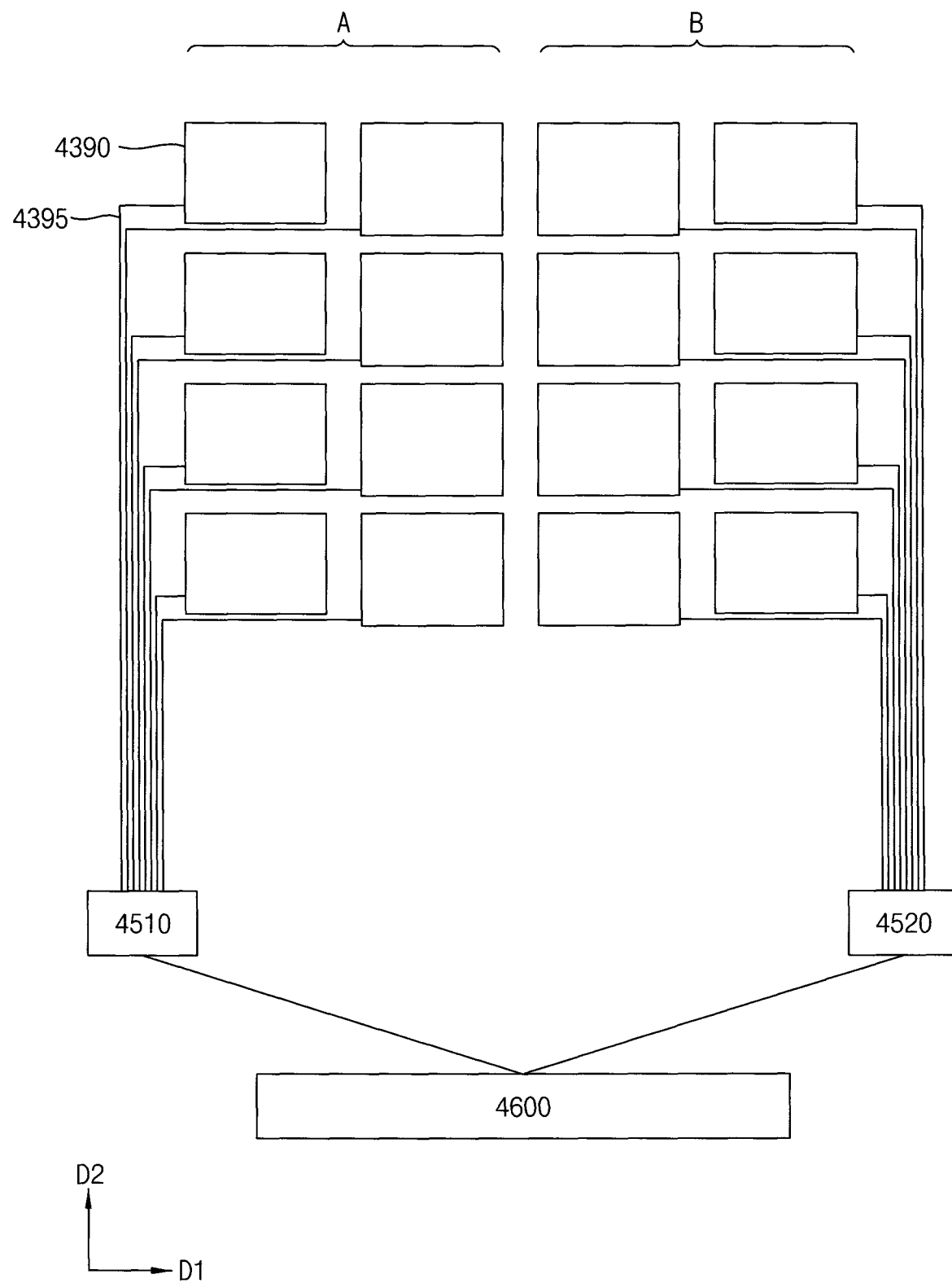
FIG. 103 is a plan view illustrating a sensing pattern of FIG. 84.
Figure 104:
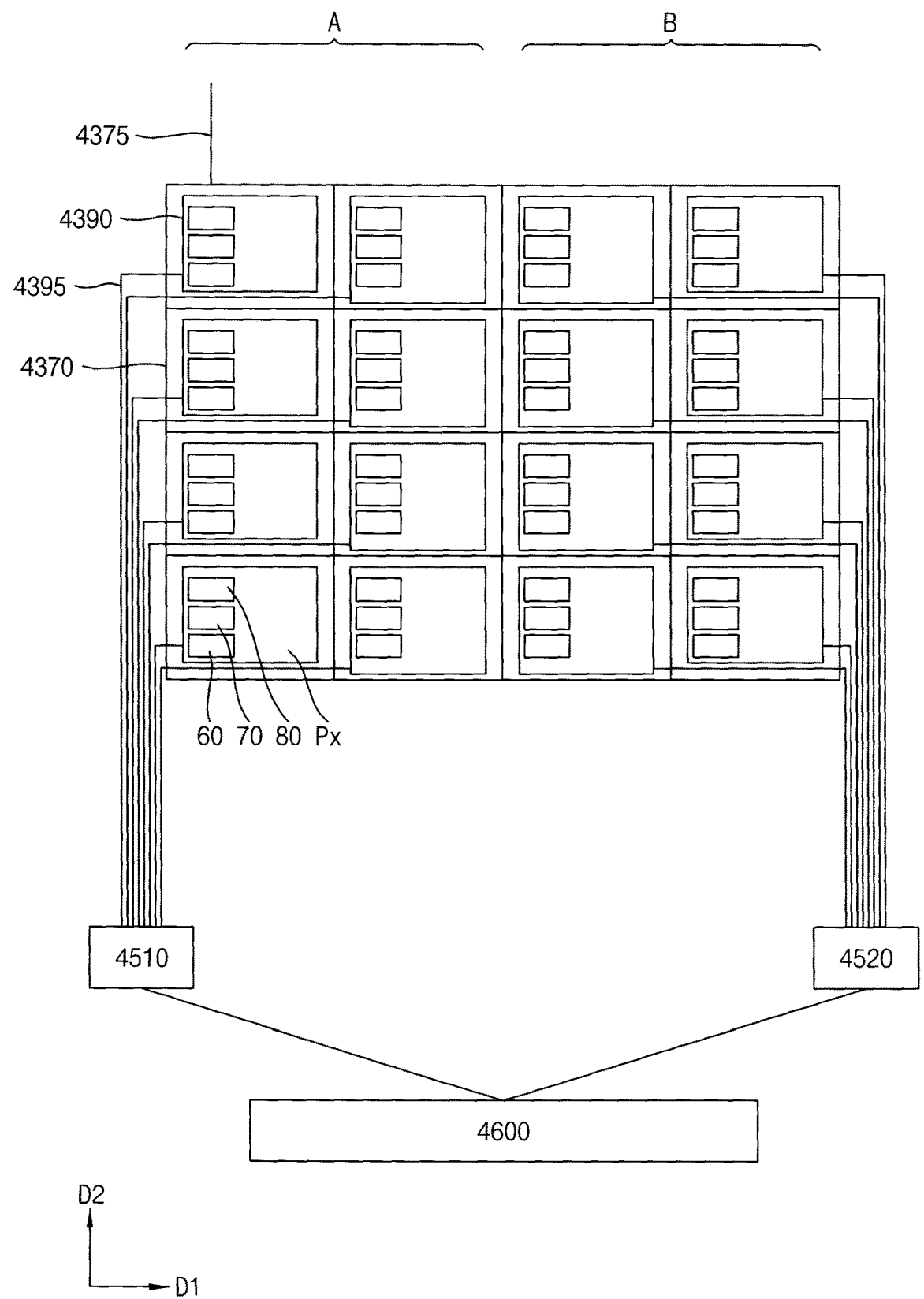
FIG. 104 is a plan view illustrating the reflection pattern of FIG. 102 and the sensing pattern of FIG. 103.

FIG. 102 is a plan view illustrating a reflection pattern of FIG. 84. FIG. 103 is a plan view illustrating a sensing pattern of FIG. 84. FIG. 104 is a plan view illustrating the reflection pattern of FIG. 102 and the sensing pattern of FIG. 103.

Referring to FIG. 84 and FIGS. 102 to 104, the reflection pattern 4370 and the sensing pattern 4390 are illustrated.

The reflection pattern 4370 is disposed only in the reflection region III. Thus, the reflection pattern 4370 is not disposed in a region that the Pixels 60, 70, and 80 are disposed. The reflection pattern 4370 may be electrically connected to a sensing driver (not shown) through a first connection line 4375. The first connection line 4375 may include the same material as that of the reflection pattern 4370. The first connection line 4375 may disposed on the same layer as the reflection pattern 4370. However, the invention is not limited thereto, and the first connection line 4375 may include different material from the reflection pattern 4370.

The sensing pattern 4390 is disposed in the light-emitting region II and the reflection region III. The sensing pattern 4390 may be electrically connected to a sensing driver (not shown) through a second connection line 4395. The second connection line 4395 may include the same material as that of the sensing pattern 4390. The second connection line 4395 may disposed on the same layer as the sensing pattern 4390. However, the invention is not limited thereto, and the second connection line 4395 may include different material from the sensing pattern 4390.

The sensing pattern 4390 may function as a sensing electrode of a touch screen panel of self capacitance type. In an exemplary embodiment, when an electric conductors contacted, capacitance of the sensing pattern 4390 around a touch position is changed, for example. Thus, a touch panel sensor (not shown) may decide a touch position based on a capacitance sensing signal corresponding to the change of capacitance.

The sensing pattern 4390 may have a size corresponding to a predetermined number of unit pixels Px. The sensing pattern 4390 may have an appropriate size according to a size of a display device.

In the illustrated exemplary embodiment, the sensing patterns 4390 classified as a plurality of sensing groups comprising a predetermined number of sensing patterns. In an exemplary embodiment, sensing patterns of A group are electrically connected to a first group driver 4510, and sensing patterns of B group are electrically connected to a second group driver 4520, for example. The first group driver 4510 and the second group driver 4520 are electrically connected to a sensing driver 4600.

When a touch signal is applied to the sensing patterns 4390, a sensing group to which the touch signal is applied is detected, and an accurate touch position in the sensing group to which the touch signal is applied is detected. Accordingly, high speed driving of a touch screen panel may be performed.

When a touch signal is applied to the sensing pattern 4390, potential difference between the sensing pattern 4390 and the reflection pattern 4370 may be occurred. Thus, capacitance between the sensing pattern 4390 and the reflection pattern 4370 is occurred, so that touch sensitivity may be declined due to the capacitance between the sensing pattern 4390 and the reflection pattern 4370.

However, in the illustrated exemplary embodiment, when a touch signal is applied to a sensing pattern 4390, a signal having the same signal as the touch signal is applied to the reflection pattern 4370. Thus, potential difference between the sensing pattern 4390 and the reflection pattern 4370 may be not occurred. Thus, capacitance between the sensing pattern 4390 and the reflection pattern 4370 is not occurred, so that decline of touch sensitivity may be prevented.

Figure 105:
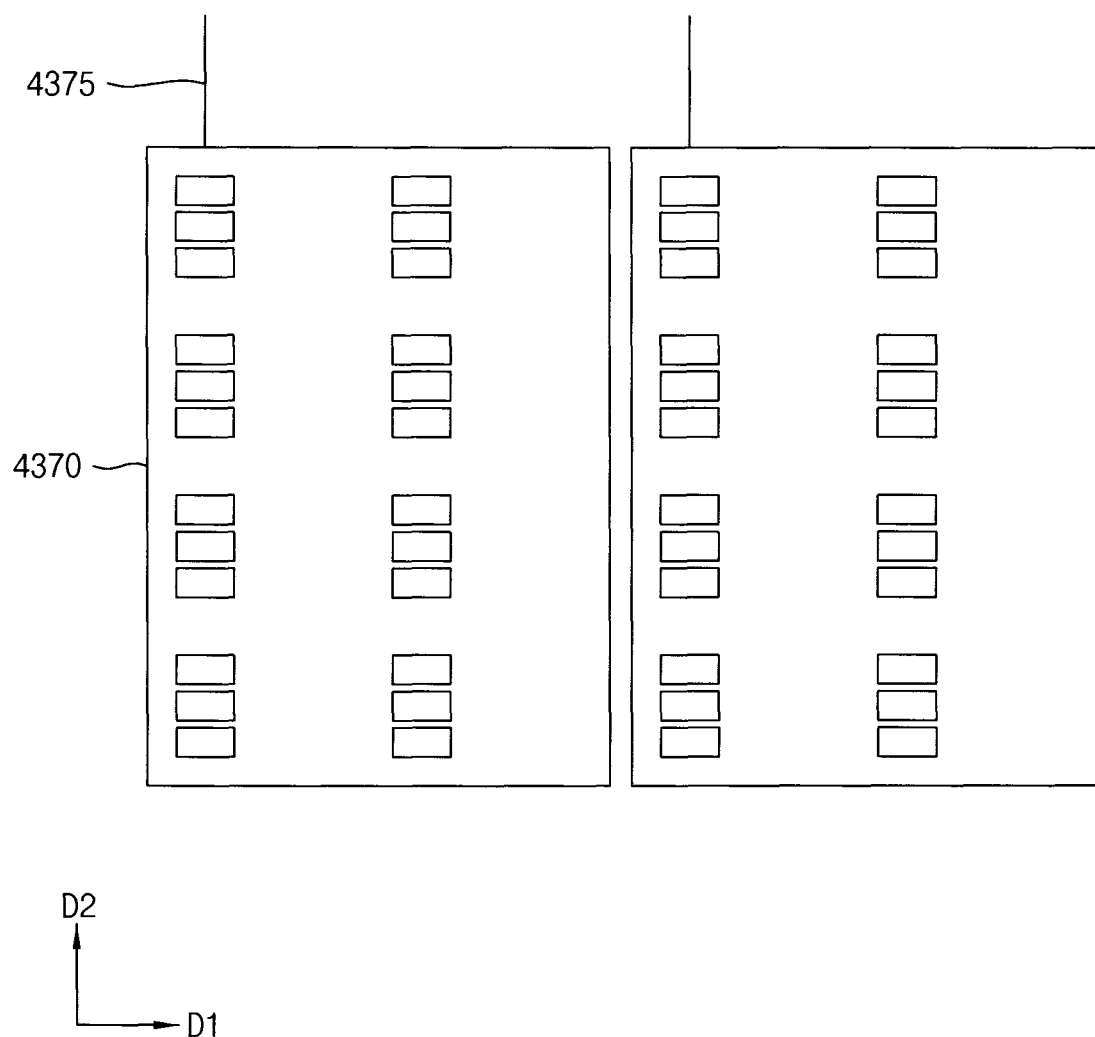
FIG. 105 is a plan view illustrating a reflection pattern of FIG. 84.
Figure 106:
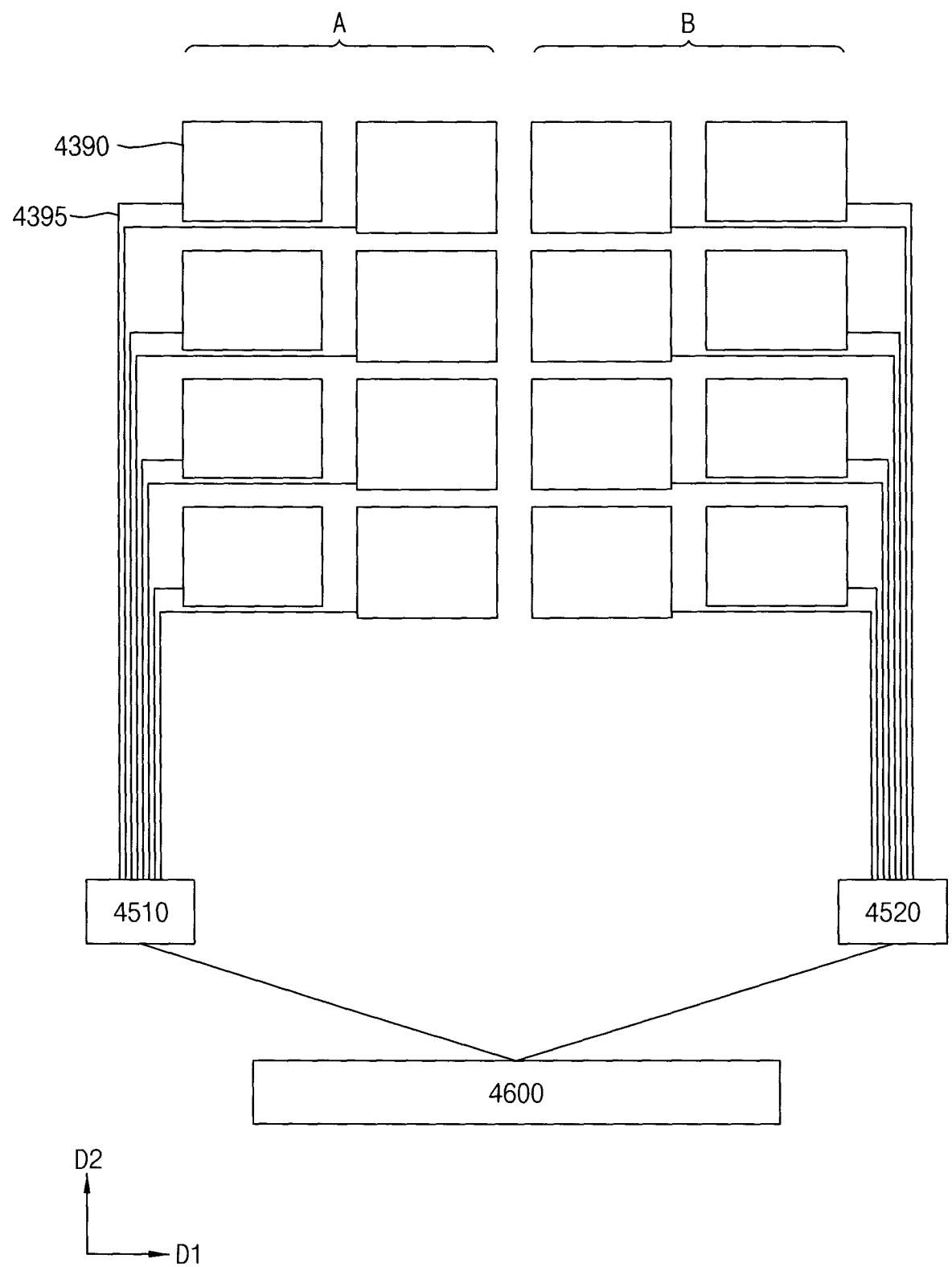
FIG. 106 is a plan view illustrating a sensing pattern of FIG. 84.
Figure 107:
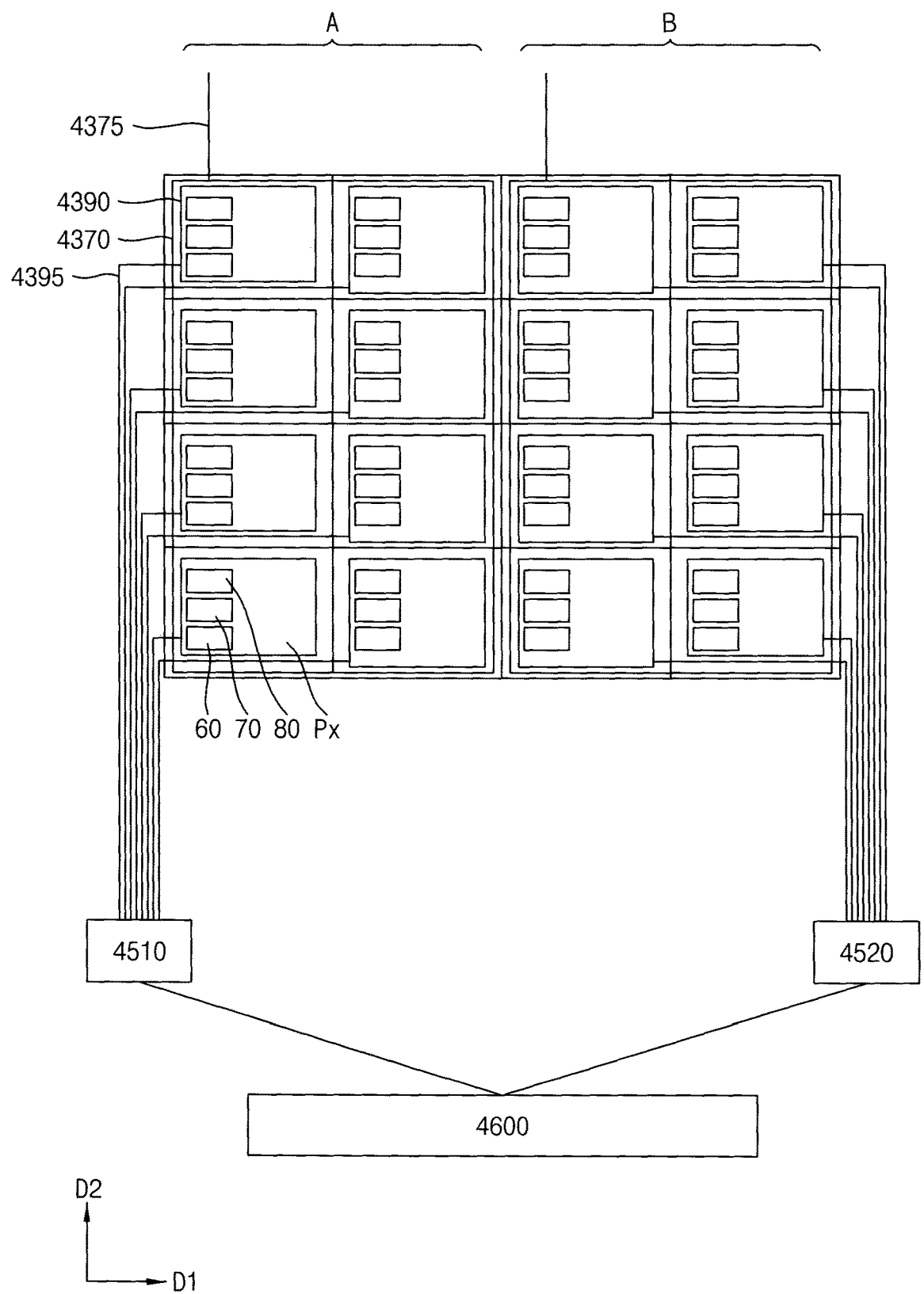
FIG. 107 is a plan view illustrating the reflection pattern of FIG. 105 and the sensing pattern of FIG. 106.

FIG. 105 is a plan view illustrating a reflection pattern of FIG. 84. FIG. 106 is a plan view illustrating a sensing pattern of FIG. 84. FIG. 107 is a plan view illustrating the reflection pattern of FIG. 105 and the sensing pattern of FIG. 106.

Referring to FIG. 84 and FIGS. 105 to 107, the reflection pattern 4370 and the sensing pattern 4390 are illustrated.

The reflection pattern 4370 is disposed only in the reflection region III. Thus, the reflection pattern 4370 is not disposed in a region that the Pixels 60, 70, and 80 are disposed. The reflection pattern 4370 may be electrically connected to a sensing driver (not shown) through a first connection line 4375. The first connection line 4375 may include the same material as that of the reflection pattern 4370. The first connection line 4375 may disposed on the same layer as the reflection pattern 4370. However, the invention is not limited thereto, and the first connection line 4375 may include different material from the reflection pattern 4370.

The sensing pattern 4390 is disposed in the light-emitting region II and the reflection region III. The sensing pattern 4390 may be electrically connected to a sensing driver (not shown) through a second connection line 4395. The second connection line 4395 may include the same material as that of the sensing pattern 4390. The second connection line 4395 may disposed on the same layer as the sensing pattern 4390. However, the invention is not limited thereto, and the second connection line 4395 may include different material from the sensing pattern 4390.

The sensing pattern 4390 may function as a sensing electrode of a touch screen panel of self capacitance type. In an exemplary embodiment, when an electric conductor is contacted, capacitance of the sensing pattern 4390 around a touch position is changed, for example. Thus, a touch panel sensor (not shown) may decide a touch position based on a capacitance sensing signal corresponding to the change of capacitance.

The sensing pattern 4390 may have a size corresponding to a predetermined number of unit pixels Px. The sensing pattern 4390 may have an appropriate size according to a size of a display device.

In the illustrated exemplary embodiment, the sensing patterns 4390 classified as a plurality of sensing groups comprising a predetermined number of sensing patterns. In an exemplary embodiment, sensing patterns of A group are electrically connected to a first group driver 4510, and sensing patterns of B group are electrically connected to a second group driver 4520, for example. The first group driver 4510 and the second group driver 4520 are electrically connected to a sensing driver 4600.

When a touch signal is applied to the sensing patterns 4390, a sensing group to which the touch signal is applied is detected, and an accurate touch position in the sensing group to which the touch signal is applied is detected. Accordingly, high speed driving of a touch screen panel may be performed.

In the exemplary embodiment, the reflection pattern 4370 is provided as a size corresponding to one group of the sensing patterns 4390. In an exemplary embodiment, the reflection pattern 4370 may have a size corresponding to eight reflection patterns 4370, for example. However, the invention is not limited thereto, and the reflection pattern 4370 may have a various size.

When a touch signal is applied to the sensing pattern 4390, potential difference between the sensing pattern 4390 and the reflection pattern 4370 may be occurred. Thus, capacitance between the sensing pattern 390 and the reflection pattern 4370 is occurred, so that touch sensitivity may be declined due to the capacitance between the sensing pattern 4390 and the reflection pattern 4370.

However, in the illustrated exemplary embodiment, when a touch signal is applied to a sensing pattern 4390, a signal having the same signal as the touch signal is applied to the reflection pattern 4370. Thus, potential difference between the sensing pattern 4390 and the reflection pattern 4370 may be not occurred. Thus, capacitance between the sensing pattern 4390 and the reflection pattern 4370 is not occurred, so that decline of touch sensitivity may be prevented.

According to the exemplary embodiment, an OLED device includes a reflection member having mirror function and touch function. Thus, additional process for forming an electrode layer having a touch function may be omitted. This, a manufacturing cost may be decreased.

In addition, the OLED device includes a first reflection member disposed in a reflection region and a second disposed in the light-emitting region and the reflection region. Thus, scattered reflection occurred at an edge of the first reflection member may be decreased.

In addition, the OLED device includes a thin film encapsulation layer. Thus, a flexible OLED device having mirror function and touch function may be manufactured.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, acid that modifications to the disclosed exemplary embodiments, as well as other exemplary embodiments, are intended to be included within the scope of the appended claims. The invention is defined by the following claims, with equivalents of the claims to be included therein.

What is claimed is:

1. A display device comprising:
   a first substrate in which a plurality of pixel areas is defined;
   a plurality of pixels including a plurality of light emitting layers between a plurality of lower electrodes and an upper electrode on the first substrate;
   a second substrate having a side facing the first substrate, wherein the light emitting layers are disposed between the second substrate and the first substrate;
   touch sensor electrodes on the second substrate, wherein the touch sensor electrodes are between the first substrate and the second substrate;
   a plurality of connection lines which are respectively connected to the touch sensor electrodes;
   a pixel defining layer separating the plurality of the pixel areas;
   a sensing driver;
   wherein the touch sensor electrodes are electrically connected to the sensing driver;
   wherein the touch sensor electrodes and the connection lines are formed of metal,
   wherein the touch sensor electrodes and the connection lines are on a same layer,
   wherein the touch sensor electrodes are connected to the corresponding connection lines.

2. The display device of claim 1, wherein the touch sensor electrodes and the connection lines are formed of molybdenum, and
   wherein the first substrate and the second substrate comprise glass.

3. The display device of claim 1, wherein the touch sensor electrodes are between the pixels in a plan view.

4. The display device of claim 3, wherein the touch sensor electrodes and the connection lines are formed of molybdenum, and
   wherein the first substrate and the second substrate comprise glass.

5. A display device comprising:
   a first substrate in which a plurality of pixel areas is defined;
   a plurality of pixels including a plurality of light emitting layers between a plurality of lower electrodes and an upper electrode on the first substrate;
   a second substrate having a side facing the first substrate, wherein the light emitting layers are disposed between the second substrate and the first substrate;
   touch sensor electrodes on the second substrate, wherein the touch sensor electrodes are between the first substrate and the second substrate;
   a plurality of connection lines which are connected to the touch sensor electrodes;
   a pixel defining layer separating the plurality of the pixel areas;

a thin film encapsulation layer on the upper electrode,
a sensing driver;
wherein the touch sensor electrodes are electrically connected to the sensing driver;
wherein the touch sensor electrodes and the connection lines are formed of metal,
wherein the touch sensor electrodes and the connection lines are on a same layer,
Wherein the thin film encapsulation layer includes a first encapsulation layer, an organic layer, and a second inorganic layer which are sequentially stacked.

6. The display device of claim 5, wherein the touch sensor electrodes and the connection lines are formed of aluminum and titanium, and
wherein the first substrate and the second substrate comprise glass.

7. The display device of claim 5, wherein the touch sensor electrodes are between the pixels in a plan view.

8. The display device of claim 7, wherein the touch sensor electrodes and the connection lines are formed of aluminum and titanium, and
wherein the first substrate and the second substrate comprise flexible resin.

9. A display device comprising:
a substrate;
a buffer layer on the substrate;
an active pattern on the buffer layer;
a first insulation layer on the active pattern;
a gate electrode on a portion of the first insulation layer;
a second insulation layer on the gate electrode;
a source electrode and a drain electrode on the substrate;
a third insulation layer on the source electrode and the drain electrode;
a lower electrode on the third insulation layer;
a light emitting layer on the lower electrode;
an upper electrode on the light emitting layer;
a pixel defining layer on the third insulation layer to expose a portion of the lower electrode;
a thin film encapsulation layer on the upper electrode;
touch sensor electrodes on the thin film encapsulation layer;
a plurality of connection lines which are connected to the touch sensor electrodes;
a sensing driver;
wherein the touch sensor electrodes are electrically connected to the sensing driver;
wherein the touch sensor electrodes and the connection lines are formed of metal,
wherein the touch sensor electrodes and the connection lines are formed of aluminum and titanium,
wherein the touch sensor electrodes and the connection lines are on a same layer,
wherein the substrate comprises:
a first polyimide layer;
a barrier film layer disposed on the first polyimide layer; and
a second polyimide layer disposed on the barrier film layer, and
wherein the thin film encapsulation layer includes a first encapsulation layer, an organic layer, and a second inorganic layer which are sequentially stacked.

10. A display device comprising:
a substrate;
a buffer layer on the substrate;
an active pattern on the buffer layer;
a first insulation layer on the active pattern;
a gate electrode on a portion of the first insulation layer;
a second insulation layer on the gate electrode;
a source electrode and a drain electrode on the substrate;
a third insulation layer on the source electrode and the drain electrode;
a lower electrode on the third insulation layer;
a light emitting layer on the lower electrode;
an upper electrode on the light emitting layer;
a pixel defining layer on the third insulation layer to expose a portion of the lower electrode;
a thin film encapsulation layer on the upper electrode;
touch sensor electrodes on the thin film encapsulation layer;
connection lines which are connected to the touch sensor electrodes; and
a sensing driver;
wherein the touch sensor electrodes are electrically connected to the sensing driver;
wherein the touch sensor electrodes and the connection lines are formed of metal,
wherein the touch sensor electrodes and the connection lines are formed of aluminum and titanium,
wherein the touch sensor electrodes and the connection lines are on a same layer,
wherein the touch sensor electrodes are connected to the corresponding connection lines,
wherein the substrate comprises:
a first polyimide layer;
a barrier film layer disposed on the first polyimide layer; and
a second polyimide layer disposed on the barrier film layer, and
wherein the thin film encapsulation layer includes a first encapsulation layer, an organic layer, and a second inorganic layer which are sequentially stacked.

11. A display device comprising:
a first substrate in which a plurality of pixel areas is defined;
a plurality of pixels including a plurality of light emitting layers between a plurality of lower electrodes and an upper electrode on the first substrate;
touch sensor electrodes on the first substrate;
a plurality of connection lines which are connected to the touch sensor electrodes;
a pixel defining layer separating the plurality of the pixel areas;
a thin film encapsulation layer on the upper electrode; and
a sensing driver,
wherein the touch sensor electrodes are electrically connected to the sensing driver,
wherein the touch sensor electrodes and the connection lines are formed of metal,
wherein the touch sensor electrodes and the connection lines are formed of aluminum and titanium,
wherein the touch sensor electrodes and the connection lines are on a same layer, and
wherein the thin film encapsulation layer includes a first encapsulation layer, an organic layer, and a second inorganic layer which are sequentially stacked.

12. An organic light emitting display device comprising:
a substrate;
an organic light emitting unit on the substrate;
a metal layer on the organic emitting unit;
a first insulating layer on the metal layer;
a plurality of sensing patterns on the first insulating layer; and
a thin film encapsulation layer on the organic light emitting unit, wherein the organic light emitting unit comprises an anode, an organic light emitting layer and a cathode, wherein the plurality of sensing patterns are formed of metal, wherein the plurality of sensing patterns are formed of aluminum and titanium, and wherein a signal is applied to the metal layer to improve touch sensitivity.

\* \* \* \* \*